(12) United States Patent
Walden, II et al.

(10) Patent No.: US 11,514,586 B1
(45) Date of Patent: Nov. 29, 2022

(54) AUTOMATED APPLICATION OF DRIFT CORRECTION TO SAMPLE STUDIED UNDER ELECTRON MICROSCOPE

(71) Applicant: Protochips, Inc., Morrisville, NC (US)

(72) Inventors: Franklin Stampley Walden, II, Raleigh, NC (US); John Damiano, Jr., Holly Springs, NC (US); David P. Nackashi, Raleigh, NC (US); Daniel Stephen Gardiner, Wake Forest, NC (US); Mark Uebel, Morrisville, NC (US); Alan Philip Franks, Durham, NC (US); Benjamin Jacobs, Apex, NC (US); Joshua Brian Friend, Raleigh, NC (US); Katherine Elizabeth Marusak, Cary, NC (US); Nelson L Marthe, Jr., Cary, NC (US); Benjamin Bradshaw Larson, Cary, NC (US)

(73) Assignee: PROTOCHIPS, INC., Morrisville, NC (US)

( * ) Notice: Subject to any disclaimer, the term of this patent is extended or adjusted under 35 U.S.C. 154(b) by 0 days.

(21) Appl. No.: 17/817,248

(22) Filed: Aug. 3, 2022

Related U.S. Application Data

(63) Continuation of application No. 17/585,222, filed on Jan. 26, 2022, which is a continuation-in-part of
(Continued)

(51) Int. Cl.
*G06T 7/215* (2017.01)
*G06T 7/33* (2017.01)
*H01J 37/20* (2006.01)

(52) U.S. Cl.
CPC .............. *G06T 7/215* (2017.01); *G06T 7/337* (2017.01); *H01J 37/20* (2013.01); *G06T 2207/10061* (2013.01); *H01J 2237/2594* (2013.01)

(58) Field of Classification Search
CPC .................... G06T 7/215; G06T 7/337; G06T 2207/10061; H01J 37/20; H01J 2237/2594
See application file for complete search history.

(56) References Cited

U.S. PATENT DOCUMENTS

| | | | |
|---|---|---|---|
| 2003/0201393 A1 | 10/2003 | Tsuneta et al. | |
| 2005/0232493 A1 | 10/2005 | Satou et al. | |

(Continued)

FOREIGN PATENT DOCUMENTS

| | | |
|---|---|---|
| CN | 108780729 A | 9/2018 |
| JP | 63-202834 A | 8/1988 |

(Continued)

OTHER PUBLICATIONS

ISA/KR; International Search Report and Written Opinion for International Patent Application No. PCT/US2020/045937 dated Mar. 30, 2021, 18 pages.
(Continued)

*Primary Examiner* — Nicole M Ippolito
*Assistant Examiner* — Hanway Chang
(74) *Attorney, Agent, or Firm* — NK Patent Law

(57) ABSTRACT

Methods and systems for calibrating a transmission electron microscope are disclosed. A fiducial mark on the sample holder is used to identify known reference points so that a current collection area and a through-hole on the sample holder can be located. A plurality of beam current and beam area measurements are taken, and calibration tables are extrapolated from the measurements for a full range of microscope parameters. The calibration tables are then used to determine electron dose of a sample during an experiment at a given configuration.

25 Claims, 199 Drawing Sheets

Related U.S. Application Data application No. 17/545,651, filed on Dec. 8, 2021, now Pat. No. 11,477,388, which is a continuation of application No. 17/210,702, filed on Mar. 24, 2021, now Pat. No. 11,399,138, which is a continuation of application No. 16/951,297, filed on Nov. 18, 2020, now Pat. No. 10,986,279, which is a continuation of application No. PCT/US2020/045937, filed on Aug. 12, 2020.

(60) Provisional application No. 62/888,309, filed on Aug. 16, 2019.

(56) References Cited

U.S. PATENT DOCUMENTS

| | | |
|---|---|---|
| 2006/0076492 A1 | 4/2006 | Taniguchi et al. |
| 2007/0023651 A1 | 2/2007 | Ishitani et al. |
| 2008/0073533 A1 | 3/2008 | Makino et al. |
| 2012/0104253 A1 | 5/2012 | Tsuneta et al. |
| 2014/0022600 A1 | 1/2014 | Phaneuf et al. |
| 2014/0226003 A1 | 8/2014 | Phaneuf et al. |
| 2014/0380531 A1 | 12/2014 | Ukraintsev et al. |
| 2015/0116470 A1 | 4/2015 | Ovod |
| 2016/0064187 A1 | 3/2016 | Tomimatsu et al. |
| 2016/0172154 A1 | 6/2016 | Kakinuma et al. |
| 2017/0278664 A1 | 9/2017 | Sato et al. |
| 2018/0039054 A1 | 2/2018 | Hattori |
| 2018/0074306 A1 | 3/2018 | Visscher et al. |
| 2018/0204704 A1 | 7/2018 | Suzuki et al. |
| 2018/0204705 A1 | 7/2018 | Tomimatsu et al. |
| 2018/0286630 A1 | 10/2018 | Takekoshi |
| 2019/0017811 A1 | 1/2019 | Watanabe et al. |
| 2019/0304745 A1 | 10/2019 | Suzuki et al. |

FOREIGN PATENT DOCUMENTS

| | | |
|---|---|---|
| JP | 2001118535 A | 4/2001 |
| KR | 1020180119699 A | 11/2018 |
| KR | 101964529 B1 | 4/2019 |

OTHER PUBLICATIONS

USPTO; Non-Final Office Action for U.S. Appl. No. 16/951,297 dated Feb. 2, 2021, 11 pages.
USPTO; Non-Final Office Action for U.S. Appl. No. 17/210,702 dated Jan. 21, 2022, 8 pages.
USPTO; Non-Final Office Action for U.S. Appl. No. 17/545,651 dated Feb. 14, 2022, 7 pages.
WIPO; International Preliminary Report on Patentability for International Patent Application No. PCT/US2020/045937 dated Mar. 3, 2022, 13 pages.
JP; Office Action for Japanese Patent Application No. JP 2021-568360 dated Apr. 19, 2022, 10 pages (includes translation).
CN; Office Action for Chinese Patent Application No. CN 202080040044.0 dated Jun. 17, 2022, 8 pages (includes translation of first 2 pages).
EPO, Extended European Search Report for corresponding European Patent Application No. 20854644.0, dated Aug. 5, 2022, 16 pages.
Marturi, N. et al.: "Fast image drift compensation in scanning electron microscope using image registration", 2013 IEEE International Conference On Automation Science and Engineering (CASE), IEEE, Aug. 17, 2013 (Aug. 17, 2013), pp. 807-812, XP032523033.
JP; Office Action for Japanese Patent Application No. 2021-568360 dated Jul. 26, 2022, 5 pages (includes translation).

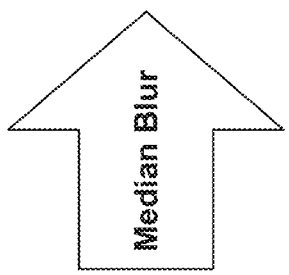
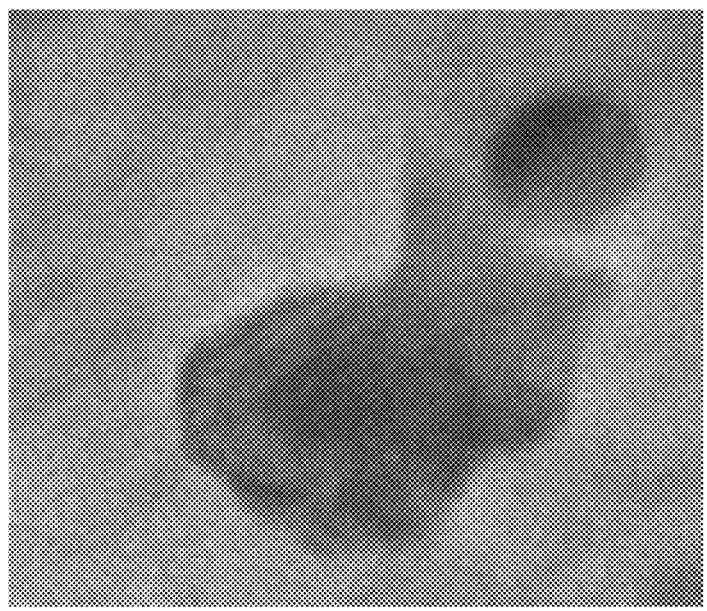
FIG. 40

Tag:
1. Review tagged areas
2. Check boxes of areas of interest
   1. Can click on each image to explode for closer look
3. Of those checked boxes, do additional higher resolution tagging and/or refine areas if desired

FIG. 60

| Session Management | |
|---|---|
| Sessions Directory Location | C:\Users\Public\Documents\Protochips\AXON |
| Sessions Directory Size (GB) | 800.00 |
| Sessions Directory Cleanup Threshold | 0.90 |
| Sessions Directory Cleanup Interval (s) | 30 |
| Sessions Directory Tagging Threshold | 0.80 |
| Save Raw Images | ☑ |
| Save Single Images | ☑ |
| Save Template Images | ☐ |
| Save Drift Corrected Images | ☑ |
| Image Save Threads | 3 |
| Image Save Thread Priority | BelowNormal |
| Image Tagging Lookback Interval (s) | 30 |

AXON Commands

| Reset Beam X/Y | Reset Beam Z |
|---|---|
| Start Unwind Beam X/Y | Stop Unwind Beam X/Y |
| Start Unwind Beam Z | Stop Unwind Beam Z |
| Save Trace | |

Microscope Commands

| | Read Imaging Mode | Set Magnification | Sync Magnification |
|---|---|---|---|
| | Read Magnification | 0 | |
| | | Set Position | Sync Position |
| X | Read Position | 0.000 ◀▶ | 0.100 μm |
| Y | | 0.000 ◀▶ | 0.100 μm |
| Z | | 0.000 ◀▶ | 0.100 μm |
| A | | 0.000 ◀▶ | 1.000 deg |
| B | | 0.000 ◀▶ | 1.000 deg |
| | | Set Shift | Sync Shift |
| X | Read Shift | 0.000 ◀▶ | 0.010 μm |
| Y | | 0.000 ◀▶ | 0.010 μm |
| | | Set Defocus | Sync Defocus |
| | Read Defocus | 0.000 ◀▶ | 0.010 μm |

FIG. 89

Microscope Profile

| Test Connection | http://198.211.143.65:8181/Microscope ▶ |
|---|---|
| Start XY Calibration | Stop XY Calibration |
| Start Focus Calibration | Stop Focus Calibration |

| Search | ◀ | ⊕ ⊕ ⊗ |
|---|---|---|
| ⊙ [0] | ⊗ | |
| Microscope Name | TALOS-9950319 | |
| Microscope Type | TALOS-9950319 | |
| Microscope Service Uri | Unknown | |
| Last Connection Time | http://198.211.143.65:8181/Microscope | |
| Simulate Calibration | 2020-02-13 16:34:34.632 | |
| ↑ Microscope Service | ☐ | |
| ↑ Positioner Capabilities | ... | |
| ↑ Coordinate Transforms | ... | |
| ↑ Focus Assist Step Sizes | ... | |
| ↑ [1] | LAPTOP-PHI5URU2 | |

Reset | Apply

FIG. 90

| ⊘ Coordinate Transforms | ... |
|---|---|
| ⊕ ⊙ [0] | BM-Ceta to TemBeam at 22.5 kx |
| ⊕ ⊙ [1] | BM-Ceta to Stage at 22.5 kx |
| ⊕ ⊙ [2] | BM-Ceta to TemBeam at 36 kx |
| ⊕ ⊙ [3] | BM-Ceta to Stage at 36 kx |
| ⊕ ⊙ [4] | BM-Ceta to TemBeam at 150 kx |
| ⊕ ⊙ [5] | BM-Ceta to TemBeam at 390 kx |

| ⊘ Focus Assist Step Sizes | ... |
|---|---|
| ⊕ ⊙ [0] | BM-Ceta at 22.5 kx |
| ⊕ ⊙ [1] | BM-Ceta at 74 kx |
| ⊕ ⊙ [2] | BM-Ceta at 150 kx |

FIG. 91

Image Buffer Size:
Throughout the experiment, AXON saves all raw and drift corrected images to a buffer that can reach up to 25,000 images. Once the system reaches 25,000 images during a session it will start to overwrite the first images. This indicator displays the total images in that session as both a percentage of capacity and total number saved.

Image Quick Stats:
The active camera/detector, frame size, magnification, and average update rate are all reported. The average update rate is as the images are saved in AXON.

X/Y Beam Position:
This indicator reflects the larger of either X or Y beam position from the alignment 0,0.

Z Beam Position:
This indicator reflects the defocus value or Z beam position from eucentric.

Automatic Beam Unwind:
Enabling automatic beam unwind will automatically trigger the stage to move the required distance in steps bringing the beam back to eucentric/alignment 0,0,0. This movement will be triggered once the beam position reaches the slider-which is user adjustable.

Manual Beam Unwind:
This will manually trigger the stage to move the required distances in steps bringing the beam back to eucentric/alignment 0,0,0. This movement can be slightly disruptive to the live image but will improve any imaging conditions affected by large beam deflections.

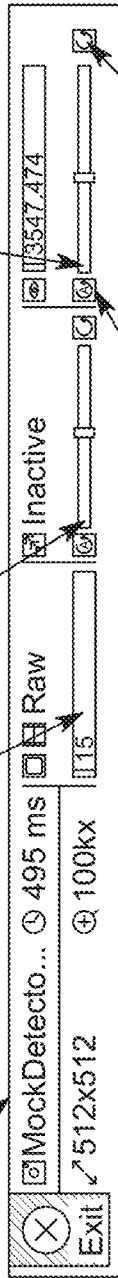

FIG. 94A

AXON Notebook:
The AXON Notebook is a separate program that can be installed on any computer for data review. It can also be used mid-session to compare sample sites and review a sample's history

Saved Images:
All images synced are saved, live, into a 25,000 image buffer
All images in the folder.
"C\Users\Public\Documents\Protochips\AXON\Sessions" are part of the temporary buffer. Once the total images in that folder is 25,000 the software will start removing the oldest images from the earliest sessions to make room for newly saved images

Save sessions to new folder on a different hard drive [either networked or external via USB] to prevent images from being deleted.

During drift correction, images are saved twice to the image buffer
- As the raw transferred image
- Digital corrected image

FIG. 95A

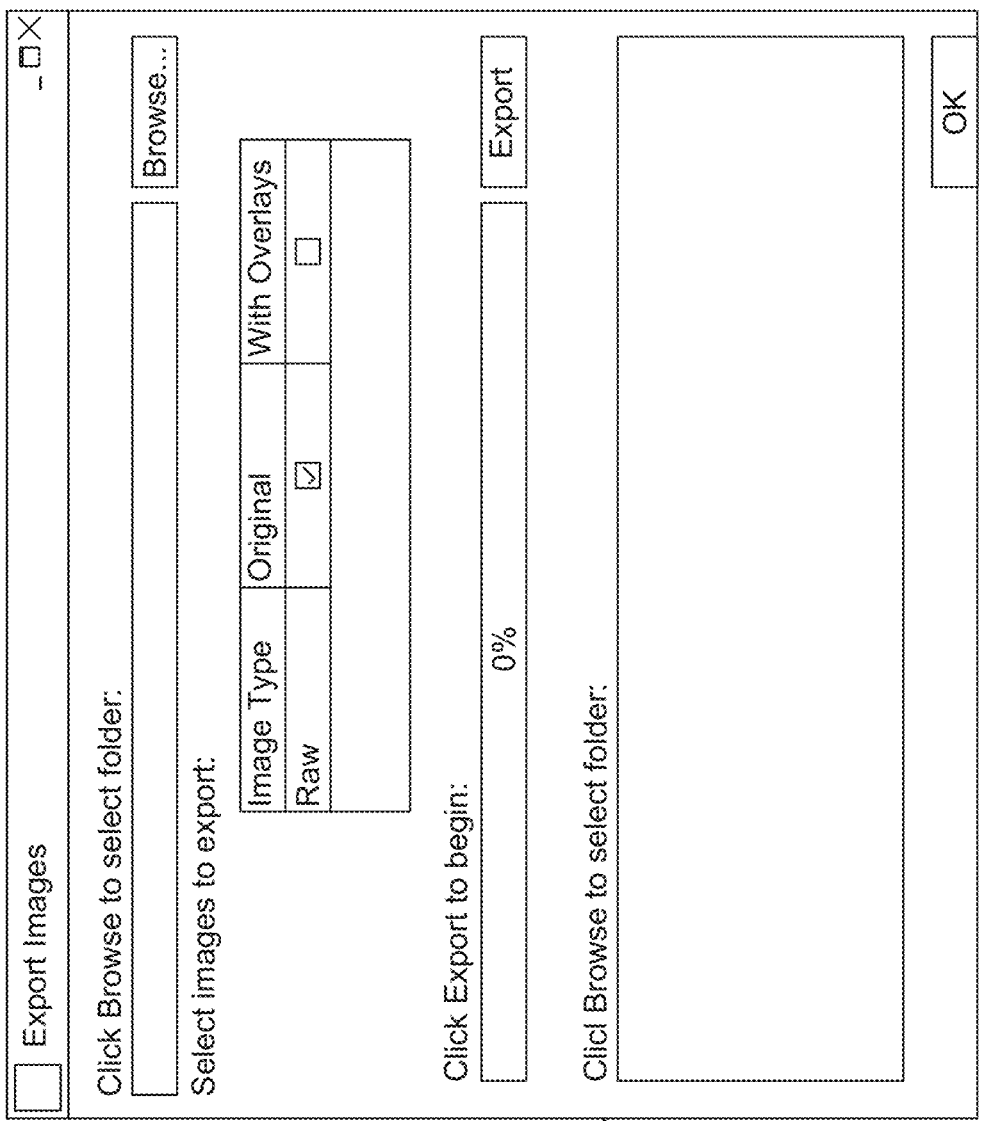

FIG. 95E

Permanently Save Images:
Save the selected folder or the active buffer by clicking on the "save" button at the bottom of the image browser. This will bring open a dialogue box where one can browse or create folders to save the buffer images to. It is highly recommended to save images to an external or networked drive.

One can select which images to save:
- One can select raw, drift corrected and/or single acquire images to save to the destination folder.
- One can choose to save images with and without any applied overlays such as scale bars or metadata.

FUSION SELECT

① Experiment Commands

Image

④ Data Overlays

| Show | Value Name | Title | Location | Size(pt) | Font Family |
|---|---|---|---|---|---|
| ⊙ Position | | | | | |
| ☐ | Coordinated Position B | Beta | Top Left | 32 | Microsoft Sans Serif |
| ☐ | Stage X | Stage X | Top Left | 32 | Microsoft Sans Serif |
| ☐ | Stage Y | Stage Y | Top Left | 32 | Microsoft Sans Serif |
| ☑ | Stage Z | Stage Z | Top Left | 32 | Microsoft Sans Serif |
| ☐ | Stage A | Alpha | Top Left | 32 | Microsoft Sans Serif |
| ☐ | Stage B | Beta | Top Left | 32 | Microsoft Sans Serif |
| ☐ | Beam X | Beam X | Top Left | 32 | Microsoft Sans Serif |
| ☐ | Beam Y | Beam Y | Top Left | 32 | Microsoft Sans Serif |
| ☐ | Defocus | Defocus | Top Left | 32 | Microsoft Sans Serif |
| ☐ | Beam A | Beam Alpha | Top Left | 32 | Microsoft Sans Serif |
| ☐ | Beam B | Beam Beta | Top Left | 32 | Microsoft Sans Serif |

FIG. 104B

Protochips AXON Notebook V1.0.66: C:\Users\Public\Documents\Protochips\AXON\Sessions\20200323-Fusion-001

Data Overlays

| Show | Value Name | Title | Location | Size(pt) | Font Family |
|---|---|---|---|---|---|
| ⊙ AXON | | | | | |
| ☐ | Local Date/Time | | Top Left | 32 | Microsoft Sans Serif |
| ☑ | Scale Bar | | Bottom Right | 24 | Microsoft Sans Serif |
| ☐ | Microscope Date/Time | | Top Left | 32 | Microsoft Sans Serif |
| ⊙ Fusion Select | | | | | |
| ☐ | Channel A Temperature | | Top Left | 32 | Microsoft Sans Serif |
| ☐ | Channel A Current | | Top Left | 32 | Microsoft Sans Serif |
| ☐ | Channel A Resistance | | Top Left | 32 | Microsoft Sans Serif |
| ☐ | Channel A Voltage | | Top Left | 32 | Microsoft Sans Serif |
| ☐ | Channel A Power | | Top Left | 32 | Microsoft Sans Serif |

| Image Metadata | |
|---|---|
| AXON Date Time | 2020-03-23 18:22:41.865 |
| Image Number | 24660 |
| Drift ROI (pixels) | Size: [256, 256]; Center: [256, 256]; Top Left: [128, 128] |
| Focus ROI (pixels) | Size: [204, 204]; Center: [255, 255]; Top Left: [153, 153] |
| Pixel Shift | Pixel Shift |
| Coordinated Position | Coordinated Position: [-32319.5714226334, -32558.8739413818, -0.02,...] |
| Drift Rate (μm/ms) | [-0.000324449525388263, -0.000378978123455357] |
| Focus Score | 20.1815203999939 |
| Focus Quotient | 0.994634754241348` |
| Match Correlation | 0.00363390427082777 |
| Image Processing Settings | ... |
| Microscope Date Time | 2020-03-23 18:22:41.854 |
| Microscope Settings | ... |
| Imager Settings | ... |
| Positioner Settings | ... |
| Auxiliary Data | ... |

Calibrate dose

- Method #1: Provide a method to directly measure beam current using Fusion or a specialized holder. AXON would control this system and the TEM, and using camera information, would build the table needed to establish dose for each AccV, aperture setting and TEM/STEM mode.
- Method #2: Use the camera conversion efficiency to calculate beam current and compare with phosphorescent screen for confidence. Using these readings, AXON would control the TEM, and using camera information, would build the table needed to establish dose for each AccV, aperture setting and TEM/STEM mode.

FIG. 111

Operate within budget

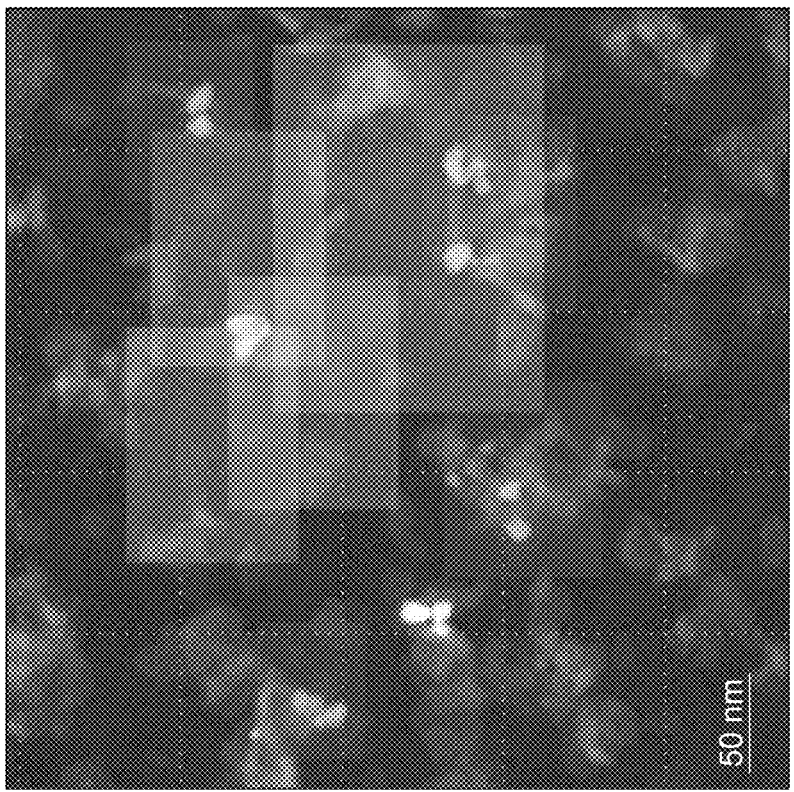

3.26 e⁻/Å²s 3.26 e⁻/Å²

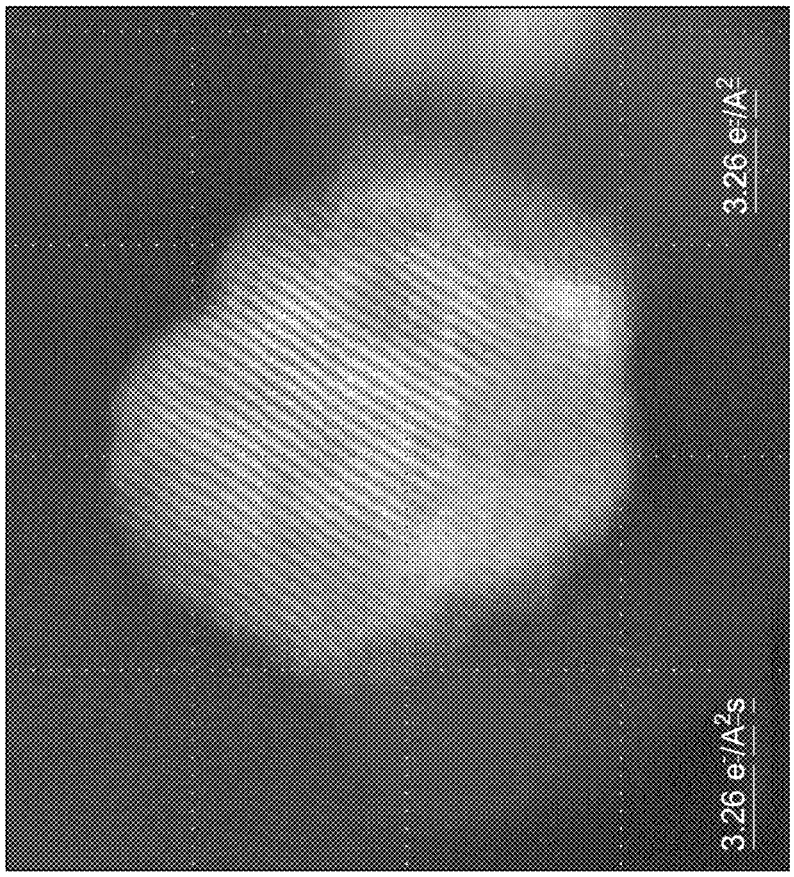

50 nm

- Include indicators within each image on the electron dose rate and total accumulated dose since "start" (like a trip odometer. Even better if full history can be accounted for (see next page).

- Qualitative map of total accumulated dose within an imaging area. Perhaps use this to guide the user to areas that have not been heavily exposed.

FIG. 113

Post experiment analysis
- Draw a box over a given region and allow the Notebook to determine the highest dose seen in that region
- Enable a filter to remove segments of the data in the image stack that contain images that were taken in areas that exceeded the dose budget

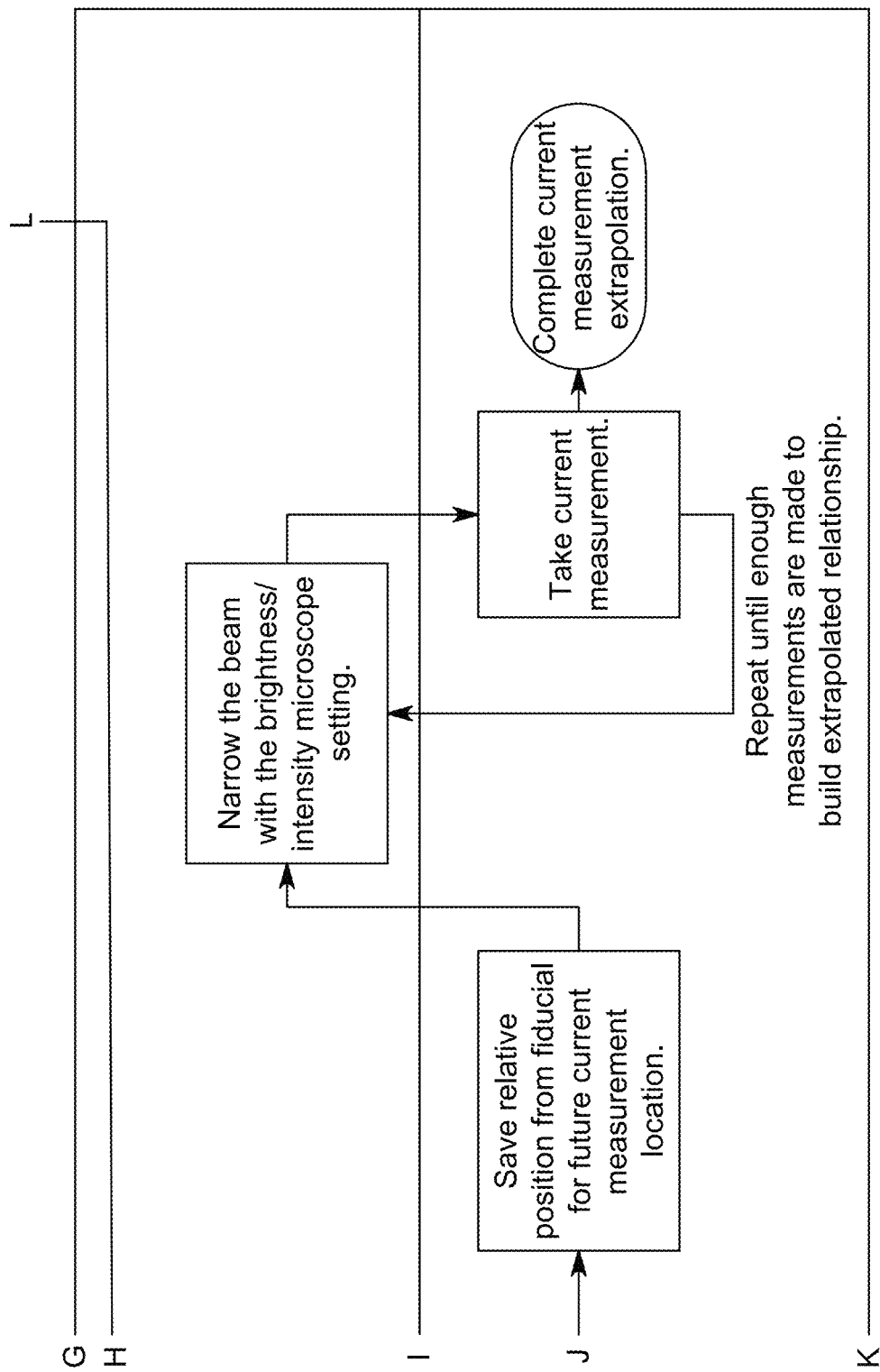

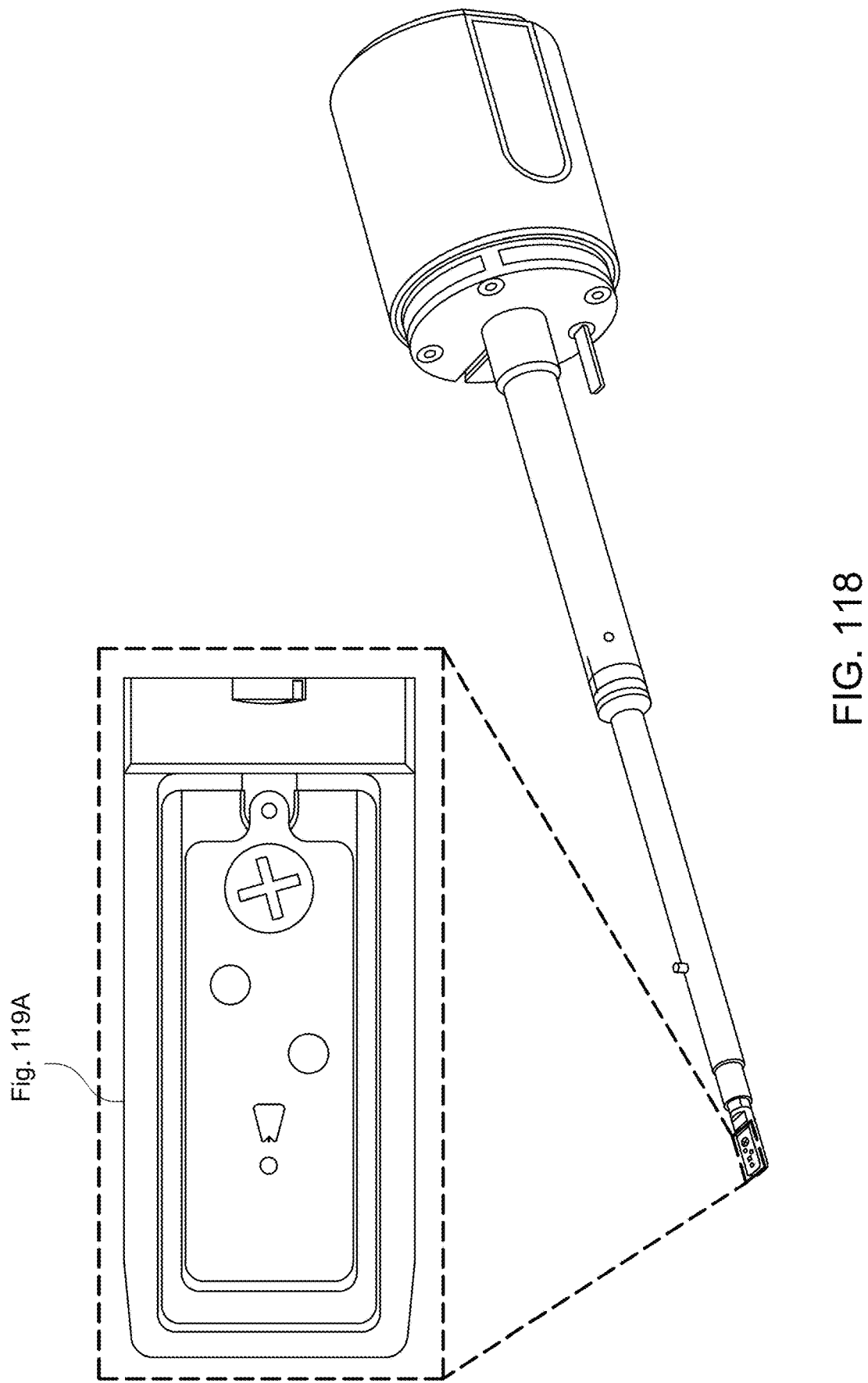

| Dose Profiles | |
|---|---|
| ⊕[0] | Mock_Microscope on MARK-SPECTRE at http://localhost/Temporary_Listen_Add...⊗ |
| ⊕Dose Area Calibrations | |
| ⊕[0] | 2022-01-10 13:41:41 at 200kV, 0 Intensity, 0 Spot Size, 7 C1 Aperture, 7 C2 Aper...⊗ |
| Beam Diameter [μm] | 0.4986274216477736 |
| CalibrationTime | 2022-01-10 13:41:41.295 |
| ⊕Microscope Settings | ... |
| ⊕Imager Settings | ... |
| ⊕Positioner Settings | ... |
| ⊕Dose Current Calibrations | |
| ⊕[0] | 2022-01-10 15:15:17 at 200kV, 0 Intensity, 0 Spot Size, 7 C1 Aperture, 7 C2 Aper...⊗ |
| Beam Current (pA) | 10 |
| CalibrationTime | 2022-01-10 15:15:17.854 |
| ⊕Microscope Settings | ... |
| ⊕Imager Settings | ... |
| ⊕Positioner Settings | ... |
| ⊕[1] | 2022-01-10 12:35:17 at 200kV, 0 Intensity, 0 Spot Size, 7 C1 Aperture, 7 C2 Aper...⊗ |
| ⊕Camera Profiles | |
| ⊕[0] | MockCamera 1 on Mock_Imaging Collection Efficiency: 0.12345 |
| Camera Name | MockCamera 1 |
| Collection Efficiency (counts/e⁻) | 0.12345 |
| Binning 2 Current Multiplier | 4 |
| Binning 4 Current Multiplier | 16 |
| Binning 8 Current Multiplier | 64 |
| ⊕[1] | TFS_Microscope on TEMVMJDW7 at http://192.168.80.129:8181/AXON/TFS_Mic...⊗ |

FIG. 126

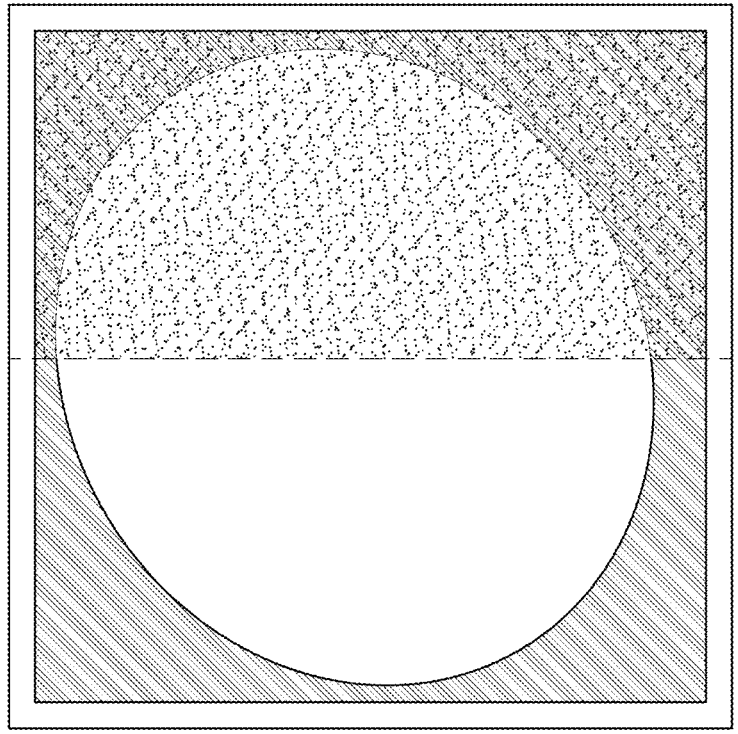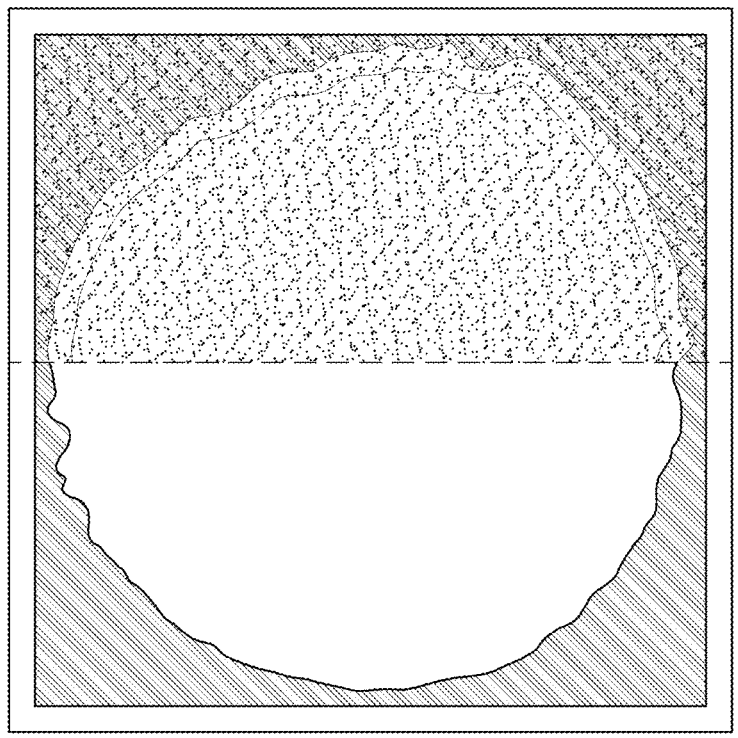
FIG. 127

FIG. 128C

| Auxiliary Data | | |
|---|---|---|
| [0] | | Other |
| [1] | | Session |
| [2] | | Dose |

Image Analysis
Data View
Dose

Dose Settings
Dose Enabled ☑
Condenser Aperture (μm) 100
Low Dose Level (e-/Å²) 1000
Critical Dose Level (e-/Å²) 5000
Overlay Opacity 0.25

Dose Calibrations
Start Dose Area Calibration | Stop Dose Area Calibration
Start Dose Current Calibration | Stop Dose Current Calibration Dose Profiles
[0] TFS_Microscope on TITAN53232540 at http://198.211.143.65:8181/AXON/TFS_Microscope
tGrokYmHwy$NSO4LVU4YpvKFa2b
VgFGnXwJ1c2jtWdO6
TFS_Microscope on TITAN53232540 at http://198.211.143.65:8181/AXON/TFS_Microscope

| ⊕ Sample Microscope | |
|---|---|
| ⊛ [0] | ... |
| CalibrationTime | 2021-11-09 15:16:18 at 300 kV, 9.6470482889391 E-06 Intensity, 6 Spot Size, 9.99E+99 Aperture |
| ⊕ Microscope Settings | 2021-11-09 15:16:18.286 |
| ⊕ Imager Settings | ... |
| ⊕ Positioner Settings | ... |
| Beam Current | 611 |
| TEM Beam Diameter | 10.769034887629 |
| ⊛ [1] | ... |
| CalibrationTime | 2021-11-09 15:24:06 at 300 kV, 8.9464151737642 E-06 Intensity, 6 Spot Size, 100 Aperture |
| ⊕ Microscope Settings | 2021-11-09 15:24:06.643 |
| ⊕ Imager Settings | ... |
| ⊕ Positioner Settings | ... |
| Beam Current | 567 |
| TEM Beam Diameter | 10.011488676586 |
| ⊛ [2] | ... |
| CalibrationTime | 2021-11-09 15:28:38 at 300 kV, 3.4122181541798 E-06 Intensity, 6 Spot Size, 100 Aperture |
| ⊕ Microscope Settings | 2021-11-09 15:28:38.489 |
| ⊕ Imager Settings | ... |
| ⊕ Positioner Settings | ... |
| Beam Current | 359 |

FIG. 128D

| | TEM Beam Diameter | 3.8237509390199 |
|---|---|---|
| ⊖ [3] | | 2021-11-09 15:32:31 at 300 kV, 8.00049336937278E-07 Intensity, 6 Spot Size, 100 Aperture |
| | CalibrationTime | 2021-11-09 15:32:31.682 |
| | ⊕ Microscope Settings | ... |
| | ⊕ Imager Settings | ... |
| | ⊕ Positioner Settings | |
| | Beam Current | 289 |
| | TEM Beam Diameter | 0.792945608810371 |
| ⊖ [4] | | 2021-11-09 15:48:42 at 300 kV, 4.059013941480865E-07 Intensity, 6 Spot Size, 100 Aperture |
| | CalibrationTime | 2021-11-09 15:48:42.350 |
| | ⊕ Microscope Settings | ... |
| | ⊕ Imager Settings | ... |
| | ⊕ Positioner Settings | |

FIG. 128E

AUTOMATED APPLICATION OF DRIFT CORRECTION TO SAMPLE STUDIED UNDER ELECTRON MICROSCOPE

CROSS-REFERENCE TO RELATED APPLICATIONS

This application is a continuation of U.S. patent application Ser. No. 17/585,222 filed on Jan. 26, 2022, entitled "AUTOMATED APPLICATION OF DRIFT CORRECTION TO SAMPLE STUDIED UNDER ELECTRON MICROSCOPE," which is a continuation-in-part of U.S. patent application Ser. No. 17/545,651 filed on Dec. 8, 2021, entitled "AUTOMATED APPLICATION OF DRIFT CORRECTION TO SAMPLE STUDIED UNDER ELECTRON MICROSCOPE," which is a continuation of U.S. patent application Ser. No. 17/210,702 filed on Mar. 24, 2021, entitled "AUTOMATED APPLICATION OF DRIFT CORRECTION TO SAMPLE STUDIED UNDER ELECTRON MICROSCOPE," now issued U.S. Pat. No. 11,399,138, issued on Jul. 26, 2022, which is a continuation of U.S. patent application Ser. No. 16/951,297 filed on Nov. 18, 2020, entitled "AUTOMATED APPLICATION OF DRIFT CORRECTION TO SAMPLE STUDIED UNDER ELECTRON MICROSCOPE," now issued U.S. Pat. No. 10,986,279, issued on Apr. 20, 2021, which is a continuation of International Patent Application No. PCT/US2020/045937 filed on Aug. 12, 2020, entitled "AUTOMATED APPLICATION OF DRIFT CORRECTION TO SAMPLE STUDIED UNDER ELECTRON MICROSCOPE", which claims priority to U.S. Provisional Patent Application No. 62/888,309 filed on Aug. 16, 2019, entitled "AUTOMATED DRIFT CORRECTION TO SAMPLE BEING STUDIED UNDER ELECTRON MICROSCOPE", the contents of all which is hereby incorporated by reference in their entireties.

TECHNICAL FIELD

The present disclosure relates to the field of electron microscopy, and particularly to a system for automated tracking of, and correcting for, drift occurring within a sample being studied under an electron microscope.

BACKGROUND

Camera and detector software suites presently available on electron microscopes typically correct for small movements by digitally shifting a limited field of view across the full field area available to the camera or detector. In most traditional studies done with an electron microscope, the sample is at room temperature with plenty of time to settle into thermal equilibrium. Measuring any number of microscope parameters, such as dose rate, energy loss or X-ray counts, for a given coordinate is straight forward on a system that is not moving. Accordingly, shifting the field of view to correct for movements occurring in a region of interest of the sample under observation can facilitate sharper images of a region of interest. Movements occurring in a region of interest of the sample under observation are typically small and can often be at a rate that is degrees of magnitude less than one nanometer per minute.

"In-situ" or "operando" studies involve applying or enabling dynamic changes to a sample, for example, by undertaking actions such as mechanically altering, electrically probing, heating, cooling, and imaging the sample in a gas or a fluidic environment. It may be advantageous for the microscopist to track a region of interest within the sample as it undergoes various changes over time. Measurements related to various parameters associated with the sample under study would need to be registered in order to comprehensively track the changes in various parameter that occur as the sample moves. This is because the tracked changes cannot be tied back to the original coordinates without carefully considering the history as to how and where a given feature has moved during the course of the experiment. Unfortunately, the magnitude of sample movement can be out of the range for common cameras and detectors to digitally shift the field of view in an adequate fashion.

Accordingly, opportunities exist for providing a novel approach for automating feature tracking and drift correction in an electron microscope when needed.

SUMMARY

This summary is provided to introduce in a simplified form concepts that are further described in the following detailed descriptions. This summary is not intended to identify key features or essential features of the claimed subject matter, nor is it to be construed as limiting the scope of the claimed subject matter.

Disclosed herein is a control system configured for sample tracking for sample tracking in an electron microscope environment. The control system comprises a memory, a processor, and a microscope control component. The control system is configured to register a movement associated with a region of interest located within an active area of a sample under observation with an electron microscope. The registered movement includes at least one directional constituent. The region of interest is positioned within a field of view of the electron microscope. The control system is further configured to direct an adjustment of the microscope control component to one or more of: dynamically center a view through the electron microscope of the region of interest, and dynamically focus the view through the electron microscope of the region of interest. The adjustment comprises a magnitude element and/or a direction element. According to one or more embodiments, the control system is further configured to apply an in-situ stimulus to the region of interest.

Further, disclosed herein is a control system configured to register movement associated with a region of interest located within an active area of a sample under observation with an electron microscope. The registered movement includes at least one directional constituent. The region of interest is positioned within a field of view of an electron microscope. The registered movement including at least one of an X translation, Y translation, Z translation, alpha-tilt and a beta-tilt. The control system is further configured to direct an adjustment of an electron microscope control component to one or more of dynamically center a view through the electron microscope of the region of interest, and dynamically focus the view through the electron microscope of the region of interest. The adjustment comprises one or more of a magnitude element, and a direction element.

Further, disclosed herein is a control system further configured to track electron dose and electron dose rate as a function of time and location on the sample throughout an experiment. A TEM holder with two measurement locations allows for direct measurement of electron beam current using both a Faraday cup and the TEM camera current or fluorescent screen current. This holder is used as part of an automated calibration workflow to measure electron beam current as a function of microscope parameters and calibrate this current against the camera current or screen current.

BRIEF DESCRIPTION OF THE DRAWINGS

The foregoing, as well as the following Detailed Description of preferred embodiments, is better understood when read in conjunction with the appended drawings. For the purposes of illustration, there is shown in the drawings exemplary embodiments; however, the presently disclosed subject matter is not limited to the specific methods and instrumentalities disclosed.

The embodiments illustrated, described, and discussed herein are illustrative of the present invention. As these embodiments of the present invention are described with reference to illustrations, various modifications, or adaptations of the methods and or specific structures described may become apparent to those skilled in the art. It will be appreciated that modifications and variations are covered by the above teachings and within the scope of the appended claims without departing from the spirit and intended scope thereof. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

FIG. 40 is a schematic graphical representation of a filtering technique that reduces background noise of an image, according to one or more embodiments of the presently disclosed subject matter.

FIG. 60 is a graphical representation of the third step in an automated experimental workflow, according to one or more embodiments of the presently disclosed subject matter.

FIG. 87 is a graphical representation of key settings that a user could manipulate to customize the active image buffer and session management, according to one or more embodiments of the presently disclosed subject matter.

FIG. 88 and FIG. 89 are graphical representations of how the control software module could be used to build a microscope profile, according to one or more embodiments of the presently disclosed subject matter.

FIG. 90 and FIG. 91 are graphical representations of how the control software module could manage calibrations specific to imaging conditions and imagers, according to one or more embodiments of the presently disclosed subject matter.

FIGS. 94A, 94B, 94C, and 94D are a graphical representation of a user interface comprised of indicators and triggers that enhance the correction experience, according to one or more embodiments of the presently disclosed subject matter.

FIGS. 95A, 95B, 95C, 95D, and 95E are a graphical representation of a user interface for a session review tool where users can view images and metadata, according to one or more embodiments of the presently disclosed subject matter.

FIGS. 102A and 102B are a graphical representation of a user interface of an in-situ heating software module, according to one or more embodiments of the presently disclosed subject matter.

FIGS. 104A, 104B, 104C, 104D, and 104E are a graphical representation of a user interface where metadata from the in-situ system, microscope, imaging system and any other connected systems can be viewed and overlaid onto the live display and session or image review tool, according to one or more embodiments of the presently disclosed subject matter.

FIGS. 108A and 108B and FIG. 109 are graphical representations of user interfaces used for an existing in-situ control software module, according to one or more embodiments of the presently disclosed subject matter.

FIG. 110 through FIG. 115 are graphical flow charts detailing a workflow where a control software module can help users effectively quantify, knowingly operate within and review the effects of cumulative dose or maximum instantaneous dose rate on an experiment, according to one or more embodiments of the presently disclosed subject matter.

FIG. 117A through FIG. 117D depict the exemplary process flow of FIG. 116 broken down into user-performed actions and actions that are performed automatically.

FIG. 118 depicts an exemplary embodiment of a TEM holder for measuring electron dose.

FIG. 126 depicts an exemplary graphical user interface showing a property grid with the matrix of data built based on the setting shown in FIG. 124.

FIG. 127 depicts an exemplary image shown as part of the measurement of beam area.

FIG. 128A through FIG. 128E depict an exemplary graphical user interface showing electron dose measurements taken as described herein.

DETAILED DESCRIPTION OF EMBODIMENTS

Figure 1A:
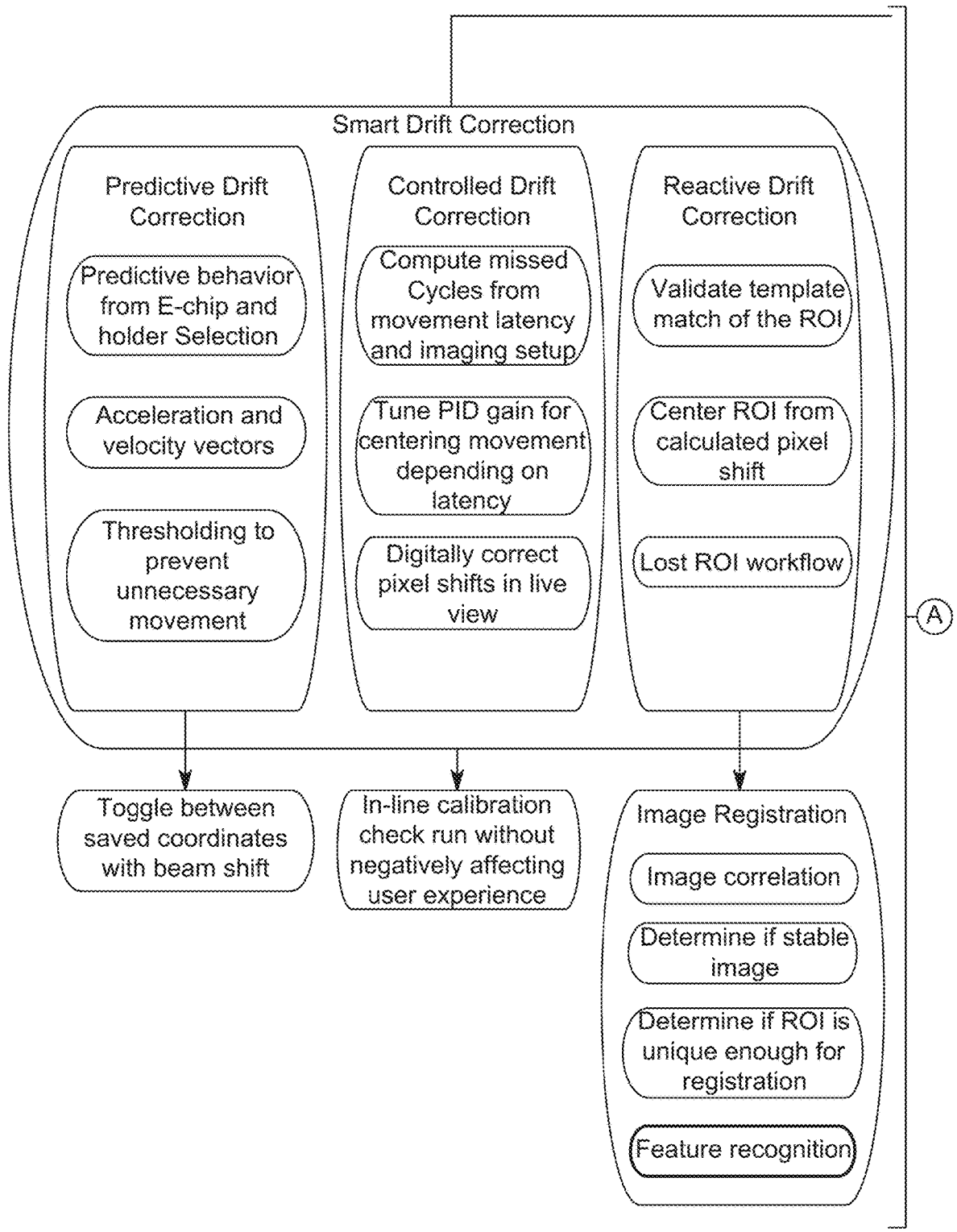
FIGS. 1A and 1B are schematic representation of a control system configured for sample tracking and drift correction in an electron microscope environment, according to one or more embodiments of the presently disclosed subject matter.

Below, the technical solutions in the examples of the present invention are depicted clearly and comprehensively with reference to the figures according to the examples of the present invention. Obviously, the examples depicted here are merely some examples, but not all examples of the present invention. In general, the components in the examples of the present invention depicted and shown in the figures herein can be arranged and designed according to different configurations. Thus, detailed description of the examples of the present invention provided in the figures below are not intended to limit the scope of the present invention as claimed, but merely represent selected examples of the present invention. On the basis of the examples of the present invention, other examples that could be obtained by a person skilled in the art without using inventive efforts will fall within the scope of protection of the present invention. The invention will now be described with reference to the Figures shown below.

Transmission electron microscopy (TEM) uses a beam of electrons transmitted through a specimen to form an image. Scanning transmission electron microscopy (STEM) combines the principles of transmission electron microscopy and scanning electron microscopy (SEM) and can be performed on either type of instrument. While in TEM parallel electron beams are focused perpendicular to the sample plane, in STEM the beam is focused at a large angle and is converged into a focal point. Like TEM, STEM requires very thin samples and looks primarily at beam electrons transmitted through the sample. One of the principal advantages of STEM over TEM is in enabling the use of other of signals that cannot be spatially correlated in TEM, including secondary electrons, scattered beam electrons, characteristic X-rays, and electron energy loss.

As a microscopist readily understands, "in-situ" or "operando" studies involve applying or enabling dynamic changes to the sample, for example, by undertaking actions such as mechanically altering, electrically probing, heating, cooling, and imaging the sample in gas or fluidic environment. Traditional in-situ systems, MEMS (microelectromechanical systems) sample supports, and modern electron microscope holders have helped reduce the movement associated with "in-situ" or "operando" studies by minimizing and localizing the stimulus to the sample area, but even these systems present too much movement to correct for using any automation that may be presently available in the marketplace.

Traditional in-situ systems include bulk heating or furnace heating holders that are capable of heating larger samples without a MEMS sample support. Bulk heating or furnace heating holders are better suited for studying some samples such as polished metals because the sample preparation process is unique and the size of sample requires too much energy that cannot be provided by MEMS sample supports in a cost-effective manner. The large amount of energy required to heat such bulk heating or furnace heating holders creates a lot of drift of the sample being studied. Physically correcting this drift can enable imaging at a higher magnification and a more stable, usable experience.

For example, during a thermal heating experiment, changing the temperature a few hundred degrees can move the sample a few hundred nanometers in the x, y plane and often introduce a change in height in the z-axis as materials expand and contract during the course of achieving thermal equilibrium. There are a lot of other sources of drift in the x, y and z axes stemming from the microscope positioner systems, holder positioner system, optics, gun, or environmental changes not related to in-situ.

Common techniques such as EDS (Energy Dispersive X-Ray Spectroscopy) and EELS (Electron Energy Loss Spectroscopy) require the sample to be still for enough time in order to acquire adequate data—often in the magnitude of several minutes. It is difficult for a person to run these techniques all at the same time if the person is also tracking the features by manually moving the holder or electron beam. Physical corrections enable workflows where fast acquisitions or scans can be used over longer periods of time building a "live" map of elemental analysis. Since the sample is physically corrected, the same sample can be imaged quickly generating smaller signals—but when summed into a running average, it can create detailed maps of the sample over a time frame, possibly even through in-situ environmental changes.

The sample holder is typically moved using a mechanical stage or a goniometer. A user would have to track the sample by manually and continuously moving the sample holder or electron beam to keep a region of interest centered since the illumination, cameras, and detectors are fixedly positioned. There are stage controls provided for finer movements of the stage (i.e., the flat platform) that supports the sample under observation. These stage controls include piezo variations, with the controlling of the stage usually accomplished by the operation of a joystick or trackball. However, coordinates and jogs are often commanded from software suites supplied with the microscope. It is not uncommon to require 2 people to carry out the experiments—one for controlling the stimulus to the sample and another for operating the microscope to account for sample movement. Under existing systems, measurements of a single feature must be manually tracked; also, such measurements are typically tied to x, y, and z coordinates rather than to specific features themselves.

During imaging of a sample using electron microscopy, the electron beam is typically directed on the sample during the entire process of imaging the sample including the steps of locating the sample, focusing on the sample, and recording the image. The electron beam can cause damage to the sample itself, and this damage is proportional to the total dose and the dose rate. The electron dose for a given area (e–/Å$^2$) is an important parameter and is calculated by multiplying the current density in the probe (Amperes/m$^2$) by the exposure time (s). The dose rate is a measured as the electron dose applied as a function of time. Beam damage can physically change a sample as chemical bonds get broken. The type and degree of damage from the electron beam depends on the characteristics of the beam and the sample. Numerous studies have investigated how electron beams damage samples. One example is by way of knock-on damage, wherein incident electrons transfer kinetic energy to the sample which can displace atoms or sputter them from the surface of the sample. Another example is by way of radiolysis or ionization due to inelastic scattering; this type of damage is common in insulating samples or liquids. A further example is by way of electrostatic charging of materials that is caused by the electron beam, which can lead to positive surface potentials due to ejected secondary or auger electrons. However, reducing dose arbitrarily to limit damage can degrade image resolution, especially for beam sensitive samples. Ideally, the goal is to operate the microscope at the highest dose possible without causing beam damage for a given sample; however, determining and staying under this "safe" dose/dose rate limit is challenging. While radiation damage cannot be eliminated, it can be measured and minimized Since the electron-beam-induced radiation damage is proportional to the electron dose and dose rate, measuring and controlling electron dose and dose rate is an ideal solution to control and limit damage to the specimen.

Calculation of the electron dose requires accurate measurement of the electron beam current impinging on the sample. In a TEM, the beam current at the sample is a function of emission current of the electron gun, the size of the condenser apertures, and the strength of the condenser lenses, which can be adjusted through the "spot size" and "intensity" settings of the TEM. Calculating the electron dose from the beam current also requires accurate measurement of the electron beam area, which is also impacted by the "spot size" and "intensity" settings.

There are several ways to measure beam current, with one common way being to use a Faraday cup holder. A typical TEM holder supports the sample at eucentric position while electrons, passing through the sample or scattered by the sample, are collected by the camera or other detectors. The Faraday cup holder collects all of the electrons striking it, and the beam current can then be measured using an ammeter. A typical Faraday cup holder includes a relatively thick layer of conductive, low-atomic-mass material to minimize electron backscatter and ensure a low-resistance path to the ammeter to provide for accurate measurement of the beam current. Alternatives to the Faraday cup holder include measurement of the "screen current" (i.e., the current collected by the fluorescent screen in the TEM and measured using an ammeter) and current calculated from the electrons counted on the TEM camera, though the Faraday cup is widely considered to be the most accurate means of measuring beam current.

The beam area can be calculated from the image of the electron beam on the fluorescent screen or the TEM camera, ensuring that the beam does not extend beyond the area of the screen/camera so that all of the current is collected. From measurements of the electron beam current (Amperes, or electrons/sec) and the beam area ($Å^2$), the electron dose rate can be calculated as the electron beam current divided by the beam area (or electrons/$Å^2$ sec). The electron dose rate multiplied by time yields the electron dose (electrons/$Å^2$).

To better understand the impact of electron dose on a given specimen, it would be beneficial to measure, display, and record the cumulative dose imparted as a function of position on a specimen over the course of an imaging session. It would also be helpful to be able to set limits on electron dose and dose rate as a function of area to control beam damage to the sample during imaging. Further, with the continuous analysis and control of the microscope, camera, detector and in-situ stimulus, it would be beneficial to provide event triggers that can automate experiments wherein conditions of a sample are adjusted automatically by a control system.

Embodiments of the presently disclosed subject matter can advantageously operate to correct drift occurring during in-situ studies. Drift occurring during in-situ studies is only one example of drift that can be corrected by embodiments of the presently disclosed subject matter. For example, embodiments disclosed herein can also advantageously operate to counteract drift that can occur from mechanical settling from a sample holder, mechanical settling from a microscope positioner system, thermal drift from environments not related to in-situ, thermal drift imparted by the optics or gun, and similar other components, and electrical drift imparted by the optics or gun, and similar other components. embodiments disclosed herein can also advantageously operate to counteract drift such as a thermal drift or an electrical drift from optics adjustments. For example, factors such as changing acceleration voltage of the gun, power changes in correctors, or power changes in the rest of the optics can cause drift.

Embodiments disclosed herein can advantageously correct all kinds of drift encountered during observation made with an electron microscope thereby enabling higher magnifications and more stable imaging regardless of the source of drift. Indeed, at a high enough magnification level, any drift from any source can require physical corrections as well associated corrections to all the dependent technologies that are enabled. At a high enough magnification level, digital registration will be limited even on more standard types of drift after settling time. For example, in addition to in-situ environmental changes and stimulus, drift can also be caused by mechanical settling from the holder or microscope positioner systems, thermal drift from environments not related to in-situ, thermal or electrical drift imparted by the optics or gun, and similar other sources. Embodiments disclosed herein can advantageously operate to counteract drift from any source.

Microscopy is challenging and in-situ microscopy adds additional complexity making the barrier to entry large and the chance of success small. Workflows associated with microscopy study require expertise and multiple resources working simultaneously. Often a team of two or three people are required to run an experiment: a TEM expert optimizing the imaging conditions and managing the re-centering and focusing through the experiment, an in-situ equipment expert controlling the stimulus, and an observer watching the sample and resulting data. Additionally, it is difficult to organize this data aligning the massive number of images and data generated in a session. Embodiments disclosed herein can advantageously operate to reduce the learning curve associated with in-situ microscopy by decreasing the level of expertise required to run an experiment, expanding the potential community of in-situ researchers and applications.

At least one embodiment of the presently disclosed subject matter includes an electron microscope control system (alternately referred to hereinafter as "control system" or "system"). The control system as disclosed herein can allow users to see every moment, putting the emphasis back on the sample and not the associated equipment. The control system can enable imaging at higher resolutions through an entire experiment and provide an undistracted viewing and capture of formerly unobservable moments. The control system can make the process of data analysis faster, easier, and more accurate. It can continuously synchronize data with relevant experiment conditions and let users prioritize the most important parameters and controls the system to optimize the others.

In various embodiments, the control system can include software modules that interact with the many systems in a TEM lab. The control system can be embodied as a server that is networked to other systems including the TEM column, cameras, detectors, and in-situ systems. In one embodiment, the control system comprises software that can be run on hardware such as a server operating at a client site. The control system can provide a robust software solution where modules address workflows linking the lab digitally. The control system can synchronize the physical sample with the column/detectors for stable images; it can further synchronize all system data in the experiment for fast, accurate publishing; it can also synchronize the parameter control to enable experiment priority settings. The control system can allow for the sample to be stable with understood movement vectors and all systems networked to this TEM hub. The control system can allow for automation and system synchronization that works with the user during a TEM session. This way, the operator is still in control, but can focus the operator's effort on the sample rather than managing all the associated equipment. The control system can address four key issues with today's electron microscopy and in-situ EM workflows: (1) reduce the steep learning curve for electron microscopy, especially in-situ EM; (2) reveal "the missing moments"; (3) consolidate the experiment data that currently is distributed across different systems; and (4) serve as a base platform to enable the development of advanced modules.

The control system can provide for tracking background drift helps in the event of a changing sample, so the software prioritizes the user specified region of interest against many different background templates segmented from the total field of view. The software forming part of various embodiments of the presently disclosed subject matter can use reference templates and drift vectors or background drift to determine when a sample is changing, such change including aspects such as phase transformations and coalescing. A changing sample typically requires a new reference template and can be quantified to flag other events.

In addition to correcting for drift, and recording the amount of movement in the x, y and z axes over time, embodiments of the presently disclosed subject matter can also provide for recording a three-dimensional map of where the sample has traveled. Embodiments of the presently disclosed subject matter can further provide for displaying an interactive three-dimensional map on a GUI (graphical user display). In a liquid cell, for example, where sample movement can be the result of a phenomenon under investigation, the control system can provide for the drift correction vectors to be visualized in a software tool that shows the three-dimensional path the sample took throughout the experiment. The control system can further provide for such a 3D map could be visualized and rotated through software in an interactive set-up for better understanding of the movement.

According to one implementation, recording a three-dimensional map of where the sample has traveled involves the use of a "coordinated position". Typically, the stage has its own coordinate system on the microscope. In some implementations, the Piezo may be in its own coordinate system independent of the stage. The beam deflection is almost always in its own coordinate system, often not represented in SI units; for example, the beam deflection may be measured as a percentage or in DAC (digital to analog converter) units. Also, systems can digitally register the sample for the finest adjustments which needs to be calculated into that coordinated position. However, there is nothing in the prior art that can link all the available positioners coordinate systems into a "coordinated position" that combines the stage position, piezo position, beam position, and digital registration to give an absolute position and vector for the sample of interest. Implementations disclosed herein overcome such limitations of the prior art.

The control system can capture the registered movement as a drift rate or a drift vector. The control system can subsequently generate a visual representation of the drift rate or the drift vector to generate a single coordinated position by combining a digital registration applied to an image of the region of interest with at least one of an x-axis, y-axis, and z-axis coordinate planes. The visual representation of the drift rate can be in the form a compass display, a bar display, a numerical value display, and/or a graph display. The control system can also register the movement as a drift rate and further generate a normalization of the drift rate.

The control system can manipulate a template of an image of the region of interest over a predetermined period of time to generate a current morphology or intensity profile. The control system can accordingly utilize filtering techniques and frame averaging to morph the template more like the active region of interest to preserve history but react to more dynamic samples. The control system is further configured to provide a visual representation of a drift rate or vector associated with the registered movement. Typically, the stage coordinates are separately tracked from piezo, separately tracked from beam position. By contrast, by combining all these coordinate planes with the digital registration applied to the image, the control system can allow for a single "coordinated position" to be tracked in x, y and z coordinates or axes. In at least one embodiment, the "coordinated position" may be separated from the indicator noting the drift rate or drift vector. The "coordinated position" can be subsequently used by the control system for other purposes such as creating a particle tracking plot, creating a 3d plot of where a feature went over time, and similar other plots.

Whereas during drift correction, it may be difficult to determine when the sample has stopped moving enough for a high-resolution acquisition with longer dwell time or exposure time, the control system as described herein can conveniently overcome such shortcomings of the art. To overcome such shortcomings, the control system can provide a visual representation of drift rate; the control system can further normalize this drift rate and display the same as an easy to read tool. Furthermore, the control system can provide for taking into a user's selection of exposure time, magnification and other factors and determining a drift rate that is acceptable under such selections to achieve a high-resolution image. In one embodiment, the drift rate is calculated from the vectors created from the "coordinated position". The control system can further guide the user to either wait or adjust the imaging conditions required for the image quality desired.

The control system can be further configured to automatically choose one or more of: a dwell rate and an exposure time to ensure a stable image resulting from an in-situ stimulus being applied. For example, in cases where the user needs fast ramp rates and high resolution at a specific magnification, the control system can provide for fast ramp rates and use the slowest ramp rate that will enable successful tracking. The control system can further average frames on the digitally registered sample to achieve the resolution. Regarding the coordinated position coordinates, typically, the stage coordinates are separately tracked from piezo, separately tracked from beam position. By combining all these coordinate planes with the digital registration applied to the image, a single "coordinated position" can be tracked in x, y, and z axes.

The control system can provide for the capture of the performance of an in-situ holder and a MEMS sample support during the experiment. This performance information can be obtained from both calibrated or "hard-coded" behavior, and further by constantly measuring actual performance because MEMS sample supports differ from chip to chip slightly. This captured information can be used to further improve in-situ stimulus being applied to the region of interest, for example, in the form of drift vectors. The performance of each e-chip and holder combination can be generally predicted by the control system as described herein. It should be noted that the magnitude and exact direction can vary quite a bit between e-chips and holders and may not be completely captured in a single-time calibration. A certain amount of on-the-fly learning of the performance of the experimental e-chip and holder could improve on the drift vectors, and the control system as described herein can advantageously help improve the drift vectors.

In various embodiments, the control system disclosed herein is configured for sample tracking in an electron microscope. The control system can comprise software instructions stored in a memory. The software can be stored in a non-transitory computer-readable medium capable of storing instructions. The instructions when executed by one or more processors, can cause the one or more processors to perform one or more of the tasks described herein. In one embodiment, the control system can comprise a one or more instructions stored in a non-transitory computer-readable medium. The one or more instructions that, when executed by one or more processors, may cause the one or more processors to register a movement associated with a region of interest located within an active area of a sample under observation with an electron microscope, and direct an adjustment of the microscope control component to dynamically center and/or dynamically focus the view through the electron microscope of the region of interest, wherein the adjustment comprises a magnitude element, and/or a direction element.

In one embodiment, the instructions can be accessed and executed by a general-purpose processor (GPU). In one embodiment, the software instructions can be accessed and executed by a central processing unit (CPU) of a computing device. In one embodiment, the software instructions associated with the control system can execute on a server in communication with the internet. In one embodiment, a storage component may store information and/or software related to the operation and use of control system. For example, the storage component may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

According to at least one embodiment, the control system includes a server or a computing device that performs one or more processes described herein. The server or the computing device may perform these processes in response to a processor executing software instructions stored by a non-transitory computer-readable medium, such as a memory and/or storage component. A computer-readable medium is defined herein as a non-transitory memory device. A memory device includes memory space within a single physical storage device or memory space spread across multiple physical storage devices. Software instructions may be read into the memory and/or storage component from another computer-readable medium or from another device via communication interface. When executed, software instructions stored in the memory and/or the storage component may cause the processor to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

According to at least one embodiment, the control system comprises a memory and a processor. The control system is configured to register movement associated with a region of interest located within an active area of a sample under observation, the region of interest positioned within a field of view of an electron microscope. The registered movement includes at least one of an x-axis, a y-axis, and a z-axis component. The control system is further configured to adjust an electron microscope control component to dynamically center and/or dynamically focus a view through the electron microscope of the region of interest. The control system determines a magnitude of the adjustment and/or a direction of the adjustment based on the registered movement.

Embodiments described herein can provide for keeping a region of interest stable and in the field of view regardless of stimulus to the sample. Additionally, embodiments of the presently disclosed subject matter can provide for a novel technique for quickly and easily quantifying beam effects and other microscope parameters on a given sample under study to establish safe limits on such beam effects and other microscope parameters prior to further imaging of the sample under study. Embodiments can advantageously provide for event triggering as well for measuring, displaying, and limiting microscope parameters applied to a sample. Embodiments disclosed herein can further provide an automatic beam unwinding process. Embodiments disclosed herein can also provide for a combination of measuring dose and beam blanking specific locations when a threshold is reached. Embodiments disclosed herein can further provide for combining autofocus/auto centering with tomography. Embodiments can provide for automated feature tracking, event triggering as well as measuring, displaying, and limiting microscope parameters of a sample in an electron microscope undergoing in-situ environmental changes. Further, embodiments of the presently disclosed subject matter can correct for thermal drift and other physical movements common to in-situ studies in an electron microscope through software. Embodiments of the presently disclosed subject matter can use image analysis, in-situ measurements, or microscope behavior to trigger changes to the microscope or in-situ environment through software. Embodiments of the presently disclosed subject matter can track dose, dose rate, and in-situ stimulus applied to a feature and the use of a single or multiple regions of interest to compare the relative impact of beam damage or in-situ stimulus for a stable or moving system.

The control system can include software that combines analysis of user specified regions of interest, background drift and predictive behavior to track features in the electron microscope often at the atomic scale, then commands positioners in the electron microscope to center and focus the region of interest. According to one or more embodiments, the control system registers movement at a nanoscale or an atomic scale. It can also be at the micron scale at lower magnifications.

According to at least one embodiment, a control system configured for sample tracking in an electron microscope environment includes at least a memory, a processor, and a microscope control component. The control system is configured to register a movement associated with a region of interest located within an active area of a sample under observation with an electron microscope. The registered movement includes at least one or more directional constituents including an x-axis constituent, a y-axis constituent, and a z-axis constituent. The region of interest is positioned within a field of view of the electron microscope. In response to the registered movement, the control system is configured to direct an adjustment of the electron microscope control component to dynamically center a view through the electron microscope of the region of interest, and/or dynamically focus the view through the electron microscope of the region of interest. The adjustment can include a magnitude element and/or a direction element. In some embodiments, the adjustment of the microscope control component comprises one or more of: an electron beam deflection, and a focal plane adjustment.

In some embodiments, the registered movement includes at least one of an alpha-tilt and a beta-tilt. The control system can counteract the registered movement in the form of a alpha-tilt and/or a beta-tilt by directing an adjustment of an electron microscope control component to dynamically center a view through the electron microscope of the region of interest, and/or dynamically focus the view through the electron microscope of the region of interest. The adjustment comprises a magnitude element, and/or a direction element.

The control system is configured to adjust the electron microscope control component to counteract the registered movement relating to physical drift, thermal drift, and/or electrical drift imparted by the electron microscope. The control system is also configured to adjust the electron microscope control component to counteract the registered movement relating to an alpha tilt of a beam of the electron microscope and a beta tilt of a beam of the electron microscope. The control system is also configured to adjust one or more electron microscope control components to counteract the registered movement relating to a drift occurring from a sample holder settling into a new location after a stage movement. The control system can further adjust the electron microscope control component to counteract the registered movement relating to a thermal settling not related to an in-situ stimulus. The control system is also configured to adjust the electron microscope control component(s) to counteract the registered movement caused by one or more of: mechanically deforming, altering an acceleration voltage applied to, electrically probing, heating, cooling, and imaging of, the sample in a gas or fluidic environment. The control system can further adjust the electron microscope control component to counteract the registered movement caused by in one or more of: pressure, flowrate, and a constituent, in an environment contiguous to the sample.

The control system is also configured to adjust the electron microscope control component to counteract the registered movement caused by drift from the physical positioning systems of the microscope or sample support. The control system is also configured to adjust the electron microscope control component to counteract the registered movement caused by the holder physically settling into a new position after moving the mechanical stage. The control system is also configured to adjust the electron microscope control component to counteract the registered movement caused by the drift from thermal equalization of the sample support stemming from difference in temperature between the external room and the sample location inside the column. The control system is also configured to adjust the electron microscope control component to counteract the registered movement caused by thermal or electrical drift from optics adjustments. The control system is also configured to adjust the electron microscope control component to counteract the registered movement caused by one or more of: a change in acceleration voltage of the gun, a power change in a corrector, a power change in another component of the optics. The control system is also configured to adjust the electron microscope control component to counteract the registered movement caused by drift in the x-axis and y-axis created during small tilt or tomography sequences. The control system is also configured to adjust the electron microscope control component to counteract the registered movement caused by a background drift within the active area.

The control system is accordingly configured to adjust the electron microscope control component to counteract the registered movement relating to one or more of: in-situ stimulus applied to the sample, change in an environmental condition in an area contiguous to the sample, physical drift imparted by the microscope, physical drift imparted by a sample support positioning system of the microscope, thermal equalization occurring on the sample support, thermal drift of an electron microscope optics, thermal drift of an electron microscope gun, electrical drift of the electron microscope optics, and electrical drift of the electron microscope gun. The control system is further configured to apply an in-situ stimulus to the region of interest, wherein the adjustment comprises a drift correction along an x-axis and a y-axis.

In at least one embodiment, the control system is further configured to apply an in-situ correction (or in-situ stimulus) to the region of interest, wherein the adjustment/correction/stimulus comprises a drift correction along the x-axis, y-axis and/or z-axis. In at least one embodiment, the microscope control component is in electronic communication with various components of an electron microscope such, for example, a mechanical stage, a goniometer, a piezo component of the stage, an illumination of an electron beam, a projection of the electron beam, electromagnetic deflection of the electron beam, and a movement of the electron beam. In at least one embodiment, the control system is also configured to register the movement at a micron scale, a nanometer scale, or an atomic scale. In at least one embodiment, the control system is also configured to simultaneously register movement associated with a plurality of regions of interest located in the sample under observation. In at least one embodiment, the control system is also configured to register the movement by referencing a template image of the region of interest against a remainder of the active area of the sample. In at least one embodiment, the control system is also configured to manipulate a template image of the region of interest over a predetermined period of time to generate a current morphology profile or a current intensity profile. It is to be noted that the template that the correction algorithm references for corrections is not a static snapshot of the sample from a while ago; instead, the template is constantly morphed through image filters so that morphology and intensity profile is more similar to features of the sample that makes up the region of interest. In at least one embodiment, the control system is also configured to capture the registered movement as a drift vector associated with one or more of: a structure of interest, a region of interest, and a background region, of the sample under observation.

In at least one embodiment, the control system is also configured to alert a user when the registered movement is below a predetermined rate. Alerting the user when a registered movement is low can be beneficial to make the user aware of when a high-resolution image is ready to be captured.

In one embodiment, the control system is also configured to improve accuracy of the drift vector by applying performance data related to a sample holder and/or a MEMS sample support to the drift vector. The control system can also analyze the drift vector to predict or select a further region of interest for observation. The control system can further apply an in-situ stimulus to the region of interest. The in-situ stimulus can be in the form a drift vector generated by the control system based on the movement registered at the region of interest. The control system applies the generated drift vector to a further area of interest within the sample. The control system can also compare the drift vector with a reference template image of the region of interest to identify a change that has occurred to the sample under observation.

In one embodiment, the control system is further configured to automatically identify a new region of interest in response to at least one of the following: a field of view (FOV) change, a sample change, a microscope status update, an un-blanking of an electron beam, an opening of a column valve, a screen raising, and an imaging condition change. The control system is further configured to digitally delineate the region of interest from a live image stream of the field of view displayed on a graphical user interface by one or more of: marking a contour on a live image stream of the field of view displayed on a graphical user interface; marking a shape on a live image stream of the field of view displayed on a graphical user interface; superimposing a pre-existing shape on a live image stream of the field of view displayed on a graphical user interface; capturing a double-click event performed on an area within a live image stream of the field of view of the electron microscope displayed on a graphical user interface; and capturing a click and drag event on an area within a live image stream of the field of view of the electron microscope displayed on a graphical user interface. In one implementation, the control system is further configured to apply a centering motion to the region of interest when the control system determines that the region of interest has moved away from a center of the field of view or from a reference point within the field of view. The control system can further determine an in-situ stimulus to be applied in real time based on one or more of: a drift velocity detected in the registered movement, and a detected imaging condition of the region of interest, a performance parameter of a sample support; and a performance parameter of a sample holder. The control system is further configured to determine an in-situ stimulus to be applied in real time based on one or more of a drift velocity, a drift speed, and a drift resolution detected in the registered movement. The detected imaging condition of the region of interest comprises one or more of: a magnification level, and an image acquisition time. The control system is further configured to counteract the registered movement by one or more of: applying a physical adjustment, applying a digital adjustment, filtering an image displayed in a live image stream of the field of view displayed on a graphical user interface, and filtering an image displayed in a drift corrected image sequence.

In various embodiments, the control system is further configured to direct generation of a seamless video of the region of interest. The control system can also digitally correct an image of the region of interest. In one implementation, while the image of the region of interest is corrected by the control system, an image of the remaining area of field of view is not digitally corrected. In one embodiment, the control system is further configured to enable a user to specify a predetermined quantity of digital correction to be applied to the at least one image of the region of interest before application of a physical correction to the at least one image of the region of interest is triggered. In one implementation, an image of a total area of the field of view is not corrected. The digital correcting can include any of the following techniques: digitally shifting the image, digitally cropping the image, digitally blurring the image, digitally sharpening the image, digitally adding to edges of the image, digitally adding background pixels to the image, and digitally adding foreground pixels to the image. The control system can also save a digital corrected copy of the image, and a regular uncorrected copy of the image. In some embodiments, the control system further comprises a review utility, wherein the review utility is configured for reviewing a captured image or a captured video indexed with one or more of: a microscope metadata, an in-situ metadata, and an imaging condition. This can advantageously provide for the ability to scrub through images after an experiment. The review utility can be configured to generate a mathematical algorithm for application to one or more of: the image, the microscope metadata, the in-situ metadata, and the imaging condition. The mathematical algorithm can be applied to a drift corrected sequence of images, wherein the control system is further configured to evaluate a change in the adjustment applied over a predetermined time interval. The mathematical algorithm can comprise at least one of: a transform analysis, an intensity plot, a pixel intensity statistic, a crystallinity score, a focal score, a variance score, a contrast score, a particle size analysis, and a distance between points analysis. Accordingly, a drift corrected sequence can allow a user to see how a particle or sample changed over time; the user can quantify this by dragging math across frames of a drift corrected sequence. The control system is further configured to export a predetermined sequence of images reviewed by the control system to a permanent disk space in a predetermined image format. The control system is further configured to apply the mathematical algorithm to an image or a metadata to isolate a predetermined sequence of images or to export a predetermined sequence of images. For example, the control system may isolate only the images in good focus or isolate when the correlation against the template changed by a predetermined amount, or isolate only the images when the temperature was changing between two predetermined outer limit values.

The control system can also generate a video based on one or more of: consecutive digitally corrected images, and consecutive digitally uncorrected images. In at least embodiment, the video can comprise a digitally corrected ultra-stable movie of the region of interest. In various embodiments, the control system generates a video based on consecutive images by applying various techniques such as, for example, a transform analysis such as FFT and CTF, an intensity plot, a pixel intensity statistic, a focal algorithm analysis, a brightness adjustment, a contrast adjustment, a gamma adjustment, a metadata overlay layer, and a shape overlay layer. In one embodiment, the video curated by the control system comprises a digitally uncorrected movie of the region of interest. In one embodiment, the video curated by the control system comprises a digitally corrected stable movie of the region of interest.

In various embodiments, the control system is further configured to develop a focus score of a focus level of the region of interest by analyzing a Fast Fourier Transform (FFT) value associated with an image of the region of interest. The control system can also develop a focus score of a focus level of a further region of interest located within the active area by analyzing a variance of pixel intensities in an image of the region of interest. The control system can also develop a focus score that quantifies contrast, normalized variance, gradient and similar other parameters. The control system is further capture an out of focus image of the region of interest to calculate an optimal z-axis distance of the sample from a lens of the electron microscope, wherein the z-axis is perpendicular to a plane corresponding to the region of interest. The x-axis as mentioned herein can be parallel to a bottom or lower edge of the plane corresponding to the region of interest, whereas the y-axis as mentioned herein can be parallel to a side edge of a plane corresponding to the region of interest. For example, assuming the plane corresponding to the region of interest to represent a rectangle shape, the x-axis may be parallel to the top and bottom edges of the rectangle while the y-axis may be parallel to the left side edge and right side edge of the rectangle. The control system can further continuously monitor a focus level of the region of interest. The control system can generate a normalized focus score based on the focus level.

The control system can further generate a normalized focus score based on a focal quality analysis and physically aligned images. The control system can further generate a normalized focus score based on a focal quality analysis and digitally aligned images. The control system is configured to change a focus level of the region of interest by applying a drift correction along a z-axis, wherein the z-axis is perpendicular to a plane corresponding to the region of interest. The control system can display a focus score on a graphical user display, wherein the focus score is juxtaposed with a display of a predefined focus score. The control system can manipulate a focus level to an over-focus condition or an under-focus condition. The control system can further use a focus control algorithm to continuously adjust an objective lens of the electron microscope to generate a normalized focus score.

The change to the sample under observation can represent any kind of change in the status quo include aspects such as a phase change, a precipitate formation, a morphology change, a reaction with a surrounding environment, a reaction with a nearby element, and a coalescing occurring within the sample under observation. The control system can register the movement as a registration algorithm and/or an alignment algorithm. The control system is further configured to calibrate the registration algorithm and/or the alignment algorithm.

In some embodiments, the control system is further configured to register the movement as a pixel shift and translate the pixel shift into a correction distance for a positioner of the electron microscope. The control system can also operate to translate a plurality of the pixel shifts into a drift velocity vector and/or a drift acceleration vector. Accordingly, the control system is further configured to a apply a correction distance to the positioner only when the resolution of the positioner can support a magnitude of the correction distance. The control system is also configured to apply a correction distance to the positioner such as to maximize a frame rate of a resulting drift corrected sequence. A plurality of pixel shifts is preferred so that physical movements are scheduled only when the resolution of the desired positioner can support the magnitude of the required move. A plurality of pixel shifts is also preferred so that physical movements are schedule only in opportune moments since the resulting positioner move could temporarily blur the view when moved mid-capture. Further, a plurality of pixel shifts is preferred so that the frame rate of the resulting drift corrected sequence is as high as possible. Users often decide to skip frames during physical movements to remove the residual effect of the move from calculations and the drift corrected sequence. Users generally do not need to skip frames when the drift correction is only a pixel shift. In response to a movement registered by the control system, the control system can trigger various actions such as, for example, pausing an in-situ stimulus, holding constant the in-situ stimulus, and changing a ramp rate of the in-situ stimulus, among others.

The control system can include algorithms to perform tasks such as reducing a size of a move as the normalized focus score approaches closer to a best registered focus score. The control system can further include algorithms to perform tasks such as increasing the size of the move as the normalized focus score deviates away from the best registered focus score. The algorithms of the control system are also able to or configured to tune re-focus points of the lens of the electron microscope, wherein the re-focus points define a focus envelope by manipulating an indicator handle. The control system also includes a z-axis focus control that can include aspects such as a beam control, a piezo control, and a stage control. The control system is further configured to perform a calibration of a camera parameter, a detector. Calibrations operate to improve performance of the drift correction and to insure accurate moves regardless of the application. For example, the control system can be configured to perform a calibration of one or more of: a camera parameter, a detector parameter, a positioner parameter, and an in-situ control parameter. The calibration can comprise a rotational offset, and a magnification focus envelope, among others. It is to be noted that a microscope profile is mostly rotational offset, focus step sizes, positioner capabilities and network setup. The control system can store a calibration value associated with the calibration in a calibration database, and compare a measured value against the calibrated value on a periodic basis; the control system can also monitor performance of the control system against one or more calibration values. The control system can also run the calibration during each movement registering session.

In at least one embodiment, the calibration value corresponds to a positioner. The calibration value is generated for at least one of: a backlash, a movement limit, a movement timing, a resolution, a total range, a preferred range, a hysteresis, a minimum move time period, a unit conversion, a neutral position, and a minimum move time period associated with the positioner. In one embodiment, the calibration value corresponds to a holder, wherein the calibration value is associated with one or more of: an imaging origin adjustment, a x-axis adjustment, a y-axis adjustment, and a z-axis adjustment, wherein the z-axis is perpendicular to a plane corresponding to the region of interest. In one embodiment, the calibration value is associated with a change in one or more of: a pressure, a flowrate, and a mechanical deformation, associated with the sample. In one embodiment, the calibration value is associated with an expected movement model corresponding to a heating holder or cooling holder. In one embodiment, the calibration value is associated with an expected movement model corresponding to one or more of: a drift velocity relating to a change in unit temperature, a cooling ramp-rate, and a heating ramp-rate.

In some embodiments, the control system is configured to apply the calibration value to an in-situ control input that comprises one or more of: a current value, a temperature set point, and a fluid flow rate. In some embodiments, the control system is also configured to calculate a maximum thermal ramp-rate achievable during a concurrent application of an in-situ stimulus and a drift correction adjustment. The adjustment can also be in the form of a drift correction applied along a z-axis to compensate for an anticipated movement of a membrane associated with the sample under observation, wherein the z-axis is perpendicular to a plane corresponding to the region of interest, wherein a x-axis and a y-axis are parallel to the plane of the region of interest. The adjustment can include a drift correction, wherein the control system is further configured to pause applying the drift correction when at least one of an x-axis parameter and a y-axis parameter of a positioner falls outside of a predetermined range. The adjustment can comprise a drift correction applied along a z-axis to compensate for an anticipated movement of a membrane associated with the sample under observation, wherein the z-axis is perpendicular to a plane corresponding to the region of interest, wherein a x-axis and a y-axis are parallel to the plane of the region of interest.

In various embodiments, the control system can calculate the maximum thermal ramp-rate achievable using one or more of: a ratio of an area of a field of view relative to an area of the region of interest, a positioner timing, an image update rate, and an expected drift rate. The control system can also alter a thermal ramp-rate affecting the region of interest in response to a change in a refresh rate of an image of the region of interest. The control system can further decrease or pause a thermal ramp-rate affecting the region of interest in response to a user attempting to manually bring a second region of interest into focus.

The control system is further configured to display, on a graphical user display device, an electron microscope control and a drift correction parameter applied to the region of interest in a same single user interface. The control system is also configured to display, on a graphical user display device, an impact of one or more of: a magnification value, an active detector size, a pixel resolution, a binning, a dwell rate, and an exposure time, for evaluating an effectiveness of an in-situ stimulus applied to the region of interest. The control system is additionally configured to assist a user in prioritizing one or more of: a camera option, a detector option, an electron microscope set-up feature, and an in-situ stimulus, for generating a stable image resulting from an in-situ stimulus applied to the region of interest. The control system can automatically choose a dwell rate and an exposure time to ensure a stable image resulting from an in-situ stimulus applied to the region of interest. The control system can further automatically adjust an in-situ stimulus applied to the region of interest in response to a user adjusting one or more of: a pixel resolution, a magnification value, and a thermal ramp-rate associated with the electron microscope. The control system can also predict a movement associated with a further region of interest based on the movement registered at the region of interest.

In at least one embodiment, the control system is configured to set a trigger function to an in-situ stimulus applied to the region of interest, wherein the trigger function is activated when a change is observed to at least one of: a sample feature, an electron microscope condition, an in-situ stimulus source, and an in-situ stimulus reading. In one embodiment, the adjustment of the microscope control component comprises a trigger function that is activated when a change is observed to a sample feature, an electron microscope condition, an in-situ stimulus source, or an in-situ stimulus reading. In at least on embodiment, the trigger function adjusts a parameter affecting at least one of: the electron microscope, a camera associated with the electron microscope, and a detector associated with the electron microscope. In some embodiments, the control system can turn a detector associated with the electron microscope on or off when a sample temperature falls outside of a predetermined range.

In some embodiments, the control system further comprises a user interface configured for developing the trigger function. In some embodiments, the control system is further configured to allow a user to set an electron dose rate limit for the sample under observation. In some embodiments, the control system is also configured to calculate an electron dose rate for the electron microscope as a function of a position of an electron microscope lens and time. In some embodiments, the control system also monitors to ensure that the electron dose rate does not exceed a predetermined electron dose rate limit. The control system can further set limits on a cumulative electron dose, in addition to limits on an electron dose rate.

In at least one embodiment, the control system is configured to display, on a graphical user display device, an image of an electron dose rate in a heatmap form; the control system is further configured to display, on a graphical user display device, an image of a cumulative electron dose in a heatmap form; the control system is configured to automatically adjust the displayed image to counteract a change in one or more of a sample position and a magnification level. The control system can also generate an automated report based on the registered movement and the applied in-situ stimulus. The control system can allow a user to set a safety limit to prevent irreversible damage to the sample. The control system can further measure an impact of an electron beam on one or more of: a sample shape, a sample composition, a sample density, and an electrical characteristic of the sample. The control system can additionally record the registered movement over a period time to generate a three-dimensional map of a history of movements occurring in the region of interest. The control system can also provide a visual display of the history of movements in a three-dimensional path on a graphical user display device. In some embodiments, the visual display of the history of movements is rotatable in an interactive manner in response to a user prompt. In some embodiments, the control system can calculate a maximum permissible movement based on one or more of an acquisition rate (e.g., exposure time in TEM mode and dwell time in STEM mode), and a magnification level, as selected by a user. The control system can further guide the user to adjust an imaging condition to prevent reaching the maximum permissible movement. The control system is also configured to set a trigger function associated with auxiliary devices such as a mass spectrometry device coupled to the electron microscope, a gas chromatography device coupled to the electron microscope, and a liquid chromatography device coupled to the electron microscope.

In at least one embodiment, the control system can adjust an environmental condition associated with the sample in response to the trigger function being activated by the control system. The control system can further adjust an environmental condition associated with the sample when a measured concentration of a substance contained in circulating water exiting an in-situ holder coupled to the electron microscope falls outside of a predetermined range. The control system can further display, on a graphical user display device, a listing of images of portions of the sample previously observed by a user along with a dose or a dose rate associated with each listed image. The control system is further configured to display, on a graphical user display device, a listing of images of portions of the sample exposed to a predefined level of electron radiation from an electron beam of the electron microscope.

In various embodiments, the control system is further configured to continuously monitor aspects such as a field of view of the electron microscope; x-axis, y-axis or z-axis parameters of at least one positioner associated with the electron microscope; a z-axis parameter of at least one positioner associated with the electron microscope; an alpha tilt of a holder; a beta tilt of the holder; an image refresh rate; a beam blanker state; a column valves state; a screen angle; a microscope metadata; and, an imaging system metadata.

In some embodiments, the applied in-situ stimulus comprises moving a positioner, wherein the control system is further configured to choose the positioner from one or more of: a stage positioner, a piezo positioner, and a beam positioner. The control system is configured to calculate a time required to move the positioner to minimize impact of a movement of the positioner on a saved image sequence. The control system can further select the positioner based on the magnitude of the applied in-situ stimulus. The control system can additionally select the positioner based on an amount of the applied in-situ stimulus remaining to reach a predetermined maximum magnitude of the applied in-situ stimulus. The control system can zero out a further in-situ stimulus that was previously applied to the positioner. The control system can also assign one or more automatic limits to an electron beam position of the electron microscope to prevent or reduce stigmation. The control system can further permit a user to toggle between the region of interest and the further region of interest. The control system can initiate acquisition of high-resolution images of the region of interest when the registered movement is below a predetermined value or predetermined rate.

In at least one embodiment, the control system is further configured to identify a user-initiated action when it detects a movement associated with at least one of: a x-axis position of a mechanical stage, a y-axis position of the mechanical stage, a z-axis position of the mechanical stage, a piezo stage deflection, a beam deflection, a piezo stage, a focal plane, an alpha tilt, a beta tilt, an image refresh rate, and an imaging condition. The control system can also calibrate or trigger an in-situ stimulus based on the user-initiated action. The control system can further pause or halt an in-situ stimulus that conflicts with the user-initiated action.

According to various embodiments, registering sample movement can be accomplished by the control system by template matching a subset of the image, usually the primary region of interest, against the rest of the field of view. Techniques to reduce the large amount of "salt-and-pepper" or background noise common in TEM (transmission electron microscopy) and STEM (scanning transmission electron microscopy) image sequences, such as a median blur filtering improves registration and alignment algorithms. It can further include filtering techniques. Registering a pixel shift can then be translated into a correction distance for positioners associated with the electron microscope. A combination of these pixel shifts can be translated into a drift velocity vector and a drift acceleration vector.

The control system can permit a user to select one or more primary regions of interest by selecting them from the live image stream in the software, for example, by making the selection of an interactive graphical user display coupled to the control system. The selection of regions of interest could be done by drawing a contour/border on the image, drawing a shape on the image, or by picking from one of the predetermined shapes. The control system can further provide for easy resizing. There could be multiple regions of interest including, for example, one for x, y drift correction, and one for z auto-focus. The control system as described herein can provide for the x, y centering region of interest to be in the center of the field of view, thus enabling users to easily move key features to the center before initiating drift correction will help. The control system as described herein can provide for accomplishing this by double clicking on the image. Alternatively, the control system as described herein can provide for accomplishing this by applying a centering motion to a position that is not at the center of the field of view. Once drift correction is initiated, new regions of interest could be set through the software, which would update any reference templates. This could be accomplished by double clicking on a new region or drawing a new region of interest.

In some embodiments, the control system is configured to reduce or eliminate the movement to facilitate generation of a seamless video of the region of interest by applying a physical adjustment, applying a digital adjustment, filtering an image displayed in a live view, and/or filtering an image displayed in a drift corrected image sequence. The system can reduce or eliminate movement for the seamless video live by physically correcting, digitally correcting, but also automatically filtering the images displayed in the live view and drift corrected image sequences. For example, the system can allow for skipping of images in the live view where the system is physically moving one of the positioners eliminating these blurred images from the sequences. The system can further send commanded movements to the positioners so that the blurred frames created by the positioners do not show up in the drift corrected image sequence or live view. Knowing how long it takes to make a positioner move can provide the user with a seamless experience with only a few frames dropped or acquisition temporarily delayed during the move. Accordingly, in various embodiments, the control system is further configured to automatically skip one or more blurred images to generate a drift corrected image sequence devoid of the one or more blurred images. The control system can further coordinate a timing of application of adjustment to synchronize with a time of acquisition of the one or more blurred images.

According to various embodiments, a region of interest's focus is scored by the control system by analyzing the variance of pixel intensities in the image. The control system can determine this through FFT (Fast Fourier Transform) calculation analysis, contrast transfer function analysis, and beam tilt analysis; the control system can alternately determine this through deflections of the beam and by any other focal algorithm. The control system can further operate to purposefully take the image out of focus, both under and over, to help determine an optimal Z height for the region of interest. However, this is not limited to just lens and beam adjustments to bring the sample in and out of focus. The action taken by the control system is hierarchal in at least one embodiment in that the control system will adjust the stage, beam and/or piezo depending on the scale of movement needed.

One procedure for changing samples (changing samples is very common in in-situ studies) involves the use of tunable filters to morph the original registration template into the current live view. Additionally, this template can be completely reset in a strategical manner when users change FOV, imaging conditions, or key items on the microscope. In at least one embodiment, the control system is configured to manipulate a template of an image of the region of interest over a predetermined period of time to generate a current morphology profile or a current intensity profile. The control system can utilize filtering techniques and frame averaging to morph the template more like the active region of interest; the control system can accordingly preserve history while reacting to more dynamic samples. Accordingly, the control system can use a template image for registering the movement. In some embodiments, the registered movement comprises a drift vector.

The control system can identify the time at which the sample is changing, and based on the identification, the control system can advantageously flag important events over long experiments with high frame rates; this can advantageously help in sorting key data from very large data sets and in saving images to file. This can further advantageously help in pausing or holding and in-situ stimulus; this can advantageously help in slowing ramp rates or in automatically updating the indicated region of interest.

According to at least one embodiment, changes to sample that control software could actively detect include the following:
1. Morphology related changes:
   a. Surface faceting
   b. Particle agglomeration/coalescence/sintering
   c. Particle dissolving/etching/sublimation d. Bulk—Inclusion dissolving/formation
e. Particle nucleation
f. Nucleation leading to sample growth
2. Phase related changes:
g. Kirkendall effect—void formation and outer shell formation
h. Crystallization/amorphization
i. Phase segregation
j. Grain boundary migration
k. Oxidation/reduction
l. Densification
3. Atomic changes:
m. Void/defect changes/dissipation/movement
n. Single atom dynamics
o. Zone axis determination
p. Graphene excitons
4. Automated features:
q. Detection of phase transformation
r. Detection of carbon contamination
s. Detection of liquid cell dewetting In various embodiments, the control of positioners associated with the electron microscope can be accomplished by one or more software algorithms that form part of the control system. In some embodiments, the control of positioners can be hierarchal in that the control system can intelligently select the most appropriate correction option among the available correction options associated with the available positioners. The selection can be based on a combination of a drift velocity and one or more imaging conditions such as a magnification level and an image acquisition time. Common available positioners in the electron microscope include mechanical stage control which is capable of coarsely moving the holder; in some examples, a piezo stage control is provided for finely moving the holder; also controls may be provided for controlling the electron beam position through electromagnetic deflection of the electron beam of the electron microscope. Control of these positioners is often run through software; however, unlike the control system as described herein, existing solutions do not tie such controls to feature movement; also, unlike the control system as described herein, existing solutions do not provide automated systems for continuous moves spanning all 3 positioners.

The control system can further reduce sample movement for seamless video. The resulting image can then be digitally corrected by the control system from the total field of view. The video could be of the FOV with the ROI centered showing how the ROI interacts with the rest of the sample. The control system can further provide for cropping or blurring of the perimeter pixels while keeping the region of interest centered. The control system can further provide for saving both image sets to file—the digitally corrected version and the uncorrected version. The control system can additionally provide for generating videos from consecutive images, digitally corrected for an ultra-stable movie of the region of interest or uncorrected for the unaltered video feed. Accordingly, embodiments of the presently disclosed subject matter can perform these functions while simultaneously applying a physical correction. The combination of these two functions can be beneficial.

The control system can further include capabilities for post-processing a perfect set of consecutive corrected images. For example, math or analysis applied to an image can easily be applied to multiple images since they are physically and digitally aligned. Math and analysis can include transform analysis such as FFT and CTF, intensity plots, pixel intensity statistics, focal algorithm analysis, particle size analysis, particle distribution analysis, distance between two points, crystallinity analysis, resolution analysis, summing frames, averaging frames, image filters, brightness adjustments, contrast adjustments, gamma adjustments, metadata and shape overlay layers. By applying mathematical functions or mathematical algorithms on a physically and digitally aligned sequence of images, the control software can present how the sample changed over time quantifying the effects of the experiment or imaging exposure. Additionally, mathematical functions or mathematical algorithms applied to the image can be used to sort and filter images. Metadata can also be used to sort and filter images. Metadata can stem from imaging conditions, microscope conditions, in-situ data or calculations made on the image. For example, the software can help identify only the images on a temperature ramp by analyzing the sample temperature and then further limit the sequence to only "in focus" images by filtering the focus quality score or normalized focus quality score. Mathematical functions or mathematical algorithms can be applied to an image sequence after capture or processed live during image capture.

The control system is further configured to generate a video based on consecutive uncorrected images. The control system includes capabilities for post-processing a perfect set of consecutive corrected images. For example, math or analysis applied to one image can easily be applied to multiple images since they are physically and digitally aligned. Math and analysis can include transform analysis such as FFT and CTF, intensity plots, pixel intensity statistics, focal algorithm analysis, particle size analysis, particle distribution analysis, distance between two points, crystallinity analysis, resolution analysis, summing frames, averaging frames, image filters, brightness adjustments, contrast adjustments, gamma adjustments, metadata and shape overlay layers.

In one embodiment, the control system as described herein can include (or be in the form of) a software suite provided by tradename AXON and/or by tradename Synchronicity. FIGS. 92 through 114 illustrate various aspects of the AXON software suite (hereinafter referred to as "AXON system", "AXON" or as the "control system" or simply "system"). The display of AXON on a digital display device such as a computer monitor can include three headings: "AXON Commands", "Microscope Commands" and "Microscope Profile". The "AXON Commands" and "Microscope Commands" section are used to feed the information in the "Microscope Profile" section that that characterizes a TEM column that the AXON software suite is installed on or is otherwise electronically coupled thereto. "AXON Commands" include functions specific to the AXON application such as: "Reset Beam X/Y" that re-centers the beam to 0,0; "Reset Beam Z" that sets the defocus to 0; "Start Unwind Beam X/Y" that triggers the X/Y unwind process (same process as lower indicator but without the restrictions); "Start Unwind Beam Z" that triggers the Z unwind process (same process as the lower indicator but without the restrictions); "Save Trace" that saves software diagnostic and trace information into a file; and, additional AXON specific commands to assist in service installation or diagnostics will be available in this section as they are developed.

"Microscope Commands" include functions specific to the TEM such as: "Read Imaging Mode" that reads whether the system is operating in TEM or STEM mode; "Read Magnification" that reads the magnification; "Read Position" which reads the current stage position for X, Y, Z, A and B (X, Y and Z corresponding to x, y and z axes; A representing alpha tilt and B representing beta tilt); "Set Position" that sets the stage to an absolute coordinate for X, Y, Z, A and B; "Sync Position" that sets the "Set" positions to the current read position to assist in making small stage increments; "Read Shift" that reads the current X, Y beam positions, which is TEM/STEM specific (TEM Shifts are often called "Image Shifts" whereas STEM Shifts are often called "Beam Shifts"; deflectors can be used for both types of movements); "Set Shift" that sets the beam to an absolute coordinate in X, Y, which is TEM/STEM specific; "Sync Shift" that sets the "Set" shifts to the current read position to assist in making small beam shift increments; "Read Defocus" that reads the current Z beam position, often called the "defocus" value; "Set Defocus" that sets the Z beam position to an absolute value; and, "Sync Defocus" that sets the "Set" defocus to the current read position to assist in making small defocus increments.

AXON can manage multiple microscope calibrations. Each TEM column can have its profile automatically created by AXON when connected to the associated microscope service. That connection can be first made through the service portal by clicking the "Test Connection" button against the available network microscope services. Upon successful connection, AXON can create a microscope profile for that TEM populated with all default capabilities. Performance can be enhanced by an accurate knowledge of the positioner and imager capabilities and the relationship between the two. While some fields can be manually entered after installation tests, several other field entries are based on automated procedures populated at the end of the process.

"Microscope Profile" includes the microscope and all connected cameras and detectors are characterized on the system installation. The "Microscope Profile" can be a combination of automated and manual parameters calibrating the capabilities of each part of the column with respect to the cameras/detectors. The microscope profile can be composed of data manually entered or automatically pulled from the connected microscope, cameras, detectors, or in-situ systems. For example, the "Microscope Name" can be populated by the computer name of the TEM column, and it can also be an editable field. The "Microscope Profile can save networking and communication information such as the "Microscope Service Uri" which can be the uniform resource indicator to the microscope service communication link and can include the "Last Connection Time" detailing the date/time of the last connection with that microscope profile; "Positioner Capabilities" can be a header for all settings associated with the microscope's ability to move the sample; "Coordinate Transforms" can be a header for all X/Y rotational alignment calibrations linking the positioners to the camera or detector (saved per detector, per positioner, per magnification); and, "Focus Assist Step Sizes" can be a header for all Z calibrations dictating the distance it takes to bring a sample over, under and in focus depending for the imaging conditions and magnification (saved per detector, per positioner, per convergence angle, per magnification).

As used herein, the following terms have the corresponding definitions. "Image Complete Threshold" is the percentage of unique pixels required to determine a new image during a continuous imaging stream. "Scan Boundary Acceptance Threshold" is the percentage of pixel rows from the bottom that the system attempts to target STEM scan boundaries before declaring a unique image in a continuous imaging stream. "Range" is the physical min and max limitations of the positioner as read by the column AXON software in microns or degrees. Each positioner will have different range limits, and these can be different in the X, Y and Z plane as well as alpha and beta tilt. "Preferred Range" is the preferred minimum and maximum limitations of the positioner as read by the AXON software in microns or degrees. These can be the same as the range or could be a subset of the range. The preferred range can be used as a safety buffer or to prevent image degradation of the optics for the cases of beam movement. Each positioner may have a different preferred range, and these can be different in the X, Y and Z plane as well as alpha and beta tilt. The preferred ranged can be microscope dependent and/or OEM (original equipment manufacturer) dependent. "Resolution" is the minimum movement distance in microns that a positioner can be commanded through the AXON software after backlash has been accounted for. Each positioner will have different resolutions, and these can be different in the X, Y and Z plane as well as alpha and beta tilt. "Hysteresis" is the distance in microns or degrees lost when changing direction on a given positioner. The hysteresis makes up the needed additional travel until changes in the resolution are discernable in the actual perceived position of the sample. Each positioner may have different hysteresis and can be different in the X, Y and Z plane as well as alpha and beta tilt. These parameters may be used for making decisions on whether a positioner is the correct positioner for the magnitude of move required by the control software. "Min Move Time" is the time required for the move to complete and the image to settle for the smallest move determined by the resolution of that positioner. Each positioner will have a different Min Move Time, and these can be different in the X, Y and Z plane as well as alpha tilt and beta tilt. "Move Pace" can be used to quantify the additional scaling factor required for larger moves to complete and the image to settle, scaling linearly with the magnitude of the move. It is not required to break the movement time of a positioner into both a minimum move time and a move pace, and these two parameters can be summarized in a single movement time if preferred. "Coordinate Transforms" can be used to characterize the rational alignment calibrations linking the positioners to the camera or detector (saved per detector, per positioner, per magnification). The coordinate transform process can be saved automatically after an automated process is triggered. An example of this process could be to move in 6 discrete steps for all relevant positioners accounting for hysteresis and save the rotational alignment between the positioner and the active camera or detector.

When a microscope calibration process is triggered, the system may automatically try to calibrate both the beam and stage for the camera or detector with some exceptions. The system may only calibrate the STEM beam when in STEM mode and the TEM beam when in TEM mode. Additionally, the process may only calibrate the beam when a certain subsection of the field of view does not exceed the preferred range or physical range of the beam which can be dictated by the microscope profile. Likewise, the system may only calibrate the stage when the magnification is low enough so that a certain subsection of the field of view does not exceed the resolution or hysteresis of the positioner.

When a positioner successfully finishes the calibration process, it may populate an entry under the "Coordinate Transforms" header detailing the camera/detector, positioner, and magnification. The system may reference calibrations in that order. On each move, the control system may look for a calibration for the correct camera or detector. If there is not one, it may alert the user that a calibration is needed. If there is, it may reference the positioner capabilities to determine the correct positioner based on the resolution and magnitude of required move. If there is not a calibration for that positioner, it may alert the user that a calibration is needed. If there is a calibration for that positioner, it may select the calibration associated with the magnification that the user is operating in or the closest magnification.

In STEM mode, it may only be necessary to get a few calibrations, one at very low magnifications for the stage, one at mid magnifications for the stage's smallest moves and the beam's largest moves, and then one at high magnifications for the beam's smallest moves. In TEM mode, it may be necessary to get more calibrations at multiple magnifications. It is not uncommon for TEM cameras to rotate the image as new lenses are enabled.

"Focus Assist Step Size" is a header for all Z calibrations that dictates the distance it takes to bring a sample over, under and in focus depending for the imaging conditions and magnification. Much like the "Coordinate Transforms", "Focus Assist Step Sizes" can be saved per camera/detector, per convergence angle, per magnification. These calibrations can also be an automated process which steps the defocus in both directions outward from the starting position in increasing magnitudes until it reaches a prescribed limit. The prescribed limit can be a fixed value or settings such as the "Calibration Maximum Step Size (um)" setting or the "Calibration Minimum Focus Quotient" setting. To improve the calibrations, if at any time, the control system gets a better focus score (alternately referred to as a score of a focal level) while stepping outward, it may restart the process from the new position. At the end of the process, it may bring the defocus back to the best focus position and populate an entry into the "Focus Assist Step Sizes". These entries apply a function to the points to help the control system determine the size of step needed as a sample goes in or out of focus.

The control system is further configured to continuously monitor a focus level of the region of interest, and to use physically and digitally aligned images along with focal quality analysis to enable a normalized focus score. Whereas focus scoring on a single image is important, but since they are all physically and digitally aligned, a focus history can be built by the control system based on the same set of features. Comparing the focus quality scores applied to a single frame against what is possible can advantageously normalize the focus score. A normalized focus score, in turn, can enable live analysis of focus to improve or depict focus quality. The focus control algorithm of the control system can constantly adjust the objective lens (defocus). As the normalized focus score approaches closer to the best registered focus score, the size of moves gets smaller (close to 0 nm). As the normalized focus score gets worse, the adjustment size increases. The direction of move is tied to analysis of the normalized score history. Movements that result in a lower normalized score get factored into a controller directed by the control system, with the controller configured to eventually reverse the direction of move. The normalized focus score references a best possible focus. That The normalized focus score and be updated on any new template (any time the imaging conditions change, FOV changes, etc.) and the template is morphed over time through filters (such as bump filter) to account for morphology changes or intensity profiles that may make a best possible focus no longer attainable. The normalized focus score filtered for noise to curtail the reaction of the controller to the noise inherent to EM images. Since there may not be adequate history available on how well a profile applies to different types of samples or other imaging conditions, this process can be triggered by users anytime drift correction is running. It can serve as an "auto focus" function to bring an out of sample back into focus faster and a calibration function to calibrate the control system for that type of sample. All calibrations are saved so this is not a necessary step on each experiment—only reserved in case the default behavior is not preferred. Drift correction does need to be running for the focus assist calibration to guarantee the control system is looking at the same region of interest through the calibration.

A key step in AXON is to start a session. This sets the default overlays, workflow and prioritizes connection type. Users can change the session name to help organize data.

On installation, AXON can create a directory of support files organized into a predetermined folder directory present on a server. In this directory, users can manually access files used by the application. AXON can automatically create a log on each microscope connection or connection with Clarity products. In one embodiment, the control system as described herein can include a software suite provided by tradename Clarity (hereinafter referred to as "Clarity" or "control system" or simply "system"). Accessing these logs can help determine how often and why users are using the AXON application.

The control system may create a folder for each session, separating the "Drift Corrected", "Raw", "Templates" and "Single Acquires" per session. This directory can be setup for first in, first out as the buffer size approaches its maximum limit. The session folders may persist for as long as there are images of that session still in the buffer. The images can be manually moved from this folder or exported using the AXON Notebook or any session or image review tool. As mentioned herein, AXON Notebook may refer to a tradename given to an image review tool forming part of the control system according to one or more embodiments of the presently disclosed subject matter. Each image can be saved with all relevant metadata, however accessing this metadata may only be possible through the AXON Notebook or supported review tools. These tools could export the images and export the metadata into a database or a CSV file.

AXON can rely on a microscope service and possibly additional camera services to interact with the TEM and cameras. These services are installed and run on the column and camera computers and communicate with the AXON application. These services can be Microsoft windows series, formerly known as NT series, and enable long-running executable applications that run in their own Windows session, but they can also be standalone applications. These microscope services work well as a long-running application that does not interfere with other users working on the same computer. On installation, a background service is started, and an icon can be created. That icon can indicate connection status with AXON. It can be in a standby state until triggered by AXON through a "Connect" function; it then attempts to reach the TEM OS and imaging OS. On clicking this icon, a small lightweight UI for the microscope service can be viewed. This application can have multiple panes, opening up to panes such as "Status", but easily toggleable to "Diagnostics" and "About". Once connected to AXON, the Connect status under AXON may change state from "Not Connected" to "Connected". Once connected to the microscope, the connection status under "Microscope" may change state from "Not Connected" to "Connected".

In terms of image monitoring, AXON does not need to create the imaging session or update conditions. The user can continue to setup the imaging conditions within their native imaging environment and AXON identifies unique images through the image monitoring process managed within the microscope or camera services. AXON polls the images as fast as it can script the imaging service. Once the control system determines that the image is unique, the process compiles the intensities of each pixel into a bitmap with all associated metadata. The control system then sends that package from the microscope service to the AXON main application. Once the package is sent, the process commands any change to the TEM column if needed like positioner updates. However the functions and features of AXON is not limited to only setting up the imaging session in the native imaging environment, an embodiment could include a software that enables control of the imaging setup.

AXON receives this bitmap package and applies the image monitoring process settings to scale the raw bitmap pixels to the user's preferences. The unscaled bitmap is typically very flat and very dark—not very visible. AXON has a few image normalizations options available in the settings, where the user can choose between "Histogram", "Min-Max" and "None". "Histogram" is the default setting. The user can set the histogram lower fraction and the lower pixel intensity and the upper fraction and upper pixel value. Once normalized, the process runs the bitmap through any image processing needed. In parallel with analysis, the process converts the bitmap into a lossless PNG or any other file type for storage in the image buffer. Only the scaled image is converted, and the original bitmap is lost.

AXON can work with full resolution images but may bin the images down for computation. This architecture can allow for performing image processing in a local environment where one can leverage third party libraries like OpenCV. This process works for single acquisitions, continuous acquisitions, STEM and TEM mode. It does require that the user setup the imaging session in their native imaging environment through either a "Search", "View", "Preview" or "Acquire". There are cases where a connection is made, but images are not displayed in the AXON software. In these cases, AXON alerts the user with a dialogue stating why images are not being displayed. This is handled under the following cases: column valves closed; beam blanked; and, screen down. Drift control may, in some instances, include corrections for movement in the X/Y plane, but not changes in height or focus.

In terms of hierarchy of positioners, the AXON system is built on a hierarchy of positioners. Ultra-fine movements can be handled though a digital registration until they hit a threshold where a beam movement is triggered to unwind the digital registration. Eventually the beam movements are also unwound by triggering a movement of the stage. The piezo could be utilized on compatible TEM columns. An example of digital registration is shifting the pixels and cropping, blurring, or filtering the edges of the field of view. By allowing a small percentage of digital registration, it enables the AXON software to provide a seamless live view of the sample without constantly triggering movements of the TEM beam or stage, keeping the regions of interest consistent and prevents image tearing and shadowing. Beam movements are different between TEM and STEM mode and are the finest physical movement available within the AXON software. Any physical move is made to center the sample which may reduce the amount of digital registration applied to the image. As the beam moves further from the aligned position the image quality suffers, overall contrast reduces, and edges have less gradient Beam shifts in TEM and STEM mode, if moved too far, may result in a degrading image. AXON can operate to unwind the beam through stage moves when the resolution of the stage and magnification allows. Unwinding the beam can be triggered manually and automatically through the AXON software. The beam position can be tracked through an indicator that reflects the greater of either the X or Y position of the beam. There can be a sliding threshold depicted on that indicator that triggers automatic unwinding when automatic unwind is enabled and the magnification is low enough.

In one embodiment, the drift correction process may include the following steps. After the median blur, the process applies digital registration to the live image. The digital registration is applied to each frame in the drift corrected image sequence, but the software simultaneously saves the raw, unaltered, images into a separate folder that is viewable in the live view when toggled in the lower indicator. There are no image skips in the raw images or drift correction images presented and saved when only a digital registration is applied. When the digital registration hits a percentage, threshold which can be fixed or set by the "Adjustment Threshold" setting, the system then triggers a physical move. There are applications where a larger or smaller "Adjustment Threshold" setting is preferred. A larger setting may give more allowable digital registration with fewer physical moves and image skips. A smaller setting may move more often with less digital registration, resulting in a sample that stays more centered in the native imaging application as well as AXON. This can be preferred when working with EELs, EDS or other analytical techniques When a physical move is triggered, AXON looks at the "microscope profile" to determine which positioner to use depending on the magnitude of the move and resolution of the positioners. AXON may always default to the coarsest available positioner if the resolution of the positioner is less than the required movement. If the required move is 20 nm and the stage's resolution is 25 nm then it may default to the next fine positioner, the beam. However, if the required move is 30 nm, then the stage may be the triggered positioner. If the stage is the default positioner, the control system may automatically unwind the beam back to 0,0. The direction of the physical move is determined by the matrix alignment from the coordinate transform calibrations. The magnitude of move is reliant on the camera or detector calibration by the TEM service engineers using common techniques such as MAG*I*CAL.

In terms of drift corrected image sequence, when a physical move is triggered the next image is skipped in the live view and it is not saved to the drift corrected image sequence. It is saved to the raw images sequence; all images are always saved in raw images. The control system also looks to the minimum move time and move pace from the "microscope profile" to determine if additional images need to be skipped in case the image update rate is less than the time it takes to move the required positioner. Skipping the images while the positioner is physically moving the sample prevents torn or shadowed images factoring into drift correction registrations and makes scrubbing through a corrected image sequence more manageable. All images are always saved in "raw images" and the user can always toggle between these two views for the same time sequence in the live view and AXON Notebook. The drift correction process continues through user interruption on the TEM. The software listens for updates to the TEM column, cameras, and detectors to determine when to grab a new template to register the image against.

The AXON system can automatically grab a new template and continue the drift correction process when the following events occur: change in magnification; change in image physical size; change in pixel area; change binning; change in acquisition time; dwell time; exposure time or integration time; gain correction enabled; bias correction enabled;

change in alpha tilt; beam; stage; change in beta tilt; Beam; stage (only readable if controlled by column like with fusion select); change in brightness; change in contrast; change in convergence angle; change in Z stage; change in defocus; change in region of interest size within AXON.

The AXON system can pause drift correction and wait until an updated state before automatically resuming drift correction when the following events occur: beam blanked; column valves closed; and, screen down. The control system can stop drift correction all together in order to not "fight" the user when the following events occur: stage X/Y movement; beam X/Y movement. Additionally, drift correction may halt the process if the correlation match of the FOV against the template exceeds the "Correlation Failure Threshold". It may also halt the process if the digital registration impedes on the region of interest. The drift correction registration can accommodate dynamic samples. This is advantageous for in-situ samples, but even "static" sample change as the beam interacts with the material or the zone axis changes. A running filter may be applied to the original template, morphing it more like the current image. The aggressiveness of this filter can be fixed or set by the "Template Morphing Factor" setting. A higher setting may result in a registration template that is more like the current image. Doing this may slowly move the region of interest in the drift direction, but this may be necessary to accommodate changing samples. On images that do not change much, it may be advantageous to keep the template morphing factor low to keep the regions of interest consistent. There are many ways the template morphing setting can be visualized referencing how dynamic a sample is. This can be a variable, slider, fixed settings, or any other type of indicator.

Drift correction can perform a correlation match of the region of interest against every pixel array of that size across the image where the template is the morphed template. The registration then digitally centers the region with the highest correlation score in the region of interest box. The region of interest can be bounded by a shape overlay on the image in the software. The AXON system does include the option to turn on "Background Assist" through the settings. "Background Assist" continues to prioritize the region of interest, but also manages other independent regions of interest to determine overall direction.

In terms of drift control specifications, AXON can correct in X, Y and Z when the imaging conditions are appropriate for the expected drift rate. When using proprietary systems, "Experiment Prioritization" may automatically help set appropriate ramp rates for the current imaging conditions. However, if the drift is not caused by the proprietary heating E-chip, the imaging conditions may need to be adjusted. If the control system is not able to keep up with the apparent drift, it can undertake the following actions: reducing the magnification or image size; and, speeding up the image acquisition rate.

Focus Assist is a process triggerable from the left bar of the screen display of AXON when drift correction is active. The focus region of interest is bound by a shape overlaid on the live view. This region of interest is moveable within the drift correction region of interest and resizable within limits. Focus assist may not run unless drift correction is active to guarantee that the same region of interest is analyzed in comparative scoring. The primary tools for this process are a focus quality score and the defocus adjustment of the microscope. Stage movements are needed during unwinding events but are not automatically engaged for larger movements due to the unreliable nature of the Z stage positioner on most microscopes. Piezoelectric control could also be supported on compatible microscopes.

Focus quality score may be applied to each image, with no history of previous scores. This score is reported in the lower indicator as both a numerical score and as a relative quotient. While there are default scoring metrics, users can also choose between the below scoring metrics through the Focus Assist setting "Focus Score Algorithm". Each algorithm has benefits for specific imaging conditions and samples. Variance calculates the variance of the image by taking the sum of the squared differences from the mean after applying an image filter. Inverse variance is calculated as a large value/Variance, which is used for inverted profiles where a decreased variance is preferred. Norm variance takes the variance and divides by the mean pixel intensity, normalizing for changes in overall intensity. Inverse norm variance is calculated as a large value/Norm Variance, which is used for inverted profiles where a decreased norm variance is preferred. Norm variance 2 takes the variance and divides by the mean pixel intensity putting heavier emphasis on normalizing for changes in overall intensity, better handling groups of saturated pixels. Inverse norm variance 2 is calculated as a large value/Norm Variance 2, which used for inverted profiles where decreased norm variance2 is preferred. Gradient calculates the gradient of the image by taking the square root of the sum of squares of the gradient matrix derived from the image after applying an image filter. Inverse gradient is calculated as a large value/Gradient, which is used for inverted profiles where decreased gradient is preferred. Gradient 2 applies a second filter to the gradient score to enhance edges and decrease background impact. Inverse Gradient 2 is calculated as a large value/Gradient 2, which is used for inverted profiles where decreased gradient 2 is preferred. Laplacian is based on the square root of the sum of squares of the Laplacian matrix derived from the image. Inverse Laplacian is calculated as a large value/Laplacian, which is used for inverted profiles where decreased Laplacian scores are preferred. Max Laplacian is the maximum of blurred Laplacian matrix. Inverse Max Laplacian is calculated as a large value/Max Laplacian, which used for inverted profiles where decreased Max Laplacian scores are preferred. Additional scoring metrics can be derived from CTF analysis of an FFT.

A focus quality score is applied to each image, with no history of previous scores. Focus quotient provides the history by dividing the current score by the recorded best-ever score. The focus quotient is used for indicating relative focus quality in the lower indicator bar and for determining the magnitude of required move. This tells the user and the software how good the focus is compared to its best possible focus quality. The history of this focus quotient is reset on each drift correction template update so that it accounts for any user interaction on the TEM. There are many reasons as to why a best possible focus score can change including reduction in contrast due to carbon contamination. This is worsened in STEM mode with higher dwell times; morphology changes as the sample reacts to in-situ stimulus or beam; and, morphology changes as the relative axis of the sample rotates. To account for these cases, a filter is applied to the focus quotient morphing the focus quotient to the current image. The aggressiveness of this filter can be fixed or can be set by the setting, "Focus Score Morphing Factor". Whenever the focus quotient is greater than the best-possible focus score, the score resets to 1. The AXON system determines that an image is in best-possible focus when the focus quotient is 1. As it approaches 0, the image is more and more out of focus, regardless of over or under. When focus assist is initiated, the focus quotient starts at 1 and it returns to 1 anytime a new template is created or anytime the measured focus quality score is above the morphed best possible. These values can be scaled or interpolated.

In terms of defocus adjustments, while Focus Assist is active, AXON makes a defocus adjustment on either; every other image or the image after the minimum move time, whichever is longer. This ensures that images are not mid focus adjustment when sampled for direction and magnitude of response. The direction of move can be determined by a fuzzy logic table where AXON analyzes direction confidence and probability that the focus is worse. When the direction confidence is low and the focus quotient reduces, the process may reverse direction. When the focus quotient increases, the process may continue in that direction. When the confidence is high that direction is correct, the process is more resilient to focus quality score reductions to prevent reversals when the sample outpaces the controller.

The magnitude of defocus adjustment is determined from the focus quotient and the focus calibration, regardless of direction. As the focus quotient decreases, the size of response increases. High focus quotients result in small defocus adjustments, small enough that the user cannot perceive the change, but the sampling statistics may continue to improve focus quality. The focus calibration provides the reference for the control system to judge the needed defocus response for a given focus quotient.

Z (focus) corrections may always default to the beam (defocus) and not automatically move the stage or piezo controls. This is because the Z stage may be very unreliable, noisy and has varying hysteresis. The control system can unwind the beam, much like the X/Y unwind. It can be automatically triggered through a sliding threshold on an indicator and it can be manually triggered through the unwind button. When the Z unwind is triggered, the control system may step the stage in the direction of the beam position and then re-focus the sample. This process continues until the beam position is less than the resolution of the Z stage. Each step is determined by the Z stage resolution in the microscope profile. These moves can be setup so that the beam and stage or beam and piezo are moved in opposite directions in a single move. This process can also be used for unwinding a piezo against the stage.

Experiment prioritization can include ramp-rate control initiated from AXON to a compatible proprietary Clarity software or any other in-situ software, where the Clarity software is still run independently outside of AXON. As noted earlier, in one embodiment, the control system as described herein can include a software suite provided by tradename Clarity (hereinafter referred to as "Clarity software", "Clarity", "control system" or simply "system"). Session types are available the in-situ software products compatible. These session types initiate a 2-way connection between AXON and the corresponding in-situ software which synchs metadata to AXON and AXON sends recommended ramp rates, start, stop, pause, and resume commands to the in-situ software. AXON can communicate maximum ramp rates within the in-situ software application that can boost chance of a stable region of interest, in good focus through temperature changes and to automatically initiate pause/resumes. AXON calculates a recommended ramp rate on connection to the TEM imaging session and updates anytime the conditions change, regardless if drift correction or focus assist are active. AXON updates this ramp rate during drift correction and focus assist to optimize performance.

AXON can automatically pause and resume thermal ramps to prevent unstable conditions anytime: the focus quality goes below a threshold while focus assist is active—(a) the ramp can pause anytime the focus quotient drops below a fixed value or the setting, "Pause Experiment Threshold"; or (b) the ramp can automatically resume when the focus quotient is corrected above a fixed value or the setting, "Resume Experiment Threshold"; the digital registration exceeds a threshold while drift correction is active—(a) the ramp can pause anytime the digital registration exceeds a fixed value or the setting, "Pause Experiment Threshold"; or (b) the ramp can automatically resume when the digital registration drops below a fixed value or the setting, "Resume Experiment Threshold"; anytime the beam is unwinding in X/Y; and, anytime the beam is unwinding in Z.

Anytime the control system triggers an automatic pause, the clarity application can alert the user within the Clarity application with text next to the recommended ramp rate stating, "Held by AXON". This behavior can be configured so that instead of pause and resume commands, a gradually decreasing ramp rate and the pause/resume is preferred. The 2-way connection triggers UI elements in AXON and in the corresponding Clarity product.

In AXON, the following options are provided: "Start Experiment", "Stop Experiment", "Hold Experiment" and "Resume Experiment". Additionally, the full workflow of in-situ software such as Fusion Select, Poseidon Select and Atmosphere 210 can be brought into the AXON user interface. A connection indicator in the lower right-hand corner of the indicator bar detailing—product icons; product name; connection status; play button to start experiment (or apply target); pause/resume button to pause or resume a ramp; stop button to stop the experiment safely cutting power to the sample or sample support; and current experiment state—active, inactive, automation hold, user hold. (3) Additional notifications on connection and running state. (4) Default overlay on the live view depending on session type.

In the in-situ software, the following options can be provided: (1) A connection status—labeled AXON, reporting connection state. (2) AXON Recommended Ramp Rate text and calculated value labeled directly below the ramp rate when running a Thermal experiment from Channel A. (3) Text alerting the user when an automation hold is applied right next to the recommended ramp rate.

Regarding connection with the microscope service, AXON computes a maximum correctable drift rate in um/ms from the field of view size, adjustment threshold setting, acquisition time and minimum move time. This allows for enough information to make the needed focus adjustments and insures stability in the X/Y correction. A power read from the sample or sample support can allow for more aggressive ramps at lower temperatures, slowing down over the largest dT/dP sections. The E-chip can also be used to delineate different behavior when new chips are introduced.

AXON Synchronicity manages a few data streams all synced through corresponding metadata appended through multiple steps in the processes. The images in the session buffer are saved with metadata stemming from: Native imaging OS (for example, TIA or Gatan); Column OS (for example, TFS or JEOL) (TFS or JEOL); and, In-situ system (for example, Protochips). The images are organized in the image buffer between a few folders, all saved with the relevant metadata. These images can be exported from the temporary buffer to a permanent folder—again saved with their metadata but also then exported with a .csv log file of all metadata appended through each step in the process. The metadata can start with the image monitoring process in the imaging service. The image monitoring process can grab each unique image as a bitmap and attach the relevant metadata from the native imaging OS. Then the microscope service appends the bitmap metadata with all relevant parameters and sends the package to AXON through the RESTful service. That bitmap is converted to a lossless PNG and the metadata data is merged with any relevant in-situ metadata. That lossless PNG is saved unedited to the "Raw Images" folder in the session buffer. If the drift correction process is running, that image is also saved with all metadata to the "Drift Corrected" folder in the session buffer after the digital registration process. If the image was flagged as a single acquisition rather than a continuous imaging stream, the raw image is again saved to the "Single Acquire" folder in the session buffer.

The AXON session buffer can be set to operate on a first-in, first-out priority from the AXON Public Documents directory. The control system creates a folder for each session, separating the "Drift Corrected", "Raw", "Templates" and "Single Acquires" per session. As the buffer size approaches its maximum limit the earliest images are removed to make room for the newest images. These session folders persist for as long as there are images from that session in the buffer so previous sessions can still be accessed even if they are not permanently exported if the active session does not exceed the buffer limit. The images can be manually moved from this folder or exported using the AXON Notebook and each image is saved with all relevant metadata, however accessing this metadata is only possible through the AXON Notebook until the images are exported and the CSV file is created. The AXON Notebook references this file structure and requires this organization for easy navigation in the application. All images are saved to the buffer at full resolution as acquired from the native imaging software but can be binned if preferred. All images exported from the image buffer to permanent disk are saved at full resolution. The user can turn on/off saving each type of image sequences to maximize the buffer to their preference. The image buffer can cover a ranging period depending on the image acquisition rate and the image saving options presented. If the image update rate is 100 ms and both raw images and drift corrected images are enabled for saving, the image buffer can be as small. However, if the image update is longer, the image buffer can span a much longer time frame. The control system can further partition the AXON server hard drive to reserve a block of hard drive for the image buffer and tie the image buffer size to available memory rather than a fixed number of images or fixed length of time.

The system has "Data Overlays" and "Image Metadata". "Data Overlays" enable a layer of text on the live view image updating with each unique image in the live view. Any overlay applied to a session persists into the AXON Notebook and persists for that session type across multiple sessions. The overlay options are managed through a property grid table with the following columns:

The overlay options can include, but are not limited to, the following:

| AXON: | Title: | Base Units: |
|---|---|---|
| ClarityControlDateTime | — | date/time |
| ScaleBar | — | mm/um/nm |
| MicroscopeDateTime | — | date/time |
| DRIFT CORRECTION: | | |
| CoordinatedDriftRate | Drift Rate: | um/ms |
| MatchCorrelation | Match: | |
| FOCUS ASSIST: | | |
| FocusRoiMean | Mean Int: | |
| FocusRoiVariance | Focus Var: | |
| FocusScore | Focus S: | |
| FocusQuotient | Focus Q: | |
| MICROSCOPE: | | |
| MicroscopeName | — | |
| MicroscopeType | — | |
| MicroscopeImagingMode | — | |
| ConvergenceAngle | Conv: | radians |
| STEMRotation | Rotation: | deg |
| ImagerMagnificationValue | Mag: | |
| IMAGE: | | |
| ImagerName | — | |
| ImagerImagePhysicalSizeX | Size X: | um |
| ImagerImagePhysicalSizeY | Size Y | um |
| ImagerImagePixelsX | Size X: | |
| ImagerImagePixelsY | Size Y | |
| ImagerBinning | Binning: | |
| ImagerAcquisitionTime | — | ms |
| ImagerContrast | Contrast: | |
| ImagerBrightness | Brightness: | |
| POSITION: | | |
| CoordinatedPositionX | X: | um |
| CoordinatedPositionY | Y: | um |
| CoordinatedPositionZ | Z: | um |
| CoordinatedPositionA | Alpha: | deg |
| CoordinatedPositionB | Beta: | deg |
| StageX | Stage X: | um |
| StageY | Stage Y: | um |
| StageZ | Stage Z: | um |
| StageA | Alpha: | deg |
| StageB | Beta: | deg |
| BeamX | Beam X: | um |
| BeamY | Beam Y: | um |
| BeamZ | Defocus: | um |
| BeamA | Beam Alpha: | deg |
| BeamB | Beam Beta: | deg |
| PixelShiftX | Px Shift X: | um |
| PixelShiftY | Px Shift Y: | um |
| IN-SITU ATMOSPHERE: | | |
| HolderTemperature | — | C |
| HolderPressure | — | mBar |
| HolderGas | — | |
| HolderFlowRate | Flow Rate: | SCCM |
| Tank1Pressure | Tank 1: | mBar |
| Tank1Gas | Tank 1: | |
| Tank2Pressure | Tank 2: | mBar |
| Tank2Gas | Tank 2: | |
| VacuumTankPressure | Vac Tank: | mBar |
| VacuumTankGas | Vac Tank: | |
| HeatingCurrent | Holder: | mA |
| HeatingResistance | Holder: | ohms |
| HeatingVoltage | Holder: | mV |
| HeatingPower | Holder: | mW |
| ExperimentType | — | |
| ExperimentLogFile | — | |
| ExperimentElapsedTime | — | |
| IN-SITU FUSION: | | |
| ChannelATemperature | — | C |
| ChannelACurrent | — | mA |
| ChannelAResistance | — | ohms |
| ChannelAVoltage | — | mV |
| ChannelAPower | — | mW |
| ChannelBResistance | Chan B: | ohms |
| ChannelBVoltage | Chan B: | mV |
| ChannelBPower | Chan B: | mW |
| ExperimentType | — | |

| AXON: | Title: | Base Units: |
|---|---|---|
| ExperimentLogFile | — | |
| ExperimentElapsedTime | — | |
| IN-SITU POSEIDON: | | |
| ChannelATemperature | — | C |
| ExperimentType | — | |
| ExperimentLogFile | — | |
| ExperimentElapsedTime | — | |

A session review tool by the tradename AXON Notebook can operate as a separate application with a separate installer. It can also be launched from within the AXON main application and is often used during experiments to reference the sample's history and previous morphology. The AXON Notebook is used to view and manage images, and to view and manage metadata from both the microscope and the supported in-situ systems. Data can be exported from the AXON computer and viewed manipulated elsewhere.

The UI of the AXON Notebook efficiently manages high resolution images so that they can quickly be scrubbed, sorted, and manipulated. The UI is dominated by an active image with overlay options and metadata associated with that image positioned in accordion headers to the right. Underneath the image are some key functions including: Navigation Bar: Time sequenced scrubber with slider that can be dragged to specific images. On clicking on the bar, the image can be sequenced through arrows on the keyboard or by dragging the slider—(1) First image: jump to the first image in the session; Previous image: move to the previous image as shown; Next image: move to the next image as shown; Last image: jump to the last image in the session. (2) Open: Open previous sessions in the buffer or any session exported to disk. (3) Sync: Refresh the directory if an active session is still saving images. (4) Toggle View: Toggle between "Raw", "Drift Corrected", "Single Acquire" and "Template" for the same time the active image. At any moment of time, one can view all other images saved to the closest timestamp. (5) Image Name: Image name or reference. Save: Permanently export images and metadata to disk. This opens separate window for managing the image export as there are export options. All available image layers in the main application are available in the AXON Notebook as well as all live metadata.

The AXON Notebook can view the active session and previous session that are still in the buffer or permanently exported to disk.

On clicking save from the AXON Notebook, the software can give export options and status. From the export images window users can set the destination folder and can export images off the AXON Core server. An external hard drive linked by USB or ethernet network or a cloud drive can be used for permanent storage of files. Then the user can select which images to export and whether to export with and without overlays. There is an "Export" button to finalize the export and a status bar showing progress. If any errors arise, the notifications can alert the user and a trace file is automatically created. This process can be run in the background while an image session is still running, and the window can be closed and can continue to run.

AXON Synchronicity and all Clarity products can be set up as separate applications that communicate together. The architecture is set to embed the workflows of Fusion Select, Poseidon Select and Atmosphere 210 into the accordion workflow in AXON. Embedding workflows is accomplished through the implementation of a "skinny UI". The Clarity architecture can be simplified into passive reporting elements and a workflow. The workflow UI is product specific and calls all the controls for the application. The reporting element visually depict the data in chars, status panes, notifications, and gas flow diagrams. All UI workflows and reporting elements are separate between native applications and updates to one application does not ripple into others. Controls are also separate, work on one product does not ripple into the others automatically. Embedding workflows without doubling maintenance requires restructuring the product specific software so that the workflow is pulled from a new "skinny UI". AXON would also reference this "skinny UI". The user could then run either the native product specific application or the workflow within AXON with no changes to workflow.

Some exemplary focal algorithms provided in various implementations include the following. Focus Quality Score: This quality score is applied to each image, with no history of previous scores. This score is reported in the lower indicator as both a numerical score and as a relative quotient. While there are default scoring metrics, users can also choose between the below scoring metrics through the Focus Assist setting "Focus Score Algorithm". Each algorithm has benefits for specific imaging conditions and samples: Default: STEM Mode: Norm Variance 2; and, TEM Mode: Inverse Gradient 2; Variance: Calculates the variance of the image by taking the sum of the squared differences from the mean after applying an image filter; Inverse Variance: A large number/Variance used for inverted profiles where a decreased variance is preferred; Norm Variance: Takes the variance and divides by the mean pixel intensity, normalizing for changes in overall intensity; Inverse Norm Variance: A large number/Norm Variance used for inverted profiles where a decreased norm variance is preferred; Norm Variance 2: Takes the variance and divides by the mean pixel intensity squared. Puts heavier emphasis on normalizing for changes in overall intensity, better handling groups of saturated pixels; Inverse Norm Variance 2: A large number/ Norm Variance 2, used for inverted profiles where decreased norm variance2 is preferred; Gradient: Calculates the gradient of the image by taking the square root of the sum of squares of the gradient matrix derived from the image after applying an image filter; Inverse Gradient: A large number/ gradient used for inverted profiles where decreased gradient is preferred; Gradient 2: Applies a second filter to the gradient score to enhance edges and decrease background impact; Inverse Gradient 2: A large number/gradient 2, used for inverted profiles where decreased gradient 2 is preferred; Laplacian: Laplacian is based on the square root of the sum of squares of the Laplacian matrix derived from the image; Inverse Laplacian: A large number/Laplacian used for inverted profiles where decreased Laplacian scores are preferred; Max Laplacian: Max of blurred Laplacian matrix; and, Inverse Max Laplacian: A large number/Max Laplacian used for inverted profiles where decreased Max Laplacian scores are preferred.

The control system can further provide for the normalization of the scale of these focus scores to make them more easily interpreted across different sample areas and magnifications. The control system can also operate to estimate the refocus points against the normalized scale. The control system can generate an autofocus or a refocus routine based on calibrations at each magnification of focus score and magnitude of Z change; this can advantageously allow for the focus to be found in as few moves as possible.

According to various embodiments of the presently disclosed subject matter, the control system can operate to keep a sample in focus through all corrections. The control system can also enable auto-focus of a region of interest through a visual control tool. The control system can further provide for constantly monitoring the focus of a primary region of interest through the experiment refocusing only when necessary. To accomplish this, the control system can operate to keep the same features in the field of view. The control system can provide for these re-focus points to be tunable via easy indicator handles, editable by the user, noting the focus envelope. The control system can provide for focus scores to be normalized and displayed on the graphical user display by the control system as an indicator in a bar shape or in a suitable other shape against an "ideal focus" so that the focus can be easily manipulated to over or under focus conditions.

In some embodiments, it is advantageous to use continuous adjustment of defocus over strategic refocus points. For continuous adjustment of defocus, the focus score is normalized by dividing the current focus score against the best score since the last template. New templates are used anytime the drift correction template is updated because the normalized focus scores need to be run on the same set of features. The normalized score and microscope calibrations set how far the defocus can be moved. The lower the score, the further the defocus can move; alternatively, the higher the score, the defocus adjustment tends closer to 0. This allows users to manually interact with the algorithm by improving on the sample and the increasing scores cannot result in meaningful movements. Any decreasing score gets factored into decisions to eventually reverse direction. To account for dynamic samples, the focus scores are morphed through a bump filter, but any other type of filter to bring the best ever score closer to the current score would work. Additionally, the normalized scores are filtered for image-to-image noise.

According to various embodiments of the presently disclosed subject matter, the control system can provide for the Z-axis control to be hierarchal using beam, piezo and stage control. Beam control is often called "defocus". The control system can further automatically pick the right positioner to move depending on the scale needed. The control system can further unwind all smaller movements back to 0 if needed. For example, if large movement is needed, the control system can move stage to correct position and zero out the piezo and beam. In one embodiment, an indicator can be used to show the beam position from neutral (preferred) with trigger points to start unwinding the beam back to neutral through stage or piezo moves. We do this in the software today for X, Y and Z.

The control system can provide for user specified limits to the "defocus" control so that the beam control does not negatively affect the image or introduce stigmation. This can also be the case for X, Y beam control if taken too far from alignment.

In various embodiments, calibrations may be used to improve performance of the drift correction and to insure accurate moves regardless of the application. For example, I some embodiments, the control system can use a sophisticated set of calibrations linking cameras, detectors, positioners, and the in-situ control parameters. The control system can also constantly monitor performance against these calibrations and could improve on the calibrations themselves. In one implementation, a calibration can be setup for each detector at each magnification for each positioner. These calibrations can help determine rotational offset, image timing and magnification focus envelopes. Each positioner can have a calibration where backlash, movement limits, and movement timing can be quantified. The control system can perform holder specific calibrations. For example, in one embodiment, the control system creates a "microscope profile" where a connection to the microscope as well as all its associated imaging systems is established. A single microscope could have different imaging environments and detectors, with each of them benefiting from a respective calibration. Each microscope profile can have a specific set of settings, positioner capabilities, and compatible imaging systems. The positioner capabilities can include, but are not limited to, the preferred movement range, total available range, resolution, hysteresis, minimum move time and move pace. Each positioner can be characterized—including TEM beam, STEM beam, stage, and piezo. Each positioner can be characterized in the X plane, Y plane, and Z plane and if/when applicable, in terms of alpha (x) tilt or beta (y) tilt as well. These capabilities can be characterized through automated test procedures or manual tests with manually entered values. Each compatible imaging system may require a specific set of coordinate transforms that characterizes the rotational offsets and nm/pixel deltas from the reported values from the TEM. These calibrations could be saved per imaging system, per detector, per camera, per positioner, and/or per magnification, among others. It is not mandatory to have a calibration available for each of the magnification levels; the control system can instead be configured or programmed to look for the closest calibrated magnification of a given positioner on a given imager run through that imaging system. Focus step size calibrations could be used to characterize how far to move the defocus, z stage, or z beam for given focus score from best capable or a filtered version of best capable. The focus calibrations can be organized per imaging system, per camera, per detector, per acceleration voltage, and per convergence angle per magnification, among others. It is not required to have a calibration at all magnifications and the control system could look for the closest calibrated magnification for that convergence angle, or that acceleration voltage.

The holder specific calibrations can help a user with an imaging origin, X, Y and Z, for a specific holder for easy navigation. Holder specific calibrations can also contain expected movement models such as, for example, a drift velocity associated with a temperature change of one degree Celsius, and ramp rate for heating or cooling holders. In one embodiment, heating can be combined with any other in-situ parameter, such as heating in gas or liquid. The control system can provide for these calibrations to be run each session; alternately, the control system can allow for the calibration values to be stored in a calibration database and checked against periodically.

According to various embodiments of the presently disclosed subject matter, the control system can automate experiments. The control system can also work seamlessly with user interruptions adapting to optimize the experiment. The control system can constantly measure the field of view, X, Y position of all positioners, Z position of all positioners, alpha and beta tilt of the holder and image refresh rate to flag any user interventions. The control system can then act appropriately to work with the user rather than against the user. For example, in one embodiment, X/Y drift correction can continue to run when the user changes the Z position and the focus can still be scored but may not auto-focus while the user is actively changing the Z position. X/Y changes of any positioner outside of expected vectors can likely mean that the user is interested in a new region of interest, whereby the control system can proceed to pause or halt drift correction. Image refresh rate, commonly a result of the user changing the dwell time in STEM or exposure time of the camera, may require changes to the in-situ stimulus, such as thermal ramp-rate, for example. to better correct for drift. The control system can provide for such changes to the in-situ stimulus. Alpha and beta tilt changes can warrant continued drift correction and auto-focus, and the control system can provide for such continued drift correction and auto-focus, as needed.

According to various embodiments of the presently disclosed subject matter, the control system can provide for triggering functions for the in-situ stimulus, microscope, camera, or detectors that can be activated in response to interruptions detected on the microscope. For example, the control system can operate to decrease or pause a thermal ramp rate in-situ stimulus while the user is trying to manually bring the sample into focus.

According to various embodiments of the presently disclosed subject matter, the control system can provide feedback to attenuate in-situ control inputs such as current, temperature and flow rate, preventing the loss of the primary region of interest. MEMs technology enables very rapid changes to the sample environment, such as thermal ramps of 1000° C./ms, and these rapid changes could push the sample outside of the field of view. The max thermal ramp rate achievable while still running drift correction can be calculated by the control system from aspects such as the active field of view relative to the region of interest size, positioner timing, image update rate and expected drift rate. This attenuation can also be automated by the control system for specific instances where Z inflections are anticipated due to buckling of membranes. Drift correction in the X, Y axis may also be needed to overcome buckling because nanoscale buckling can also move in X, Y, not just up and down (i.e., not just in Z).

This may not be limited to heating environments. Various in-situ stimuluses such as mechanically probing, electrically probing, heating, cooling, pressure changes, or imaging the sample in a fluidic environment can enact sudden movements that need attenuation. The control system can advantageously provide for such attenuations.

According to various embodiments, the control system can further simplify the experiment by combining the relevant microscope control and sample stimulus into a single user interface.

It is to be noted that it is not a requirement to bring everything into a single user interface. Instead, communication methods can be setup between applications so that live analysis on the image or microscope parameter monitoring can issue commands to the in-situ control system. For example, a first application labeled AXON can analyze the live images from the microscope and issue pause/resume commands to the in-situ software. Anytime the digital registration exceeds a threshold (a sign that the physical corrections cannot keep up with the drift), the AXON application can issue a pause command to the in-situ application to pause the stimulus. Then, when the digital registration falls below a threshold, the AXON application can send the command to resume. Similarly, when the normalized focus score falls below a threshold (a sign that the sample is going out of focus), the AXON application can issue a pause command to the in-situ application, resuming once it rises above a threshold. Instead of issuing pause or resume commands, the AXON application can throttle the ramp-rate gradually until the physical corrections can keep up adequately. The AXON application can also recommend a ramp-rate for certain thermal experiments. The recommended ramp-rate value can be calculated from the measured image acquisition rate, field of view size, and some predictive behavior or characteristic associated with the heating system being used. The application can update this value according to actual behavior and the user can just command a target temperature and allow the AXON application to completely set and manage the ramp-rate. The control system can also issue pause commands to the in-situ software during unwinding of the beams or during certain microscope status changes. The control system can also be configured to stop an experiment depending on pressure changes in the TEM as a safety precaution.

In one embodiment, to help the user enable certain thermal ramp-rates, the control system can operate to show the user how the magnification, active detector size, pixel resolution, binning, dwell rate and exposure time affect the ability to drift correct. the control system can further help the user prioritize one or more camera/detector options, microscope setup, and in-situ stimulus to ensure a stable image within the capabilities of drift correction, helping the user prioritize certain settings and then automatically or guiding the user through the setup of other dependent settings. For example, the user can prioritize a pixel resolution, magnification and thermal ramp rate and the control system can operate to automatically pick a dwell rate or exposure time to enable the prioritized settings to keep the image stable and in the field of view during drift correction. Again, this could be applied by the control system can to any number of in-situ stimuluses such as pressure changes or any number of microscope parameters.

According to various embodiments of the presently disclosed subject matter, in addition to a primary experimental site, the control system can operate to use drift vectors to predict the location of a secondary or even many other imaging sites. Sample movement is often in the same direction across the active area on heating and cooling holders. Drift vectors applied at one region of interest can be applied by the control system to most of the active area. With beam and holder position control, the control system can allow for users to easily toggle between primary, secondary, and even tertiary sites during an experiment through a software user interface. These sample locations could be laid out in a map by the control system can for quick control and sites could be keyed as experimental controls to help quantify beam and dose effects on the sample. Sample sites can be a set of X, Y, Z coordinates; alternately, sample sites can be tied to feature recognition of the images.

According to various embodiments of the presently disclosed subject matter, to help automate experiments, the control system can develop triggering functions based from several noticed changes to the sample features, microscope conditions, in-situ stimulus source, or in-situ stimulus readings. the control system can further enable the user or other software to set triggers to the in-situ function or microscope settings based on image analysis. For example, the control system can decrease the temperature when a particle size exceeds a certain number of nanometers. Additionally, the control system can pause a ramp rate and increase camera acquisition rate when the EDS detector picks up a higher peak of a certain element.

According to various embodiments of the presently disclosed subject matter, drift correction of the image enables analysis of a specific feature, but triggers can be developed by the control system to incorporate multiple sites. For example, when particle size exceeds a certain number of nanometers, a high-resolution acquisition can be triggered by the control system for 2 or 3 predetermined locations—with all sites known to the control system due to the application of drift vectors.

According to various embodiments of the presently disclosed subject matter, the control system can also enable users or other software to set triggers to the electron microscope, camera or detector based on in-situ stimulus source or in-situ stimulus readings. For example, the acquisition rate of the camera could be sped up when the measured resistance of the sample exceeds a certain number of ohms. Additionally, certain detectors could be turned on or off by the control system when the sample temperature exceeds a specific temperature. An EELS or EDS measurement could be automatically triggered for a specific feature when the temperature of the sample reaches a predetermined temperature, and it can automatically turn off to protect the detector once the temperature exceeds that predetermined temperature. For example, in various embodiments, the control system can operate the trigger function in-situations including, for example, decreasing temperature when a particle speed exceeds a predetermined value; control temperature, ramp rate, gas environment, and a similar other attribute falls outside of a predetermined range of values; when particle size, number of particles, electron diffraction, image FFT, and similar other attribute falls outside of a predetermined range of values. The control system can also speed up acquisition rate when resistance of the sample exceeds a predefined value The control system can enable users to set triggers based on other attached equipment such as mass spectrometry, gas, or liquid chromatography, etc. The control system can set a trigger to cause an action such as adjustment the environment or temperature or taking an EELS measurement once the measured water concentration leaving the in-situ holder is less than 5 ppm, for example. This can advantageously remove the guesswork in many existing workflows and help the user automatically take the next step based on quantitative information. The triggers can be programmed through a software program such as Python scripting or other specific APIs or a full-blown software development kit.

According to various embodiments of the presently disclosed subject matter, the control system can provide many interfaces to help users or software develop these triggers. The control system can allow for experiments to be built in an in-UI (user interface) experiment builder, a visual programming language, a python or other easily accessed programming language or through specific APIs or a software development kit.

According to various embodiments of the presently disclosed subject matter, the control system may include a TEM holder having a current collection area (for example, a Faraday cup) to catch the electron beam and enable measurement of the beam current using an ammeter. To optimize current collection, the TEM holder may include design features to minimize electron backscatter, including use of materials with low atomic number, the use of materials with high electrical conductivity, and/or the use of apertures. The current collection area should be electrically isolated from the holder body to avoid leakage. The path from the current collection area to the ammeter should be very low resistance and electrically shielded to prevent interference or noise from the microscope or other electronics.

In addition to the current collection area, the TEM holder may include a through-hole to permit unobstructed passage of the electron beam to the camera or fluorescent screen to enable measurement of the beam area and beam current using the camera or screen.

Beam area measurements may be made through a various different techniques user varying degrees of automation and/or user involvement or input. Over the holder through-hole, the beam may be narrowed and centered over the camera where a software control system may calculate the beam area using machine vision. A pixel threshold may be used to isolate the area on the camera illuminated by the beam. Alternatively, the beam may be spread beyond the field of view and deflected a known distance until the software control system detects the beam edge. The beam area may be determined from three or more points along the beam edge. Alternatively, the beam area may be determined over the current collector vs over the through-hole. With an aperture of a known area placed over the current collector made from a material with a different backscatter coefficient, the current collector on the holder may be translated by the goniometer until the edge of the aperture intersects the beam. By monitoring the current while translating the holder, the measured current on the current collector will change when part of the beam is shadowed by the aperture. Beam area measurements are only relevant in TEM imaging and are not needed to profile STEM dose rates.

To facilitate collecting current through both the current collection area and the camera or fluorescent screen without removing the holder from the microscope, the current collection area and the through-hole should be in close proximity to one another so that translation of the holder using the goniometer can center the electron beam in both the through-hole and the current collection area.

To facilitate locating the center of the current collection area and the through-hole using an automated workflow, a fiducial mark may be included on the holder with a predetermined or known distance from the fiducial mark to the center of both areas. The fiducial mark may be located at the nominal x/y/z=0 of the goniometer. Once the fiducial mark is located, the goniometer may be automatically translated such that the beam is well-centered in either region.

A current calibration workflow consists of the following process, some or all of which may be automated. First, the fiducial mark is located on the holder to identify a known reference point. Next, the holder is translated to the center of the through-hole, and the beam current and beam area are measured and recorded on the camera/screen for a given set of microscope settings. Next, the holder is translated to the center of the current collection area, and the beam current for the same set of microscope settings is measured and recorded. Next, this process is repeated until pairs of current/area measurements for both areas have been made and recorded over the full range of microscope parameters.

Alternatively, similar measurements may be made for a subset of microscope parameters while the remaining points may be determined from interpolated or extrapolated data between or around the measured points.

All relevant microscope parameters impacting beam area and/or beam current, such as aperture size, intensity or brightness (the particular term used may vary by microscope manufacturer), and spot size, may be included in these measurements. A complete set of measurements may comprise a microscope calibration file such that the beam area and beam current is known for any microscope condition.

Comparing the beam current measured with the Faraday cup to the beam current measured with the camera or the fluorescent screen using this workflow allows for accurate determination of the screen or camera collection efficiency under all conditions. These numbers are usually provided by the microscope or camera manufacturer but are often incorrect and can vary over time. Thus, measured beam current can be correlated to beam current reported by a fluorescent screen or the camera across a range of microscope configurations to determine a correction factor such that a true beam current value can be determined for a value of fluorescent screen current or camera current for the defined configuration.

In later experiments, after the above-described calibration has been performed, the software control system may read the current microscope parameters is use for the experiment and use the stored measurements to calculate the electron dose rate and track the cumulative electron dose against the sample position and beam area. The control system may interpolate data between measured points to reflect the beam area and beam current as the microscope user changes parameters on the microscope mid-experiment. Users may take additional measurements with either the camera or the fluorescent screen during their later experiments that can be used to correct the calibrations that were run using the Faraday cup. Additionally, the control system may monitor the emission current to provide a correction factor against the beam current as the emission current degrades over the course of an experiment.

According to various embodiments of the presently disclosed subject matter, drift vectors applied by the control system to coordinate measurements can help realistically track any number of microscope parameters over time. The control system can combine measurements of real-time dose rate applied to a sample as a function of position on the sample and time, and logging of the cumulative dose (dose rate multiplied by time throughout the course of an imaging session) applied to the sample as a function of position. Dose rate can be calculated by the control system from the electron beam current divided by its area (beam diameter). Dose rate can alternately be measured directly by communicating with a faraday cup, a camera and/or a TEM directly. These beam parameters can be tracked by the control system for specific features or for the entire imaged area which may move due to microscope conditions, natural sample drift, and/or the in-situ stimulus.

Because beam damage is not always obvious from the image, the control system can provide for a method to display where the user has observed the sample and the amount of dose or dose rate imparted on the sample. According to various embodiments of the presently disclosed subject matter, the cumulative dose could, for example, be displayed graphically by the control system along with the sample image in the form of a heatmap that would adjust automatically as the sample position and magnification changes. This would indicate portions of the sample that had received relatively high dose vs. portions that received lower doses. Drift correction could also be applied to this heat map. Further, every X, Y coordinate can be registered according to drift vectors so that the measured dose rate or cumulative dose is tracked accurately for what is happening to each feature on the sample; otherwise, as it drifts, the measured coordinates can be for the wrong area. Further, maximum dose rate can be tracked by the control system can for that same area. A total cumulative dose applied can also be tracked by the control system.

According to one or more embodiments, the control system can further generate an automated report based on the registered movement, the applied in-situ stimulus, and/or the measured microscope parameters. According to one or more embodiments, the control system can allow a user to set an electron dose rate limit or cumulative dose for the sample under observation. The control system can further monitor that an electron dose rate does not exceed the electron dose rate limit.

The control system is further configured to calculate in real-time an electron dose rate as a function of a position of an electron microscope lens and time. The control system can use a chip or specific sample to measure the current generated by the beam at the sample location for improving on the reported dose and dose rate. This could represent one of the calibrations used by the control system.

Cumulative dose for a region of interest can be shown by the control system on the image to show the impact of dose on the sample as a function of time for beam-sensitive samples. Drift vectors can help register this heat map with the movement of specific features. This colored overlay of the field of view developed by the control system can instruct the user as to what parts of the sample have been exposed to a particular dose of radiation. With this information, a user can determine if the user needs to move to a different location or if the sample area is safe to continue imaging with the electron beam.

According to various embodiments, reports could be automated or built for the user to compare multiple sites for a given in-situ control or as a function of time. These reporting and graphical techniques provided by the control system can be used for beam conditions such as dose and dose rate; they can be also used for any microscope parameter measured by the software as well as in-situ measurement or stimulus.

According to various embodiments, the control system can also allow a user to set dose rate limits for a sample such that the dose rate cannot exceed a specified threshold value regardless of user inputs that can control the dose rate (beam current, beam size, magnification, and similar other parameters.) If a user changes any parameter that would cause the dose rate to exceed the threshold value, whether intentionally or not, the control system can operate to prevent or warn the user from exceeding the threshold value by limiting the parameters. This would advantageously allow the user to avoid excessive dose rates that can irreversibly damage the sample. These limits to protect the sample can be applied to other detectors, microscope parameters or the in-situ stimulus. Other mechanisms such as colors, counters, or on-screen indicators too can help the user keep track of the total accumulated dose and dose rates, both live and from the image metadata. A dose rate limit, or a dose budget, can be used in tomography applications to guide a user to only take a certain number of images given the instrument parameters and to ensure that the total dose to the sample remains under the dose budget.

According to various embodiments, by measuring and controlling the dose and dose rate, the control system can provide a user with the ability to quickly and quantifiably measure the impact of beam effects on sample shape, composition, density, electrical characteristics, etc. Users could quickly measure several reference sites with different doses/dose rates to quickly determine benchmark thresholds for these parameters, then image another site with dose/dose rate limits in place to ensure that beam damage is minimized under known-good conditions. A low-dose reference can be established by the control system to compare against sites that undergo more extensive or longer imaging With multiple sample sites, these references can be applied to other measured microscope parameters by the software or for other in-situ stimuluses. In addition, a matrix of conditions can be defined that adjust sample dose and dose rate. A thumbnail view can be presented to the user to evaluate visually where sample changes began occurring due to dose. FFTs and other calculations could be performed on each thumbnail to help identify sample changes as an effect of dose, and cross-correlation can be performed with a low-dose baseline and the amount of change scored or tagged for interpretation by the user.

In addition to setting electron dose limits and electron dose rate limits, the control system may also take steps to reduce the electron dose rate to the sample and therefore minimize electron dose if a limit is being approached. For example, in TEM mode, using the microscope electron dose calibration information, the spot size or intensity may be decreased to reduce the electron dose rate. Alternatively, in STEM mode, the dwell time may be reduced, or sparse/spot scanning techniques may be introduced to minimize electron dose.

Embodiments may also convert the electron dose from units of fluence (electrons/$Å^2$) to units of Grays, which represents the amount of energy deposited on the sample per unit mass (J/kg). To make this conversion, the composition of the sample must be determined. The composition may be known from prior experiments, or it may be determined through an analytical technique such as EDS. Providing the ability to convert units allows for more direct comparison of electron microscopy data with other correlative techniques such as x-ray microscopy and spectroscopy.

Embodiments may also convert the two-dimensional dose vs. area measurements into electron interaction volume data in three dimensions. The range and straggle of electrons as the electron beam interacts with a sample is a function of the sample composition and morphology as well as the electron beam energy and its angle of incidence. The interaction volume may be simulated and presented with electron dose data for samples where three-dimensional information may be particularly useful, such as liquid cells or multi-layer sample structures.

Embodiments can further provide for drift correction that combines a user specified region of interest (ROI), background drift and predictive behavior to track features in the electron microscope then commands positioners in the electron microscope to center and/or focus the ROI. Embodiments can further provide for predictive behavior that can include on-the-fly learning of the unique X, Y and Z movement of the specific E-chip and holder combination and applying this knowledge to determine where a sample might drift to. Embodiments can further provide for tracking pixel shifts over time to build drift velocity and acceleration vectors. Combining the expected behavior of in-situ holders to improve on those vectors. Embodiments can further provide for allowing the user to draw a region of interest and then commanding the microscope to center that ROI in the field of view. Alternatively having a pre-drawn ROI and allowing a user to command new center positions which move the sample or beam.

Embodiments can further provide for supporting multiple ROI on a single image stream. Embodiments can further provide for supporting a centering motion that is not actually the center of the FOV (field of view). Embodiments can further provide for using drift vectors or background drift and a reference template to determine a sample event for use as an internal or external flag. Embodiments can further provide for saving images to file or flagging key data sets. Embodiments can further provide for pause or slow in-situ stimuluses. Embodiments can further provide for updating the actual or indicated region of interest.

Embodiments can further provide for a hierarchal control of positioners. Automatically picking the correct positioner from either the stage, piezo, or beam depending on the size of the needed movement as well as the amount of movement left before preferable or hard limits. Embodiments can further automatically zero the finer positioner when moving coarser positioners. For example, when moving the mechanical stage, the piezo and beam deflectors can be set to zero and the total magnitude of the movement corrected with the mechanical stage. Moving the beam away from a neutral position can negatively impact the imaging. Accordingly, the control system can include indicators to bring attention to the beam position for X, Y, and Z. The user can set up the control system for "Automatic Unwinding" which can unwind the beam anytime it hits a trigger point on the indicator. Unwinding the beam forcefully moves the next coarser positioner and beam in opposite directions until the beam is neutralized—without the user losing the region of interest.

Embodiments can further provide for a user-set or automatic limits of beam position, including "defocus", to prevent unwanted stigmation. Embodiments can also provide for applying a digital correction on top of a physical correction and saving both image sets to file. Embodiments of the presently disclosed subject matter can additionally provide for saving raw images to file and saving consecutive images as movies, both corrected and not corrected.

The data review tool can provide further functionalities when the images are all physically and digitally corrected. The control system provides for a physically and digitally aligned image sequence to enable math and analysis applied to a single frame to be extrapolated across an entire image sequence. The control system can further provide for supporting statistics on a single sample site over time, plotting any metadata or derivations, intensity analysis, FFTs, and similar other statistics across multiple images to thereby provide for the ability to build a history of the analysis.

Focus control can further allow for continuous defocus adjustments scaled by a normalized focal score. The control system can allow for normalizing the focal score, morphing the normalization for changing samples and filter out noise. The control system can further allow for continuous defocus adjustments to be run along with user adjustments.

The effectiveness of the control system is further enhanced by the provision of tunable filters to morph the original registration template into the current live view, and the ability to completely reset this template strategically when a user changes FOV, imaging conditions, or similar other key items on the microscope.

The control system manages the image buffer across multiple sessions with files written to disk rather than held in memory. The control system further provides for scheduled or continuous cleanup of the buffer and further provides for the ability to export images from the session directory to other permanent drives. Some or all of these images can be held at a priority overriding the buffer cleanup. Users can tag images to override first-in-first-out buffer rules with processes to make sure that the rest of the buffer can still be managed without overwhelming the hard-drive space. The control system further includes indicators to show the size of the buffer and the size of the prioritized images. The control system can further operate to reduce overall data size of the buffer when running out of storage size. In order to reduce storage space, the control system operates to save only the changing pixels rather than entire image per frame and stitch them together in the live view; the control system also operates to bin down images where correlations are too similar, or the control system operates to store average pixels when correlation are similar. The control system also uses fast dwell times over a longer period of time with physical corrections to build live EDS maps of a sample site. The control system can further use similar workflows for EELs. The control system may save secondary sites at a lower magnification and may use the secondary site data to do more than just analyze beam effects. The control system can provide for automatically jumping between a specific sample site and a much lower magnification view of the sample to put the sample sites into perspective. The control system can also provide for automatically jumping between a set of sample sites and a much lower magnification view of the sample to put the sample sites into perspective. The control system further operates to enabling users in the AXON Notebook review tool, for example, to scrub through different sites and their macro view as a function of time to see relative changes.

The control system can also be configured such that dedicated services that run on specific machines are structured differently so that image processing could be done on the camera or microscope PCs rather than services that send images and information to the computing device on which the control system is executing.

The control system can save digitally registered and raw images together. The image buffer can be managed across multiple sessions with data files written to disk rather than held in memory. The control system can further allow for scheduled cleanup or continuous cleanup of the image buffer and the ability to export images from the session directory to other permanent drives.

According to one implementation, some images can be held at a priority status, overriding the buffer cleanup. The system can further provide users with the ability to tag images to override buffer cleanup based on first-in-first-out buffer rules with processes to make sure that the rest of the buffer can still be managed without overwhelming the hard-drive space. The system can further include indicators used to show the size of the buffer and the size of the prioritized images.

Embodiments can further provide for autofocus or refocus routine to find the ideal focus, normalization scale and refocus points in as few moves as possible. Embodiments can also provide for focus can be found in as few moves as possible based from a calibration of focus score and Z distance at each magnification. Embodiments can additionally provide for a visual focus control tool for electron microscopes built from a normalized focus score versus calculated ideal. Embodiments can also provide for user set refocus handles and further for over focus and under focus. Embodiments can also provide for ability to drag the actual focus on the normalized scale to easily over and under focus the sample. Embodiments can additionally provide for combining positioner, lens, and holder calibrations with actual behavior to improve direction and magnitude of commanded movements. Embodiments can further provide for monitoring X/Y position, Z position, alpha/beta tilt, and image refresh rate to flag any user interruptions. Embodiments can further provide for many variations of the decision matrix with the user during interruptions vs. against the user. Embodiments of the presently disclosed subject matter can further provide for tracking constant behavior of interruptions to improve on expected models. Embodiments can also provide for triggering new behavior on the in-situ control, microscope, camera, or detector from interruptions detected on the microscope. Embodiments can additionally provide for decreasing or pausing a thermal ramp rate when user is trying to manually bring the sample into focus by adjusting the defocus knob. Embodiments can further provide for automatic attenuation of in-situ control inputs such as ramp rate to prevent the loss of the primary ROI. Embodiments can provide for automatic attenuation of in-situ control inputs to overcome known performance of the control system such as film buckling at specific temperatures. Embodiments can further provide for a software algorithm that can calculate max ramp rate of the stimulus from the active field of view relative to ROI size, positioner timing, image update rate and expected drift rate.

Embodiments can provide for a software tool that can help users set the magnification, active detector size, pixel resolution, binning, dwell rate and/or exposure time to achieve specific thermal ramp rates. Embodiments of the presently disclosed subject matter can further provide for monitoring, controlling, and/or altering pressure changes or any stimulus change that could cause drift. Embodiments can additionally provide for allowing the user to prioritize one or more camera/detector options, microscope conditions, and in-situ stimulus to ensure a stable image within the capabilities of drift correction. Embodiments of the presently disclosed subject matter can further provide for helping the user prioritize certain settings and then automating the setup of other dependent settings. Embodiments can also provide for the user to prioritize a pixel resolution, magnification and thermal ramp rate and the software would automatically pick a dwell rate or exposure time to enable the prioritized settings to keep the image stable and in the FOV (field of view) during correction. Embodiments can further provide for applying drift vectors to predict the location of secondary or many other imaging sites and allowing users to easily toggle between sites.

Embodiments can further provide for an indicator to normalize drift rate and alert the user of when movement is slow enough for a high-resolution acquisition. Embodiments can allow for EDS or EELS spectral or maps to be taken of a sample that is moving due to thermal effects or simply the sample reaction itself. Though this method of drift correction that accounts for sample movement as well as sample changes, EDS maps can be realigned based on the drift corrected STEM data. EDS typically requires long exposures or the integration of many short exposures of the same sample area in order to accumulate enough signal to build a map or spectrum with sufficient signal to noise. Prior art solutions only allow for an exact cross correlation and digital realignment of frames that are moving, but this technique may not work for a sample that is moving too quickly, too far or is changing. The approach for drift correction described in this subject matter can allow for EDS data to be taken at intervals defined by the user, then realigned based on the simultaneous STEM images taken. Furthermore, the user can decide to integrate frames in order to build a higher signal to noise image stack. This new technique would allow for the creation of video clips using EDS maps that show the changing composition of a sample through time. The same technique could be done using EELS maps assuming a suitable simultaneous TEM image for drift correction could be acquired.

Embodiments can further provide for enabling the user to set triggers to the in-situ function based on image analysis and subsequently adjust the in-situ environment through control of the in-situ equipment. Embodiments can also provide for decrease temperature when particle size exceeds a predetermined size in nanometers. Embodiments can additionally provide for controlling any in-situ stimulus based on image analysis techniques of the acquired image through TEM or STEM. Embodiments can further provide for controlling temperature and/or ramp rate, gas environment, and similar other attributes based on particle size, number of particles, electron diffraction, image FFT, and similar other parameters.

Embodiments can provide for controlling any in in-situ stimulus based on other electron microscope column detectors including EDS (Energy Dispersive X-Ray Spectroscopy) and EELS (Electron Energy Loss Spectroscopy) and similar other techniques. Embodiments can further provide for controlling temperature and/or ramp rate, gas environment, etc. based on elemental ratio from EDS maps, reduction of a sample through EDS (Energy Dispersive X-Ray Spectroscopy) and EELS (Electron Energy Loss Spectroscopy) and similar other techniques. Embodiments can further provide for enabling the user or other software to set triggers to the electron microscope, camera or detector, other in-situ equipment based on in-situ stimulus readings. Embodiments further provide for speeding up acquisition rate when resistance of the sample exceeds a predetermined resistance value in ohms. Embodiments disclosed herein can further provide for pump-purge cycle routine until the total water concentration as read by an integrated mass spectrometer reads below a predefined valued, for example, <5 ppm. Embodiments can further provide for interfaces to help researchers build experiments and make custom triggers either through an in-UI (user interface) experiment builder, visual programming language, scripting language, a Python wrapper, a API (application programming interface), and/or a SDK (software development kit).

Embodiments can provide for tracking the total accumulated dose and maximum dose rate of a specific sample site to help users quantify beam damage of a site. Embodiments can further provide for a sample site to be a set of coordinates or features in the image tracked by the control system. Embodiments can further provide for a heat map that sums the rectangular regions tracked by software to visualize the total accumulated dose and maximum dose rate of a wider field of view. Embodiments can also provide for a visualizer to compare beam effects for a single site or across multiple sites at specific times or for specific in-situ stimulus conditions. Embodiments can further provide for a heatmap for sample positions.

Embodiments can provide for an automatic report generator that compares sample sites for a given in-situ control or as a function of time. Embodiments can further provide for limits for dose, dose rate, other microscope parameters or in-situ stimulus. Embodiments can additionally provide for software tools to help the user avoid excessive stimulus to a region of interest. Embodiments can also provide for a software routine to allow the user to set the maximum total accumulated does or does rate and prohibits or warns the user when these limits are approaching or surpassed in each region. Embodiments can further provide for establishing a reference site to compare against sites that go through more rigorous imaging or in-situ environmental changes.

Figure 1B:
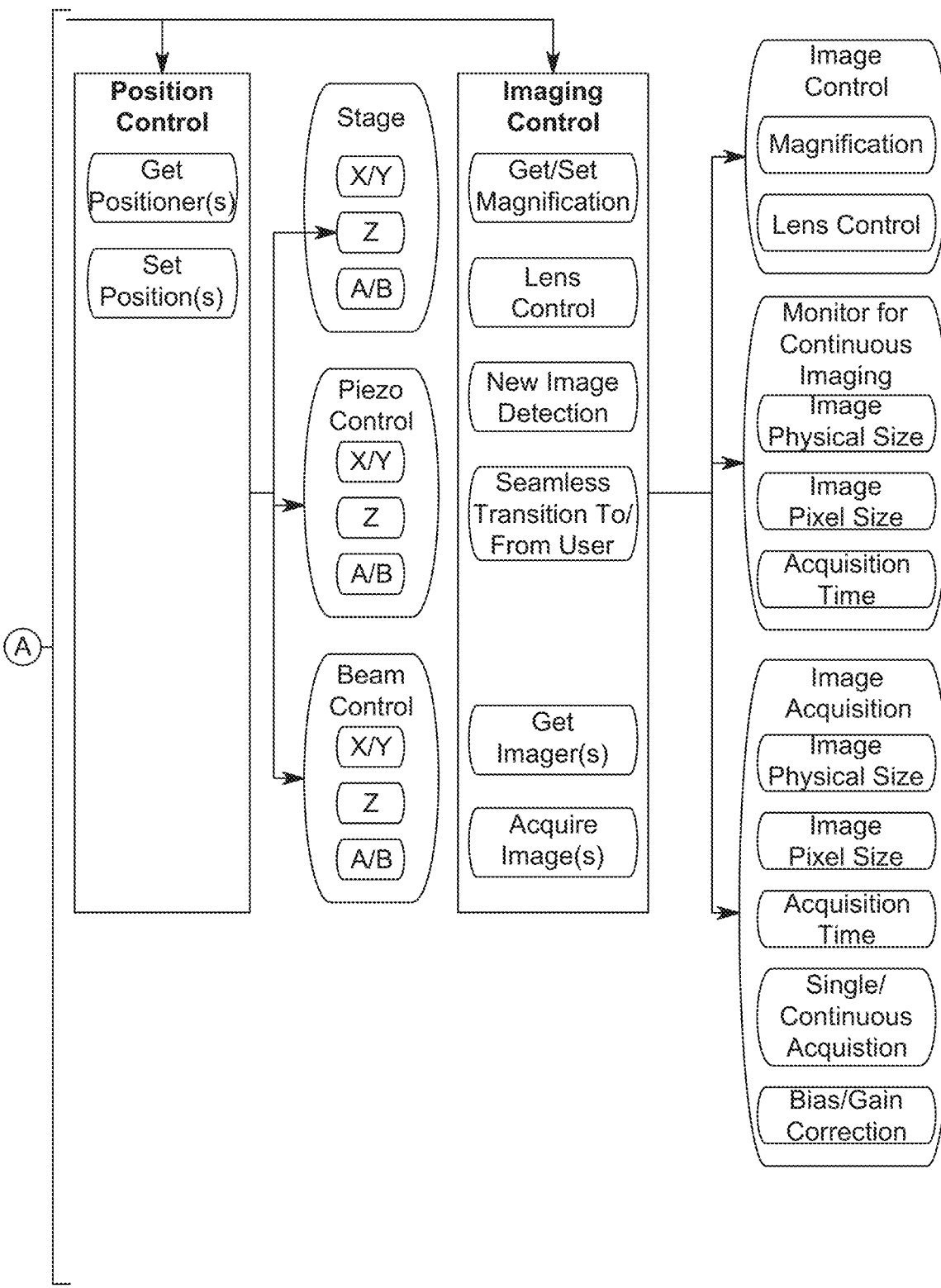

FIG. 1 is a schematic representation of drift correction that combines user specified ROI (region of interest), background drift, and predictive behavior to track features in the electron microscope then commands positioners in the electron microscope to center and/or focus the ROI, according to one or more embodiments of the presently disclosed subject matter. The smart drift correction module is communication with a position control module and an imaging control module. The position control module is configured to communicate with positioners, and further to adjust the setting of the positioners based on instructions received from the smart drift correction module. The imaging control module is configured to communicate with various aspects of imaging including acquiring images based on instructions received from the smart drift correction module.

Figure 2:
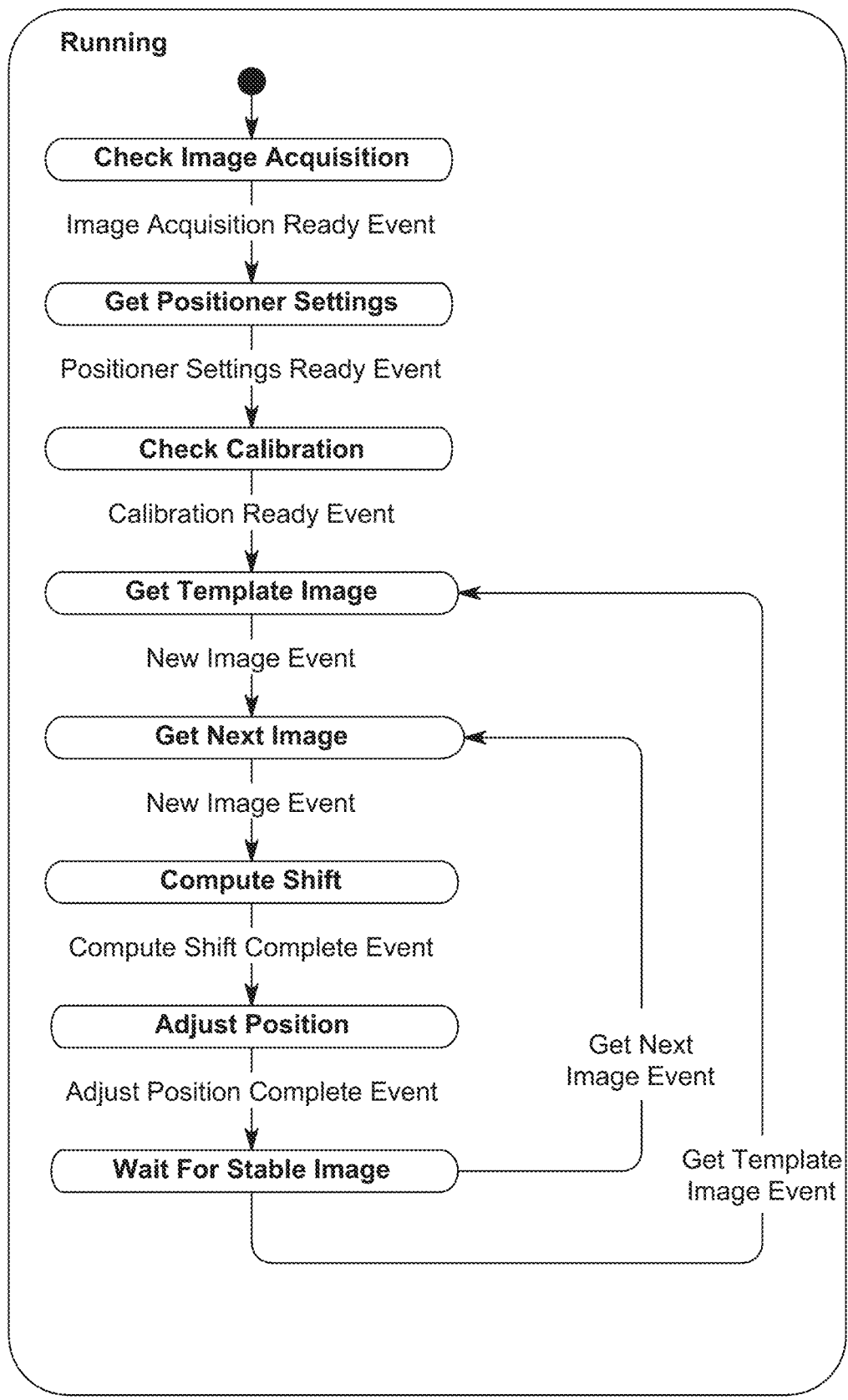
FIG. 2 is a schematic representation illustrating details of a reactive drift correction process by the control system, according to one or more embodiments of the presently disclosed subject matter.

FIG. 2 is a schematic representation showing the details of reactive drift correction, according to one or more embodiments of the presently disclosed subject matter. The steps of the reactive correction process proceed according to the flow chart illustrated in FIG. 2 according to at least one embodiment of the presently disclosed subject matter.

Figure 3A:
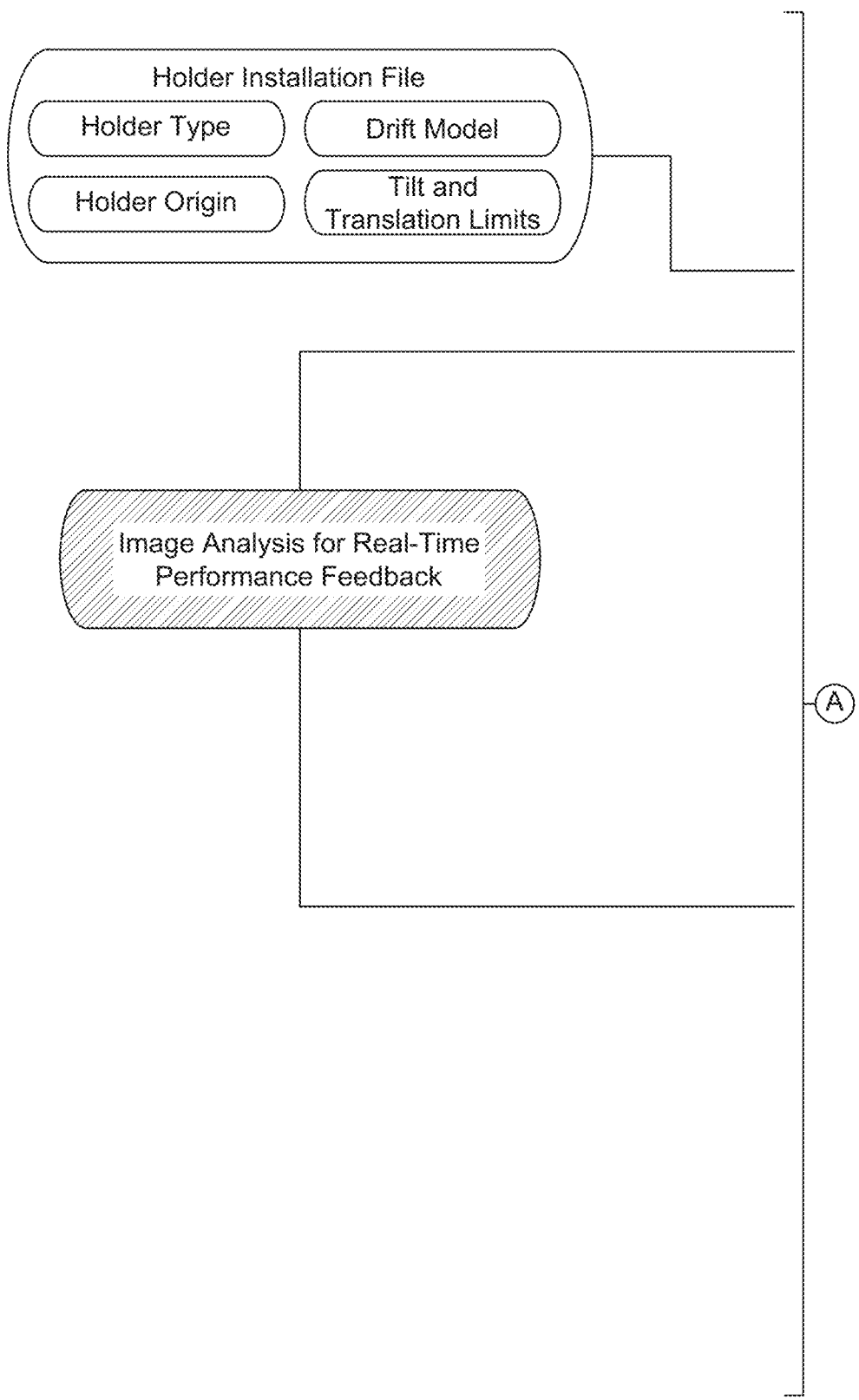
FIGS. 3A and 3B are schematic representations illustrating an on-the-fly learning by the control system of unique x, y and z axes movements of an E-chip and a holder in combination of predictive behavior of where the drift is expected to occur, according to one or more embodiments of the presently disclosed subject matter.
Figure 3B:
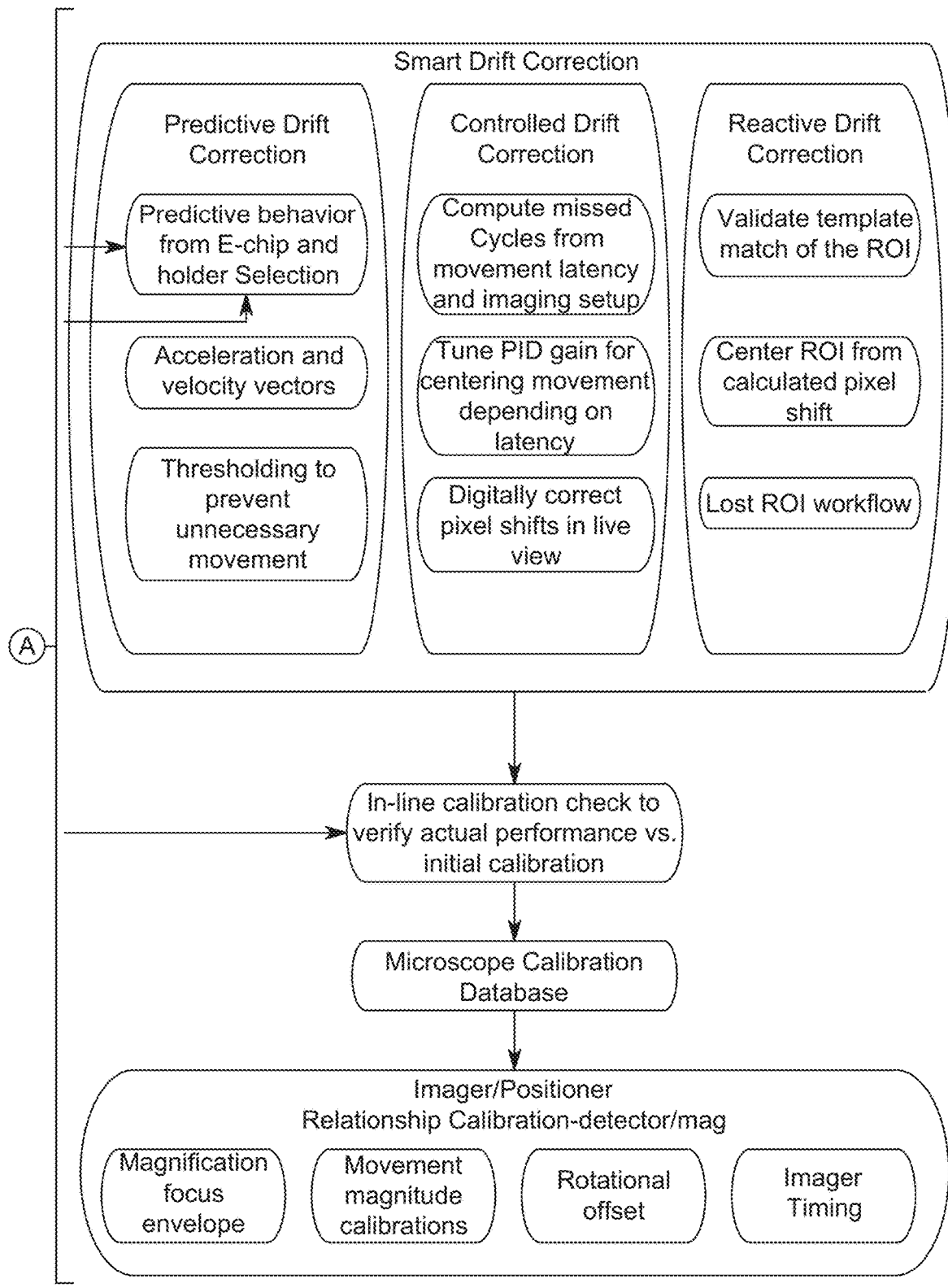
Figure 4:
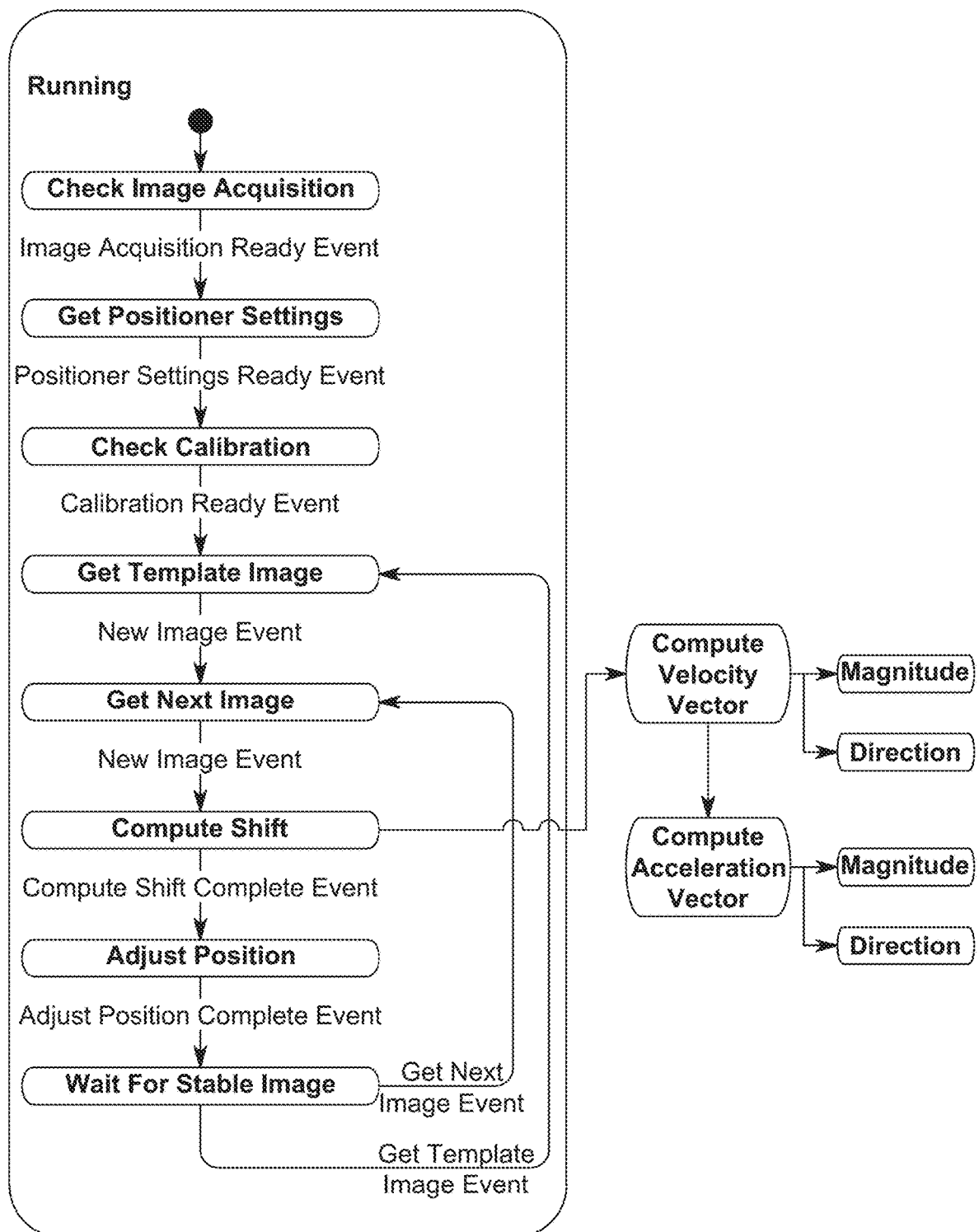
FIG. 4 is a schematic representation illustrating a module of the control system that tracks pixel shifts over time to build drift velocity and acceleration vectors, according to one or more embodiments of the presently disclosed subject matter.
Figure 5:
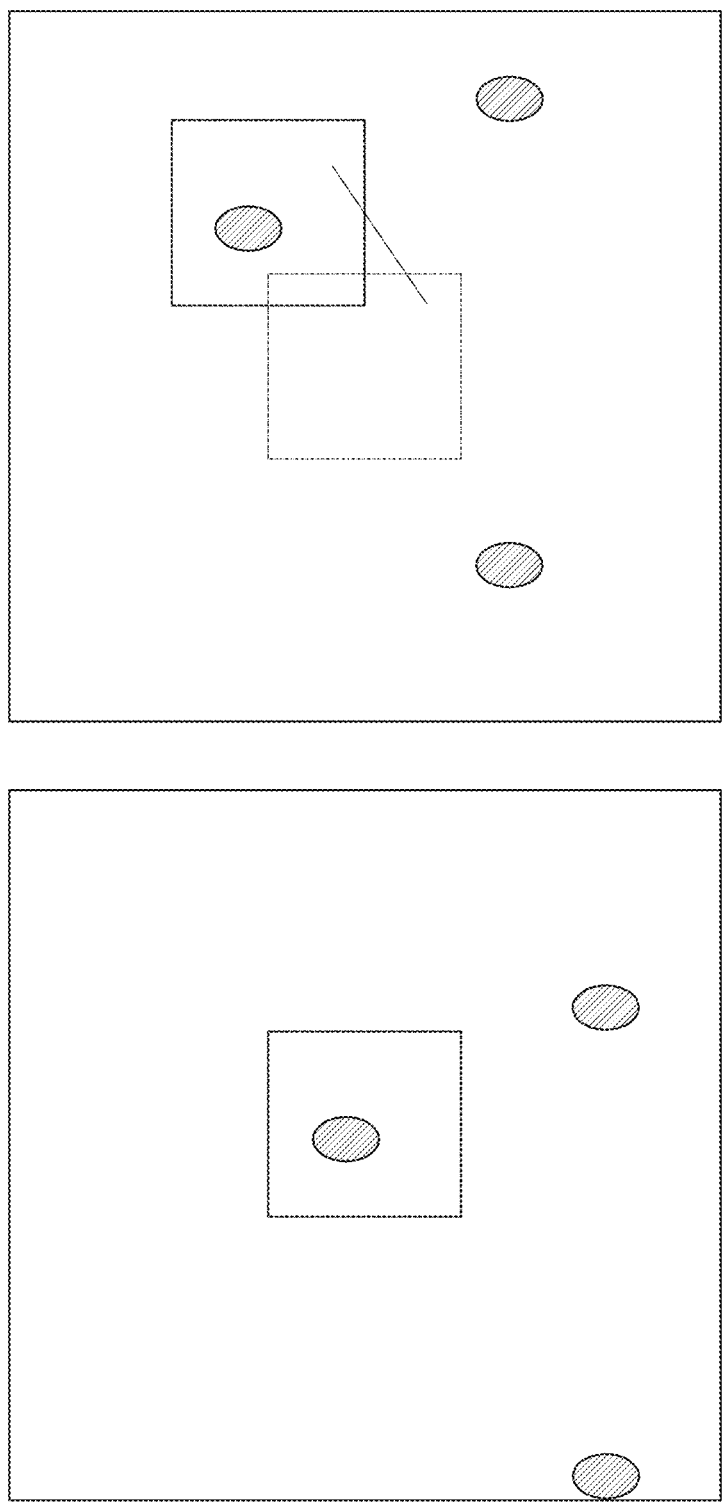
FIG. 5 is a graphical representation of a module that forms part of the control system that is configured to allow a user to select a region of interest by drawing and then command the electron microscope to move and center the ROI in the field of view, according to one or more embodiments of the presently disclosed subject matter.
Figure 6:
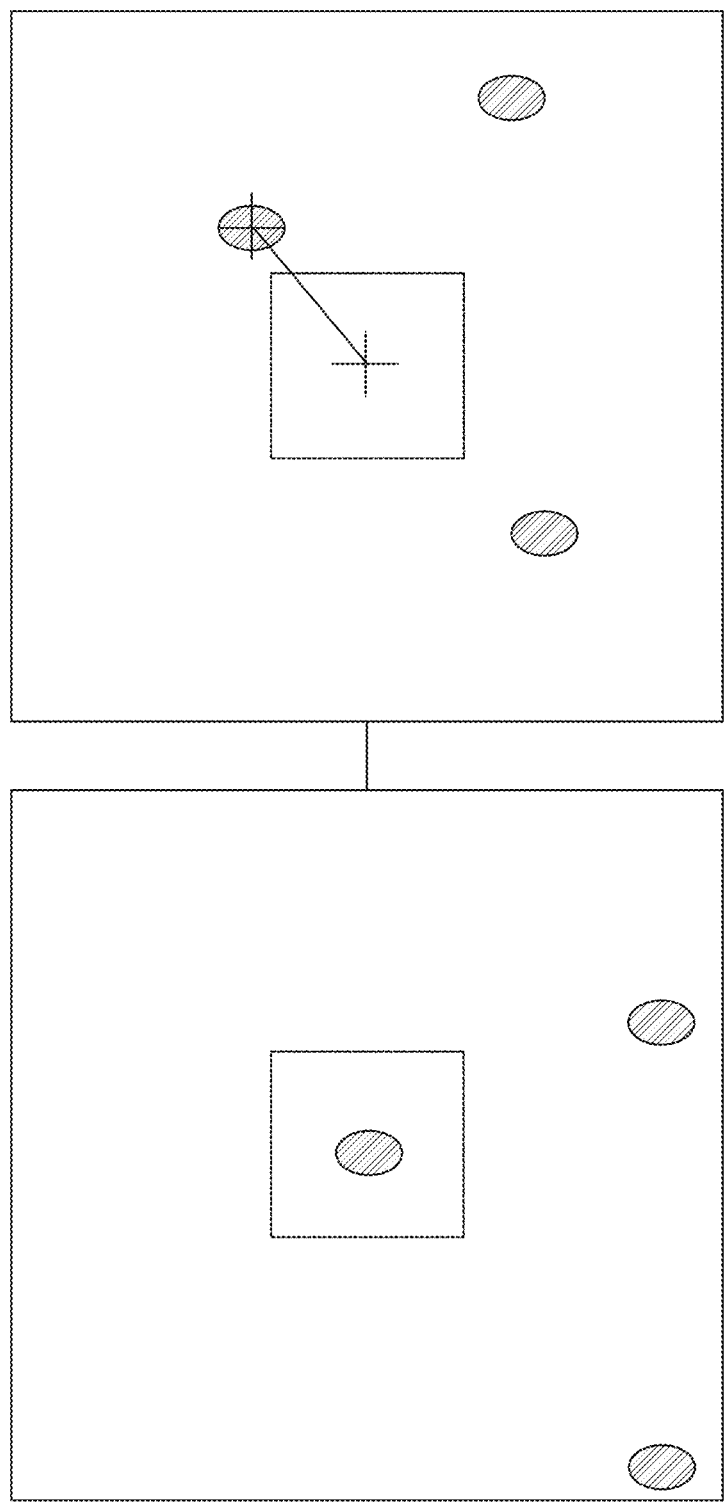
FIG. 6 is a graphical representation of a module that forms part of the control system having a pre-drawn ROI that is configured to allow a user to command a new center position, whereby the sample or beam is moved by the control system, according to one or more embodiments of the presently disclosed subject matter.
Figure 7:
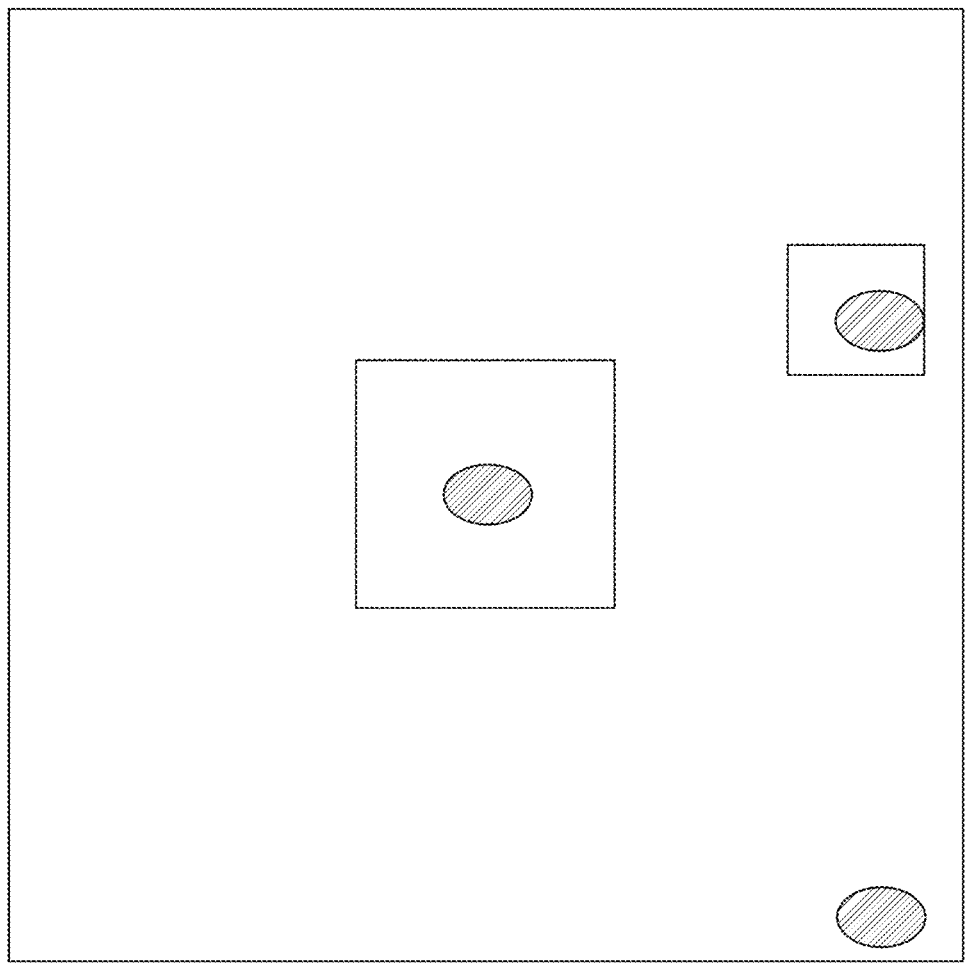
FIG. 7 is a graphical representation of a module that forms part of the control system that is configured to support multiple ROI on a single set of consecutive images, according to one or more embodiments of the presently disclosed subject matter.

FIG. 3 is a schematic representation showing on-the-fly learning of unique X, Y and Z movement of the E-chip and holder in combination of predictive behavior of where it may drift to enhance correction processes, according to one or more embodiments of the presently disclosed subject matter FIG. 4 is a schematic representation of software tracking pixel shifts over time to build drift velocity and acceleration vectors. Combining the expected behavior of in-situ holders to improve on those vectors, according to one or more embodiments of the presently disclosed subject matter.

Figure 8:
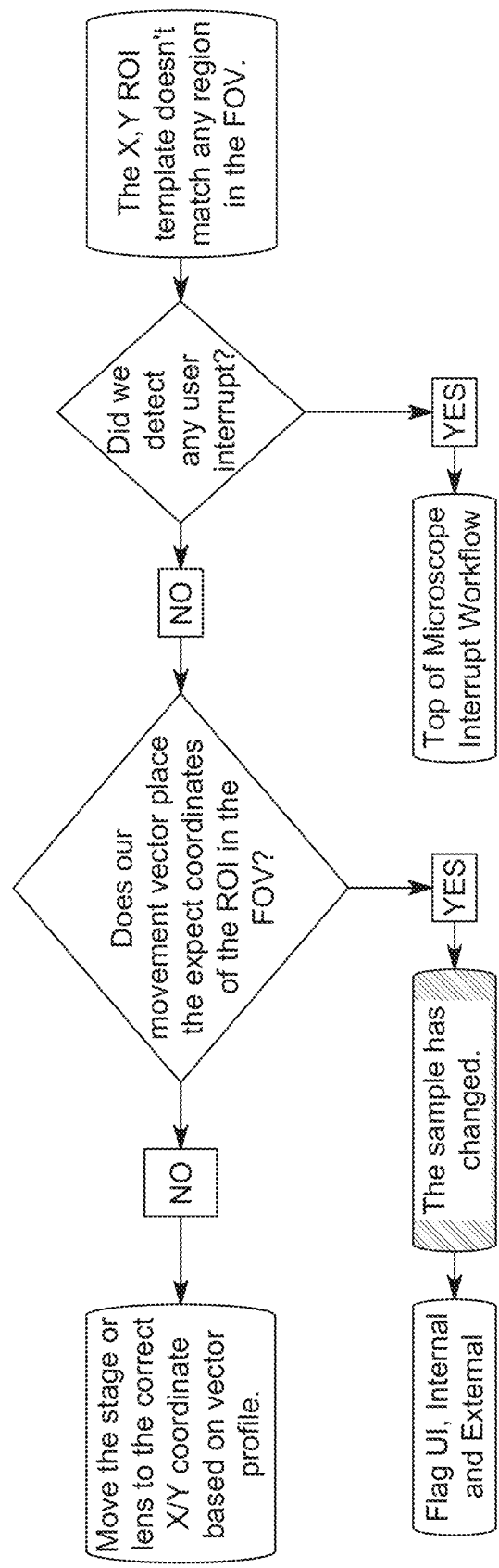
FIG. 8 is a flow chart wherein a module that forms part of the control system that uses drift vectors, background drift and/or a reference template to determine when a movement occurring within a sample, according to one or more embodiments of the presently disclosed subject matter.

FIG. 8 is a flow chart wherein a software module that forms part of the control system that uses drift vectors, background drift and/or a reference template to determine when a sample is changing, and using this information as an internal or external flag, according to one or more embodiments of the presently disclosed subject matter.

Figure 9:
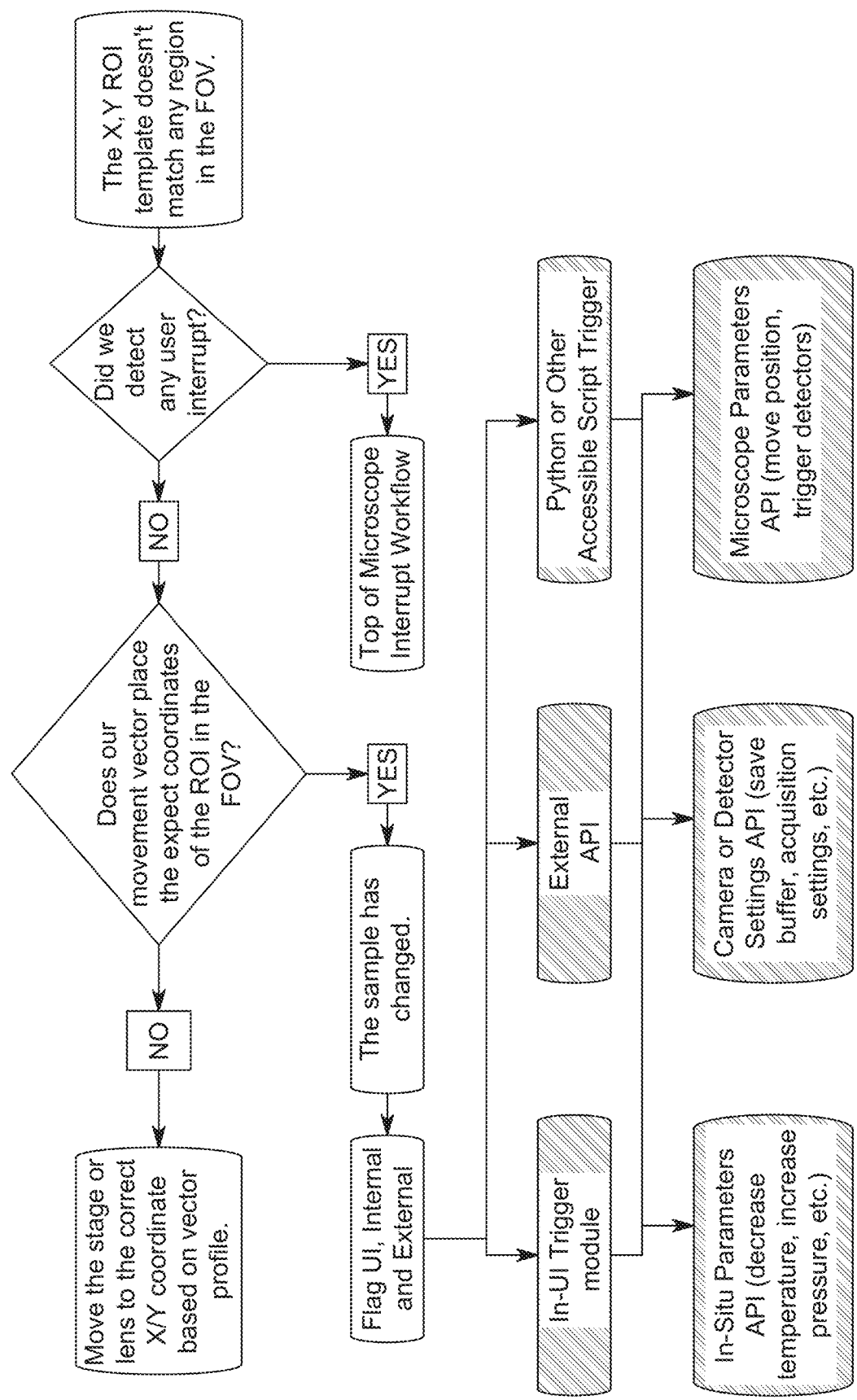
FIG. 9 is a flowchart illustration of a module that forms part of the control system that is configured to trigger to camera, detector, microscope, or in-situ, according to one or more embodiments of the presently disclosed subject matter.

FIG. 9 is a flowchart illustration of a software module that forms part of the control system that is configured to trigger to a camera, a detector, a microscope or in-situ. According to one or more embodiments of the presently disclosed subject matter, examples of trigger actions undertaken by this software module include pause or slow in-situ stimulus, save off imaging buffer, increase acquisition rate, or move position.

Figure 10A:
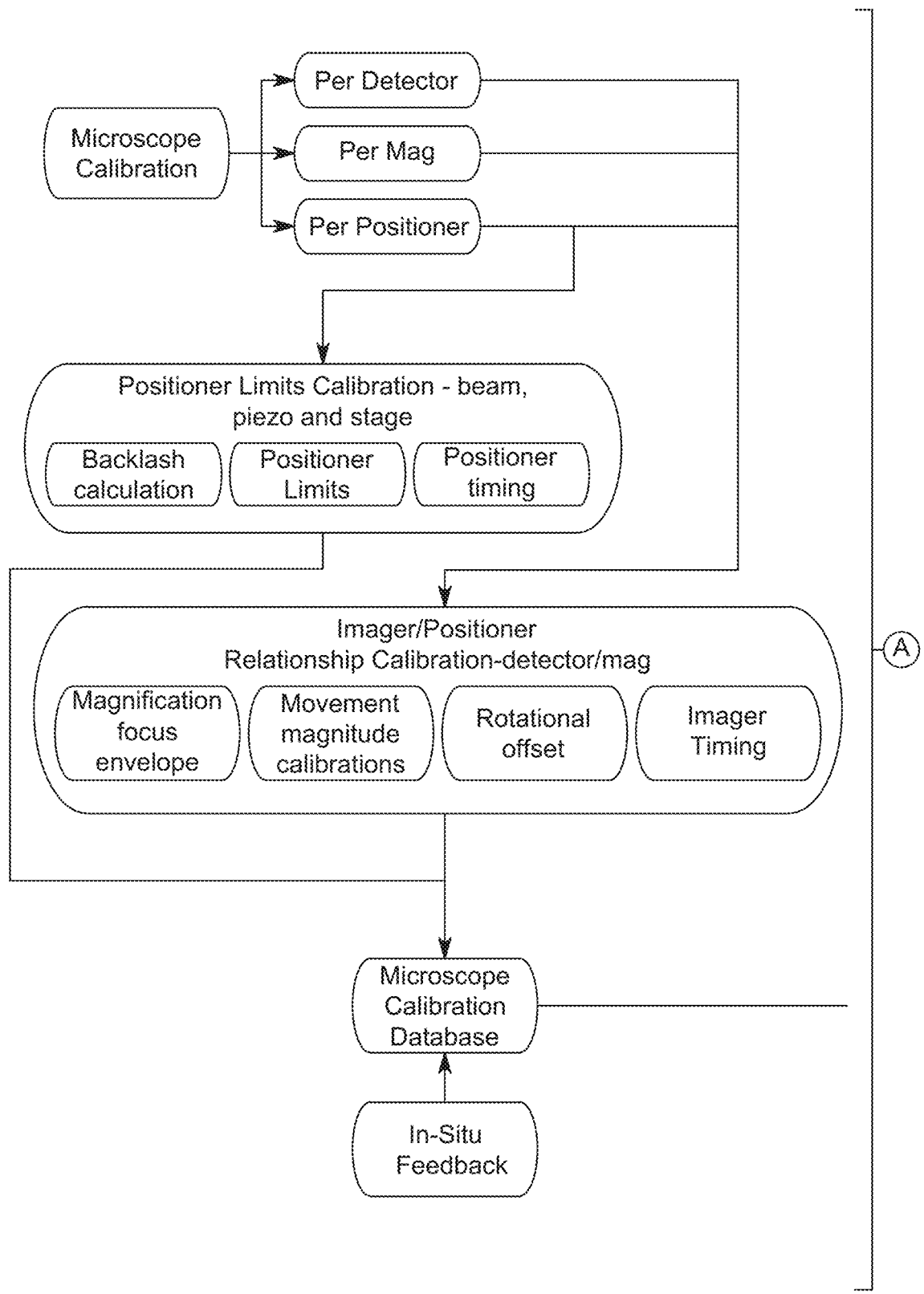
FIGS. 10A and 10B are a flowchart illustrating a module that forms part of the control system that is configured to use a hierarchal control of positioners, according to one or more embodiments of the presently disclosed subject matter.
Figure 10B:
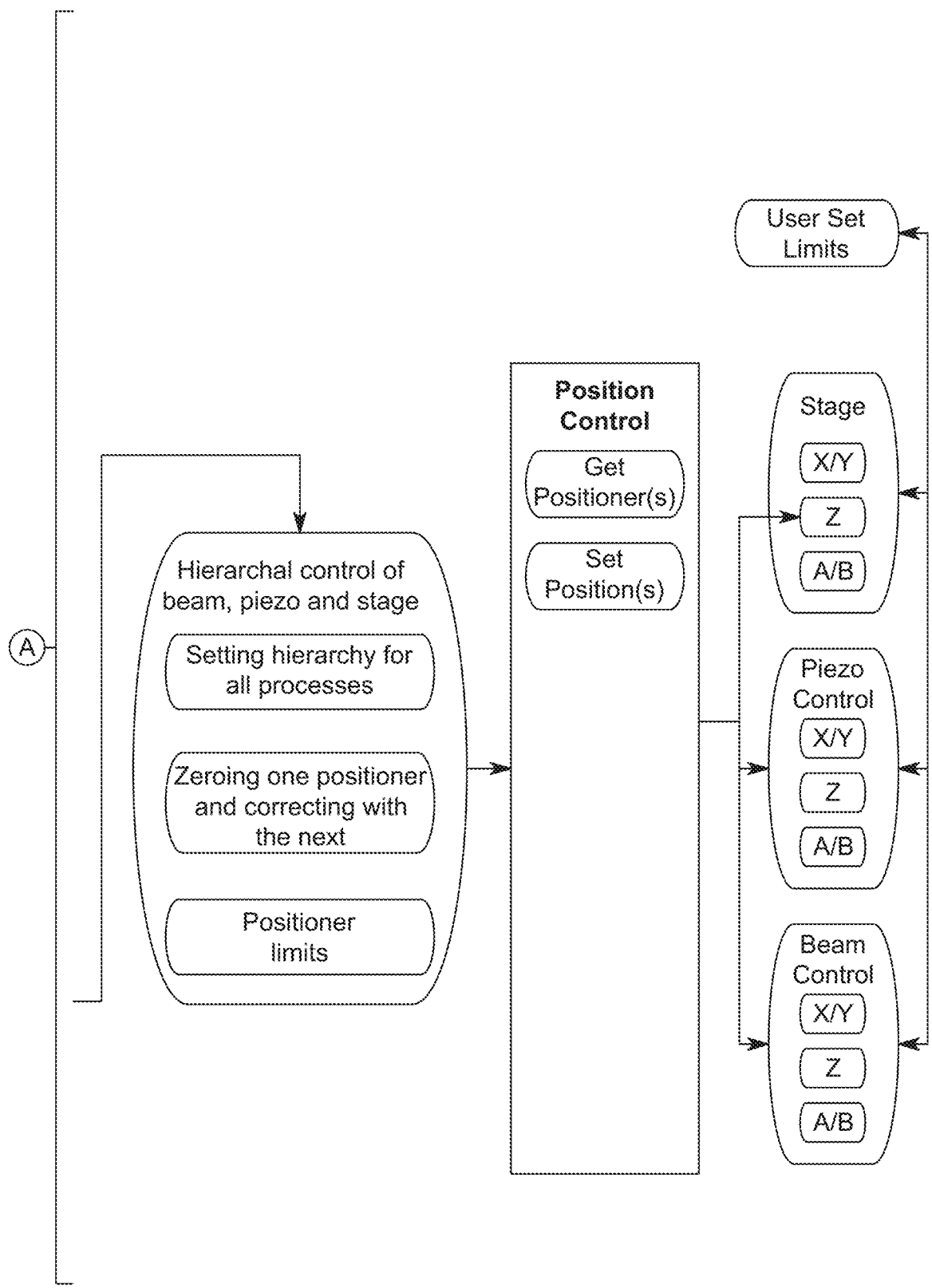

FIG. 10 is a flowchart illustrating software module that forms part of the control system using a hierarchal control of positioners, automatically picking the correct positioner from either the stage, piezo or beam depending on the size of the needed movement and the amount of movement left before preferable or hard limits, according to one or more embodiments of the presently disclosed subject matter.

Figure 11:
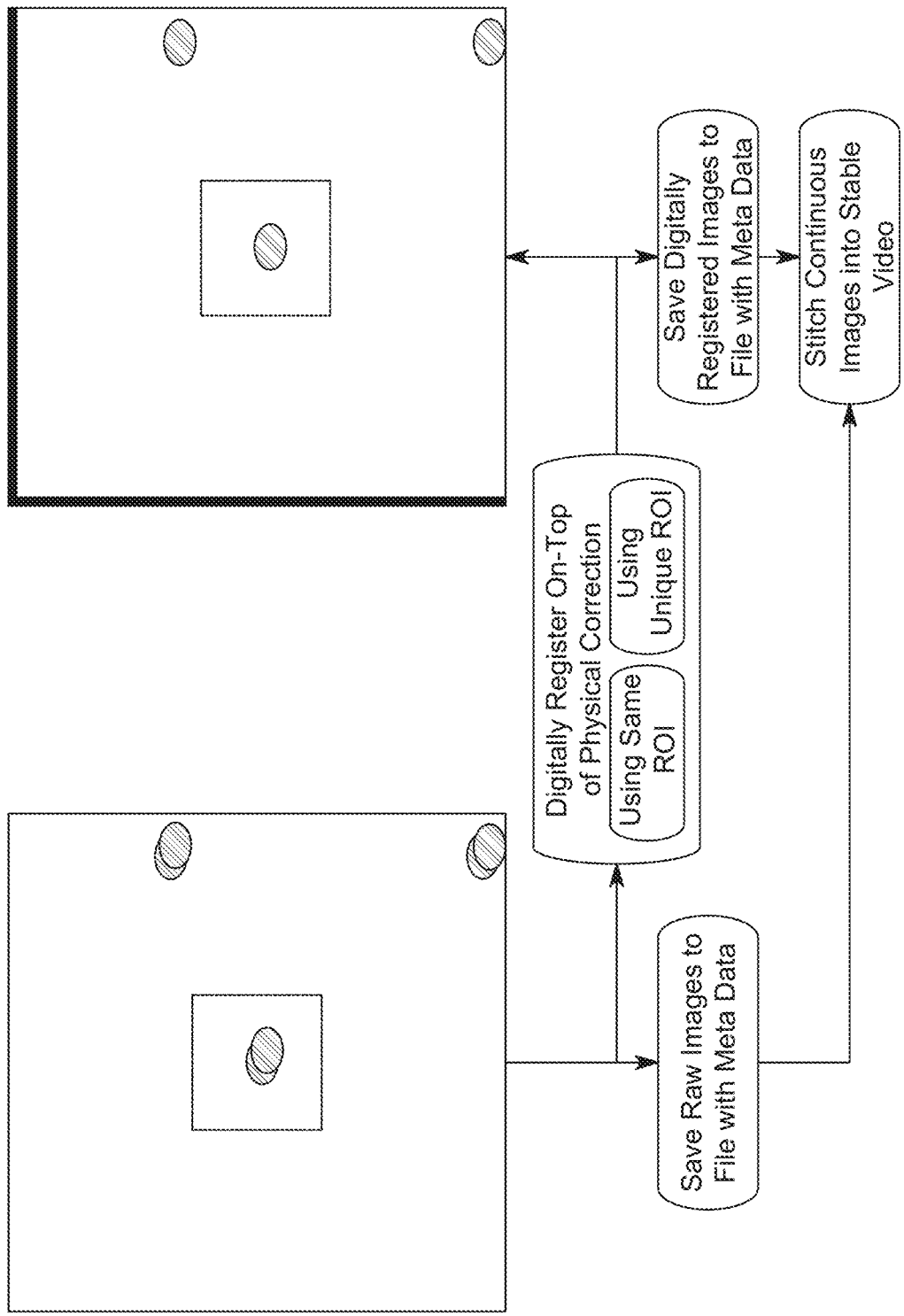
FIG. 11 is a graphical illustration of a module that forms part of the control system that is configured to apply a digital correction on top of a physical correction and saving consecutive images as movies, according to one or more embodiments of the presently disclosed subject matter.

FIG. 11 is a graphical illustration of software module that forms part of the control system. As illustrated in FIG. 11, the control system is configured for applying a digital correction on top of a physical correction and saving consecutive images as movies, both corrected and not corrected, according to one or more embodiments of the presently disclosed subject matter.

Figure 12A:
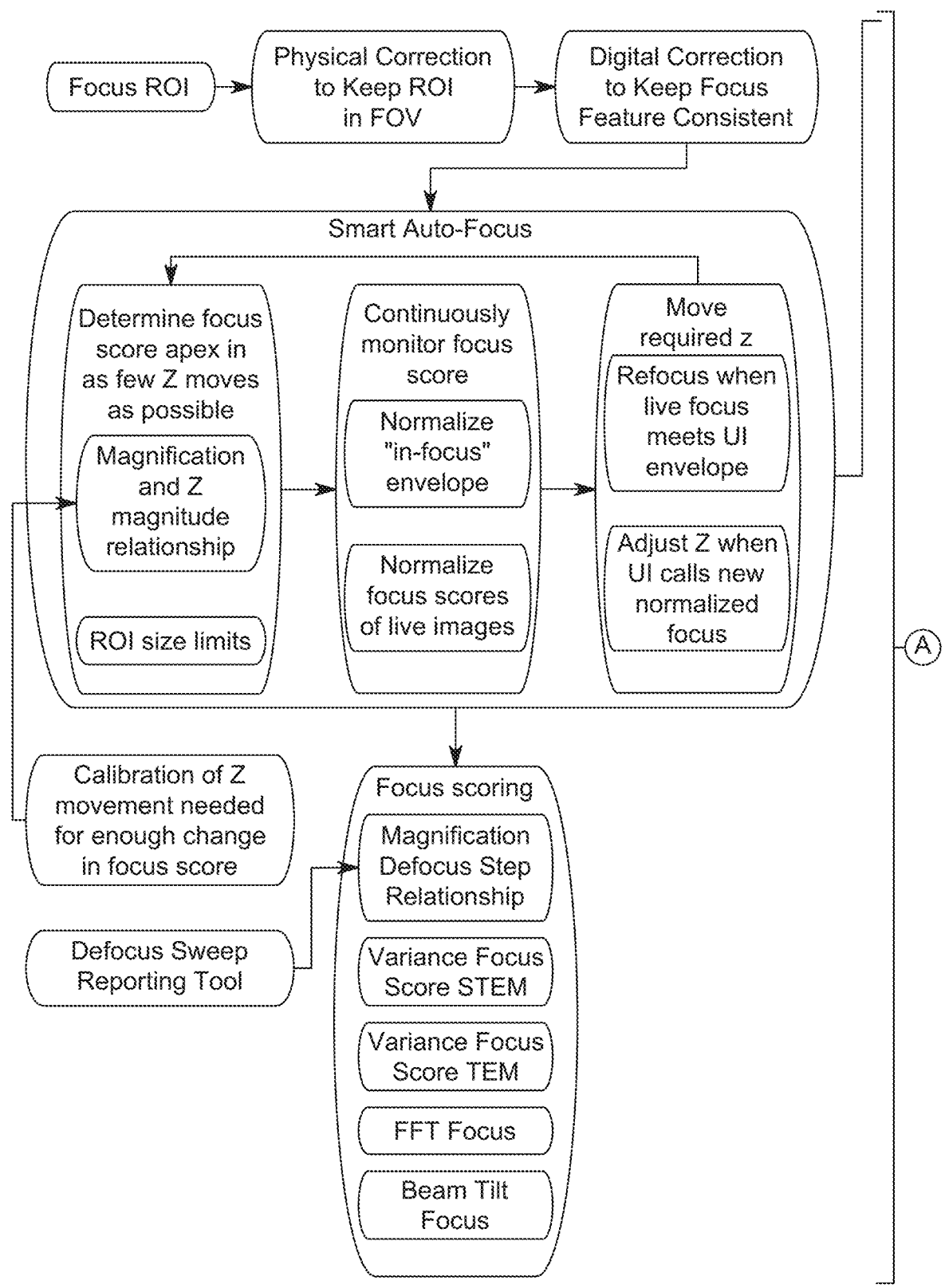
FIGS. 12A and 12B are a flow chart illustrating a module that forms part of the control system that is configured to run an autofocus or refocus routine to find the ideal focus, according to one or more embodiments of the presently disclosed subject matter.
Figure 12B:
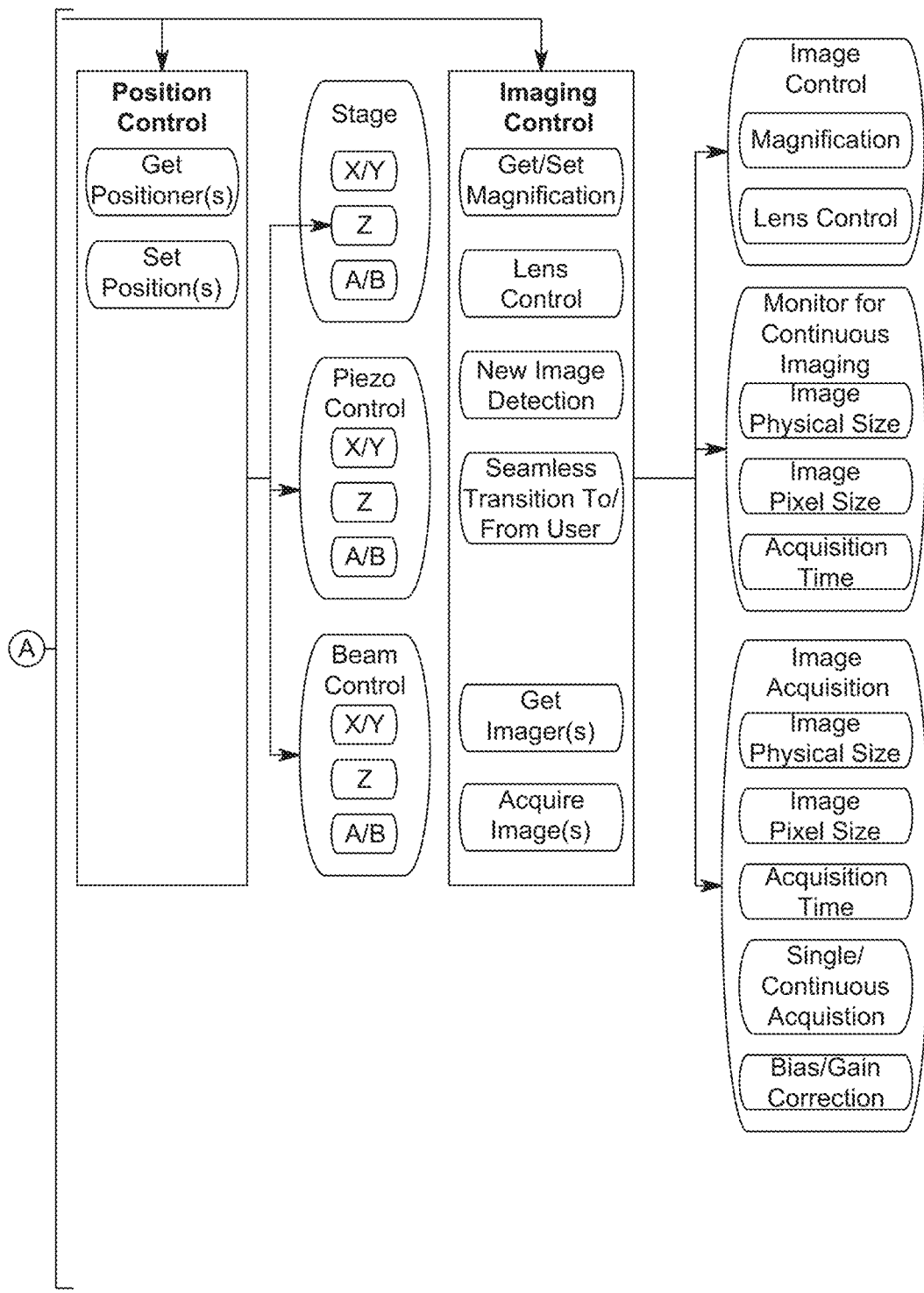
Figure 13:
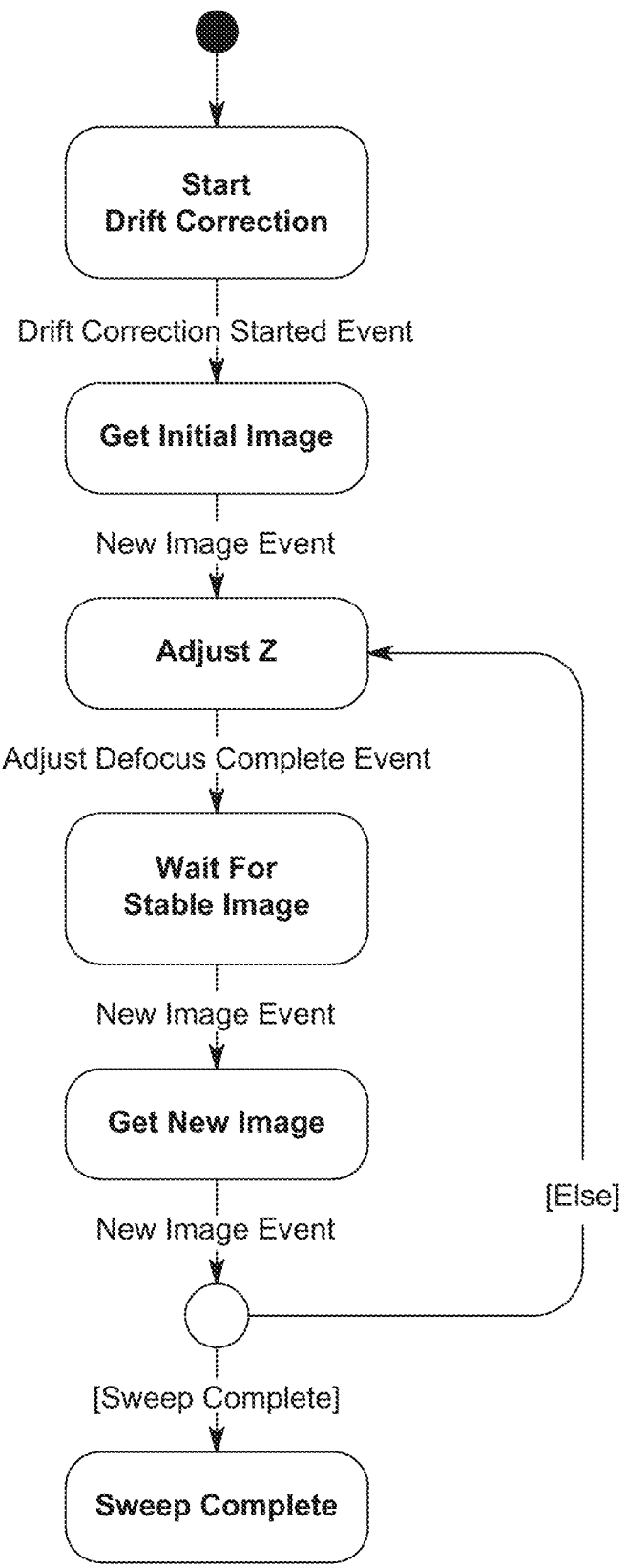
FIG. 13 is a flow chart illustrating a focus scoring sweep, according to one or more embodiments of the presently disclosed subject matter.

FIG. 12 is a flow chart illustrating software module that forms part of the control system running an autofocus or refocus routine to find the ideal focus, normalization scale and refocus points in as few moves as possible, according to one or more embodiments of the presently disclosed subject matter. FIG. 13 is a flow chart illustrating a focus scoring sweep, according to one or more embodiments of the presently disclosed subject matter.

Figure 14:
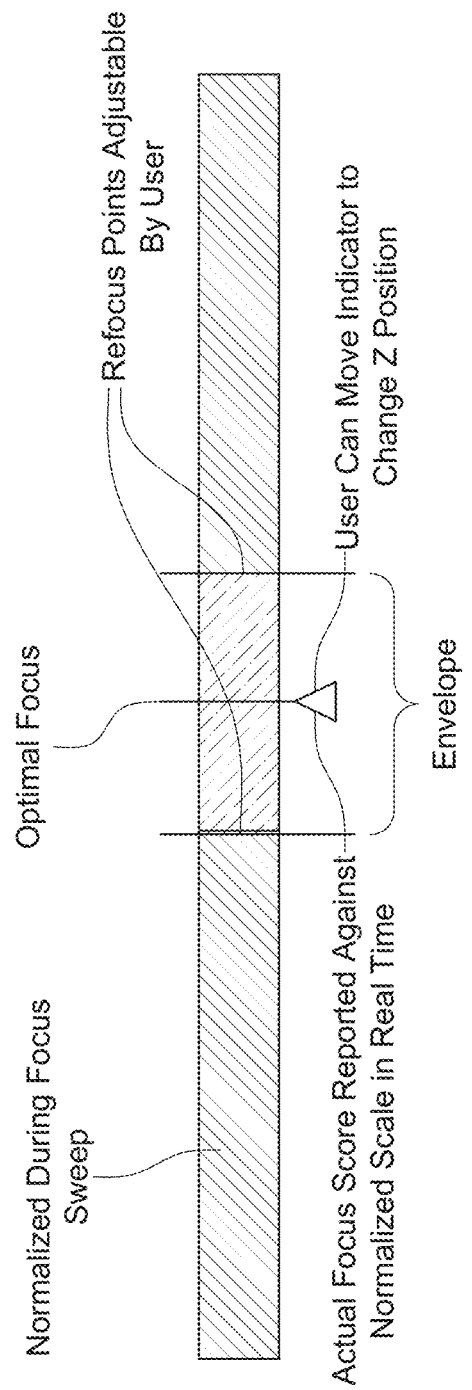
FIG. 14 is a graphical representation of a visual focus control tool for electron microscopes built from a normalized focus score versus calculated ideal with user set refocus handles, according to one or more embodiments of the presently disclosed subject matter.

FIG. 14 is a graphical representation of a visual focus control tool for electron microscopes built from a normalized focus score vs. calculated ideal with user set refocus handles and the ability to drag the actual focus against a normalized scale, over and under focused, according to one or more embodiments of the presently disclosed subject matter.

Figure 15A:
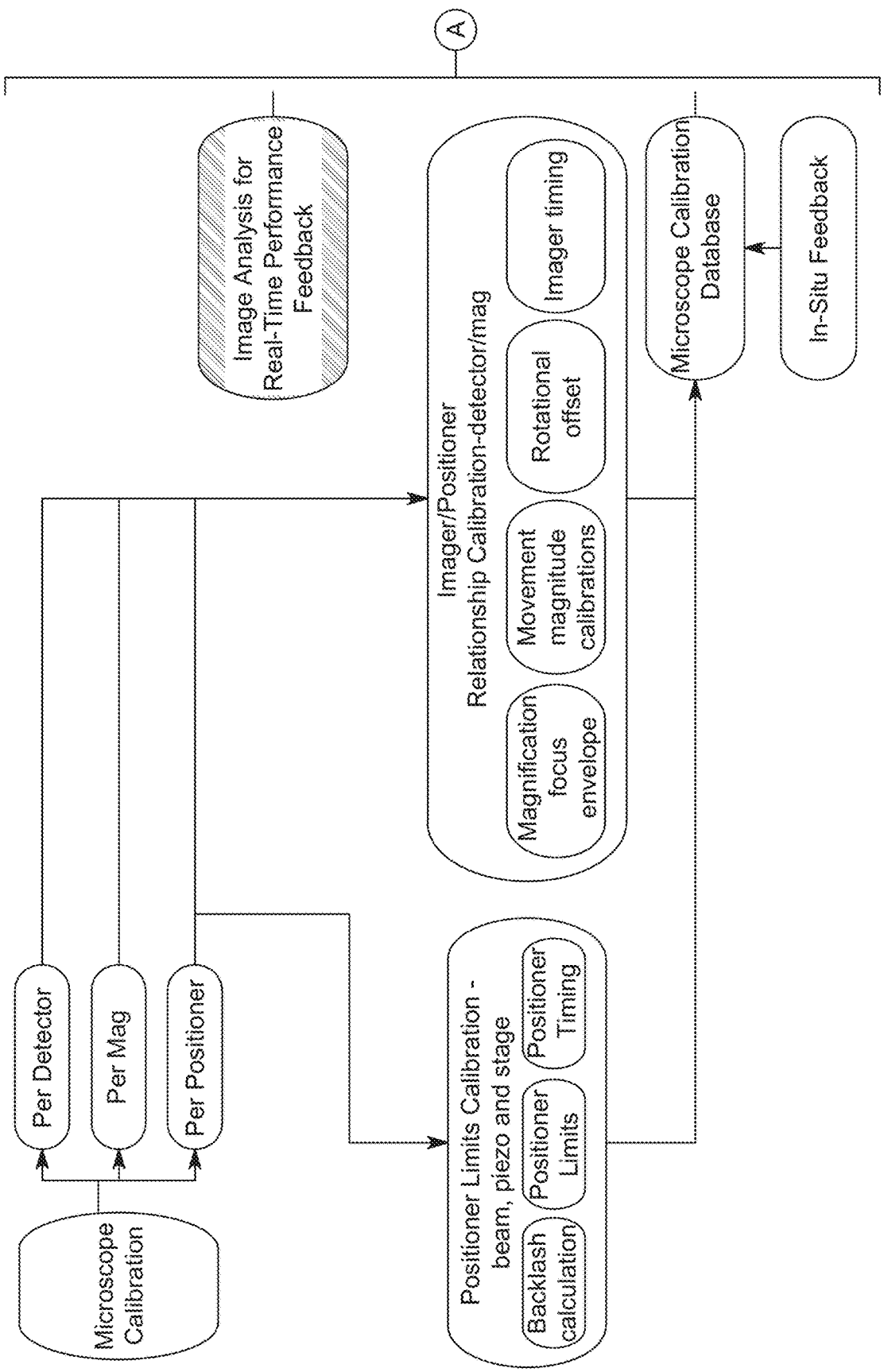
FIGS. 15A and 15B are a graphical illustration of a module that forms part of the control system that is configured to combine positioner, lens and holder calibrations with actual behavior to improve direction and magnitude of commanded movements, according to one or more embodiments of the presently disclosed subject matter.
Figure 15B:
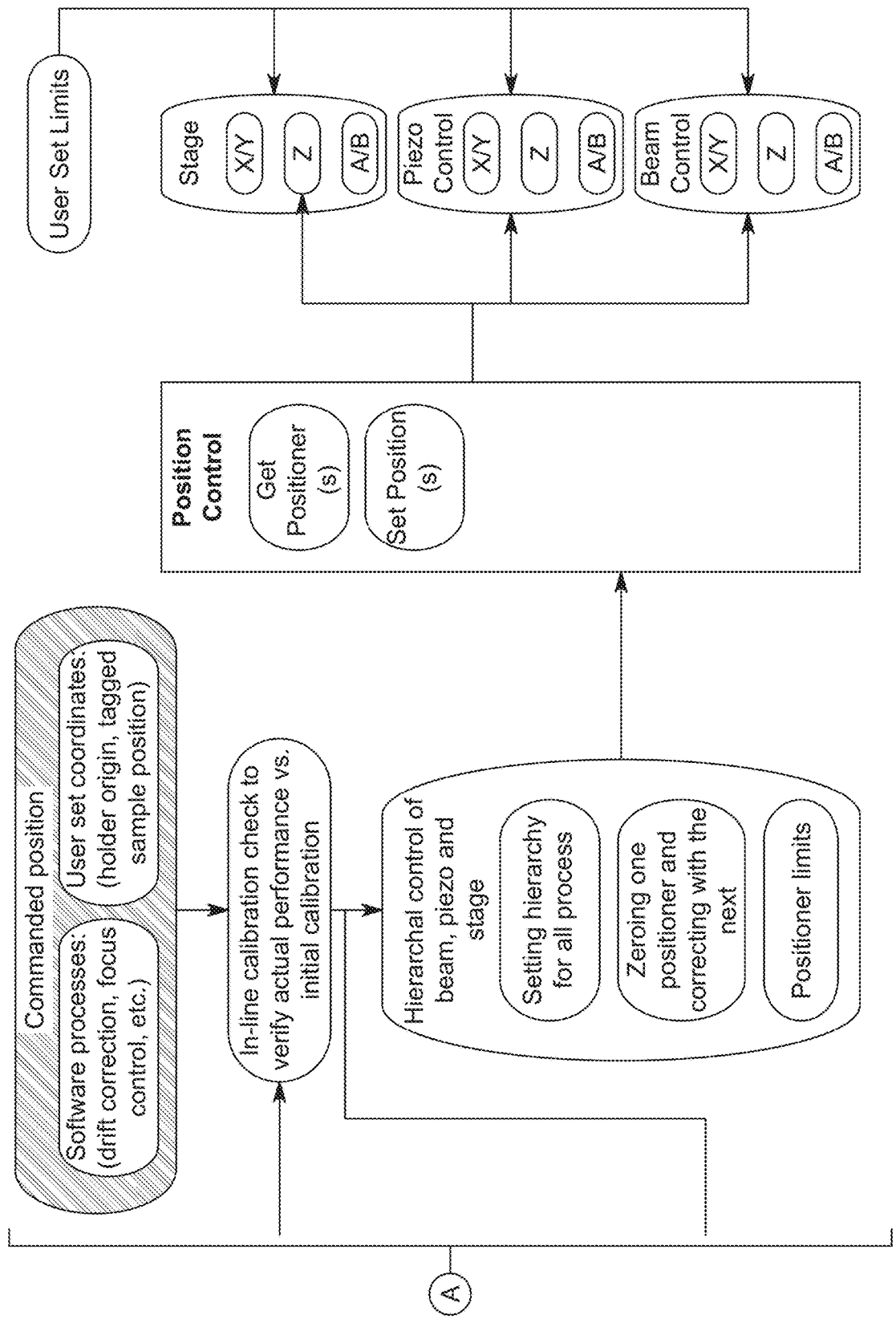

FIG. 15 is a software module that combines positioner, lens, and holder calibrations with actual behavior to improve direction and magnitude of commanded movements, according to one or more embodiments of the presently disclosed subject matter.

Figure 16A:
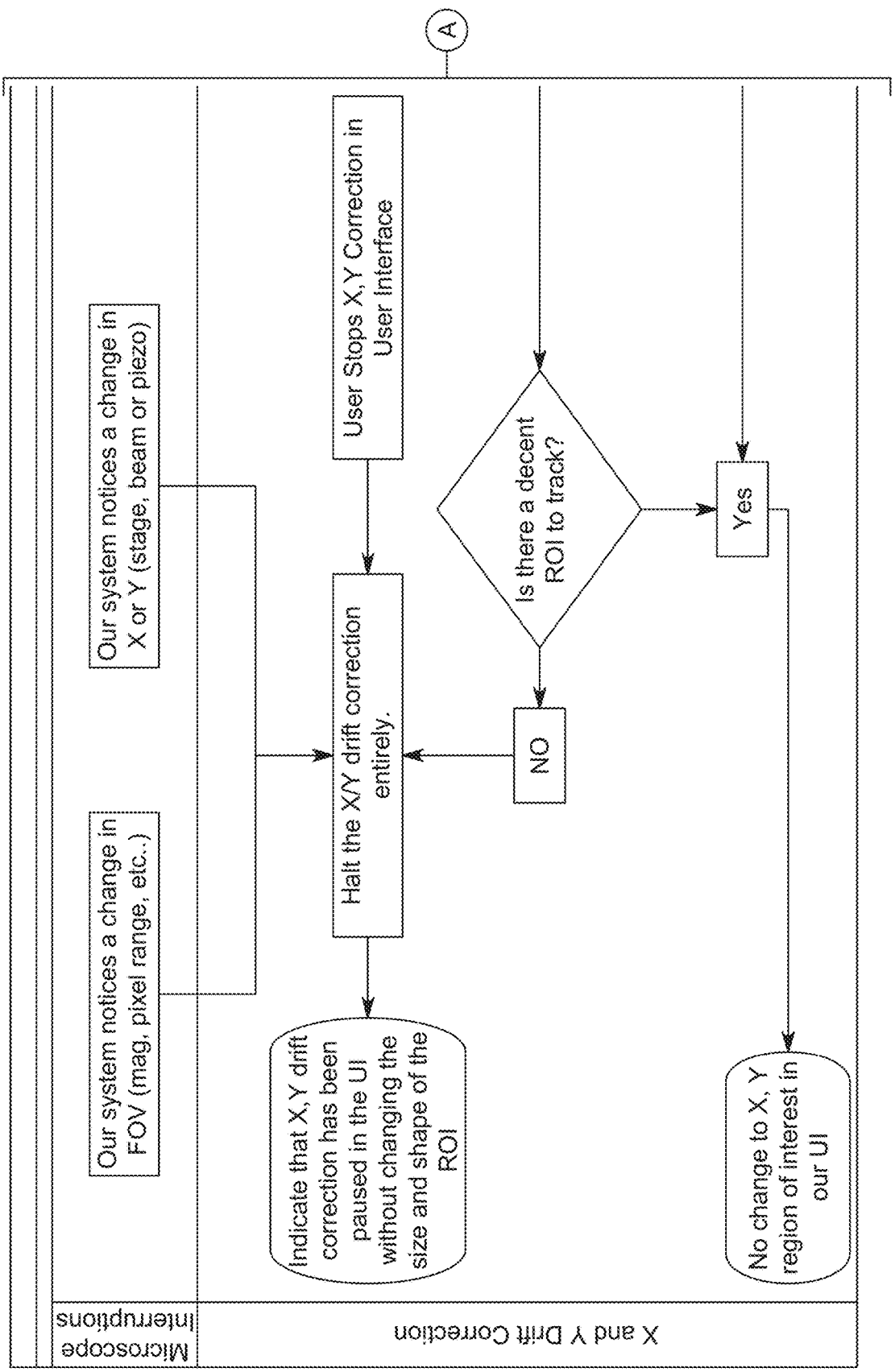
FIGS. 16A-16B, FIGS. 17A-B and FIGS. 18A-B are flowcharts related to a module that forms part of the control system that is configured to monitor x-axis, y-axis and z-axis positions, alpha/beta tilt, and image refresh rate to flag any user interruptions, according to one or more embodiments of the presently disclosed subject matter.
Figure 16B:
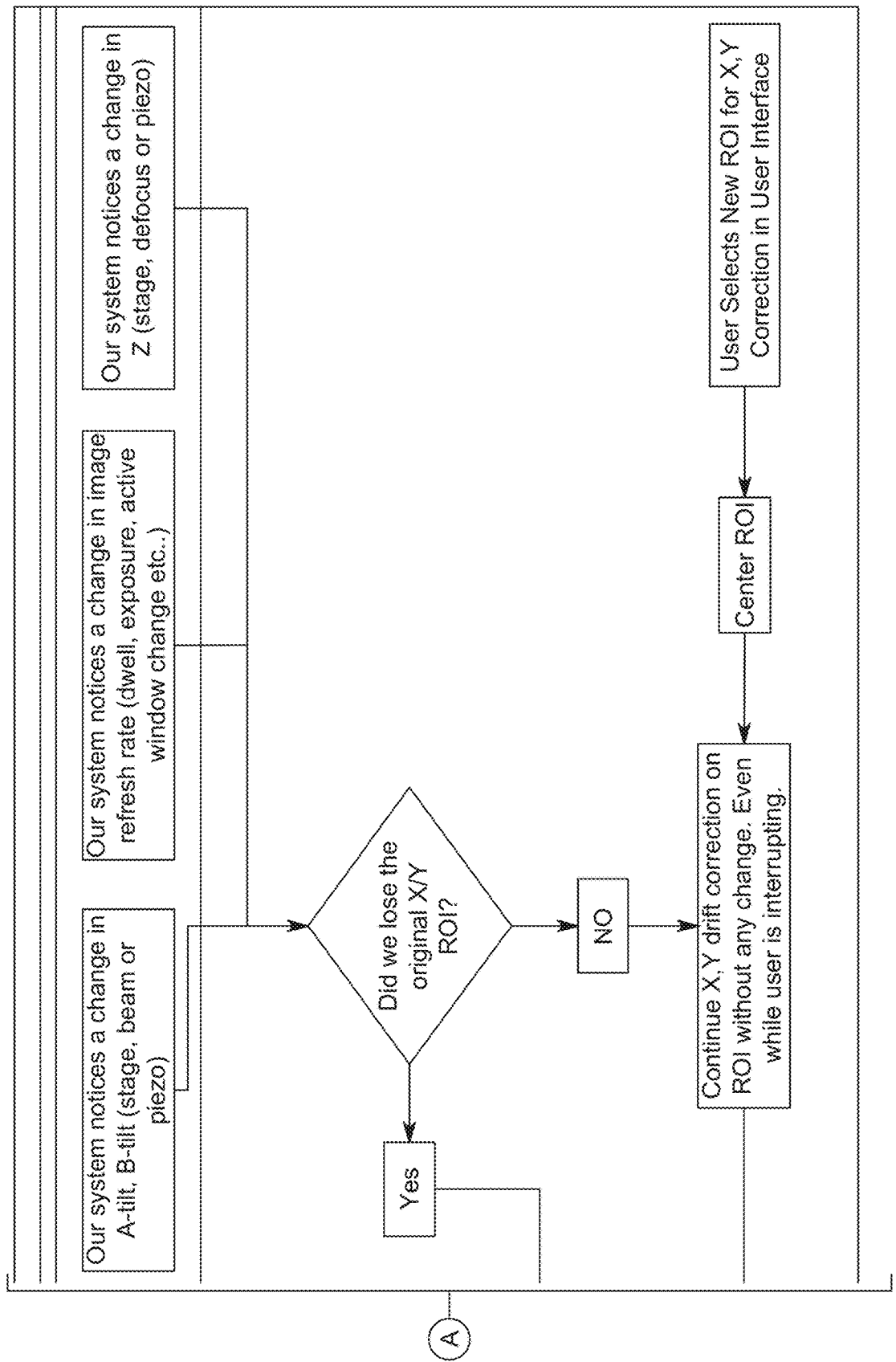
Figure 17A:
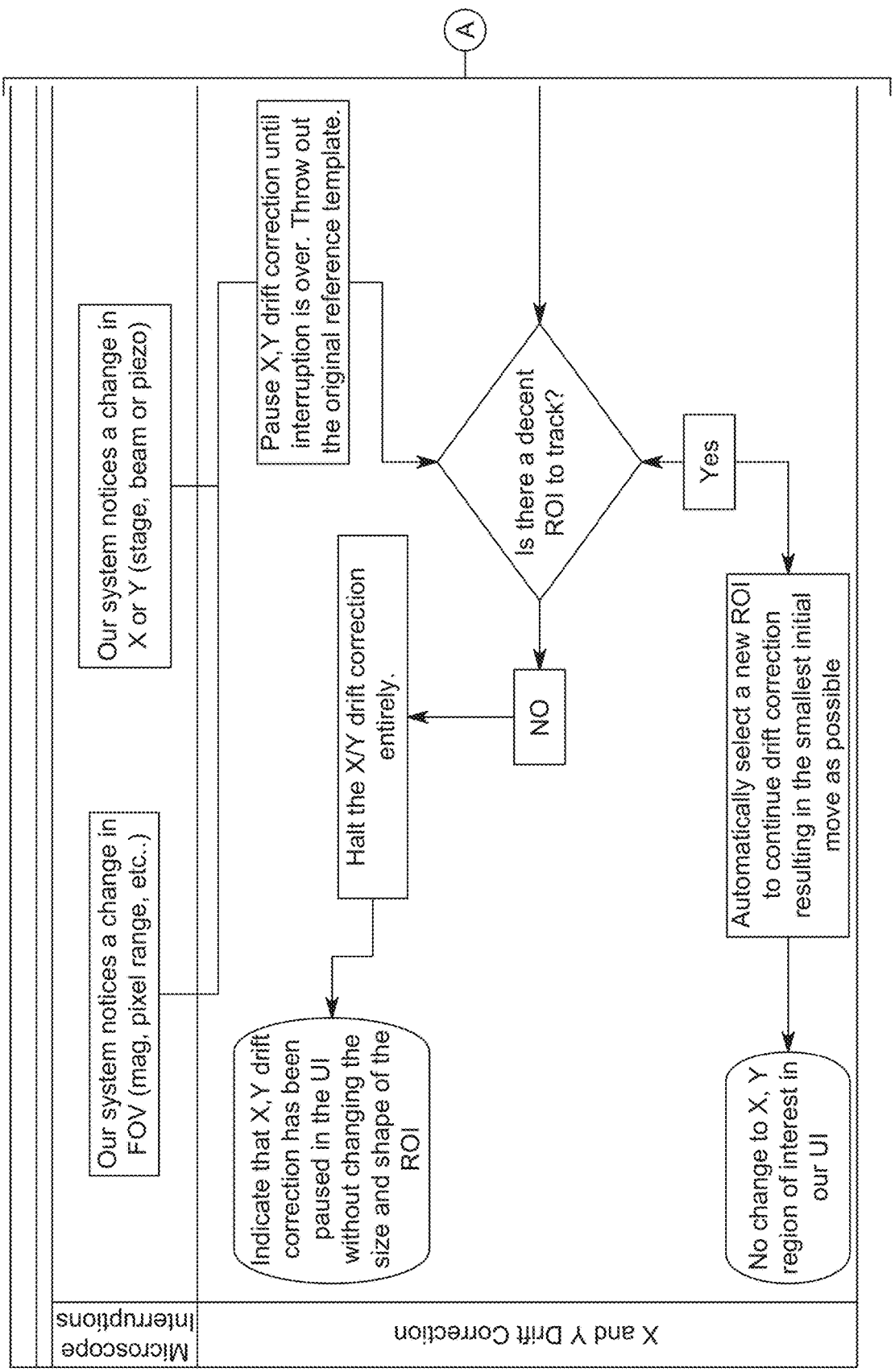
Figure 17B:
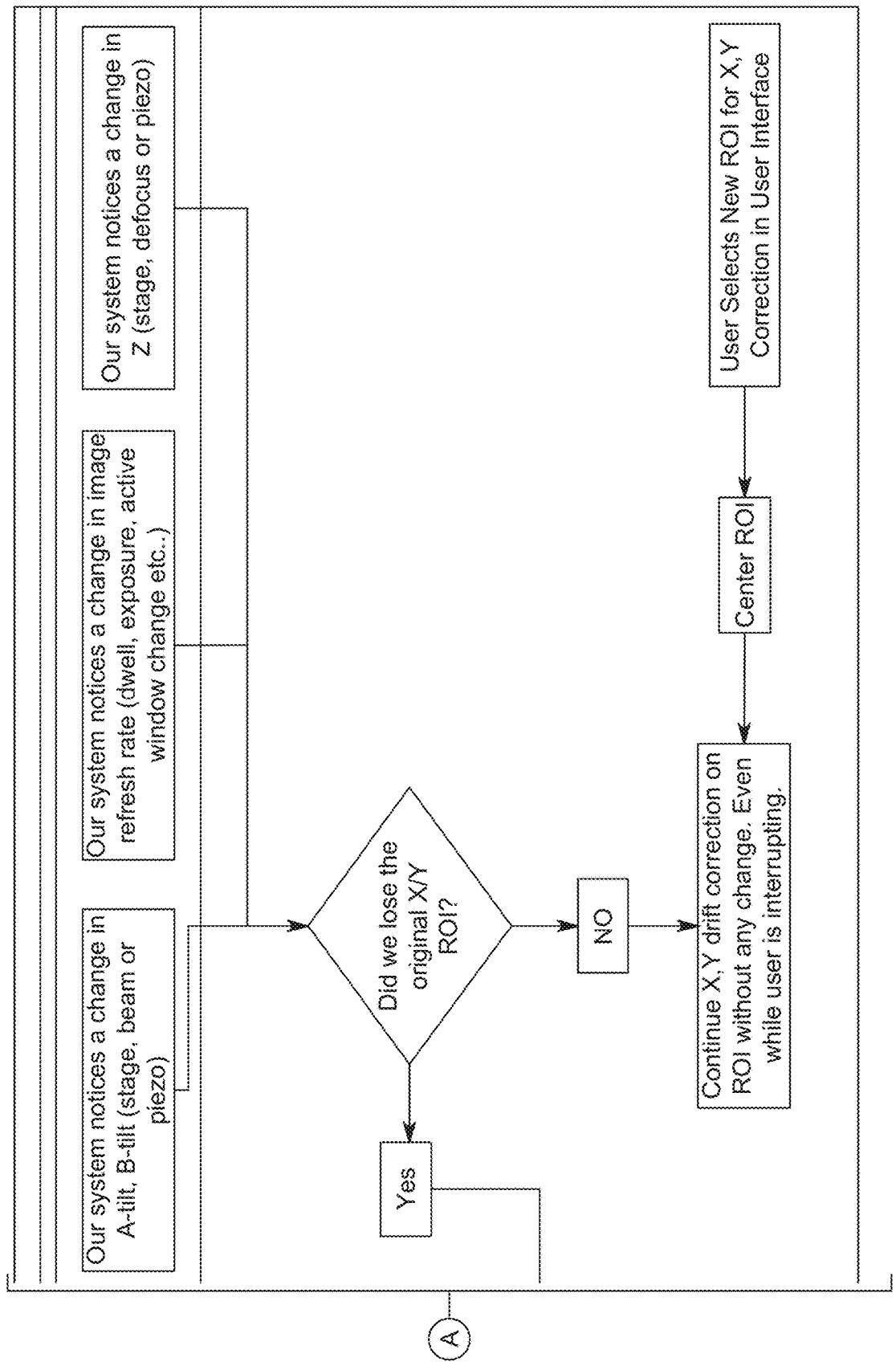
Figure 18A:
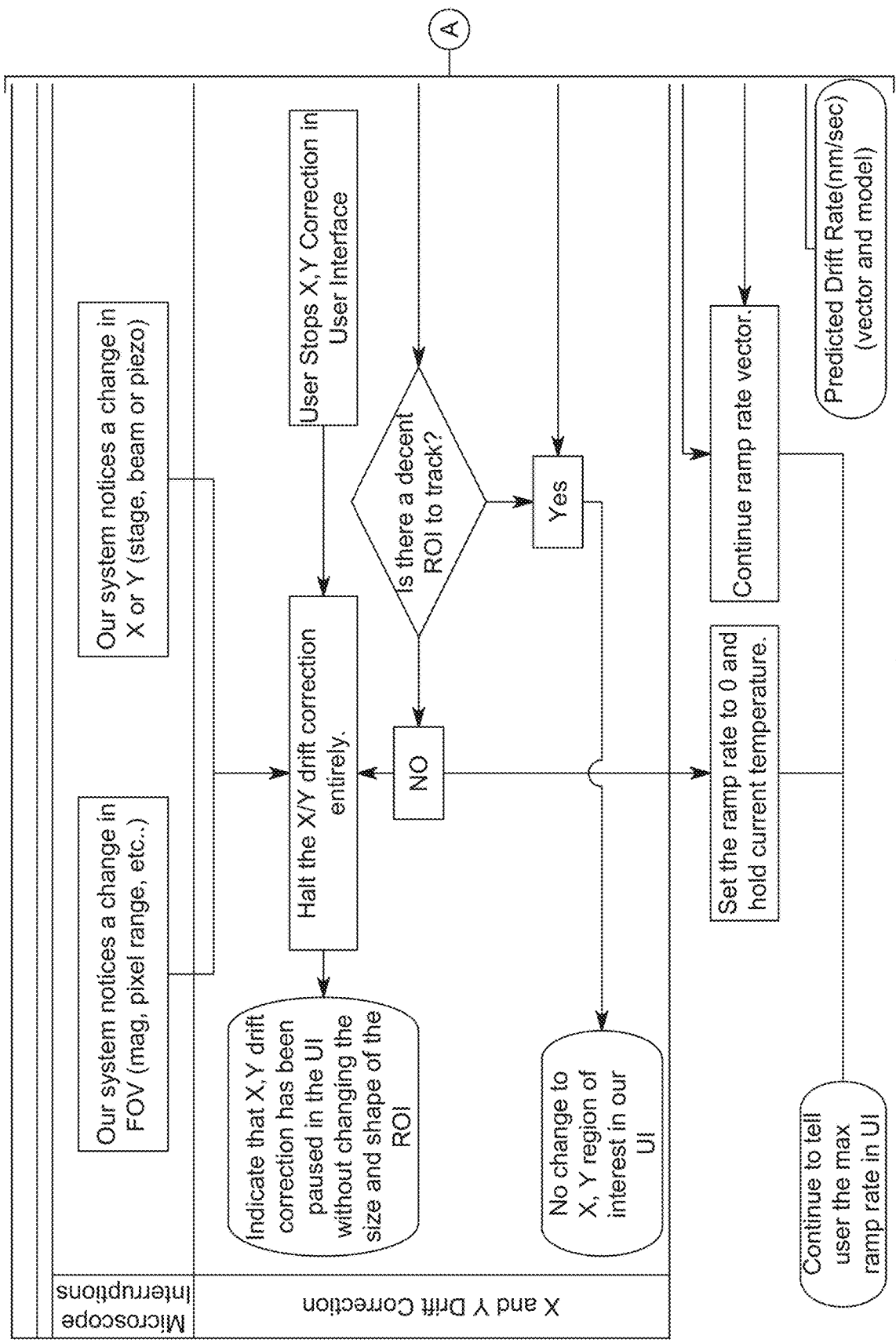
Figure 18B:
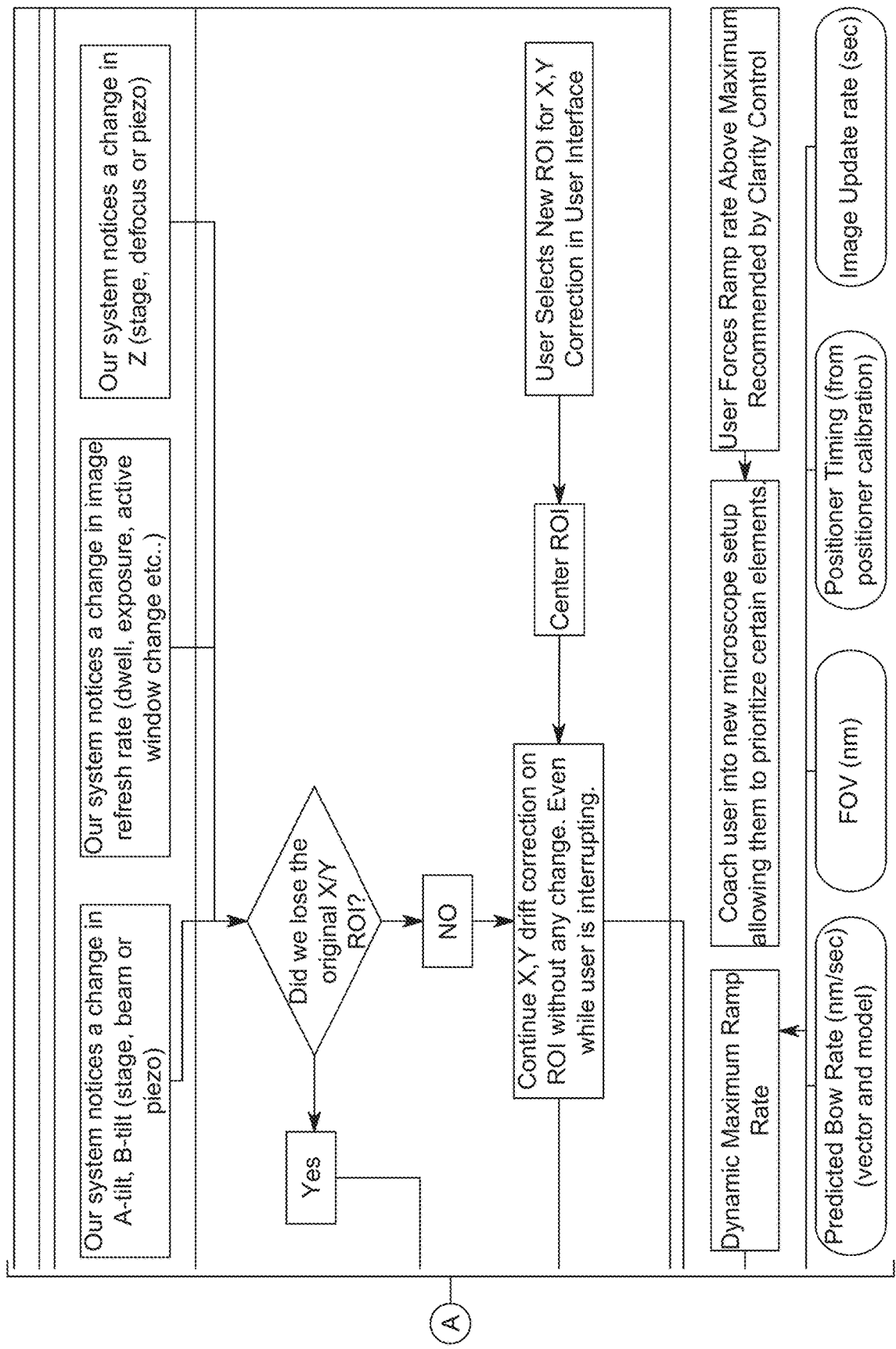

FIG. 16 is a flowchart of software module that forms part of the control system that monitors X/Y position, Z position, alpha/beta tilt and image refresh rate to flag any user interruptions, according to one or more embodiments of the presently disclosed subject matter. FIG. 17 is a flowchart of software module that forms part of the control system that monitors X/Y position, Z position, alpha/beta tilt and image refresh rate to flag any user interruptions but designed to continue the correction process to better maintain drift vectors through the interruption, according to one or more embodiments of the presently disclosed subject matter. FIG. 18 is a flowchart of software module that forms part of the control system that monitors X/Y position, Z position, alpha/beta tilt and image refresh rate to flag a change to an in-situ stimulus such as temperature or pressure, according to one or more embodiments of the presently disclosed subject matter.

Figure 19:
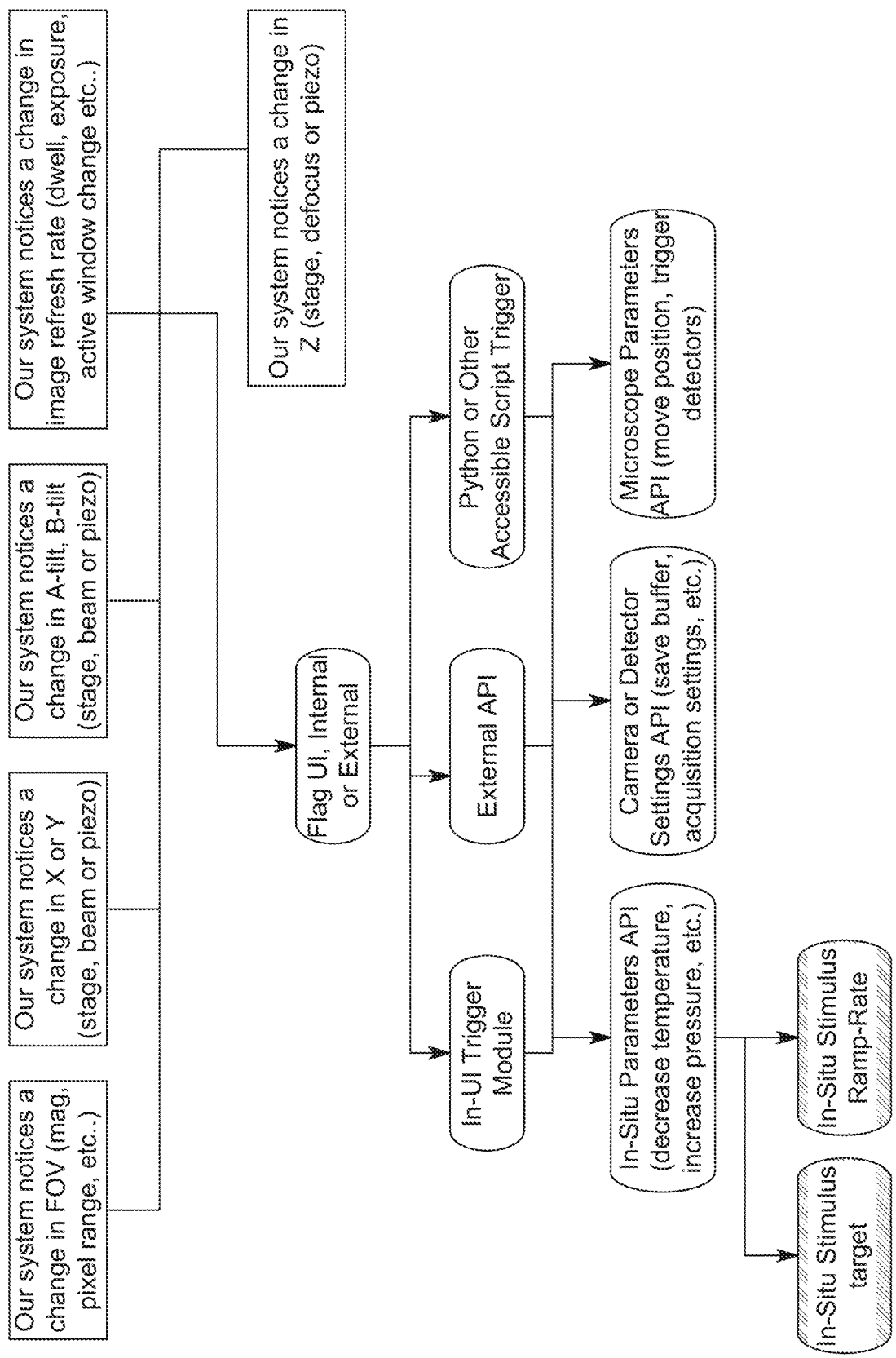
FIG. 19 is a graphical illustration of a module that forms part of the control system that is configured to trigger new behavior on the in-situ control, microscope, camera or detector from interruptions detected on the microscope, according to one or more embodiments of the presently disclosed subject matter.
Figure 20A:
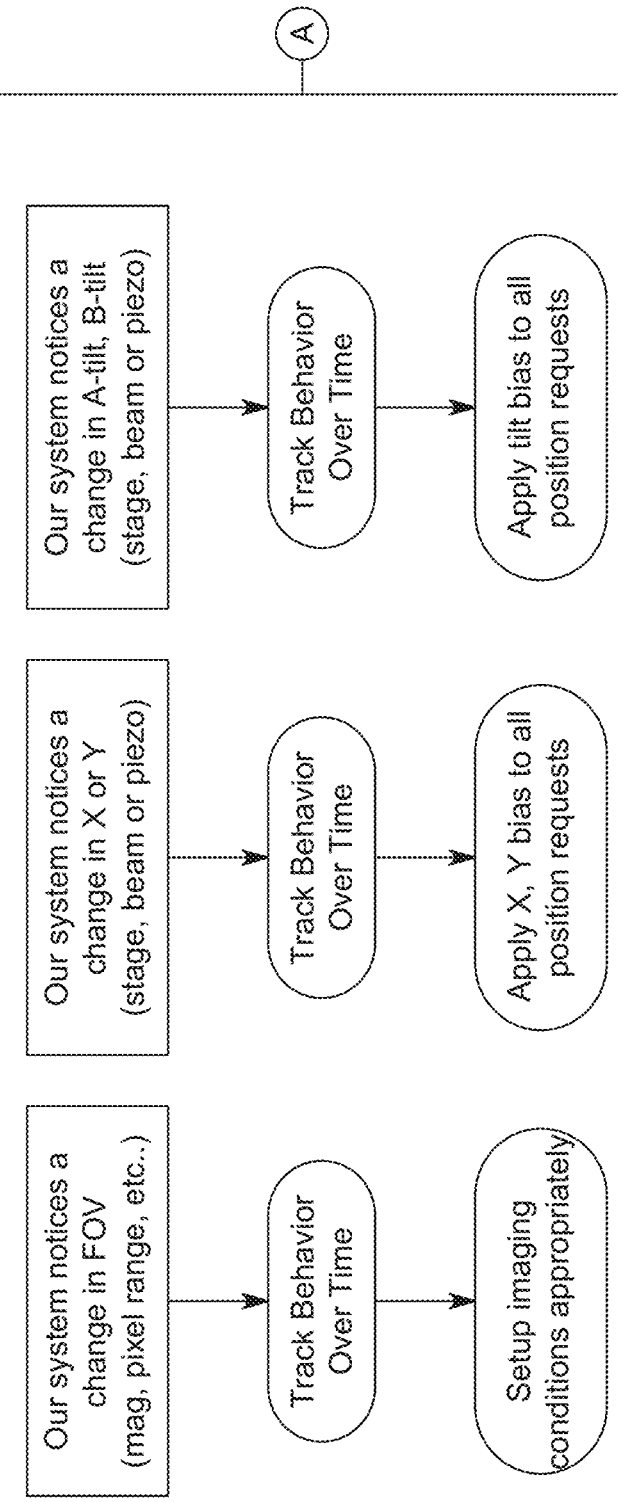
FIGS. 20A and 20B are a graphical illustration of a module that forms part of the control system that is configured to take user interruptions on the microscope and improves on expected models or processes, according to one or more embodiments of the presently disclosed subject matter.
Figure 20B:
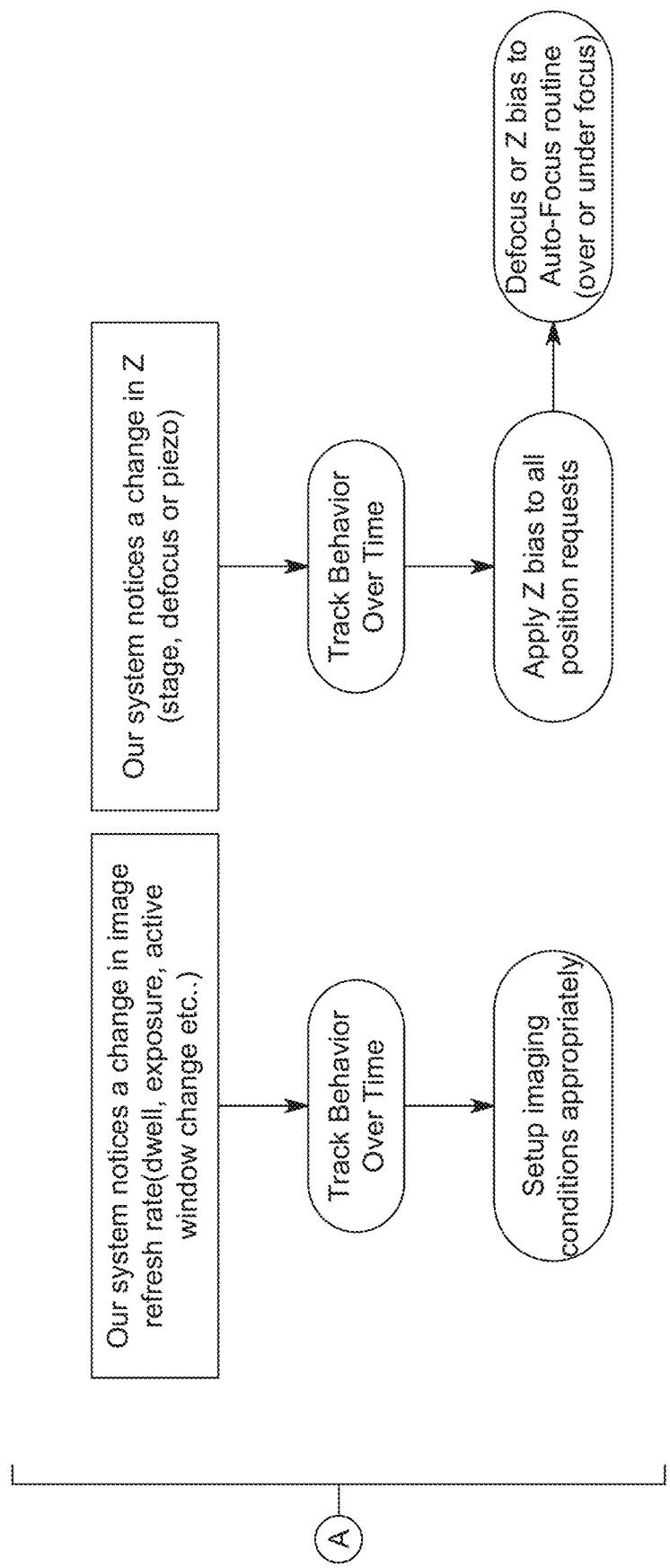
Figure 21:
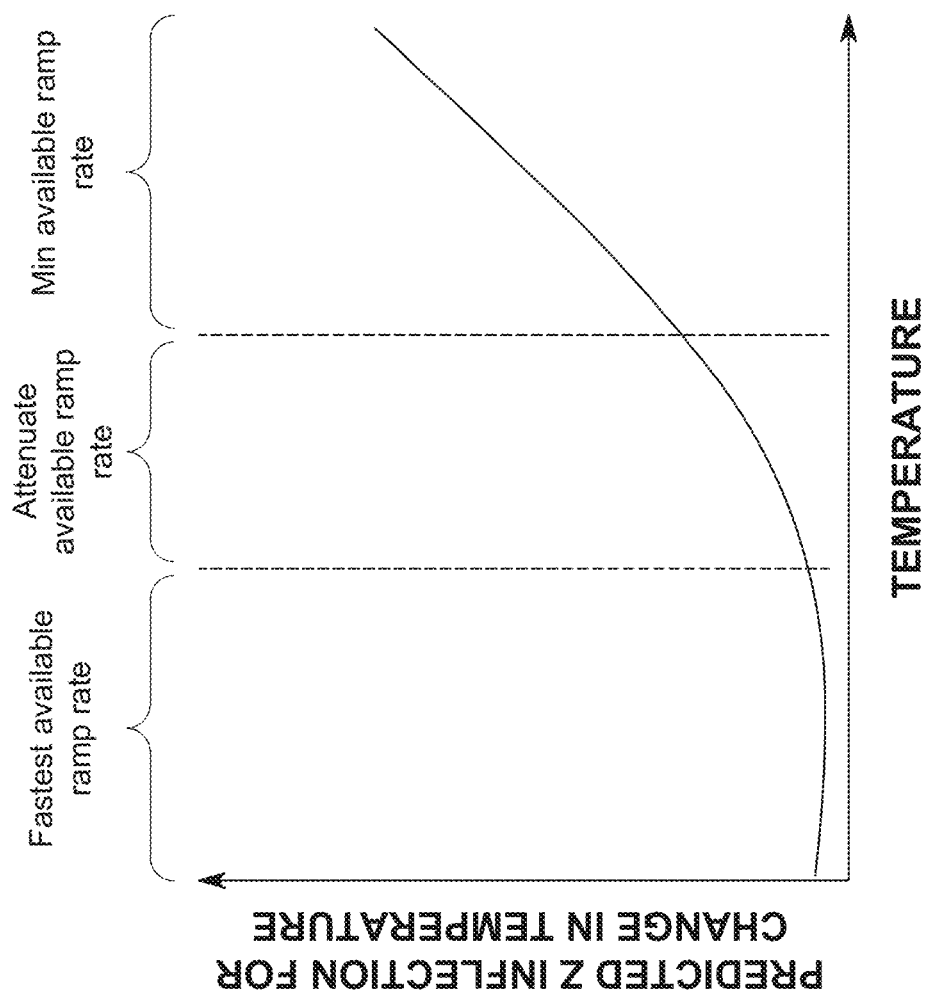
FIG. 21 is a graphical illustration of a module that forms part of the control system that is configured to provide automatic attenuation of in-situ control inputs such as ramp rate to prevent the loss of the primary ROI, according to one or more embodiments of the presently disclosed subject matter.

FIG. 19 is a diagrammatic representation of software module that forms part of the control system which triggers new behavior on the in-situ control, microscope, camera or detector from interruptions detected on the microscope, according to one or more embodiments of the presently disclosed subject matter. FIG. 20 is a diagrammatic representation of software module that forms part of the control system which takes user interruptions on the microscope and improves on expected models or processes, according to one or more embodiments of the presently disclosed subject matter. FIG. 21 is a schematic representation of software module that forms part of the control system with automatic attenuation of in-situ control inputs such as ramp rate to prevent the loss of the primary ROI, according to one or more embodiments of the presently disclosed subject matter.

Figure 22:
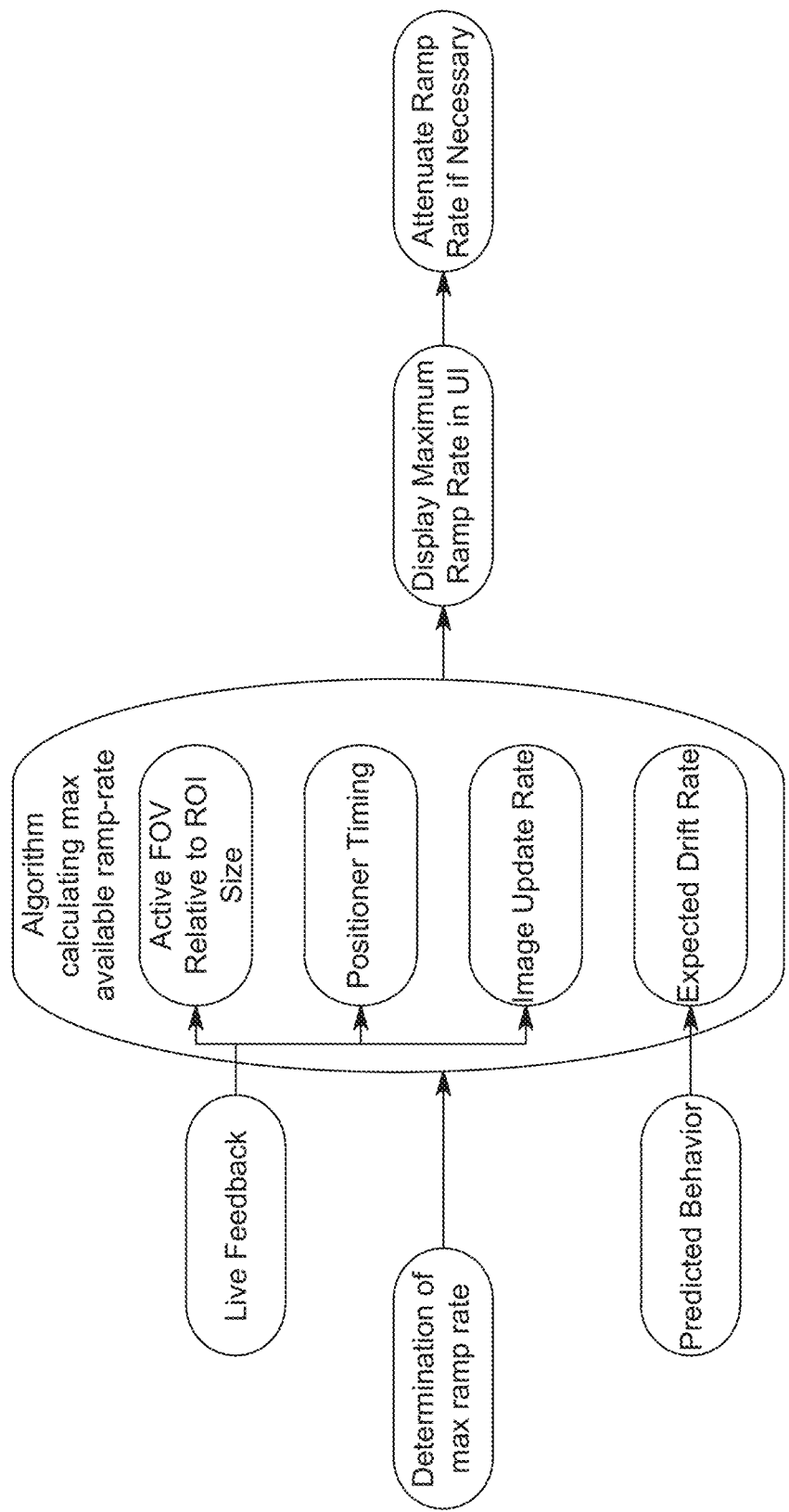
FIG. 22 is a flowchart of a module that forms part of the control system that is configured to calculate a maximum ramp rate of the stimulus from the active field of view relative to ROI size, positioner timing, image update rate and expected drift rate, according to one or more embodiments of the presently disclosed subject matter.

FIG. 22 is a flowchart of software module or algorithm that forms part of the control system that calculates max ramp rate of the stimulus from the active field of view relative to ROI size, positioner timing, image update rate and expected drift rate, according to one or more embodiments of the presently disclosed subject matter.

Figure 23:
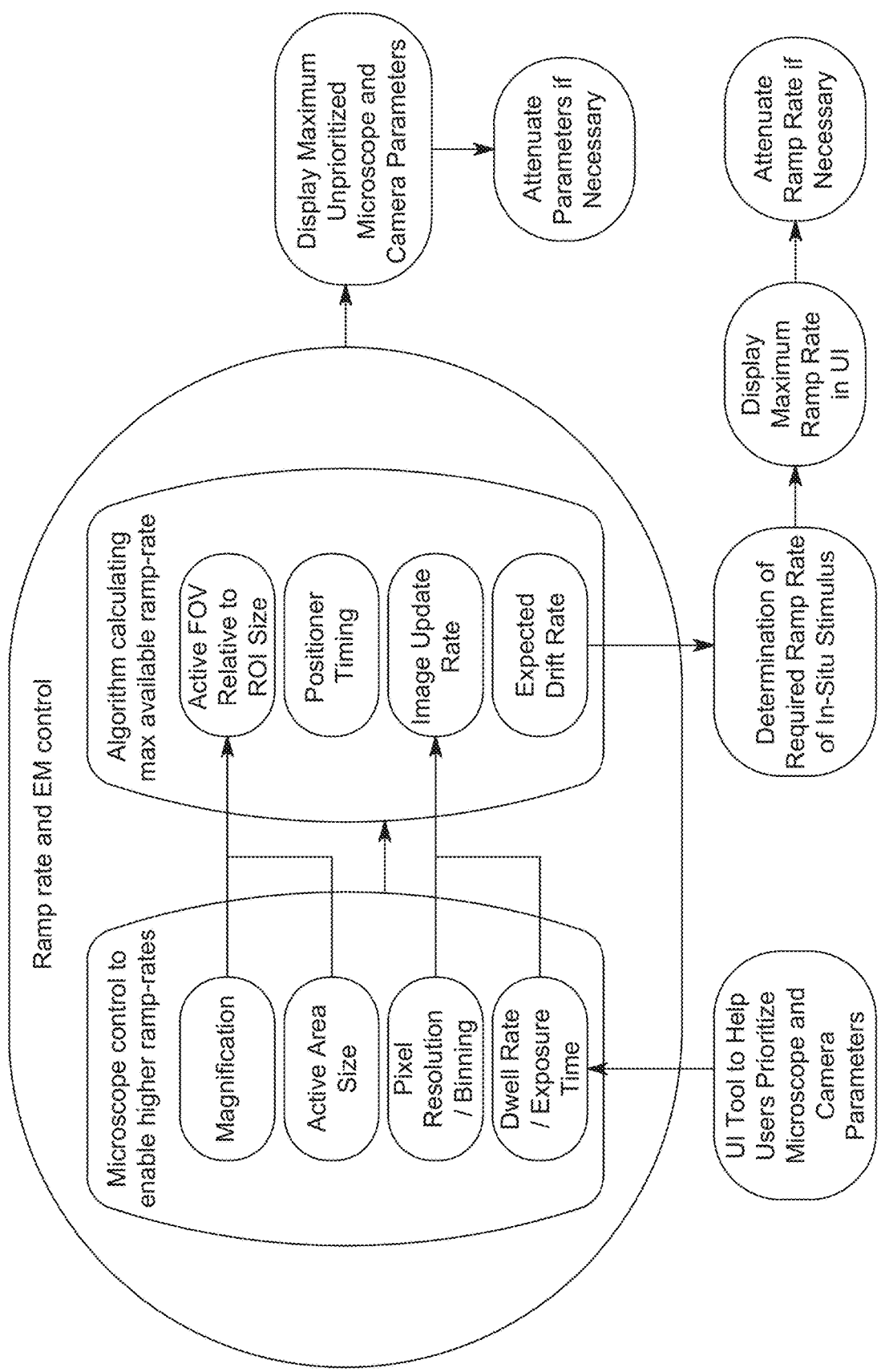
FIG. 23 is a flowchart of a module that forms part of the control system that is configured to help a user set the magnification, active detector size, pixel resolution, binning, dwell rate and/or exposure time to achieve specific thermal ramp rates, according to one or more embodiments of the presently disclosed subject matter.

FIG. 23 is a flowchart of software module that forms part of the control system that helps users set the magnification, active detector size, pixel resolution, binning, dwell rate and/or exposure time to achieve specific thermal ramp rates, according to one or more embodiments of the presently disclosed subject matter.

Figure 24:
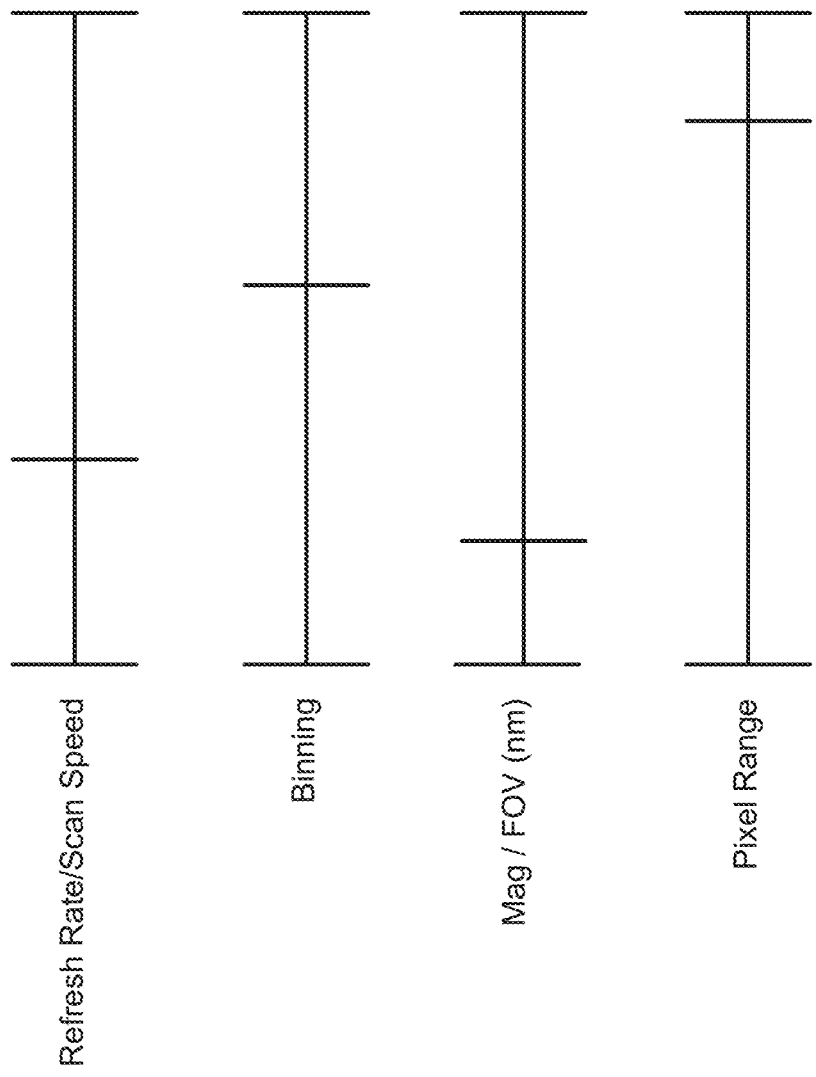
FIG. 24 is a schematic graphical representation of a module that forms part of the control system that is configured to allow a user to prioritize one or more camera/detector options, microscope setup, and in-situ stimulus to ensure a stable image within the capabilities of drift correction, according to one or more embodiments of the presently disclosed subject matter.

FIG. 24 is a schematic graphical representation of software module that forms part of the control system which allows the user to prioritize one or more camera/detector options, microscope setup, and in-situ stimulus to ensure a stable image within the capabilities of drift correction, according to one or more embodiments of the presently disclosed subject matter. Helping the user prioritize certain settings and then automating the setup of other dependent settings.

Figure 25:
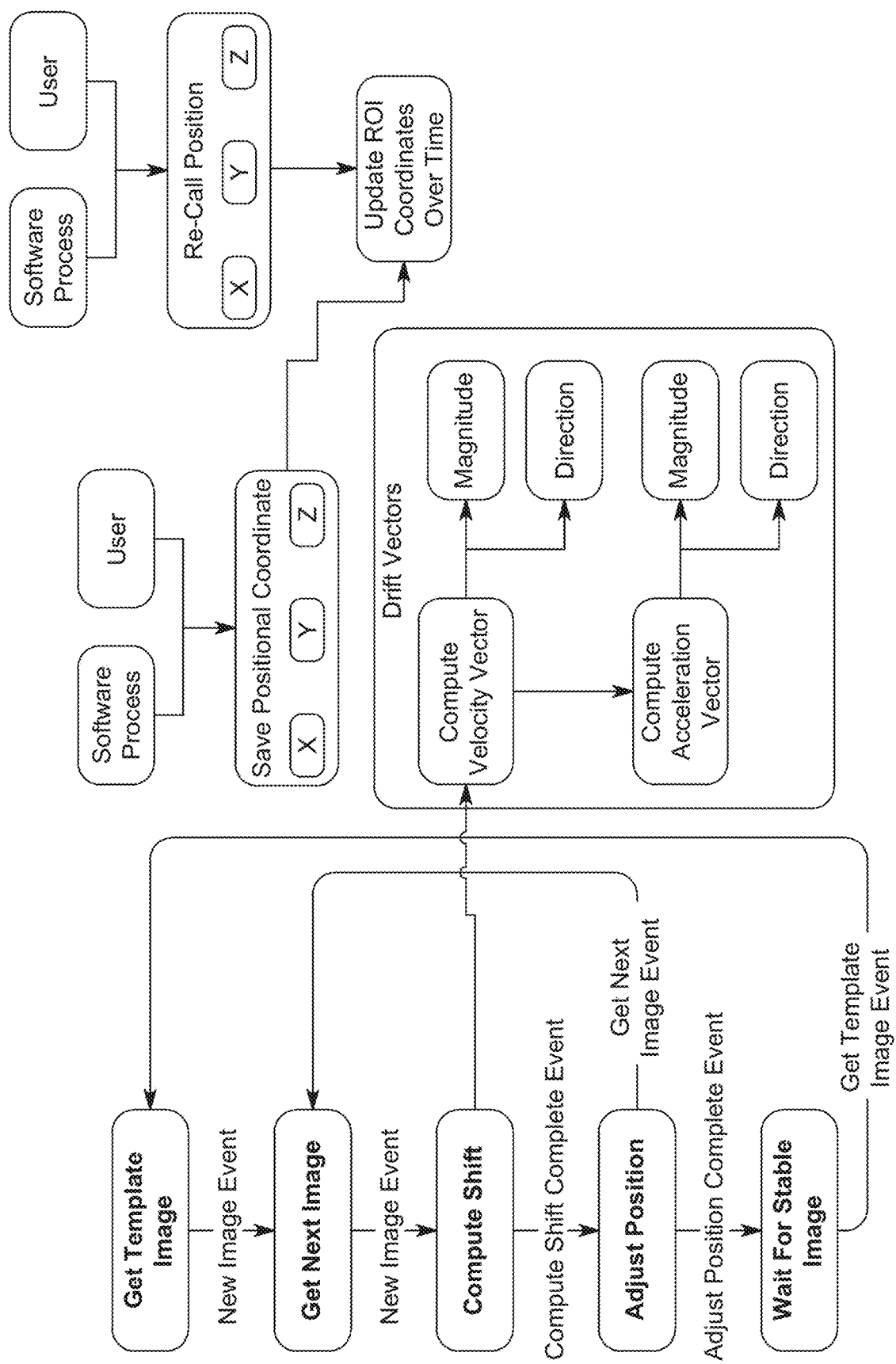
FIG. 25 is a schematic representation of a module that forms part of the control system that is configured to apply drift vectors to predict the location of secondary or many other imaging sites and allowing users to easily toggle between sites, according to one or more embodiments of the presently disclosed subject matter.

FIG. 25 is a schematic representation of software module that forms part of the control system which applies drift vectors to predict the location of secondary or many other imaging sites and allowing users to easily toggle between sites, according to one or more embodiments of the presently disclosed subject matter.

Figure 26:
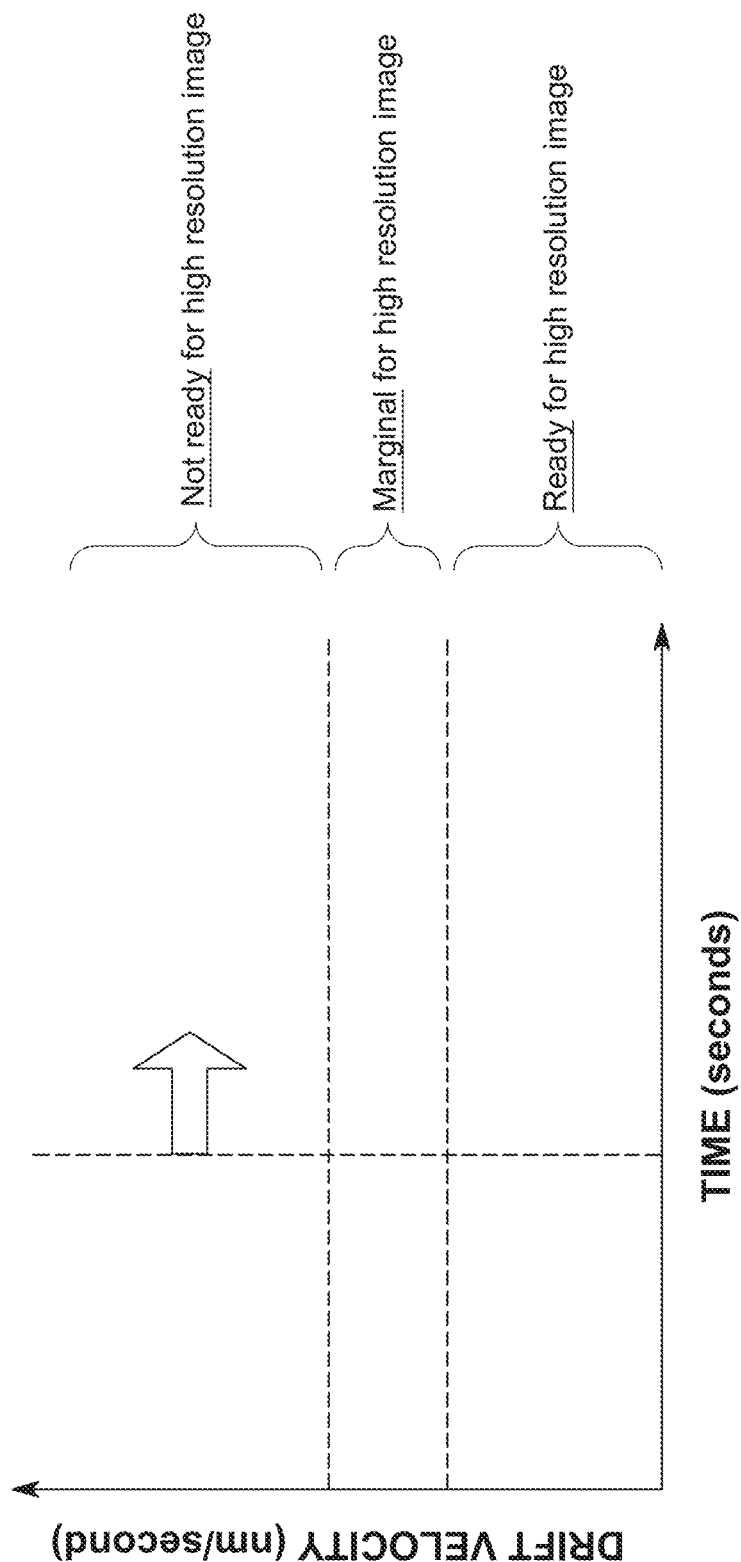
FIG. 26 is a schematic graphical representation of an indicator that forms part of the control system that is configured to normalize drift rate and alert the user of when movement is slow enough for a high-resolution acquisition, according to one or more embodiments of the presently disclosed subject matter.

FIG. 26 is a schematic graphical representation of an indicator to normalize drift rate and alert the user of when movement is slow enough for a high-resolution acquisition, according to one or more embodiments of the presently disclosed subject matter.

Figure 27:
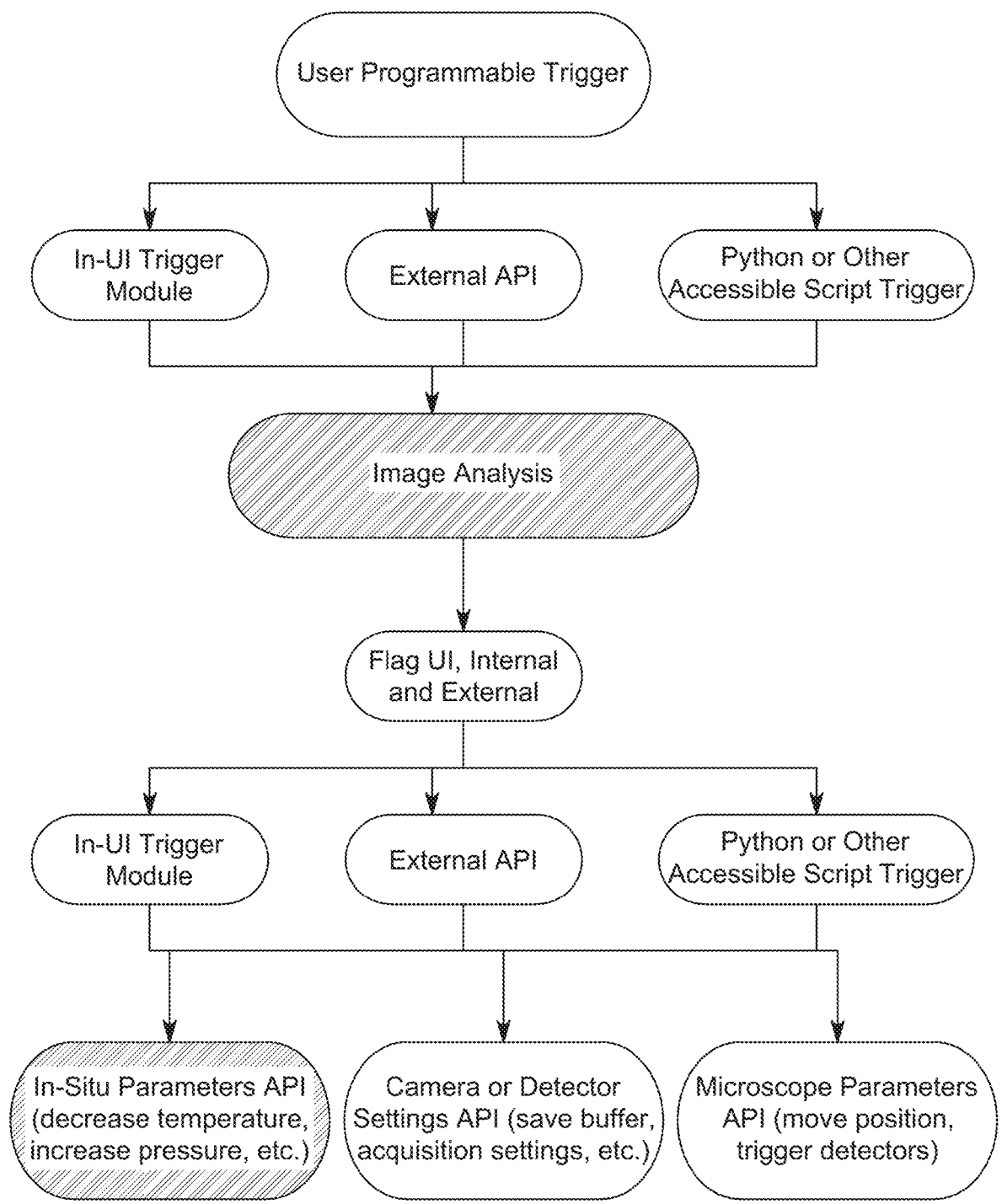
FIG. 27 is a diagrammatic representation of a module that forms part of the control system that is configured to enable a user or other software modules to set triggers to the in-situ function based from image analysis, according to one or more embodiments of the presently disclosed subject matter.

FIG. 27 is a diagrammatic representation of software module that forms part of the control system that enables the user or other software modules to set triggers to the in-situ function based from image analysis, according to one or more embodiments of the presently disclosed subject matter.

Figure 28:
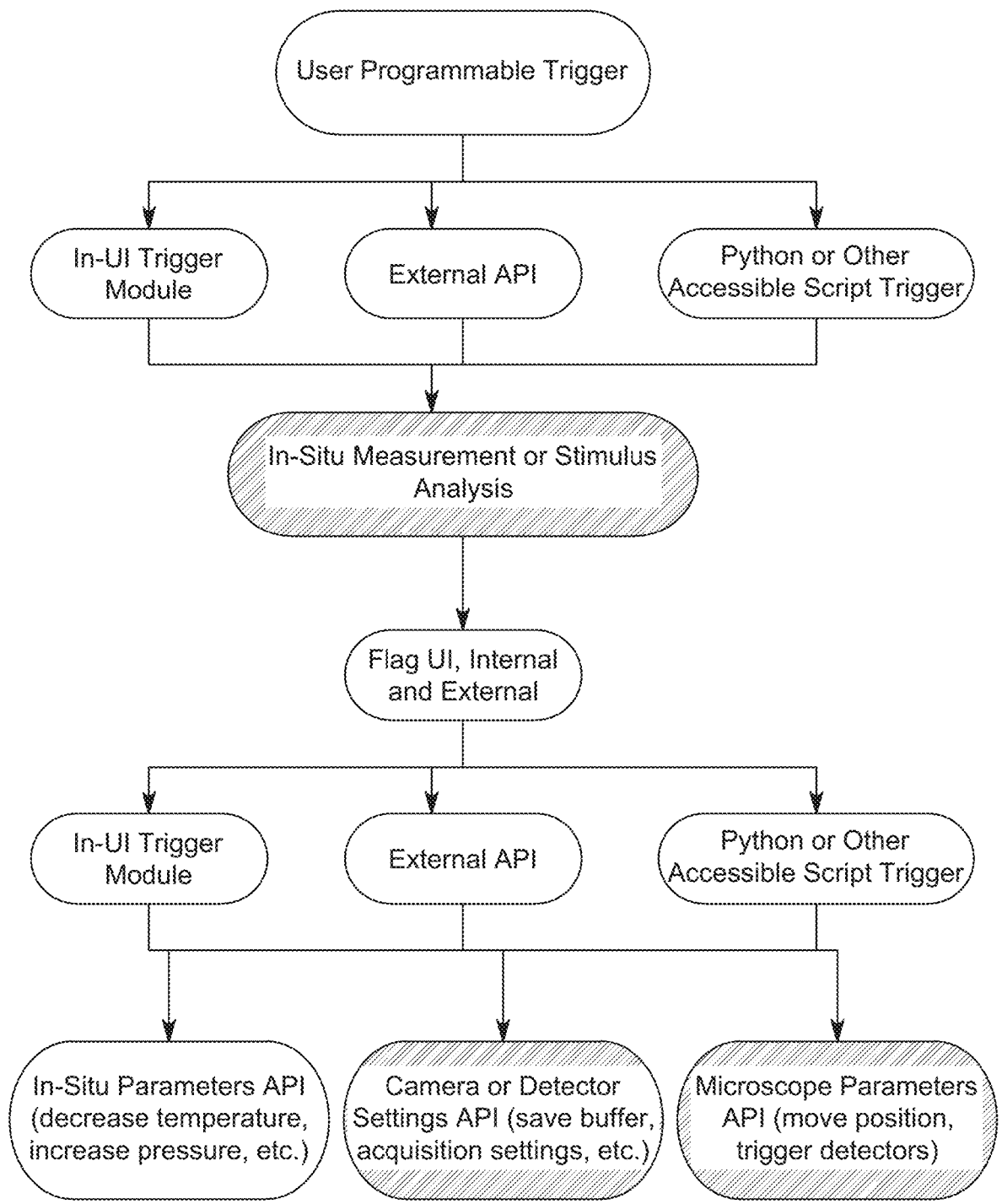
FIG. 28 is a diagrammatic representation of a module that forms part of the control system that is configured to enable a user or another software module to set triggers to the electron microscope, camera or detector, based from in-situ stimulus readings, according to one or more embodiments of the presently disclosed subject matter.

FIG. 28 is a diagrammatic representation of software module that enables the user or other software modules to set triggers to the electron microscope, camera or detector based from in-situ stimulus readings, according to one or more embodiments of the presently disclosed subject matter.

Figure 29:
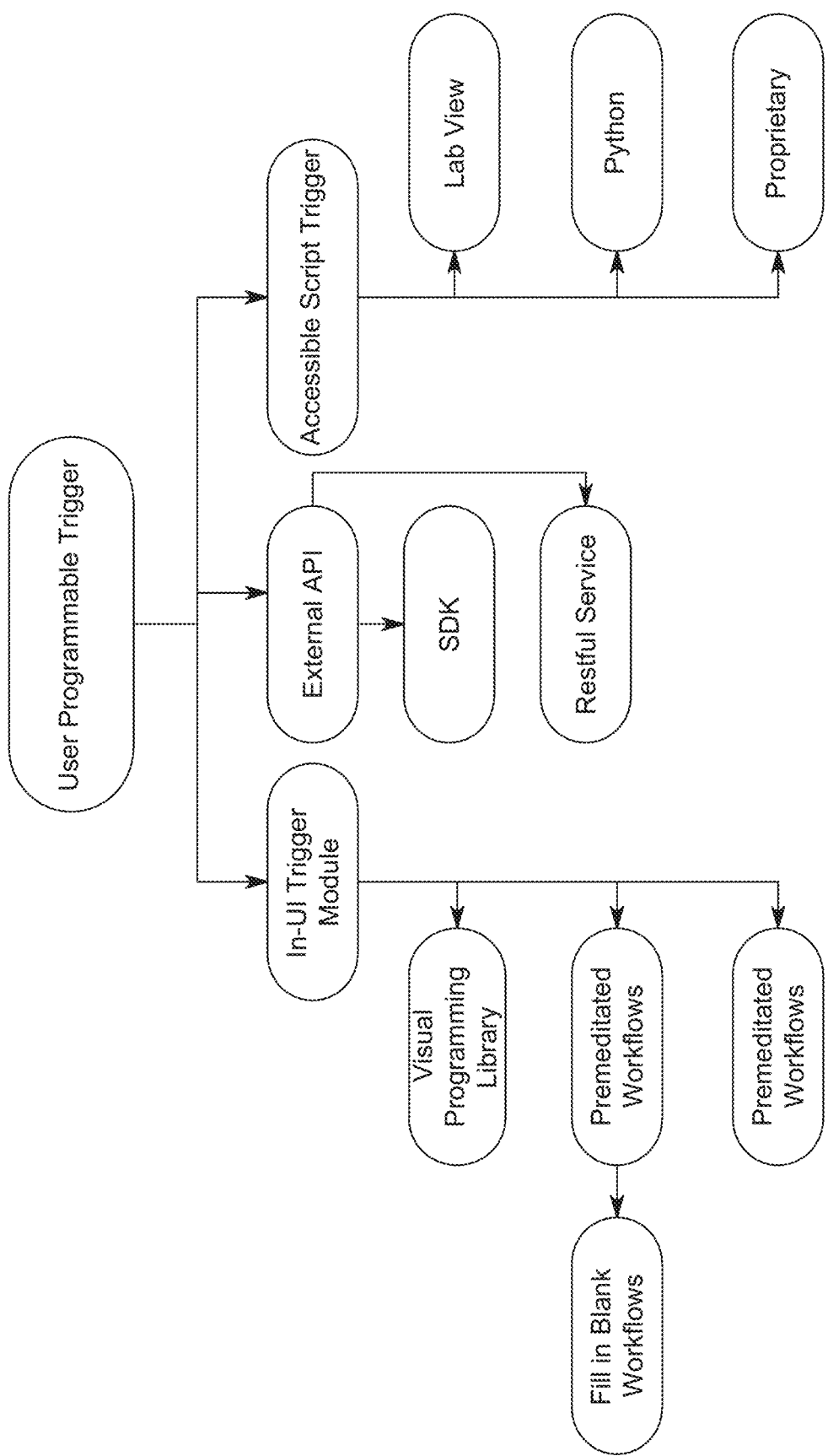
FIG. 29 is a diagrammatic representation of interface that form part of the control system that is configured to help researchers build experiments and make custom triggers, according to one or more embodiments of the presently disclosed subject matter.

FIG. 29 is a diagrammatic representation of interfaces that help researchers build experiments and make custom triggers, according to one or more embodiments of the presently disclosed subject matter.

Figure 30:
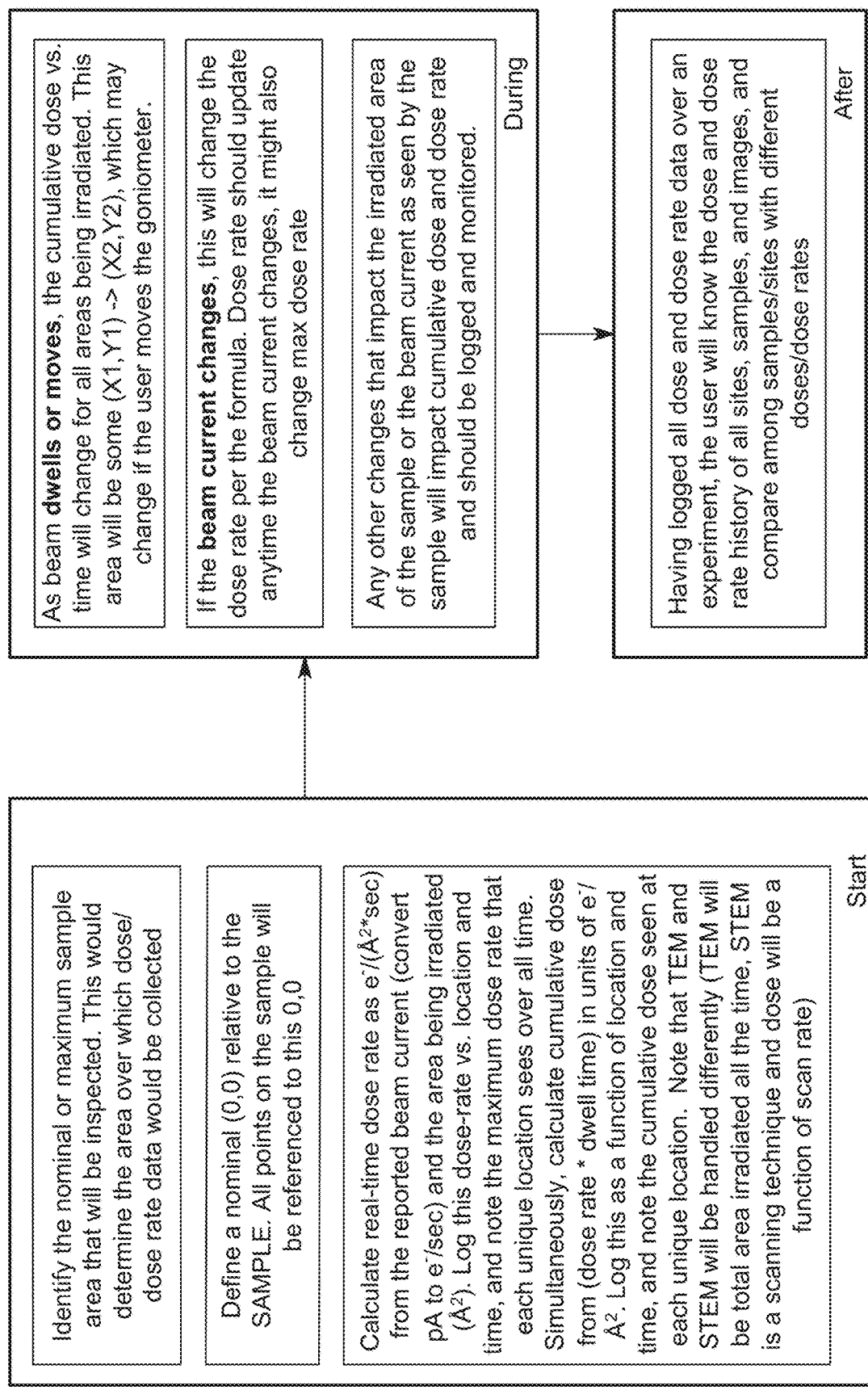
FIG. 30 is a schematic representation of a module that forms part of the control system that is configured to track a total dose and dose rate of a specific sample site to help a user quantify beam damage of a site for a specific feature, according to one or more embodiments of the presently disclosed subject matter.

FIG. 30 is a schematic representation of software tracking module the total dose and dose rate of a specific sample site to help users quantify beam damage of a site for a specific feature, according to one or more embodiments of the presently disclosed subject matter.

Figure 31:
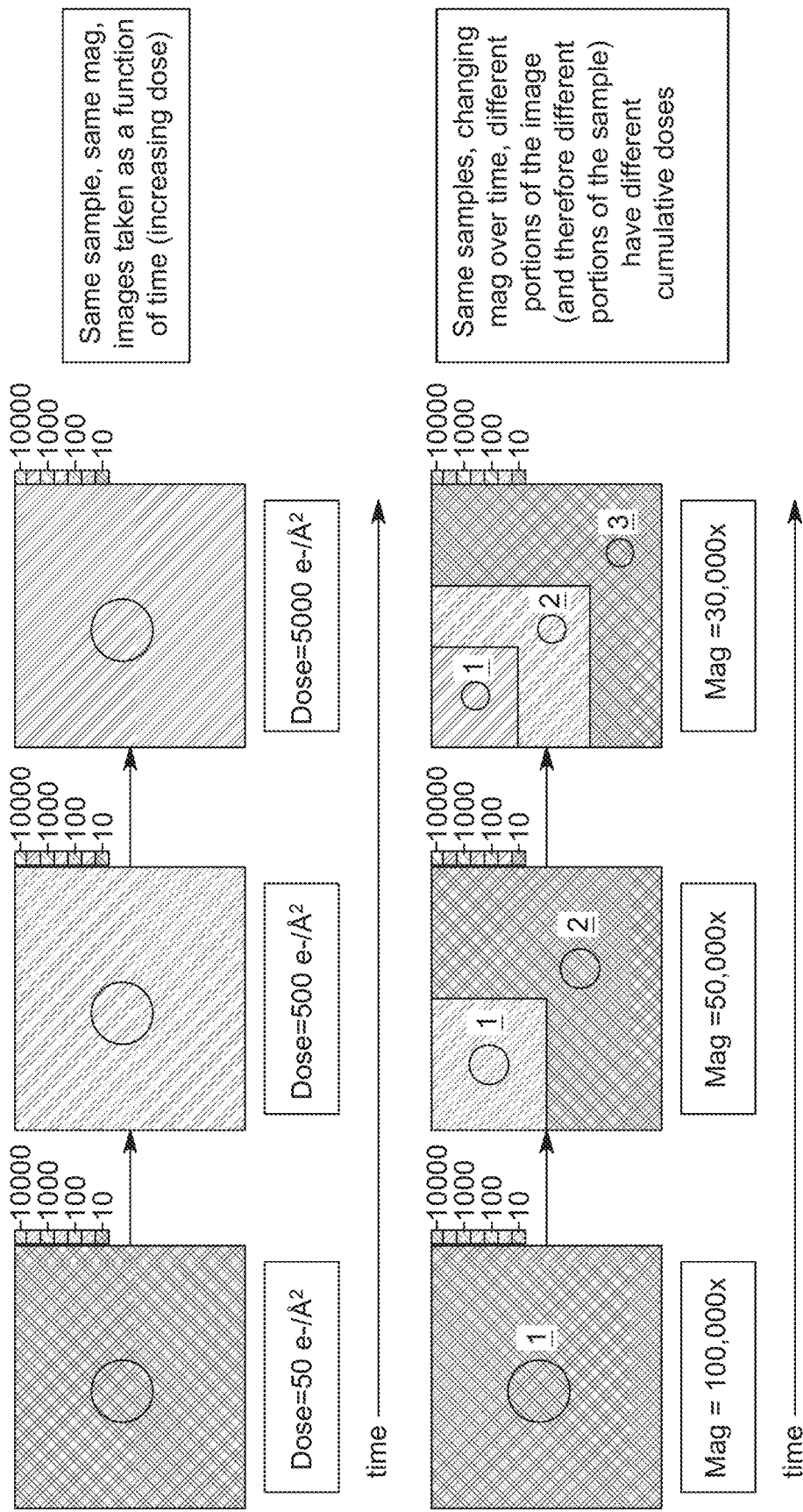
FIG. 31 and FIG. 32 are schematic graphical representations of a visualizer module that forms part of the control system that is configured to help a user compare beam effects for a single site at specific times or for specific in-situ stimulus conditions, according to one or more embodiments of the presently disclosed subject matter.

FIG. 31 is a schematic graphical representation of software visualizer module to compare beam effects for a single site at specific times or for specific in-situ stimulus conditions, according to one or more embodiments of the presently disclosed subject matter.

Figure 32:
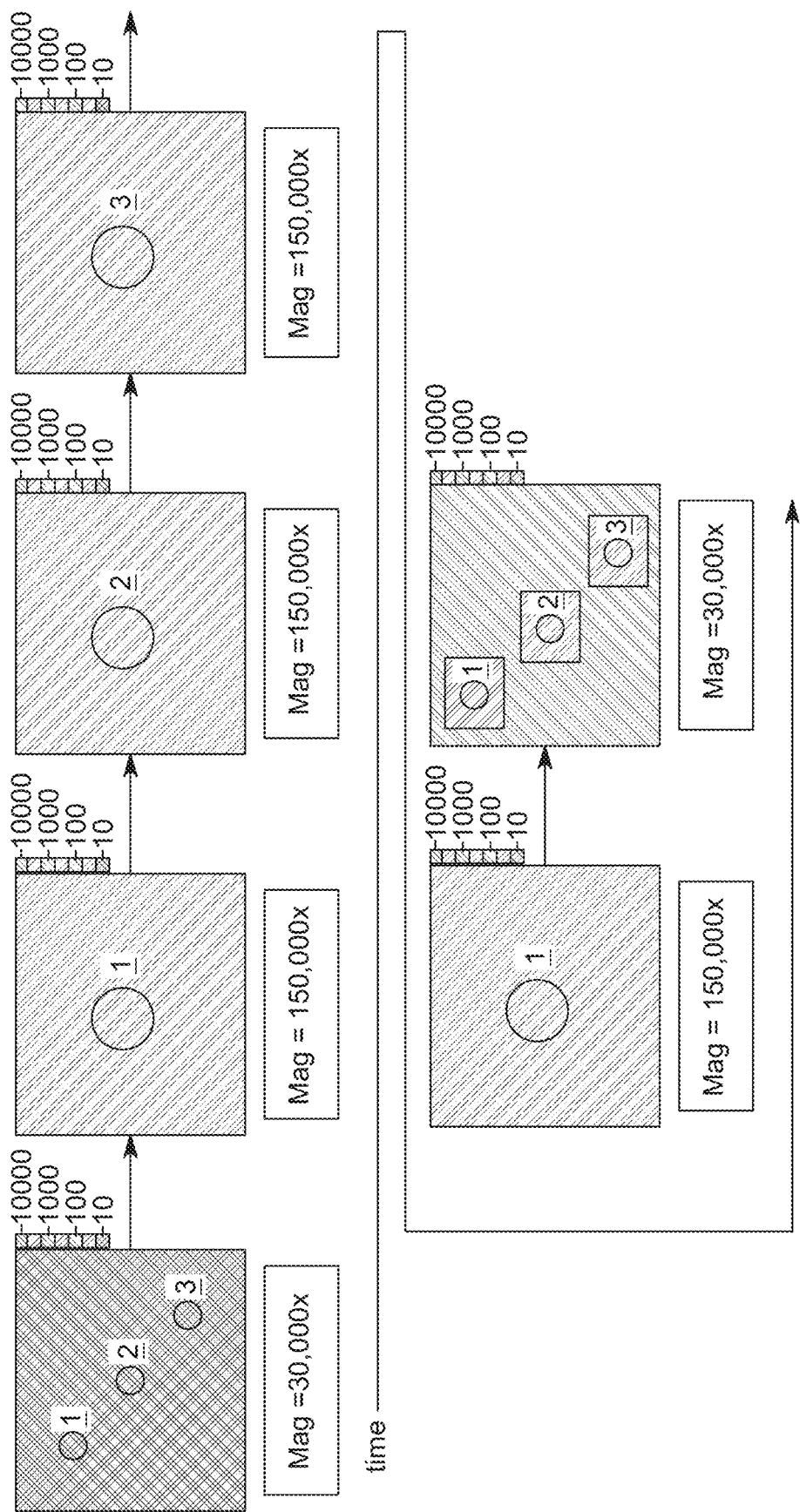

FIG. 32 is a schematic graphical representation of software visualizer module to compare beam effects for multiple sites at specific times or for specific in-situ stimulus conditions, according to one or more embodiments of the presently disclosed subject matter.

Figure 33:
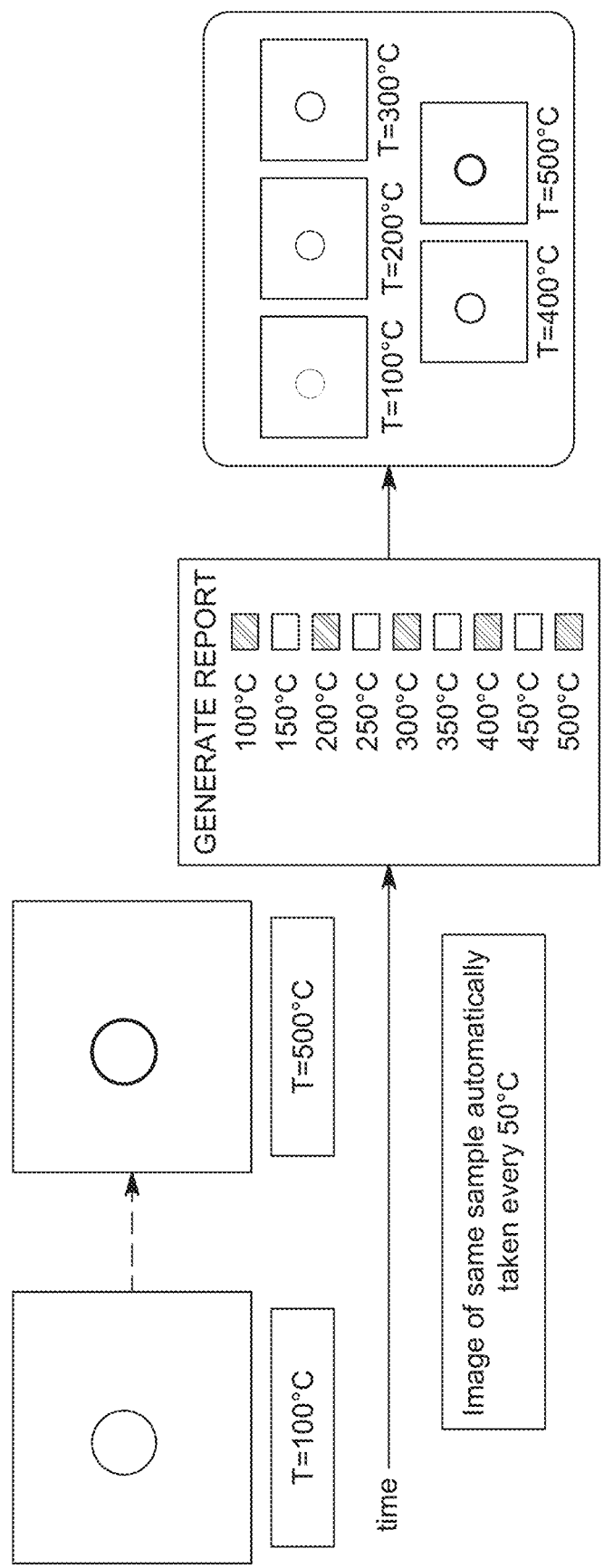
FIG. 33 is a schematic graphical representation of an automatic report generator module that forms part of the control system that is configured to compare sample sites as a function of time, according to one or more embodiments of the presently disclosed subject matter.

FIG. 33 is a schematic graphical representation of software automatic report generator module that compares sample sites as a function of time, according to one or more embodiments of the presently disclosed subject matter.

Figure 34:
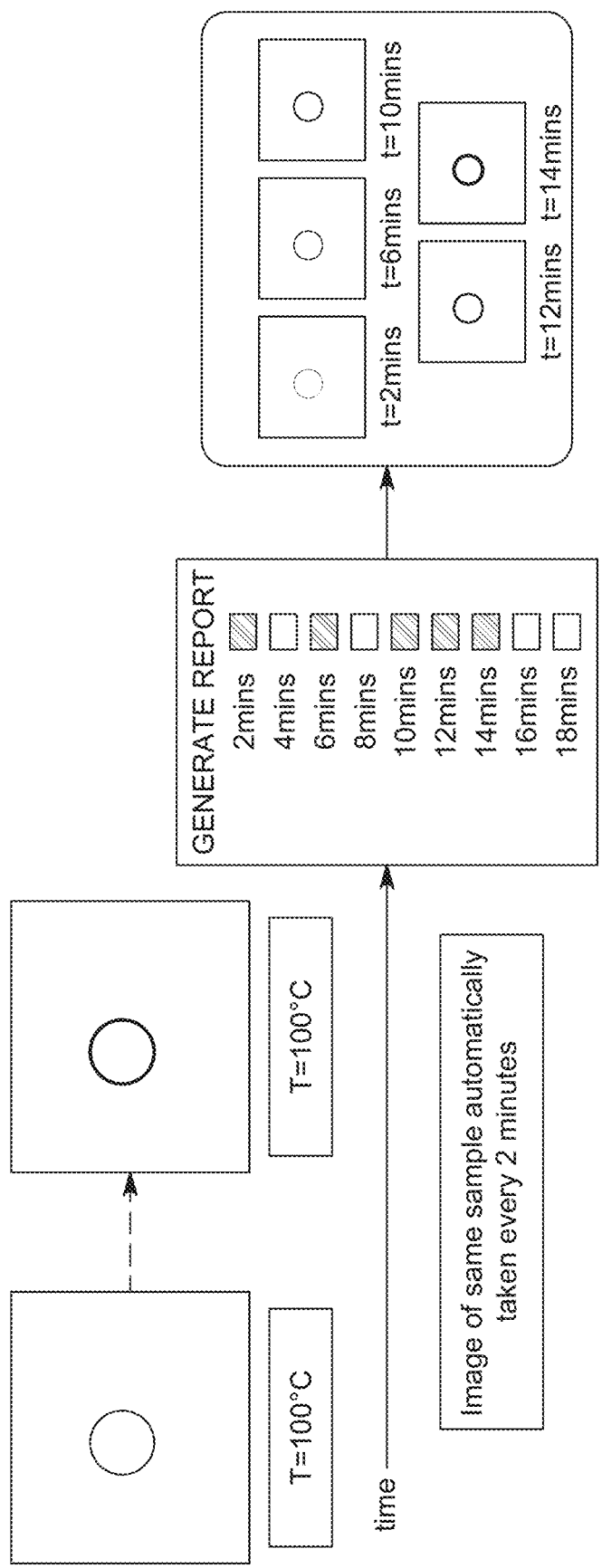
FIG. 34 is a schematic graphical representation of an automatic report generator module that forms part of the control system that compares sample sites for a given in-situ control, according to one or more embodiments of the presently disclosed subject matter.

FIG. 34 is a schematic graphical representation of software automatic report generator module that compares sample sites for a given in-situ control, according to one or more embodiments of the presently disclosed subject matter.

Figure 35:
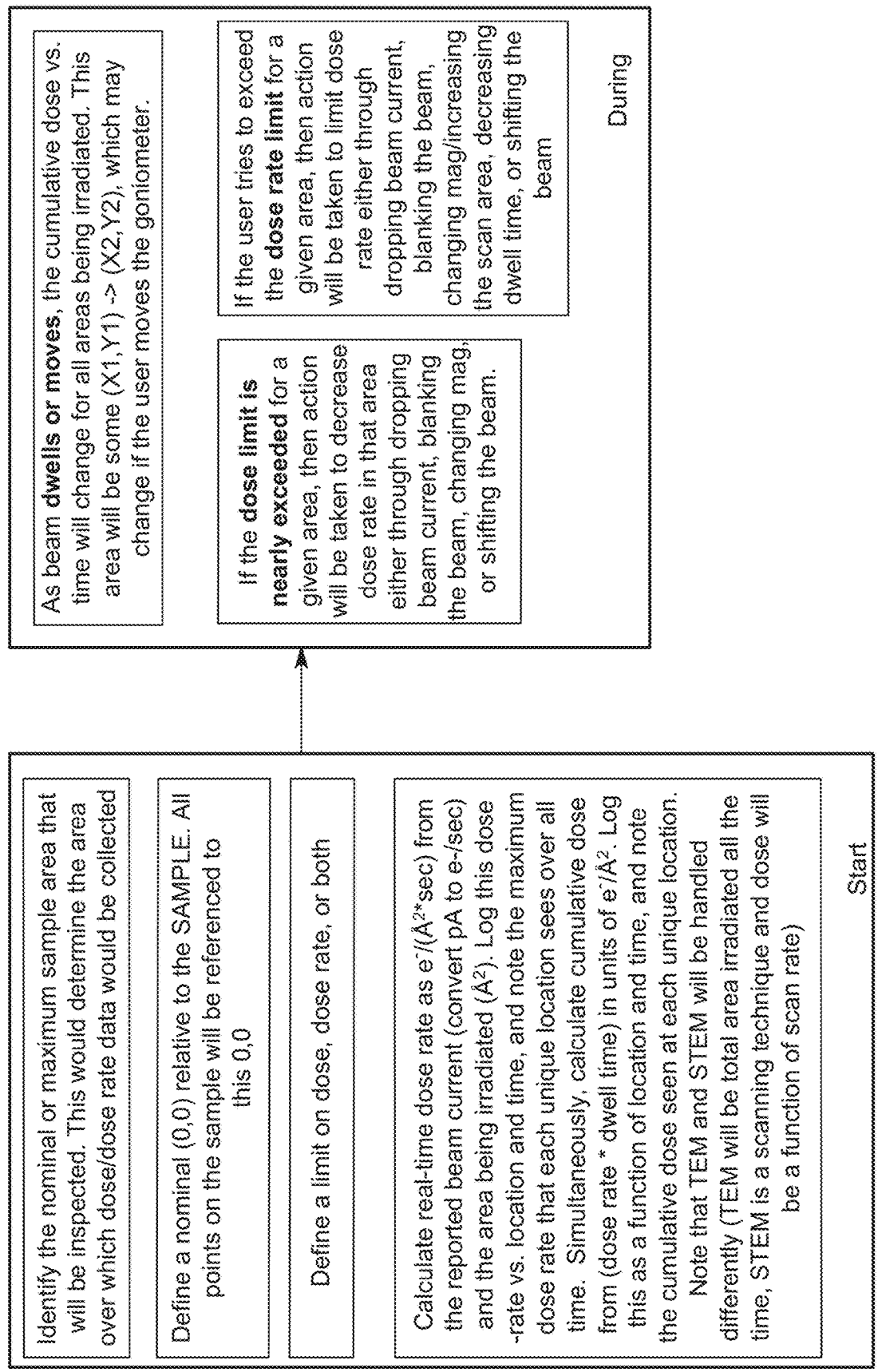
FIG. 35 and FIG. 36 are schematic graphical representations of a module that can form part of the control system that is configured to limit dose, dose rate or other microscope parameters as well as in-situ stimulus, according to one or more embodiments of the presently disclosed subject matter.

FIG. 35 is a schematic representation of software module which limits dose, dose rate or other microscope parameters or in-situ stimulus, according to one or more embodiments of the presently disclosed subject matter.

Figure 36:
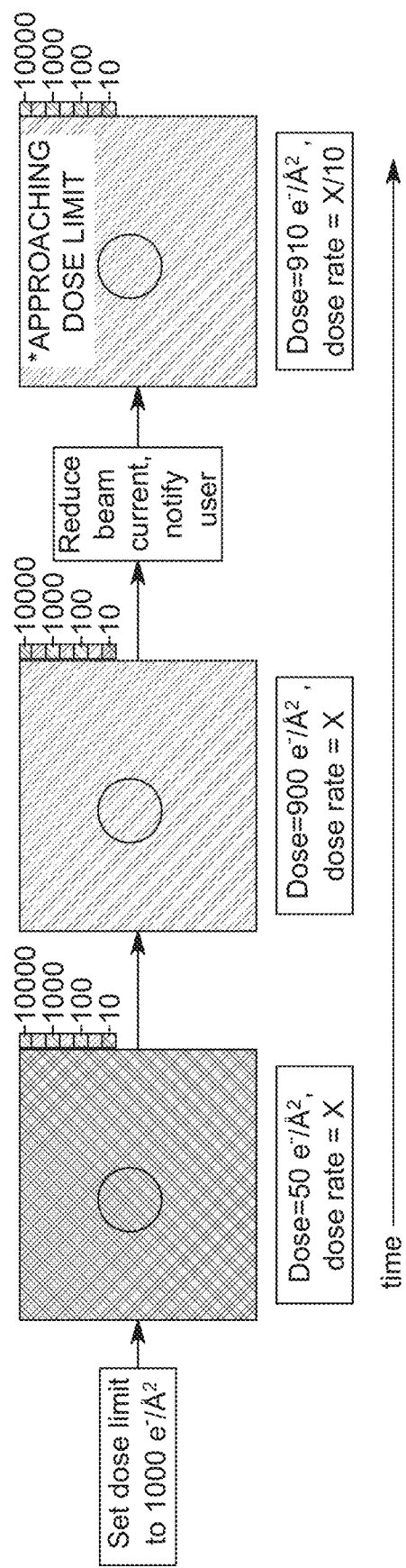

FIG. 36 is a schematic graphical representation of software module which limits dose, dose rate or other microscope parameters or in-situ stimulus, according to one or more embodiments of the presently disclosed subject matter. The software interface establishes a reference site to compare against sites that go through more rigorous imaging or in-situ environmental changes, according to one or more embodiments of the presently disclosed subject matter.

Figure 37:
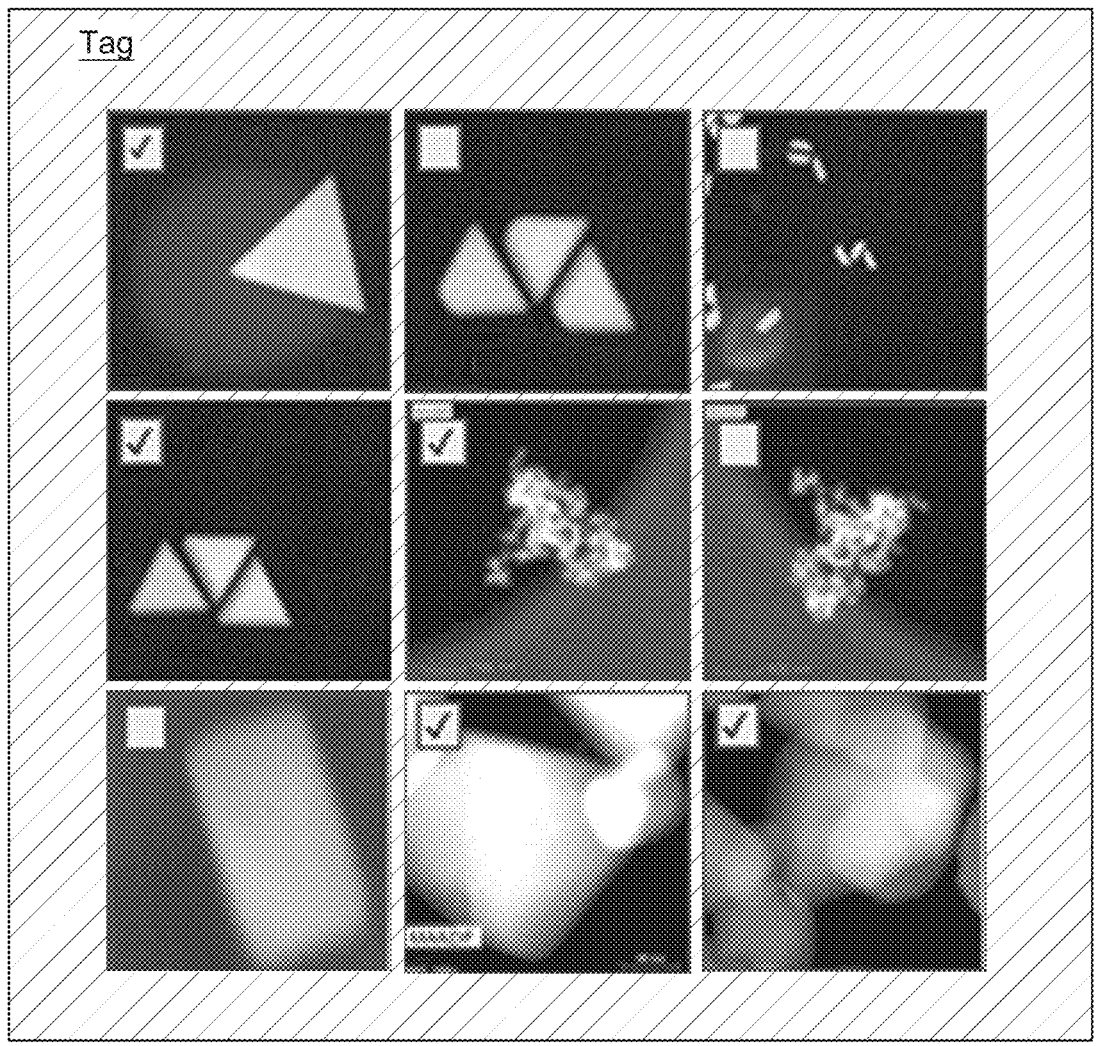
FIG. 37 is a diagrammatic representation of an example for how multiple sample sites can be tracked across an entire imageable area for quick navigation through UI or triggers, according to one or more embodiments of the presently disclosed subject matter.

FIG. 37 is a diagrammatic representation of an example for how to track multiple sample sites across the entire imageable area for quick navigation through UI or triggers, according to one or more embodiments of the presently disclosed subject matter.

Figure 38:
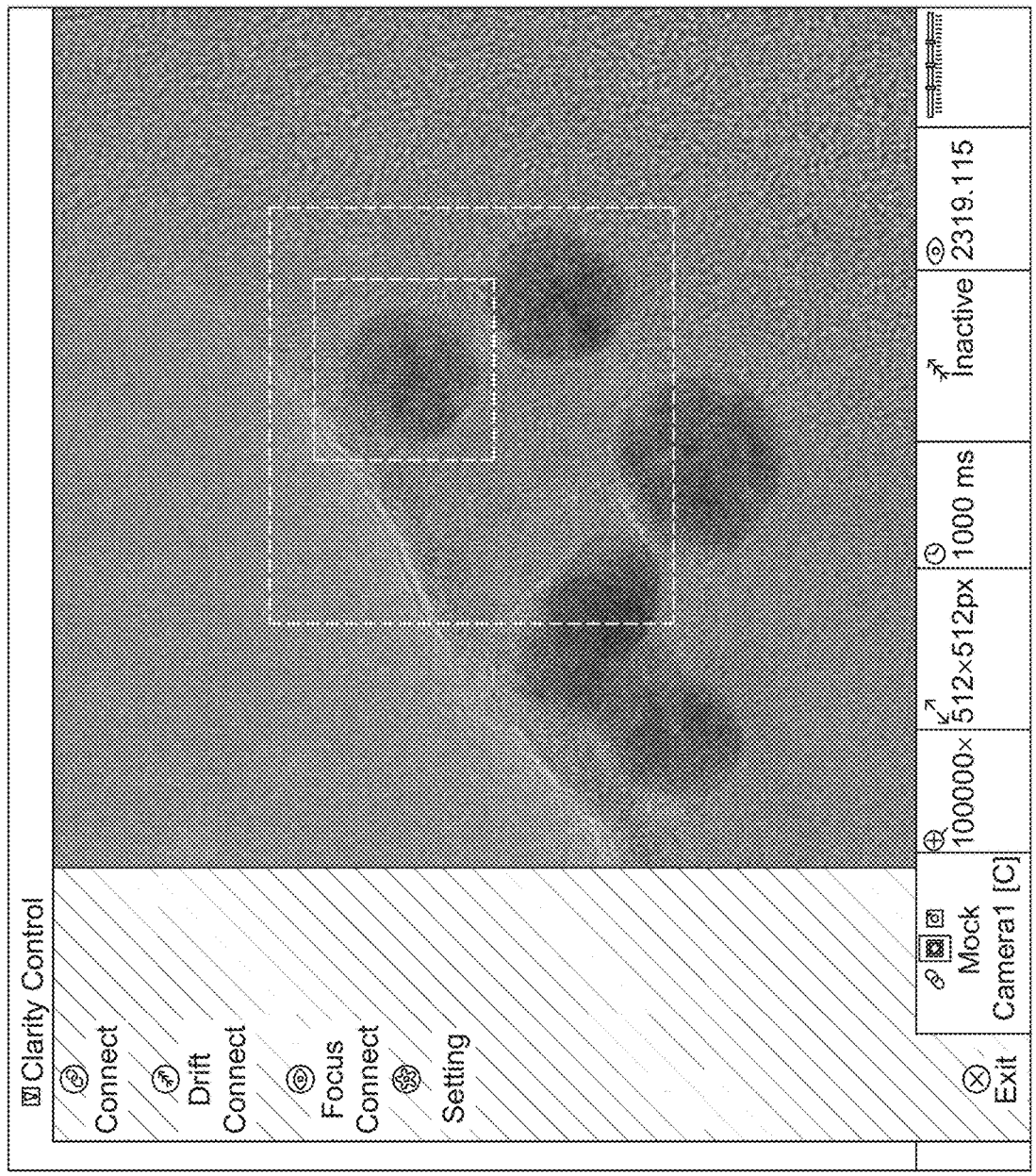
FIG. 38 is an illustrative representation of an example of one or more regions of interest identified on a live image feed with key functions to keep a sample stable in X, Y and Z aces included along with some key metadata describing the image, according to one or more embodiments of the presently disclosed subject matter.

FIG. 38 is an illustrative example of one or more regions of interest identified on the live image feed, according to one or more embodiments of the presently disclosed subject matter.

Figure 39:
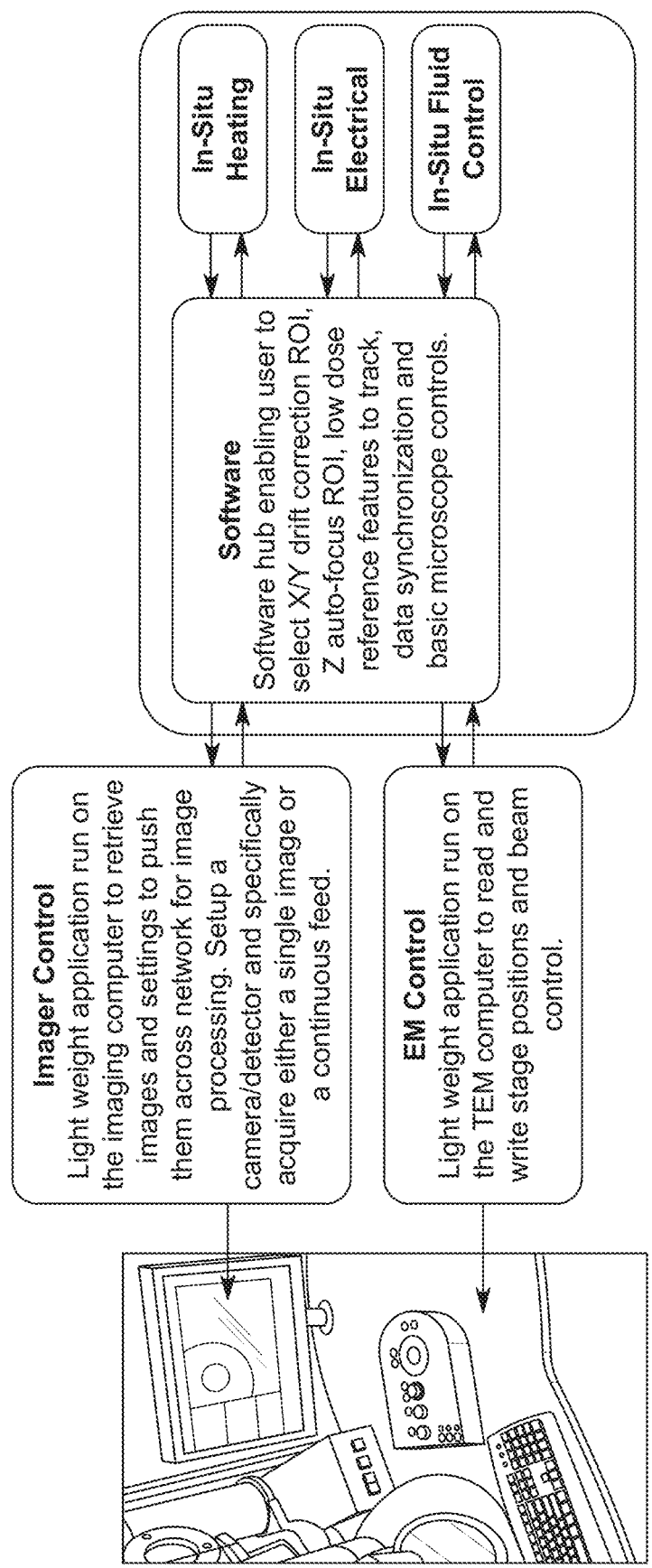
FIG. 39 is a schematic graphical representation of a basic communication architecture for a software module that forms part of the control system, according to one or more embodiments of the presently disclosed subject matter.

FIG. 39 is an illustrative diagram of a basic communication architecture for the software module that forms part of the control system, according to one or more embodiments of the presently disclosed subject matter.

FIG. 40 is diagrammatic representation of a filtering technique to reduce the background noise of an image, according to one or more embodiments of the presently disclosed subject matter.

Figure 41:
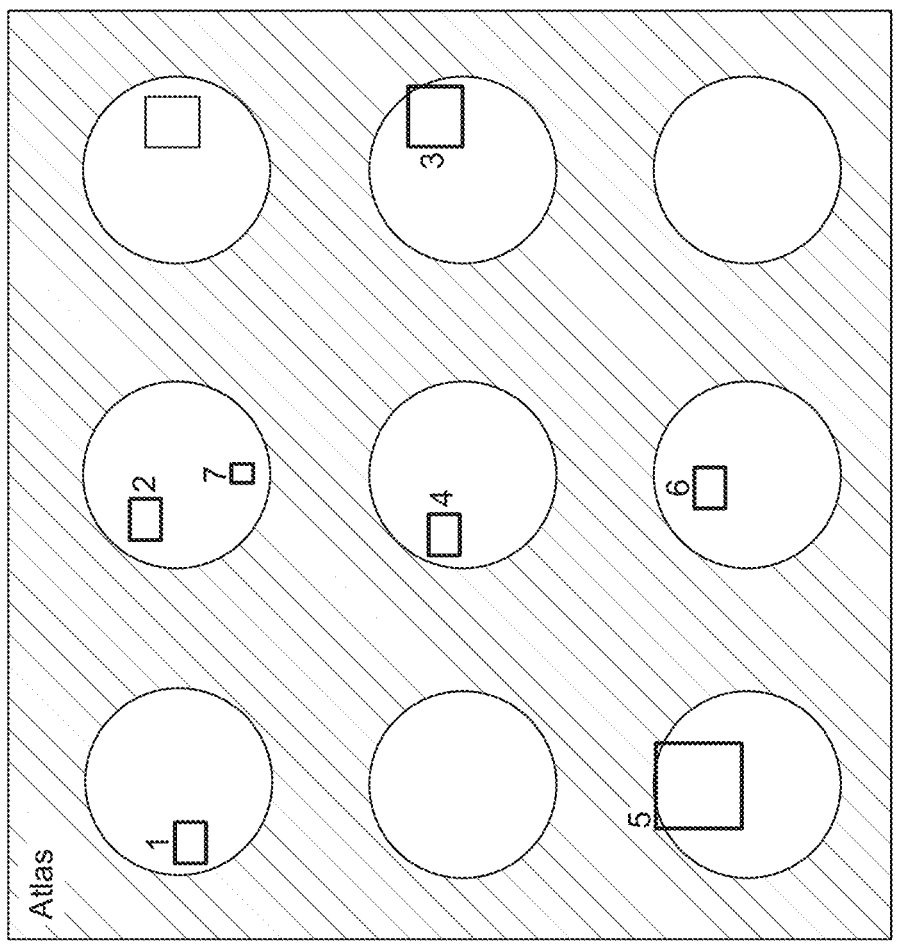
FIG. 41 is a schematic graphical representation of multiple regions of interest presented against total field of view, according to one or more embodiments of the presently disclosed subject matter.

FIG. 41 is diagrammatic representation of multiple regions of interest presented against total field of view, according to one or more embodiments of the presently disclosed subject matter.

Figure 42:
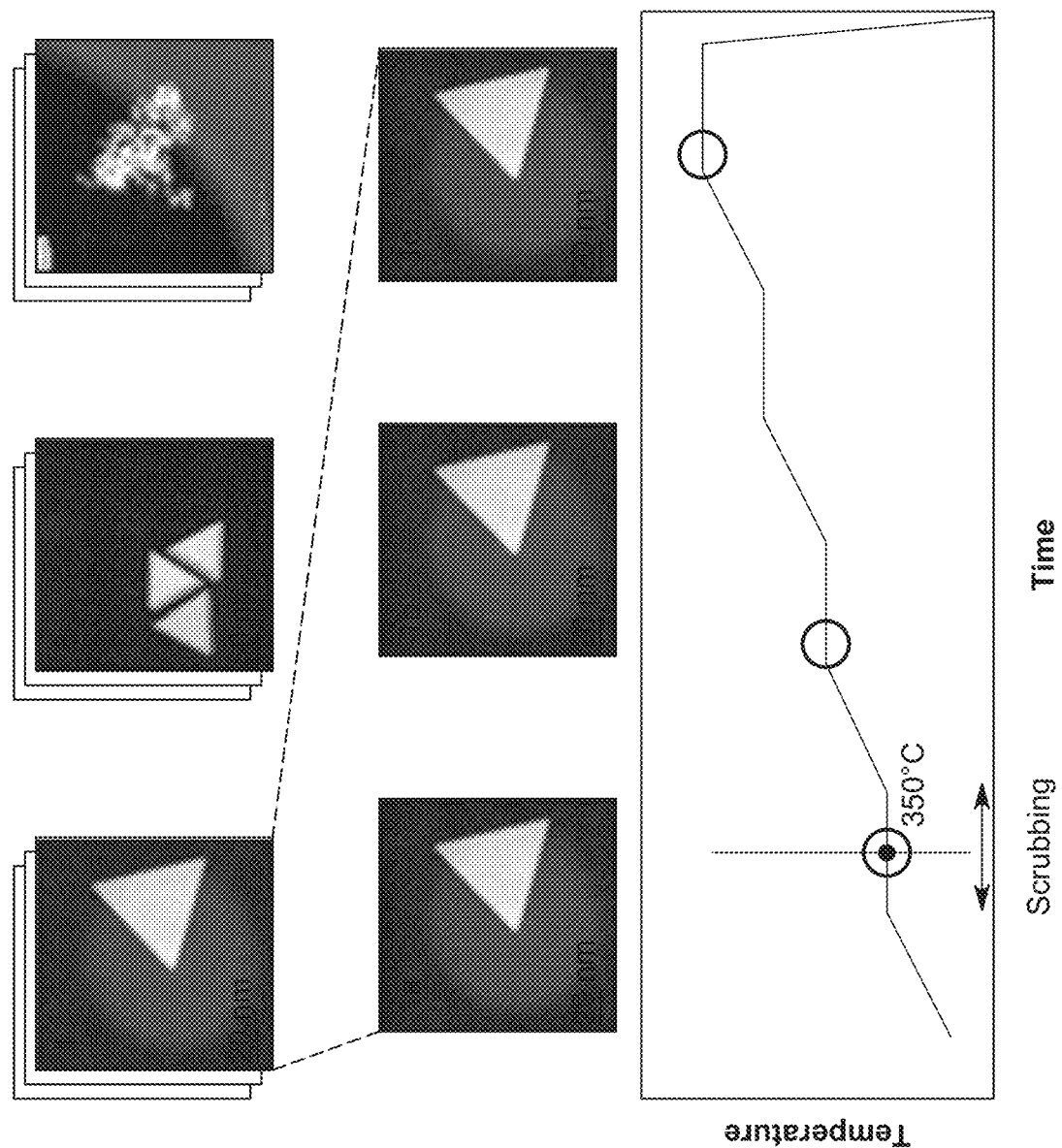
FIG. 42 is a schematic graphical representation of an example of report generated from multiple sites for a given time period or a given in-situ stimulus, according to one or more embodiments of the presently disclosed subject matter.

FIG. 42 is diagrammatic representation is an example of report generation from multiple sites for a given time or in-situ stimulus, according to one or more embodiments of the presently disclosed subject matter. The metadata can advantageously be of value during and after the experiment. The control system may permit users to plot metadata and filter all metadata linked to the images. For example, the control system can allow a user to plot temperature vs. time, and then select only those images involved in specific temperature transitions. As another example, the control system can allow a user to plot focus quality scores and filter a specific image set for creating time sequences, wherein the specific image set only includes images that are in good focus.

Figure 43:
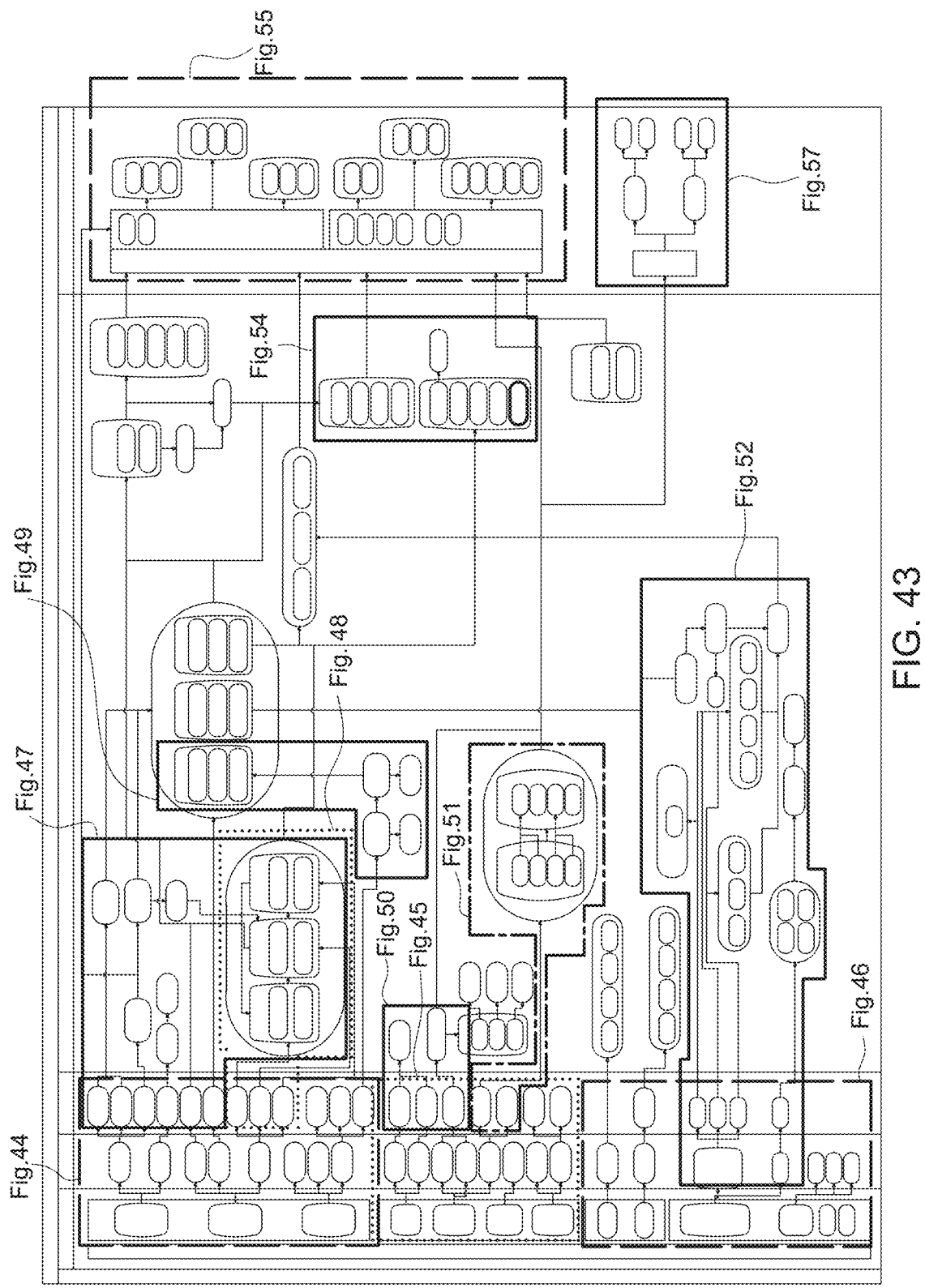
FIG. 43 is a schematic graphical representation of the control system in the form of a chart, according to one or more embodiments of the presently disclosed subject matter.
Figure 44A:
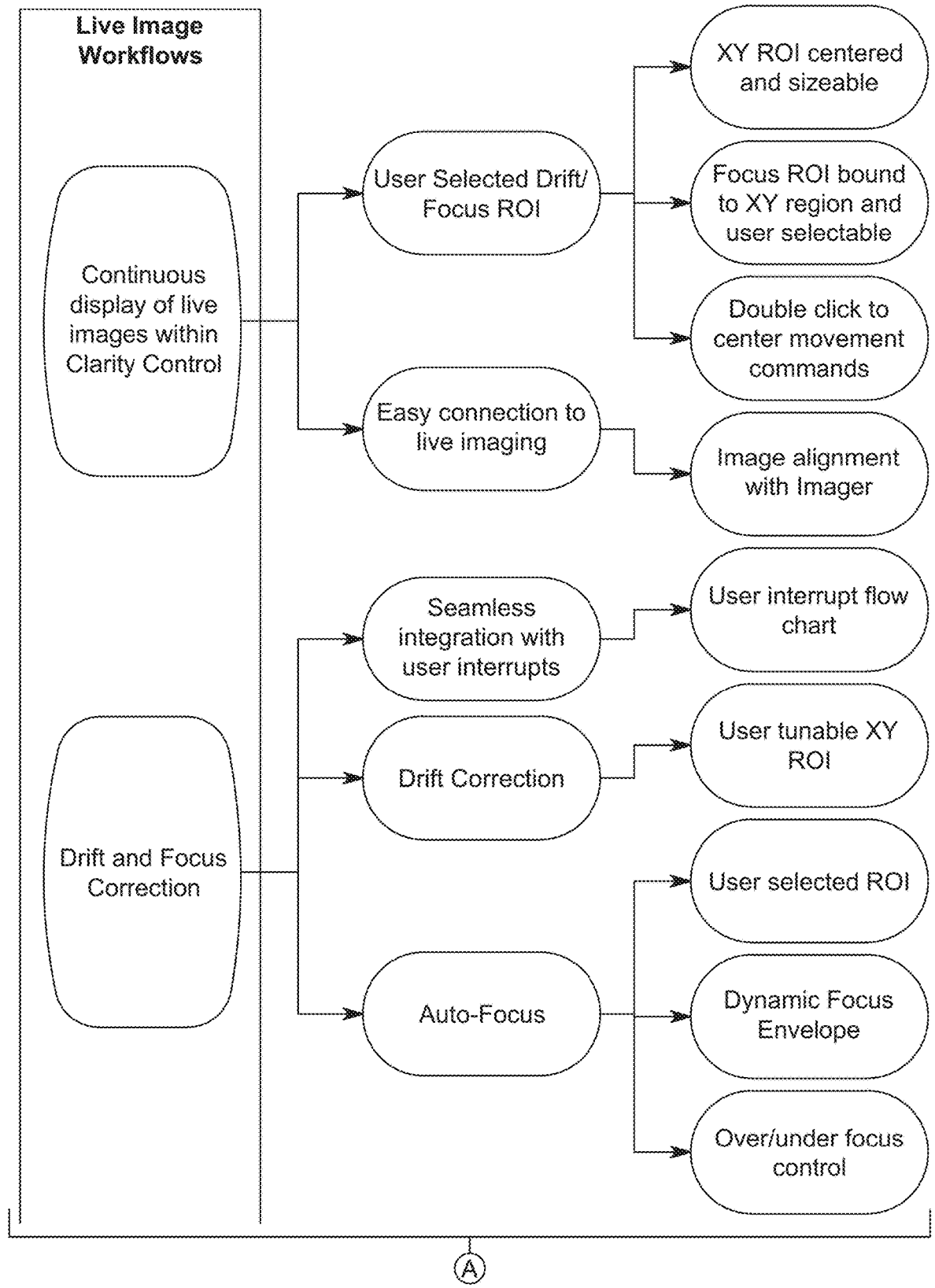
FIGS. 44A and 44B, FIG. 45, FIG. 46, FIGS. 47A and 47B, FIG. 48, FIG. 49, FIG. 50, FIG. 51, FIGS. 52A and 52B, FIG. 53, FIG. 54, FIGS. 55A and 55B, FIG. 56, and FIG. 57 illustrate various portions of the control system of FIG. 43.
Figure 44B:
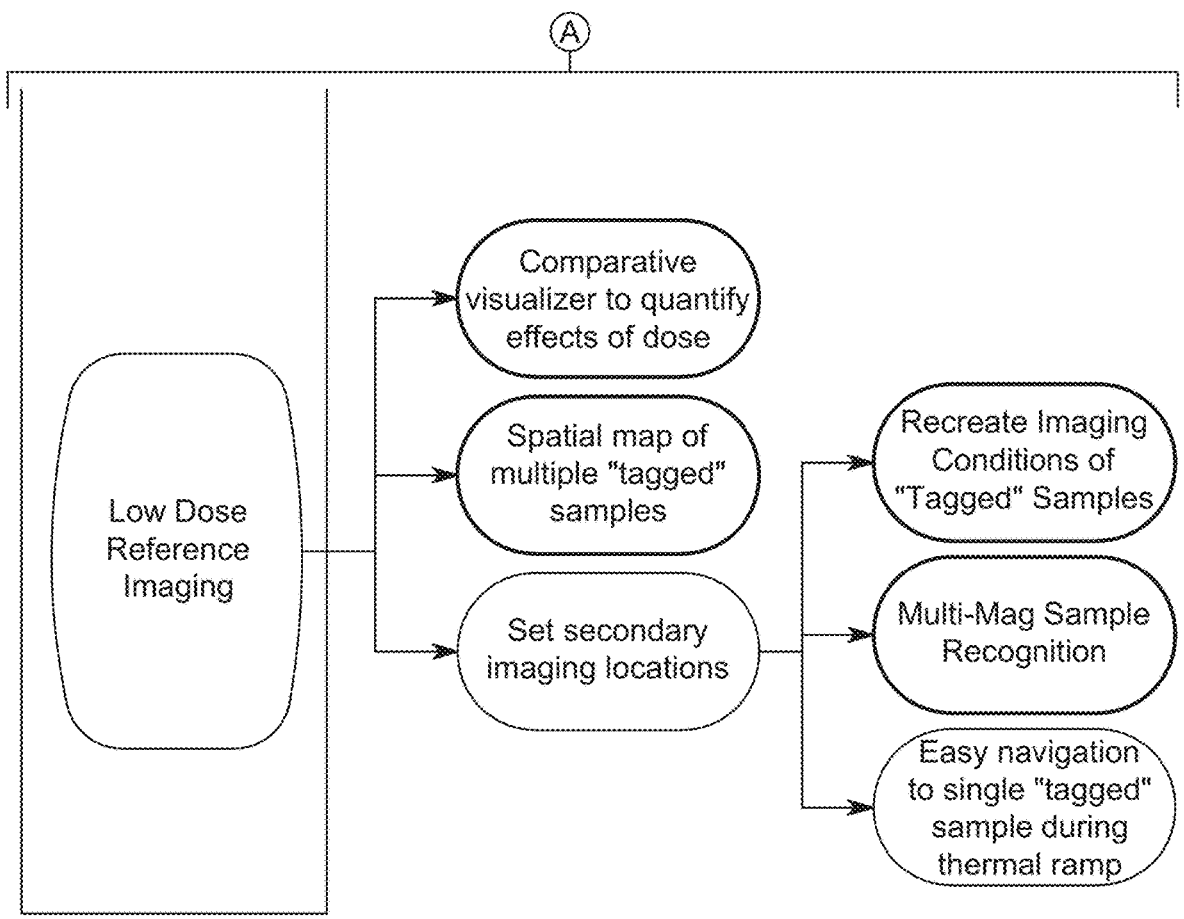

FIG. 43 is diagrammatic representation of a control system in the form of a chart, according to one or more embodiments of the presently disclosed subject matter.

Figure 45:
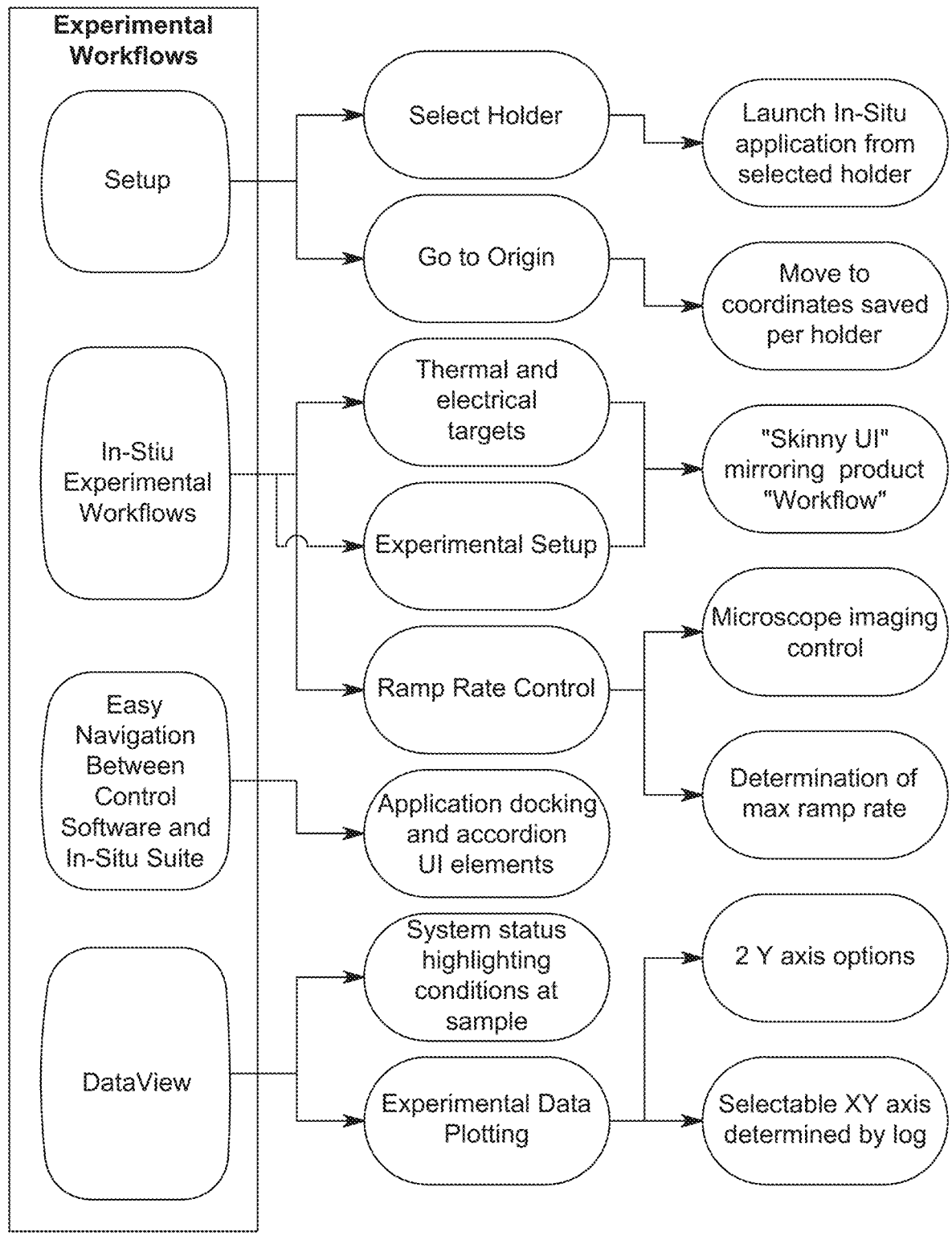
Figure 46:
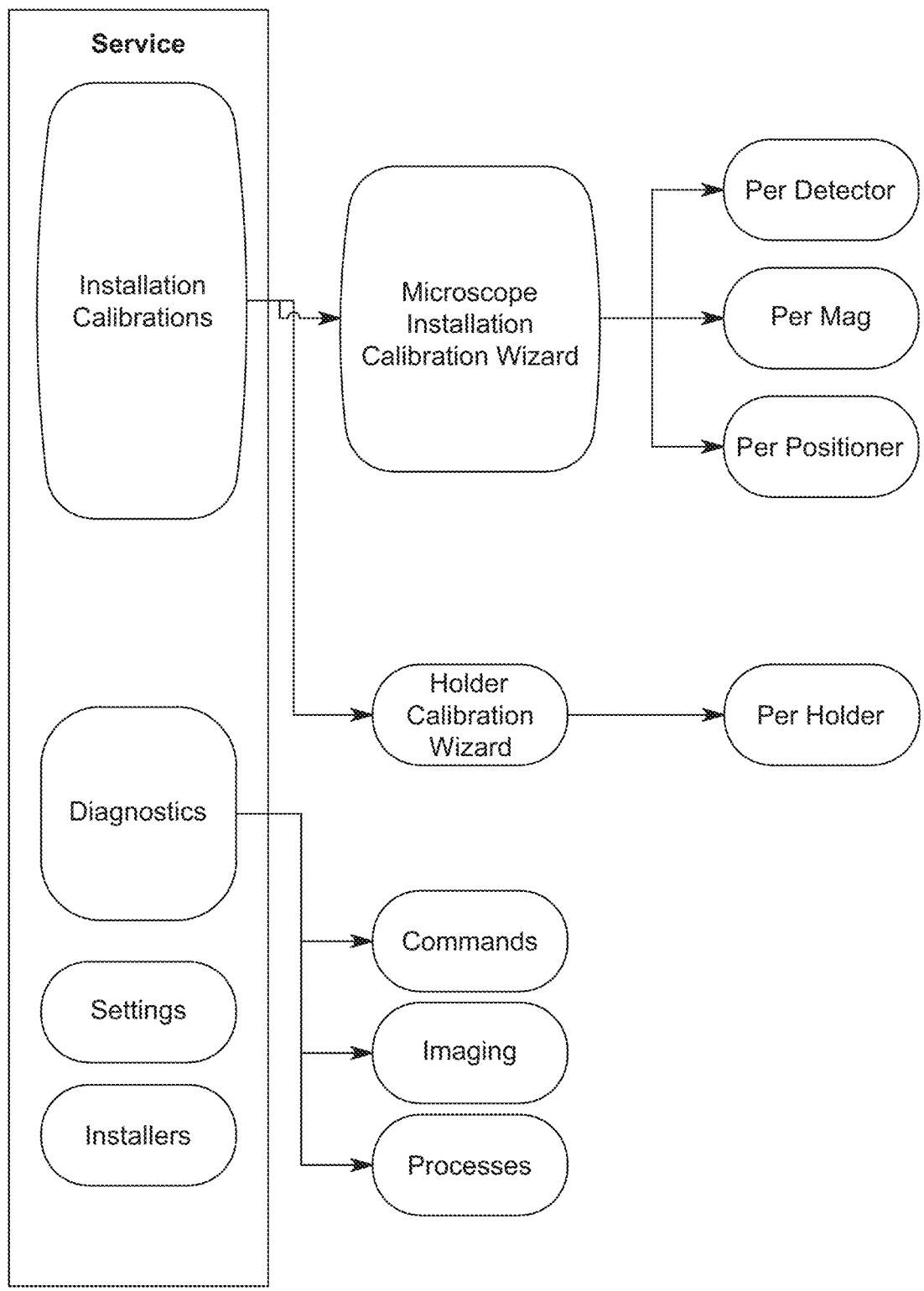
Figure 47A:
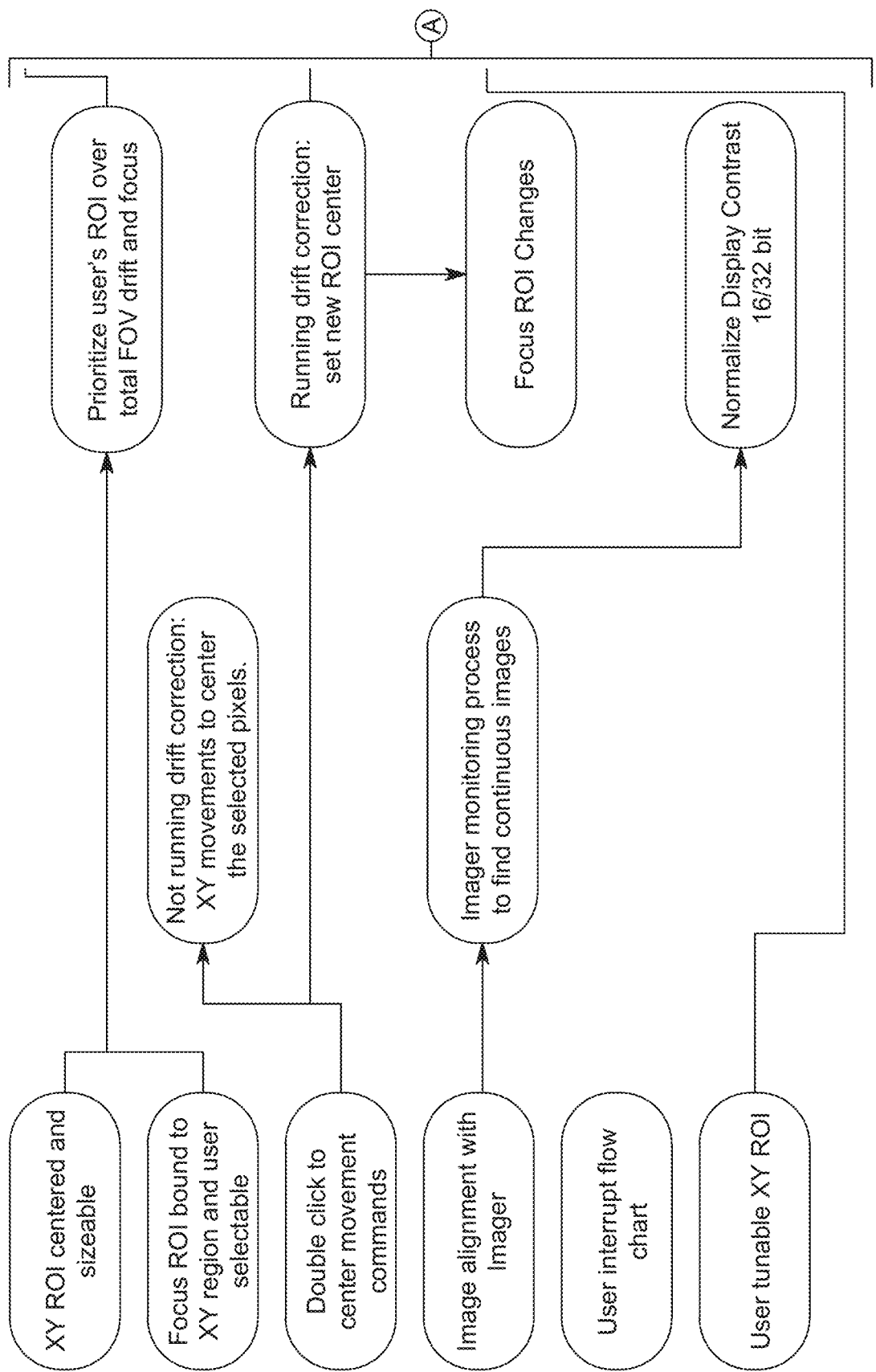
Figure 47B:
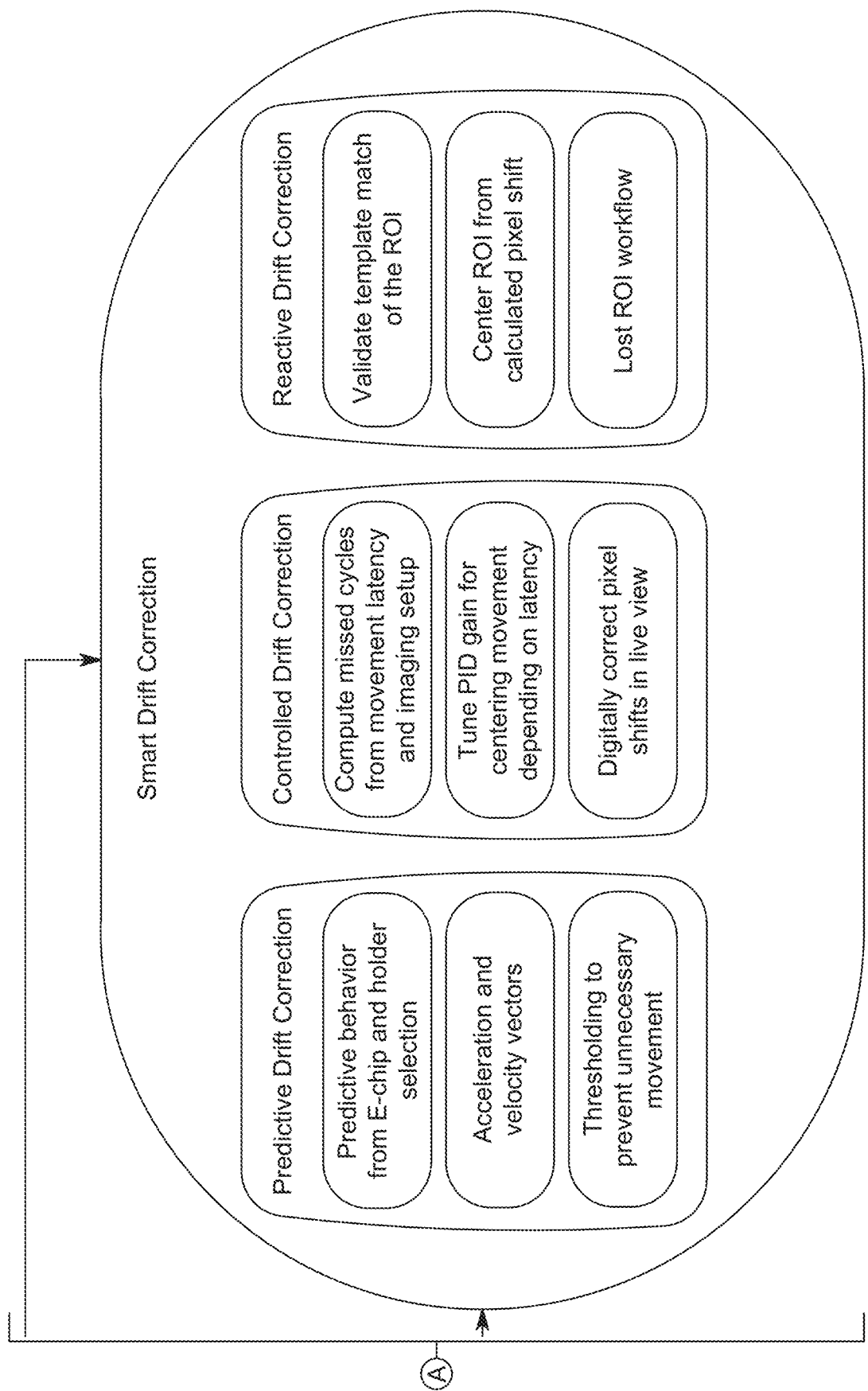
Figure 48:
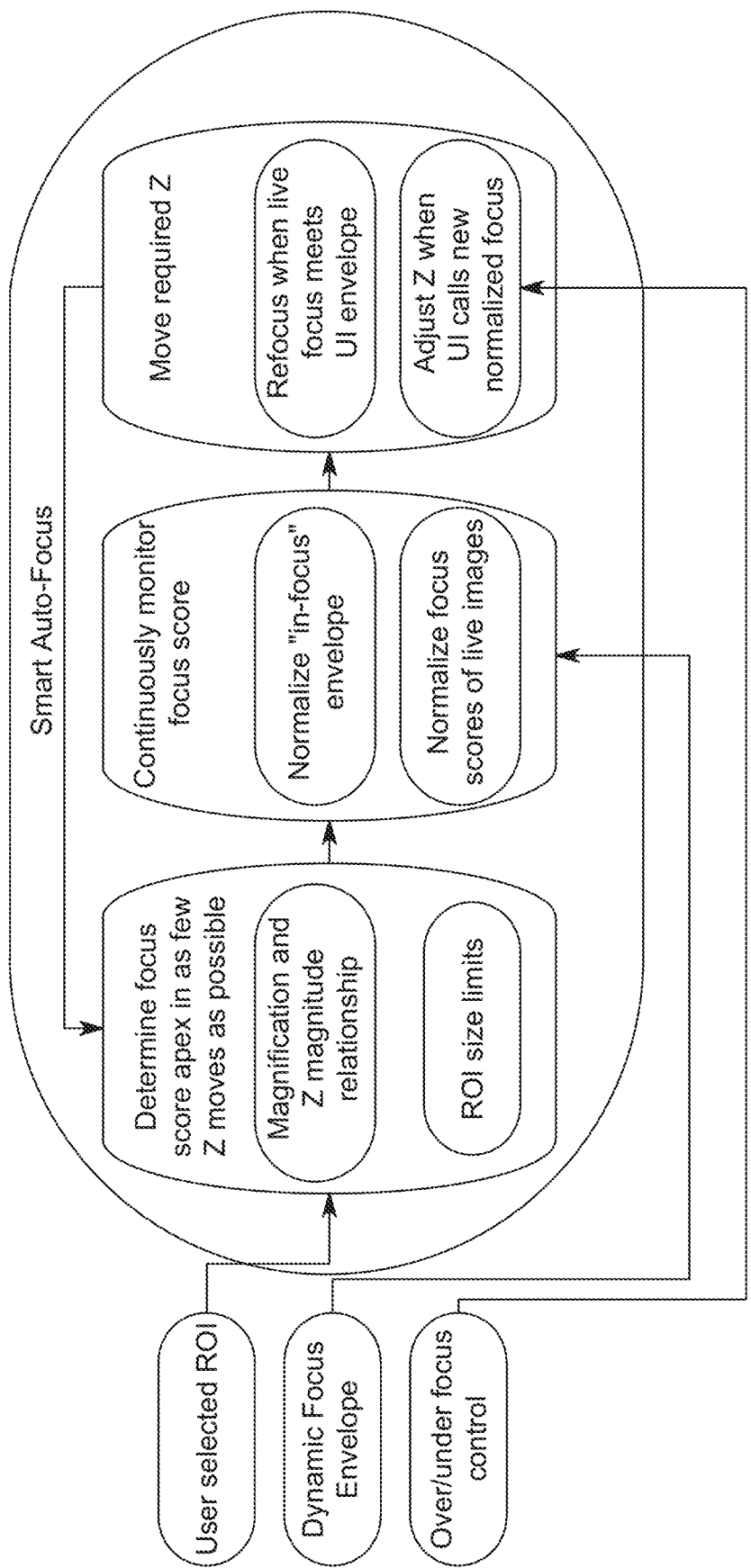
Figure 49:
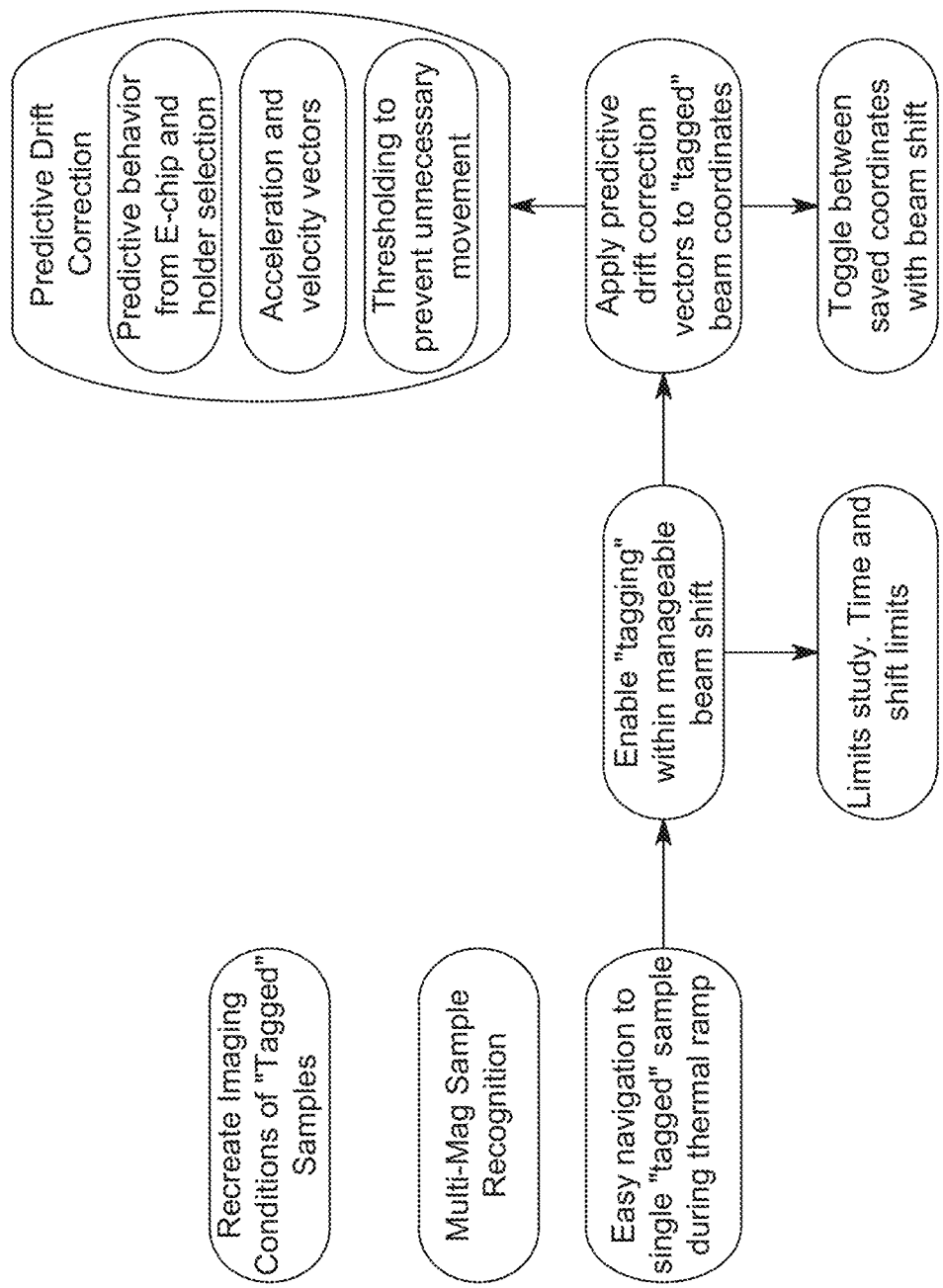
Figure 50:
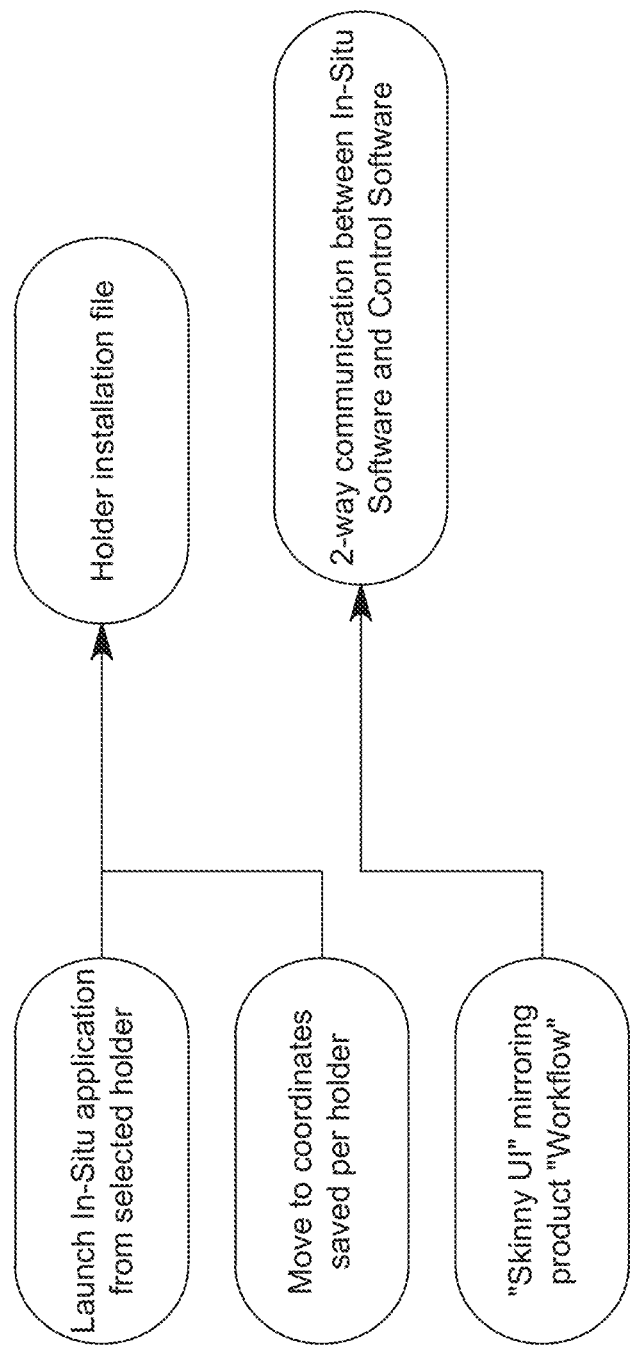
Figure 51:
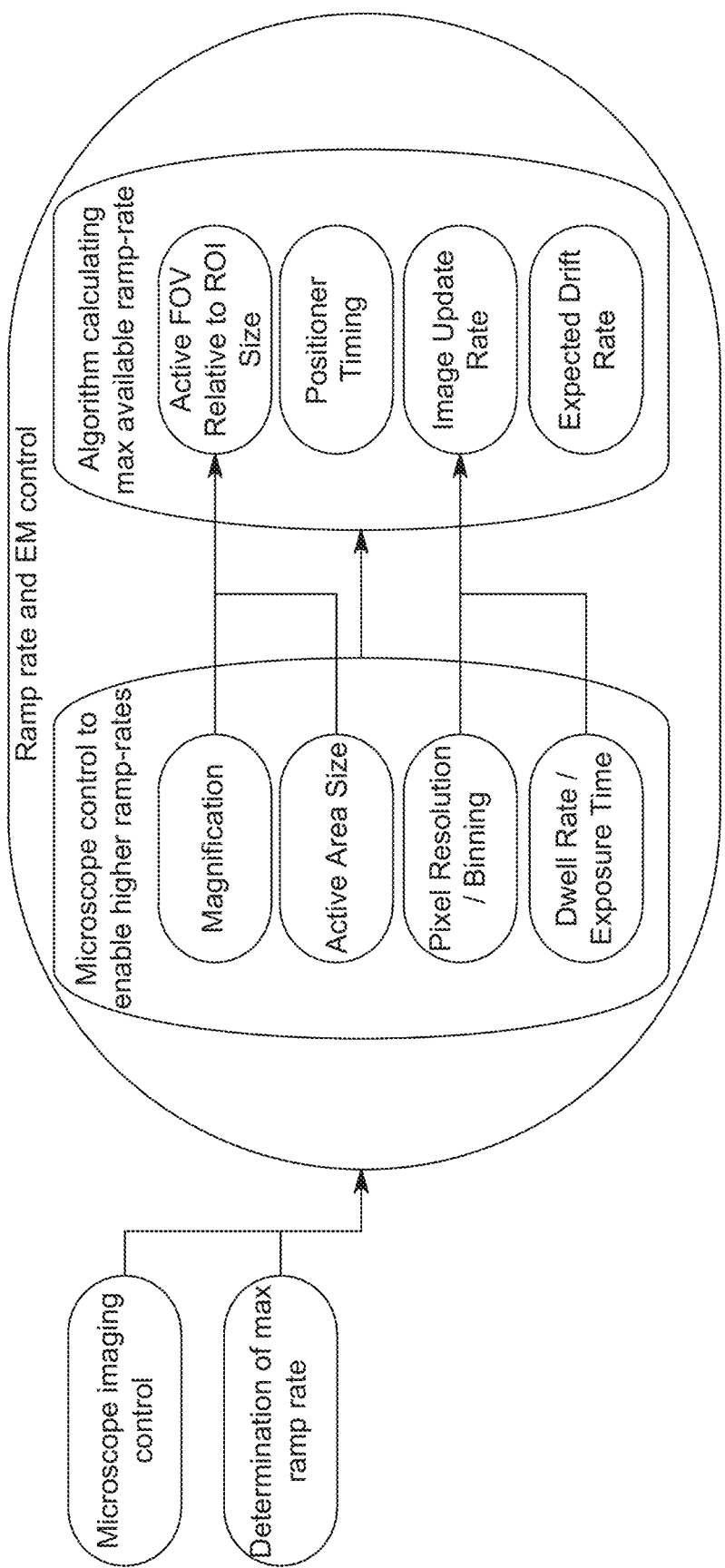
Figure 52A:
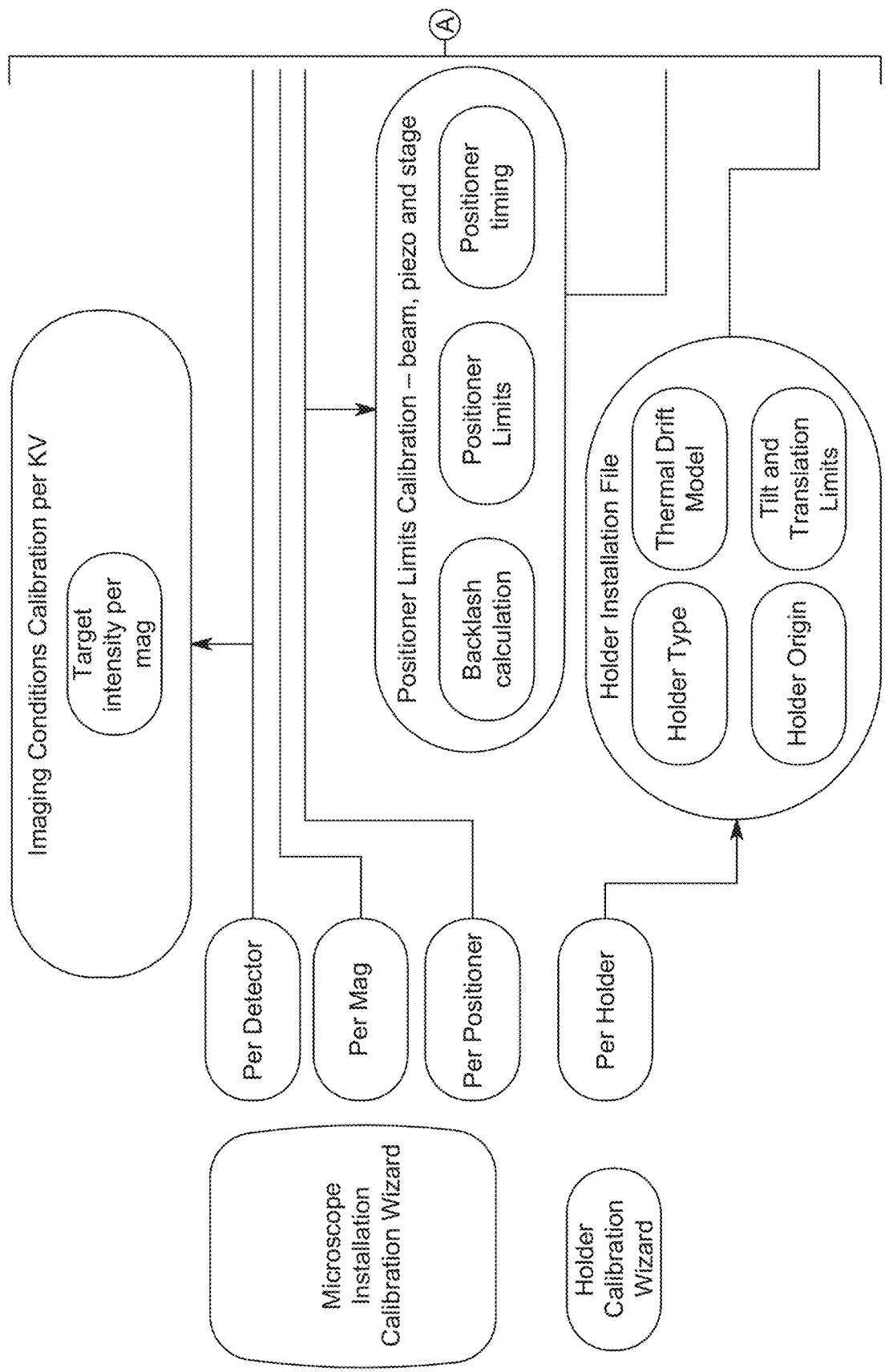
Figure 52B:
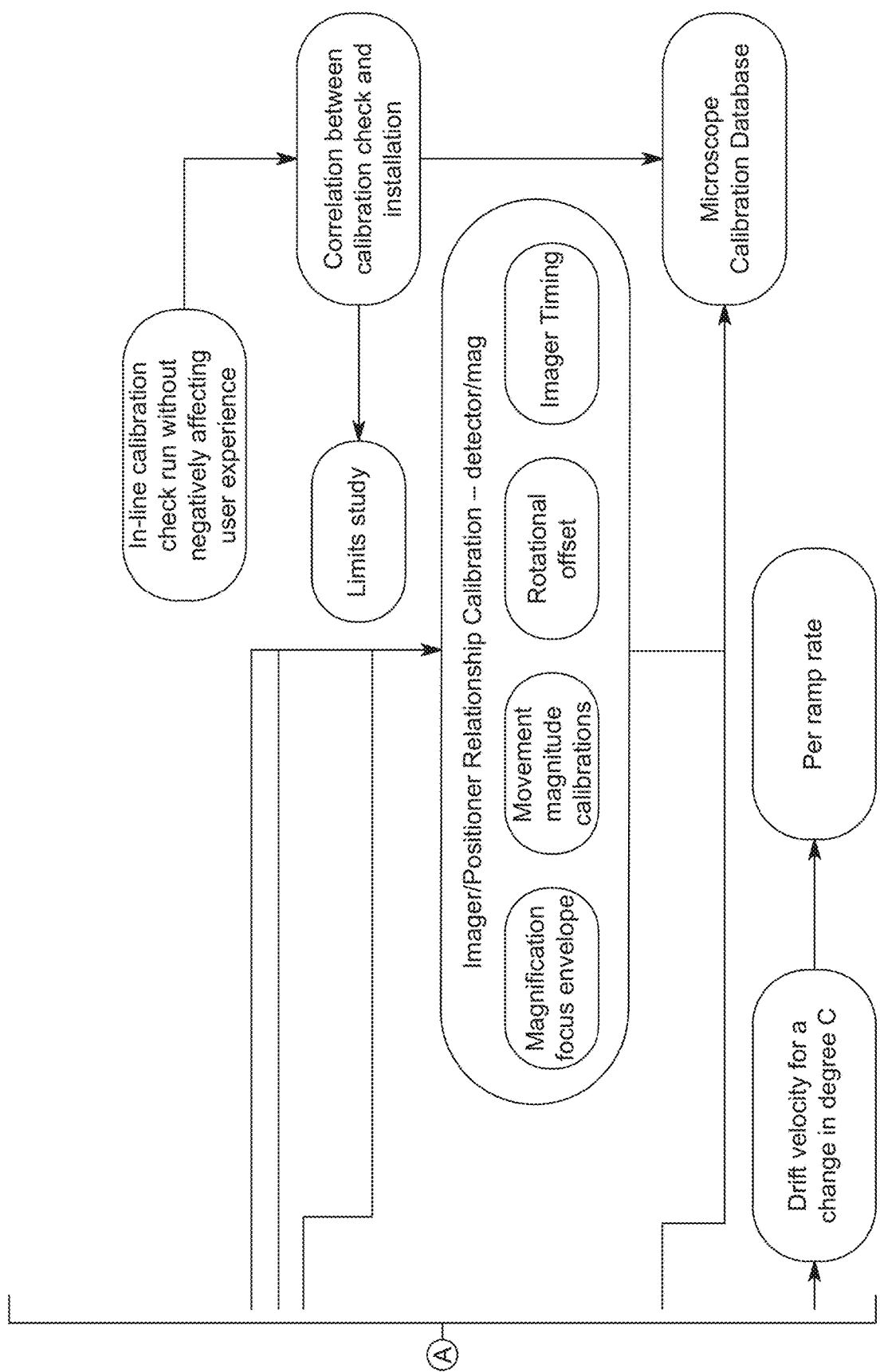
Figure 53:
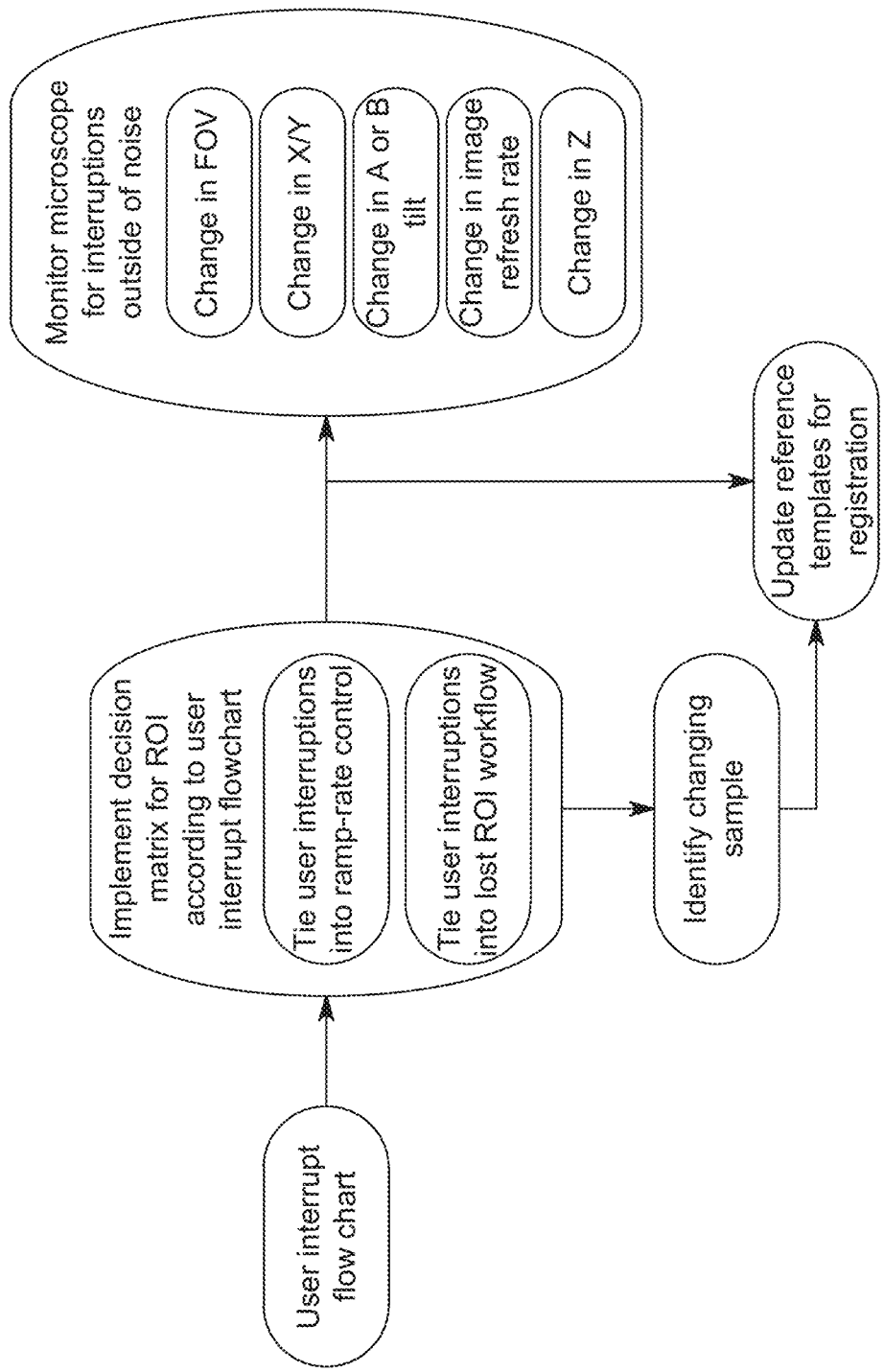
Figure 54:
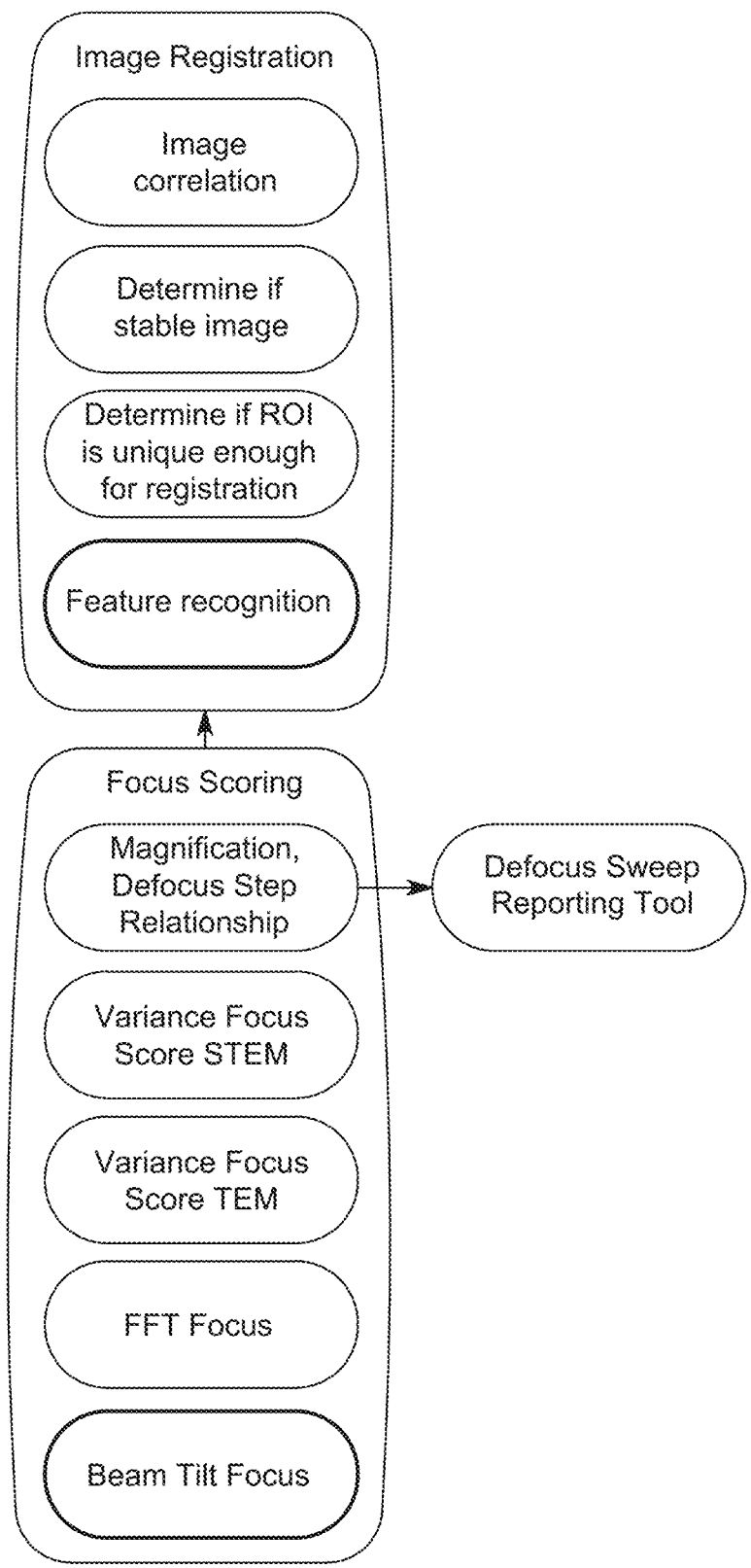
Figure 55A:
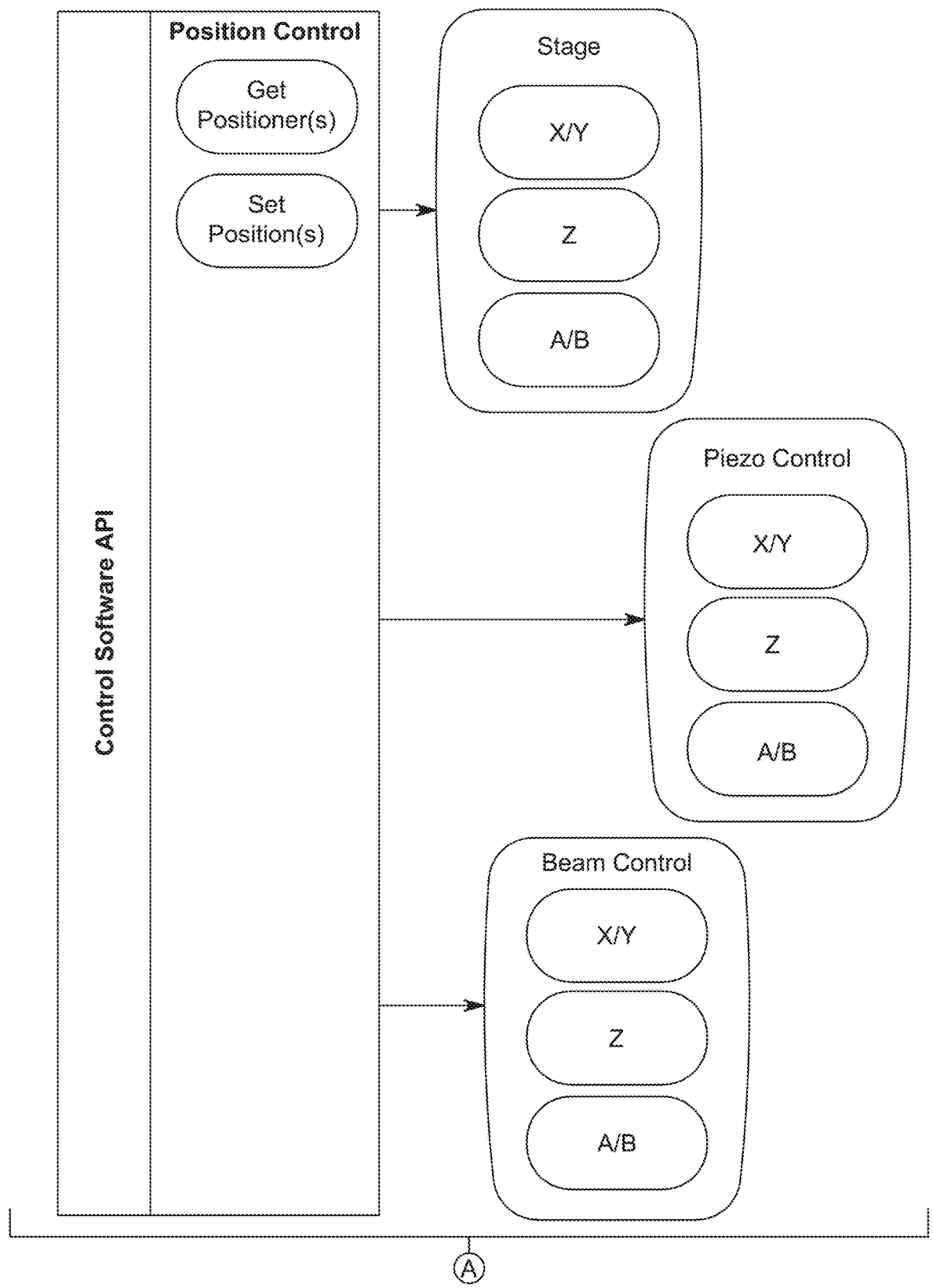
Figure 55B:
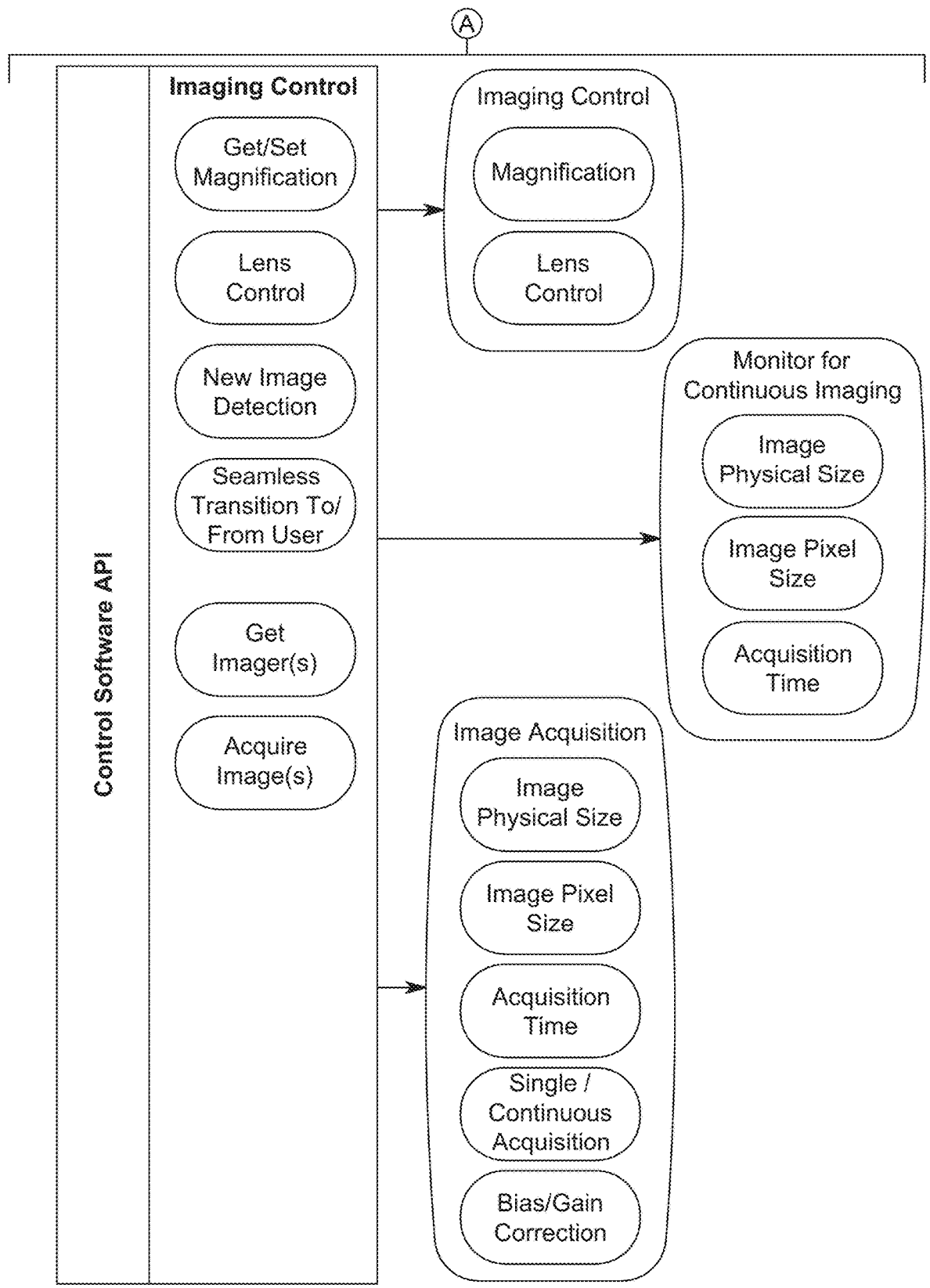
Figure 56:
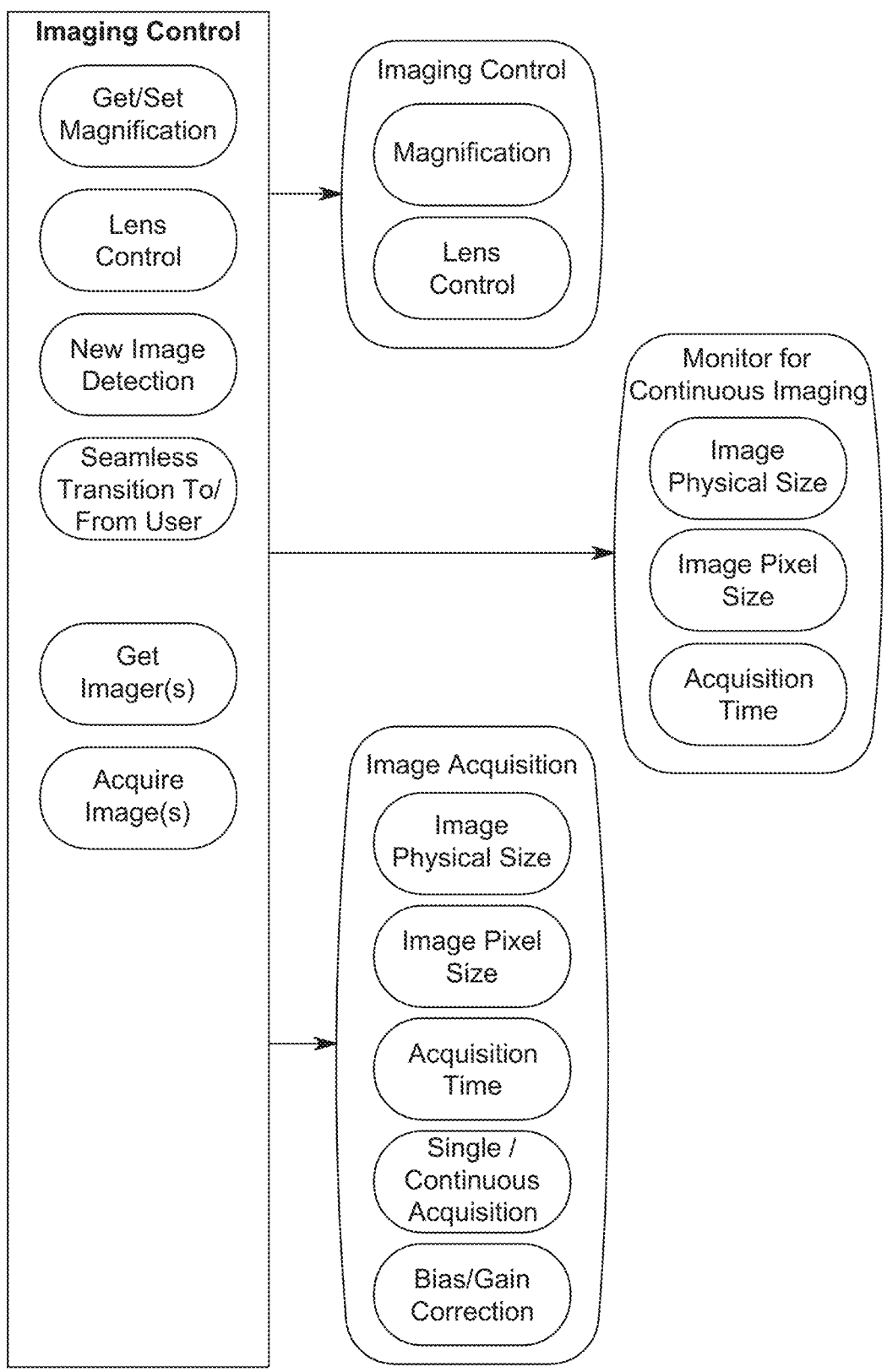
Figure 57:
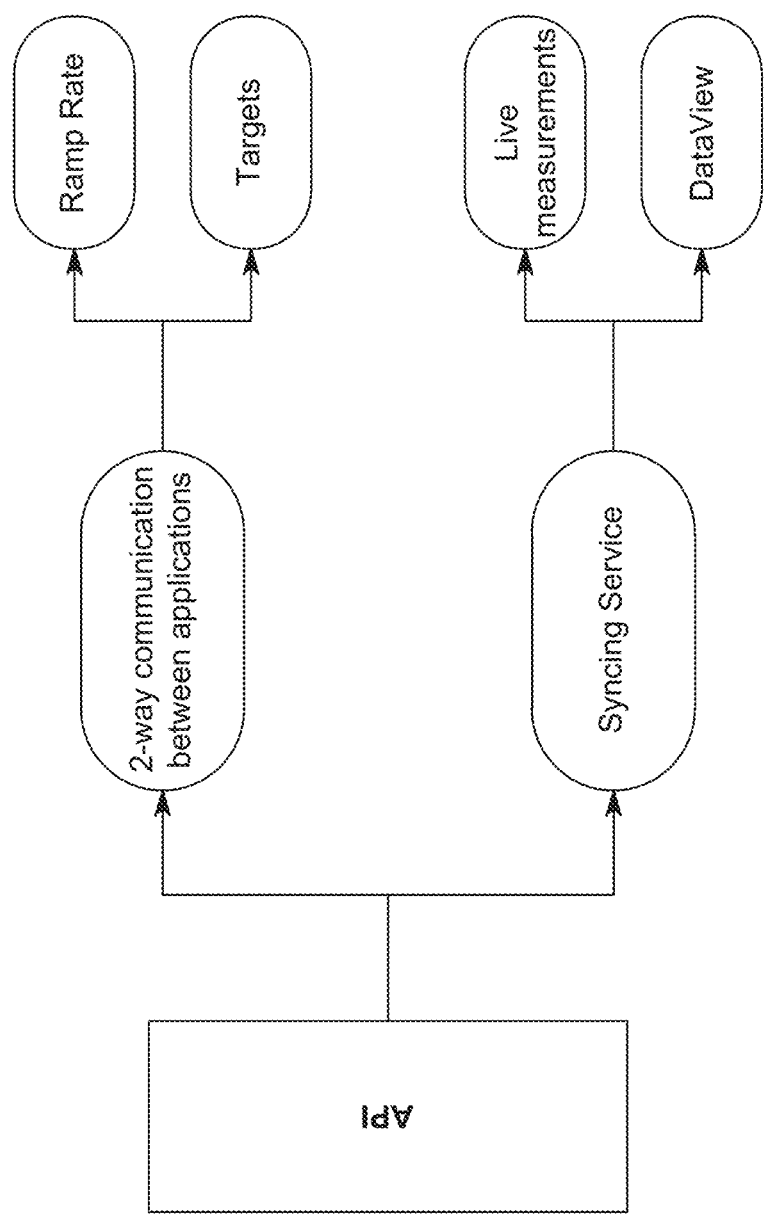

FIG. 44 through FIG. 57 illustrate various portions of the control system of FIG. 45 whereas FIG. 58 through FIG. 68 are schematic graphical representations of a workflow to automate in-situ experiments, according to one or more embodiments of the presently disclosed subject matter.

Figure 58:
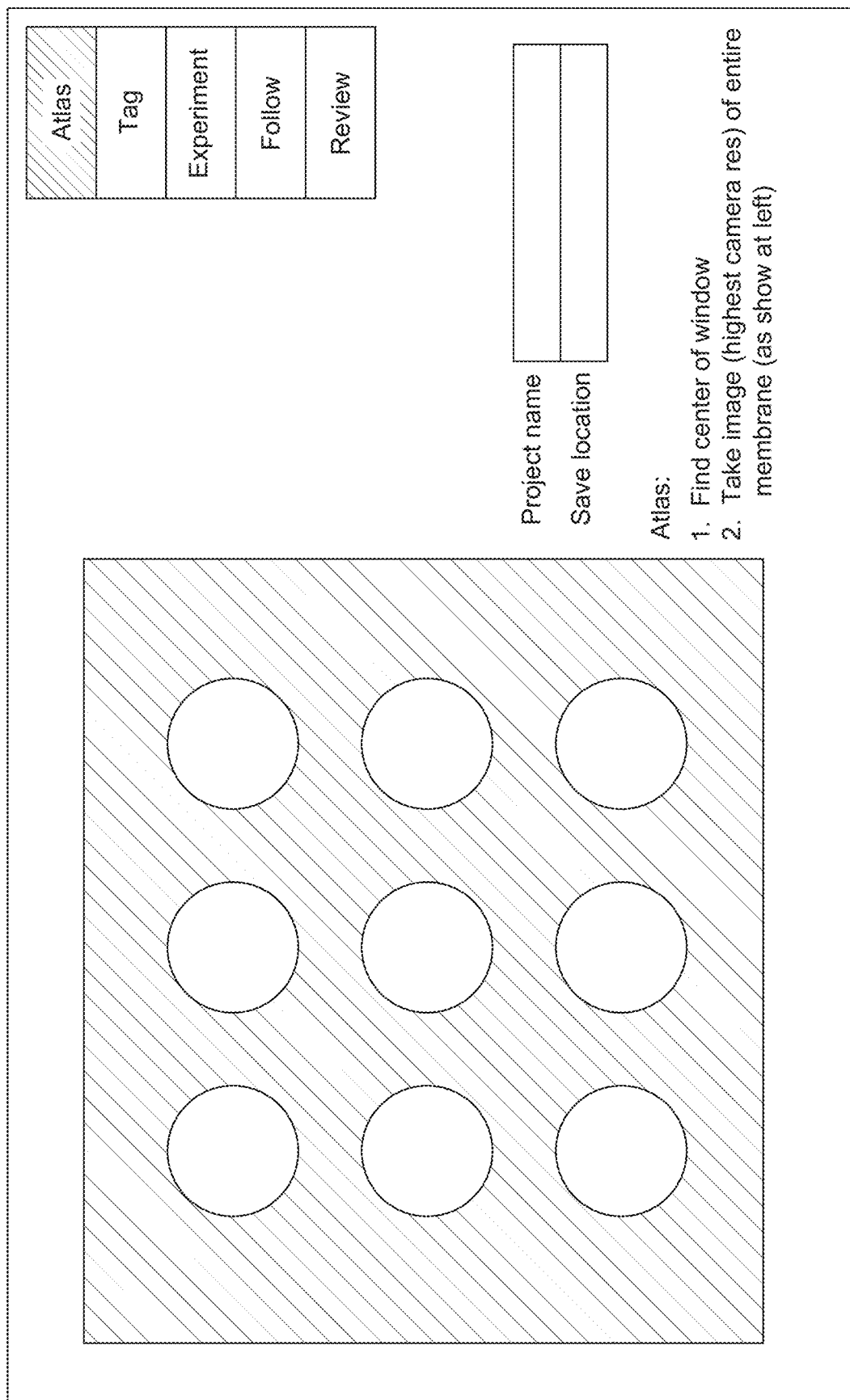
FIG. 58 is a graphical representation of the first step in an automated experimental workflow, according to one or more embodiments of the presently disclosed subject matter.

FIG. 58 is a graphical representation of the first step in an automated experimental workflow wherein the software module helps users find the operational area for the experiment which is often a subset of the entire moveable range in X, Y and Z axes. This is the area where sample can be viewed and where in-situ stimulus can be applied.

Figure 59:
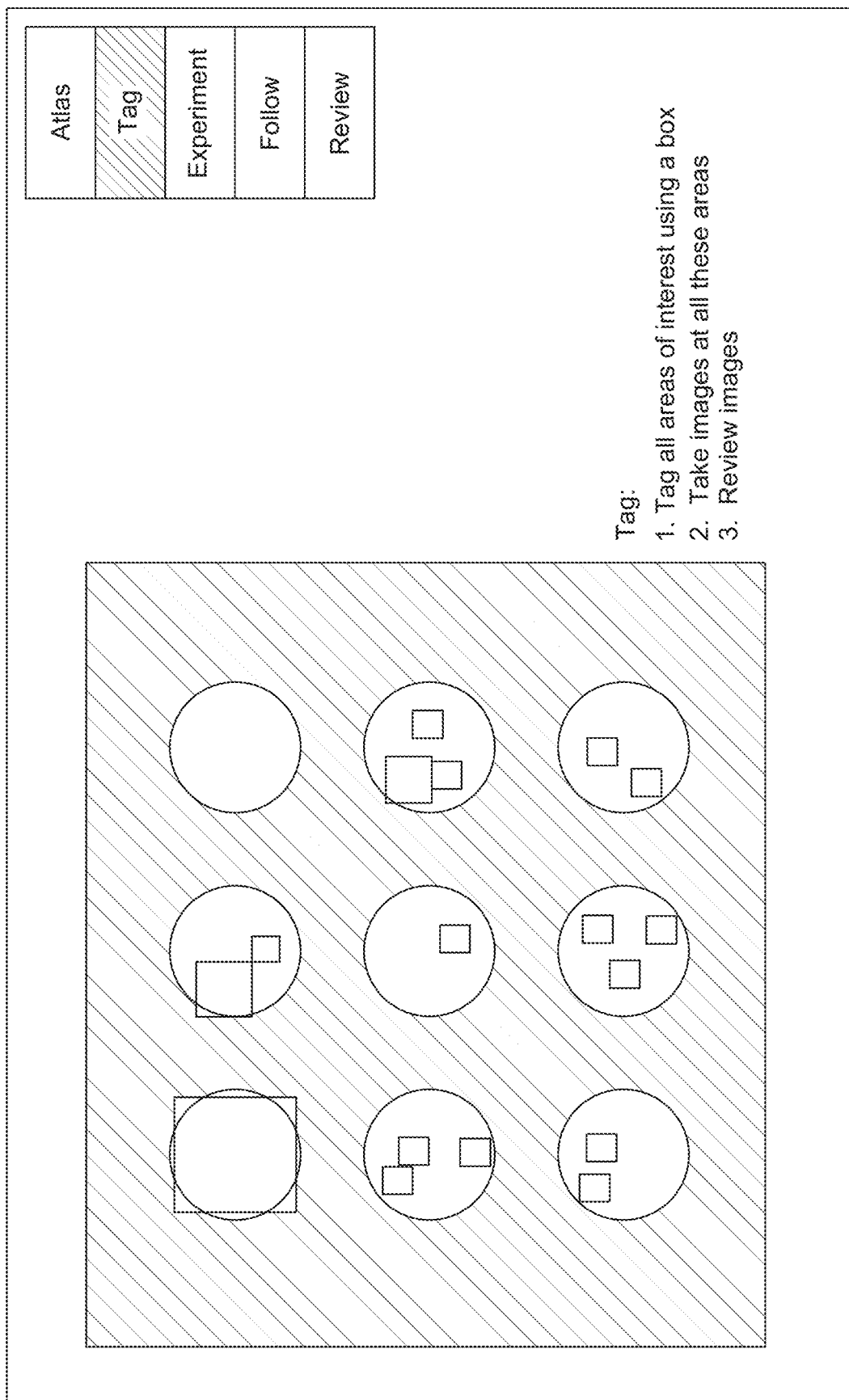
FIG. 59 is a graphical representation of the second step in an automated experimental workflow, according to one or more embodiments of the presently disclosed subject matter.

FIG. 59 is a graphical representation of the second step in an automated experimental workflow wherein the software module helps users tag specific regions of interest within the operational area. The software module can save locations and help users manually or programmatically navigate to these key areas easily referenced by thumbnails of the sample morphology and a coordinate in X, Y and Z axes of location on a map.

FIG. 60 is a graphical representation of the third step in an automated experimental workflow wherein the software module helps users review the tagged regions. This can be an automatic or manual step for users to down select the most important regions.

Figure 61:
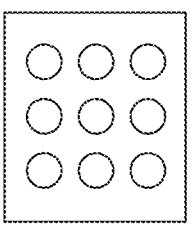
FIG. 61 is a graphical representation of the fourth step in an automated experimental workflow, according to one or more embodiments of the presently disclosed subject matter.

FIG. 61 is a graphical representation of the fourth step in an automated experimental workflow where users load or build an automated experiment. The in-situ stimulus profile can be created. Additionally, image captures at all regions of interest identified earlier can be manually triggered or programmed as part of the experiment.

Figure 62:
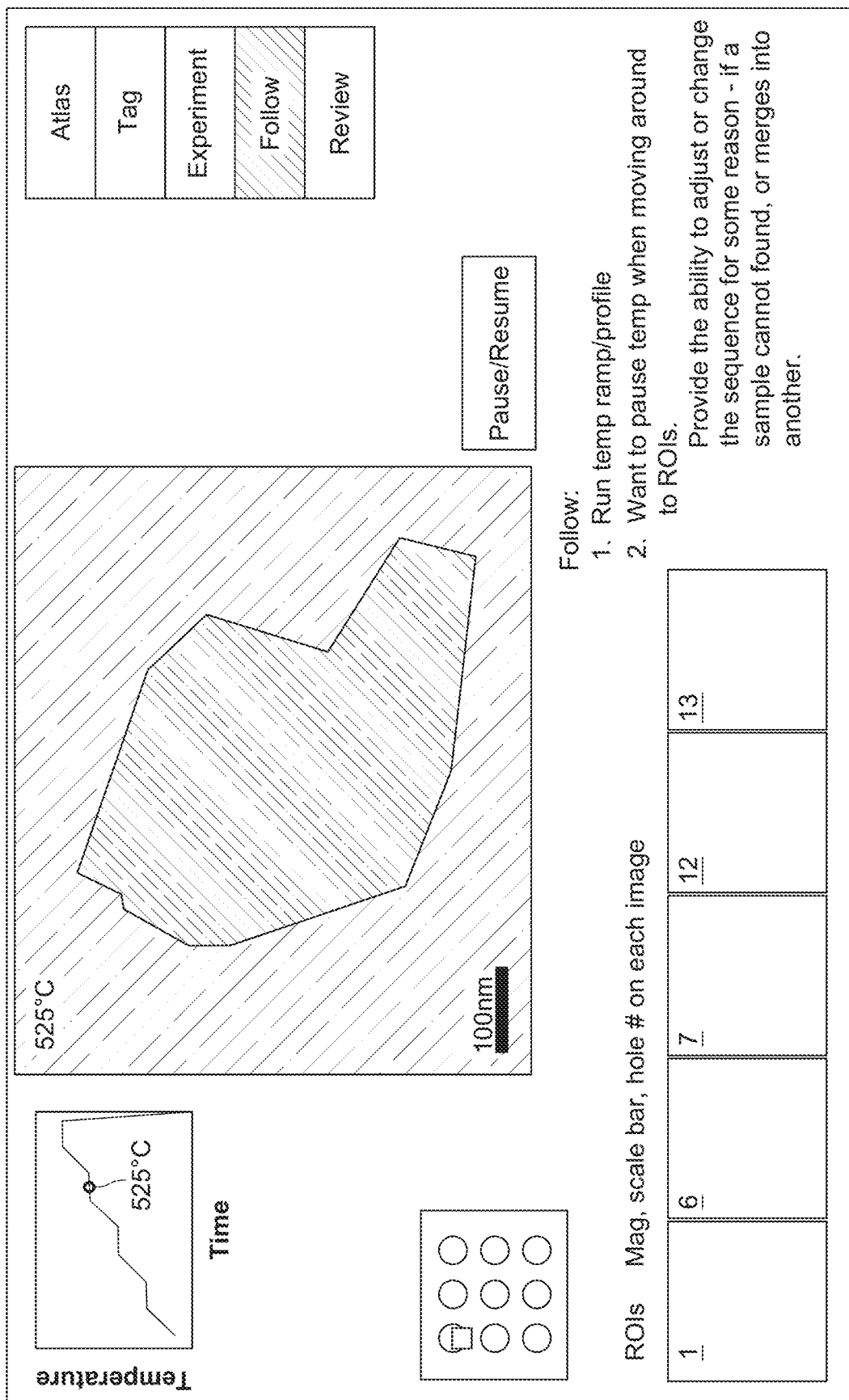
FIG. 62 is a graphical representation of the fifth step in an automated experimental workflow, according to one or more embodiments of the presently disclosed subject matter.

FIG. 62 is a graphical representation of the fifth step in an automated experimental workflow where the programmed experiment is physically run. The software module would apply the programmed stimulus and capture changes at all tagged regions of interest as programmed in the experiment setup. The sample drift is tracked throughout the experiment.

Figure 63:
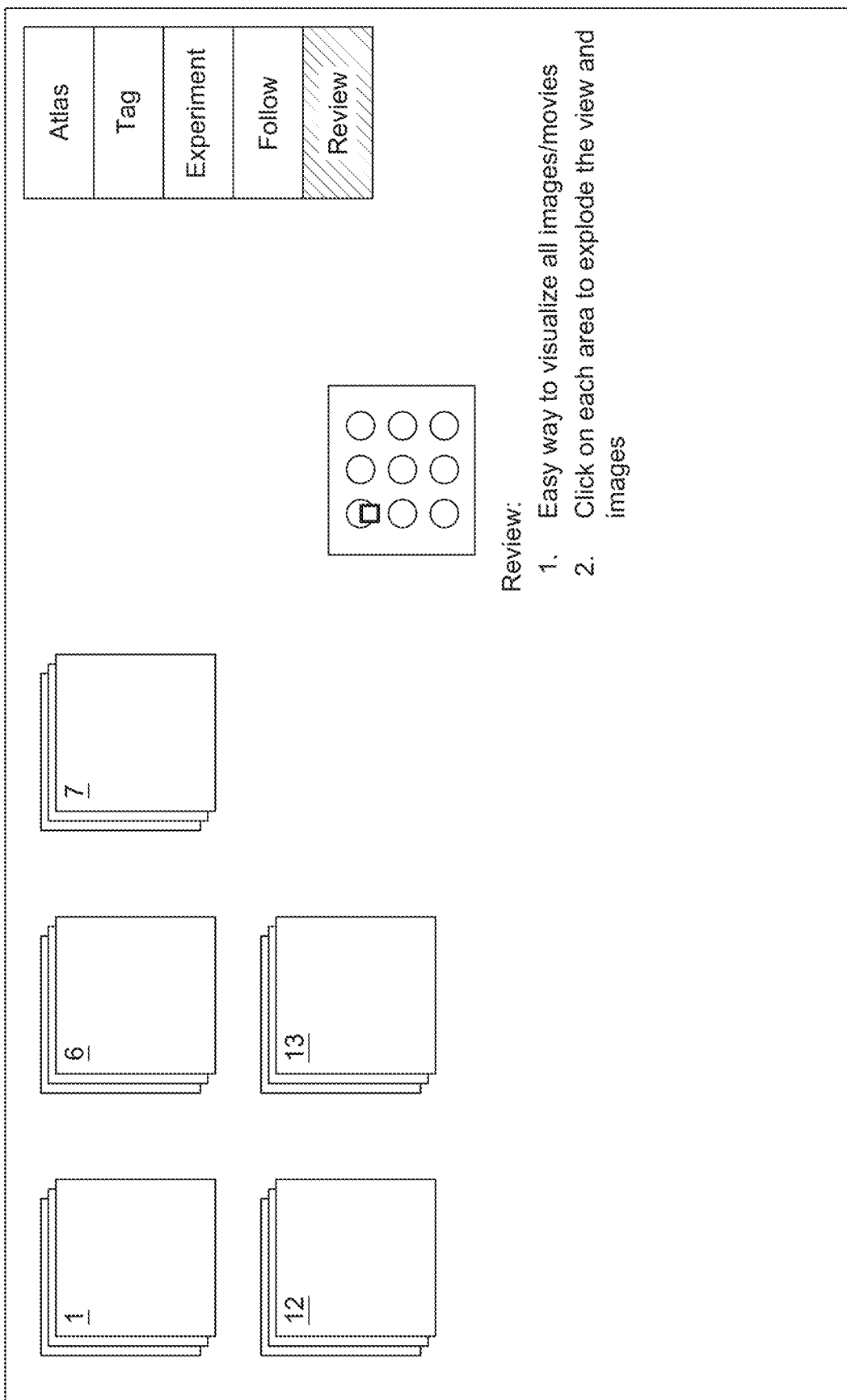
FIG. 63 is a graphical representation of the sixth step in an automated experimental workflow, according to one or more embodiments of the presently disclosed subject matter.

FIG. 63 is a graphical representation of the 6th step in an automated experimental workflow where the user can easily review the changes of each tagged region of interest as a function of in-situ stimulus and microscope conditions.

Figure 64:
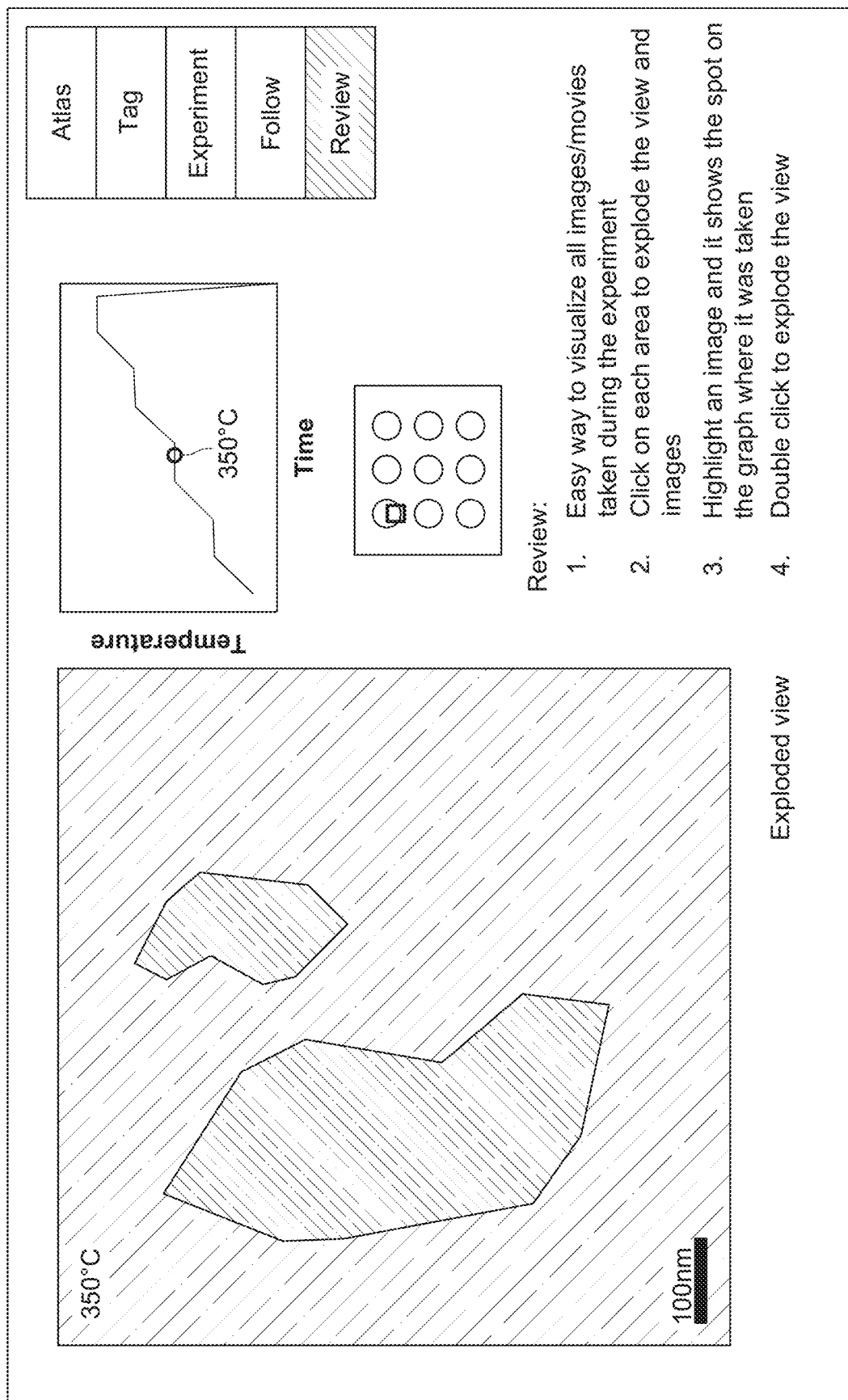
FIG. 64 is a graphical representation of an alternative view of the sixth step in an automated experimental workflow, according to one or more embodiments of the presently disclosed subject matter.

FIG. 64 is a graphical representation of an alternative view of the 6th step in an automated experimental workflow where the user can easily review experimental data indexed with the images of a single region of interest captured during the automated experiment to visualize how a single sample site changed over time.

Figure 65:
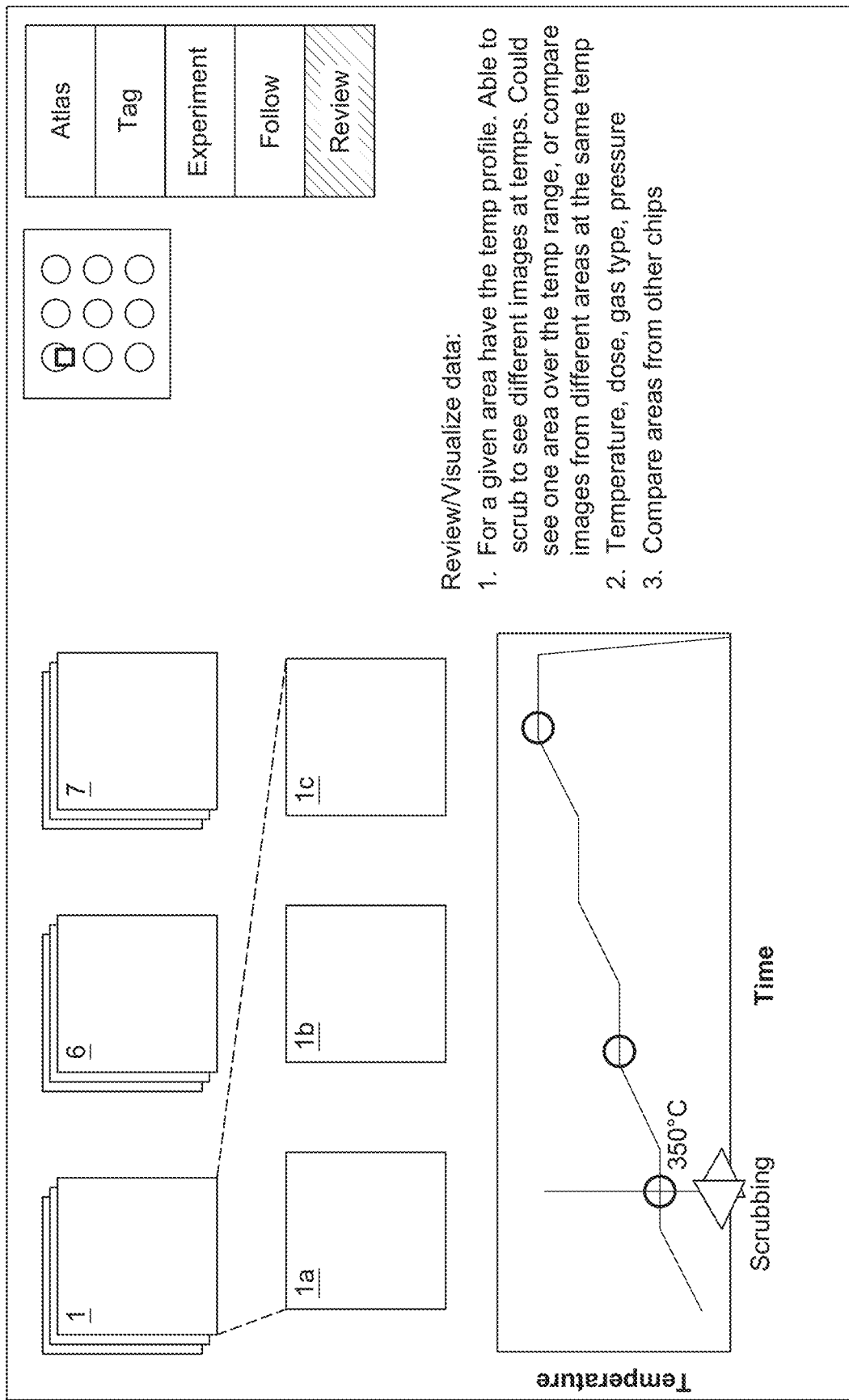
FIG. 65 is a graphical representation of an alternative view of the sixth step in an automated experimental workflow, according to one or more embodiments of the presently disclosed subject matter.

FIG. 65 is a graphical representation of an alternative view of the 6th step in an automated experimental workflow where the user can easily review experimental data indexed with the images captured among multiple regions of interest during the automated experiment to see how multiple sites looked at specific times.

Figure 66A:
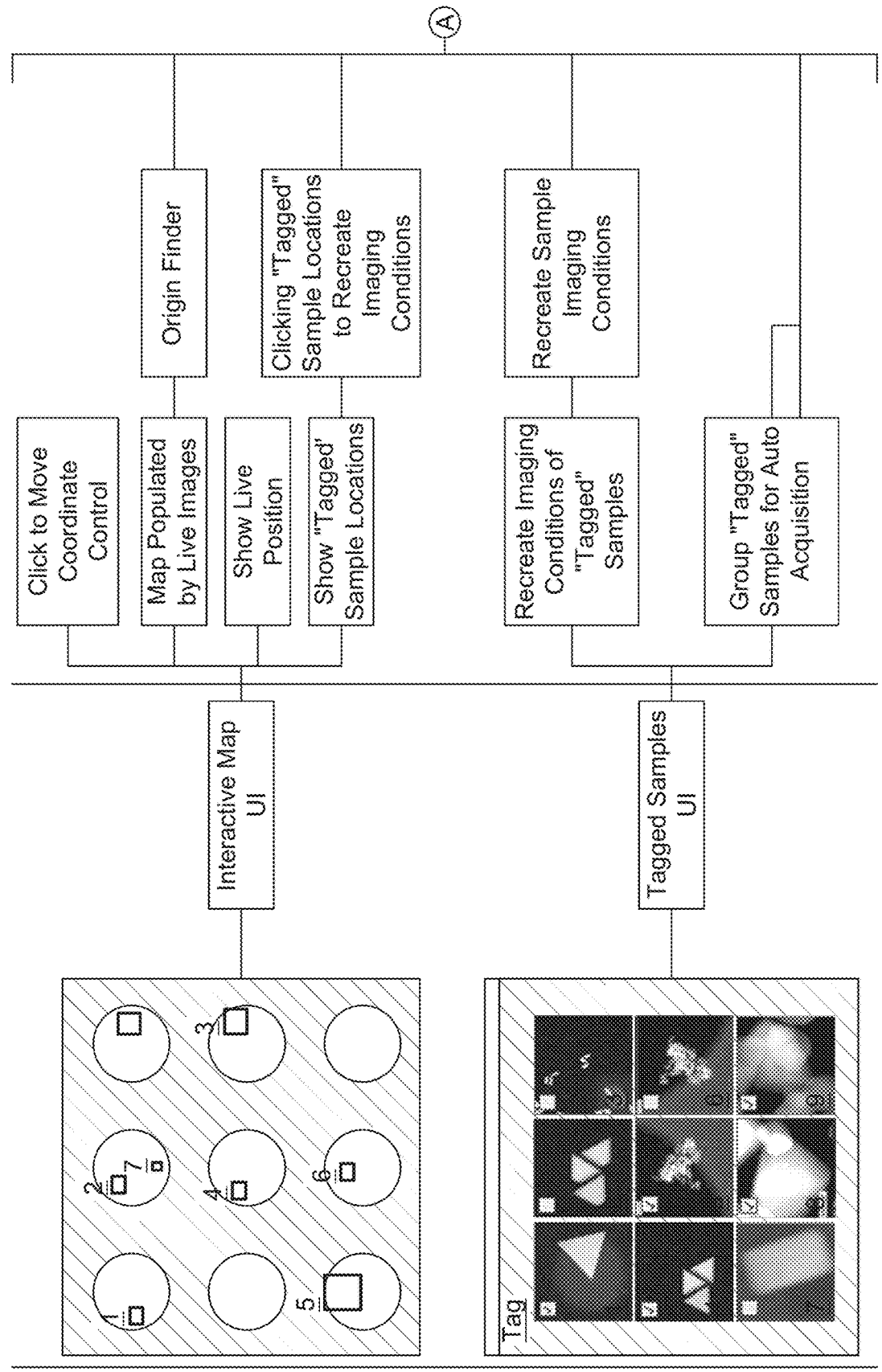
FIGS. 66A and 66B are a schematic graphical representation showing how tagged regions at multiple sites can be tracked even if only one region of interest is in the field of view, according to one or more embodiments of the presently disclosed subject matter.
Figure 66B:
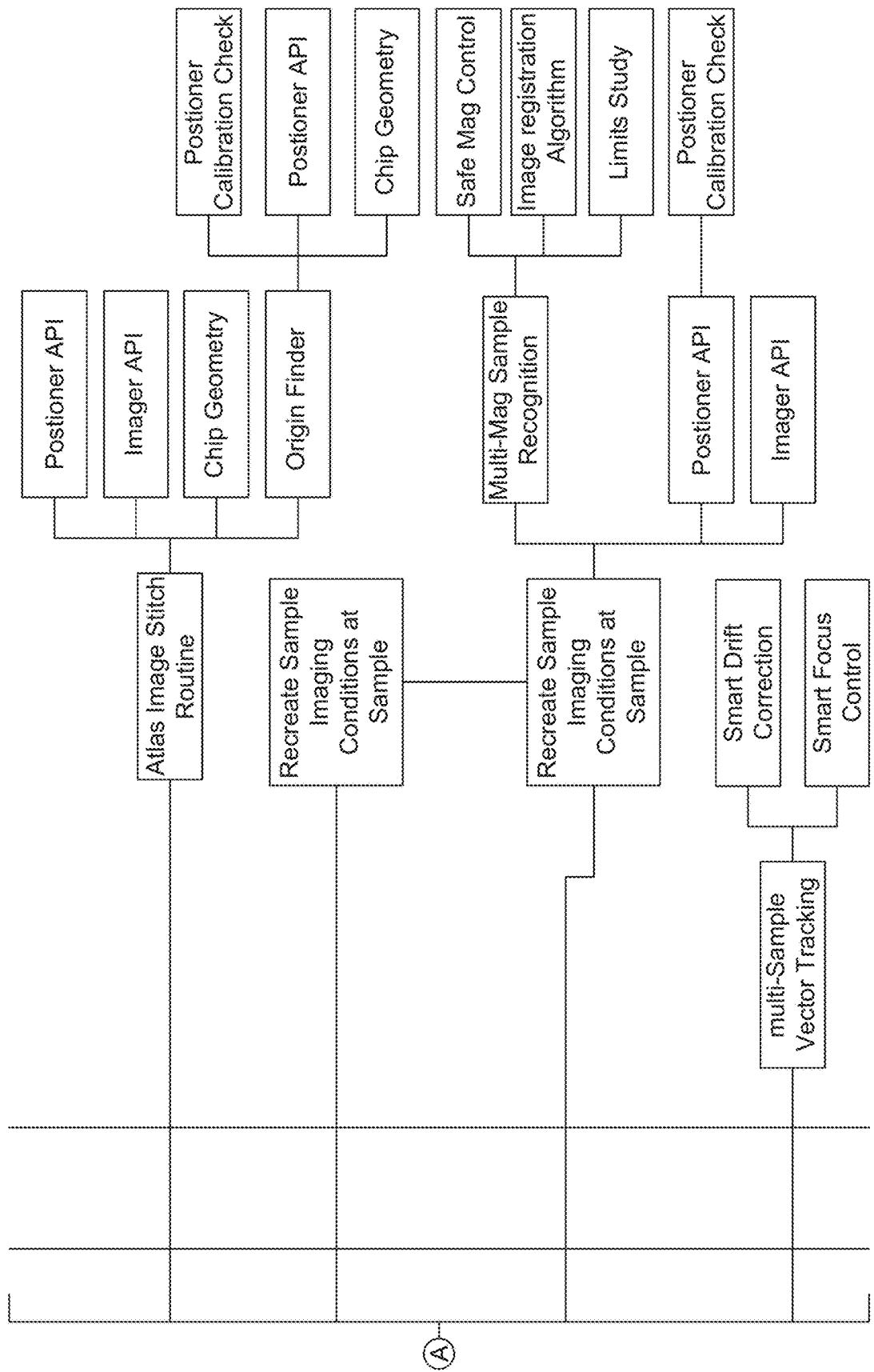

FIG. 66 is a schematic graphical representation showing how tagged regions at multiple sites can be tracked even if only 1 region of interest is in the field of view.

Figure 67:
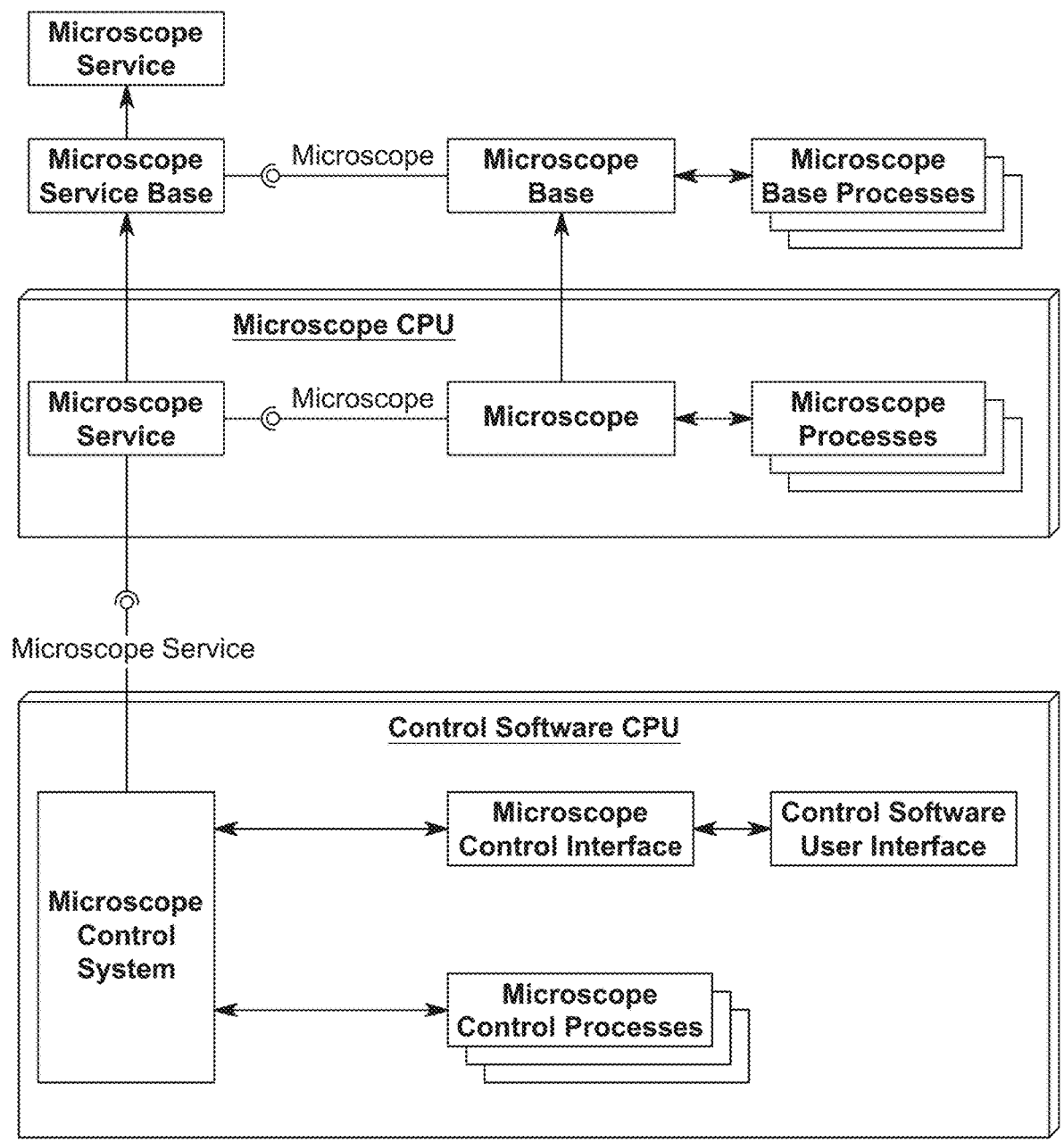
FIG. 67 is a schematic graphical representation of an architecture where a control software running on a control software CPU utilizes a single microscope service on the microscope CPU, according to one or more embodiments of the presently disclosed subject matter.

FIG. 67 is a schematic graphical representation of an architecture where the control software running on a control software CPU utilizes a single microscope service on the microscope CPU. The microscope service can handle all needed microscope and imaging controls needed by the control software in this architecture.

Figure 68A:
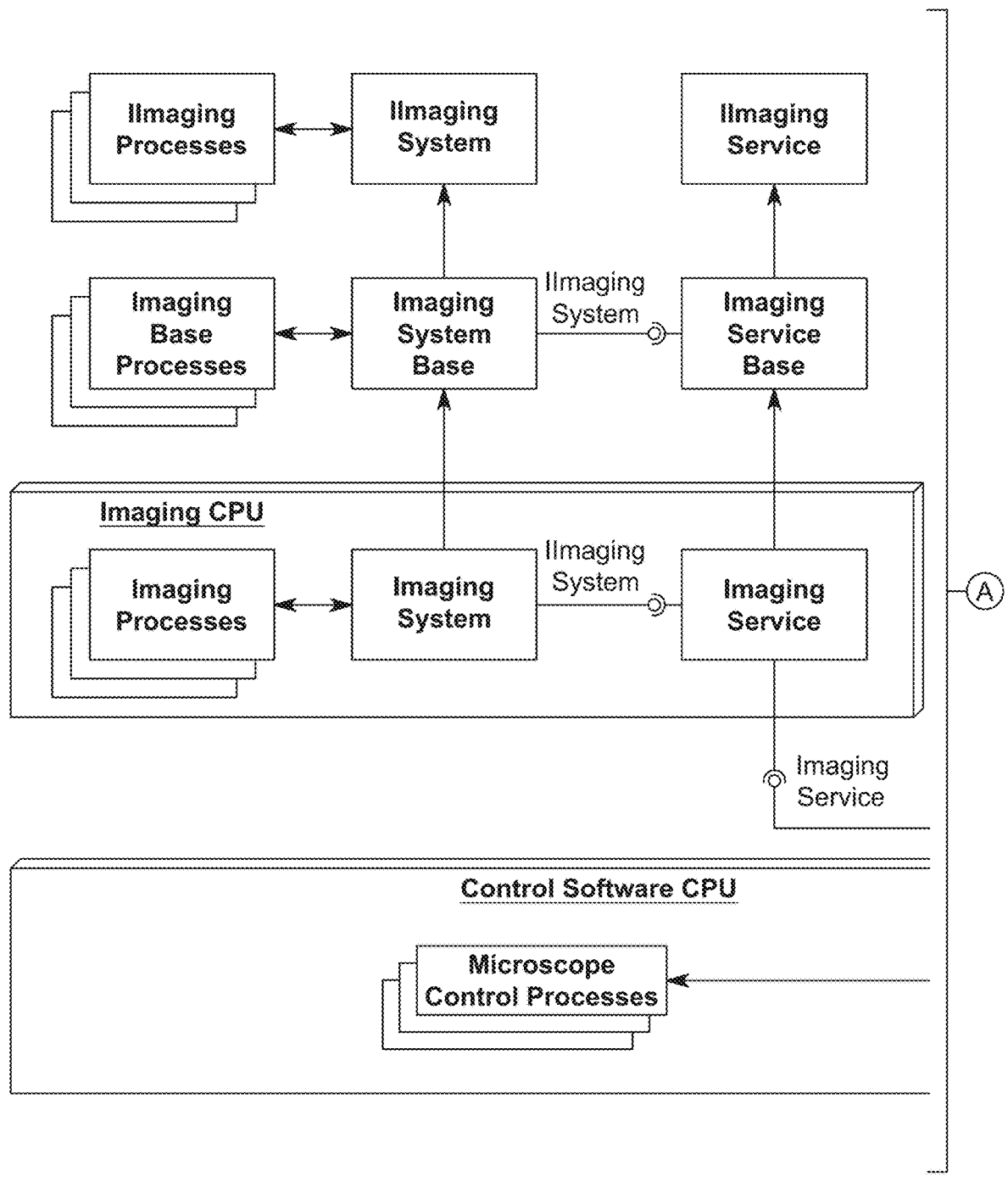
FIGS. 68A and 68B are a schematic graphical representation of an architecture where a control software running on a control software CPU utilizes both a microscope service on the microscope CPU and an imaging service on the imaging CPU, according to one or more embodiments of the presently disclosed subject matter.
Figure 68B:
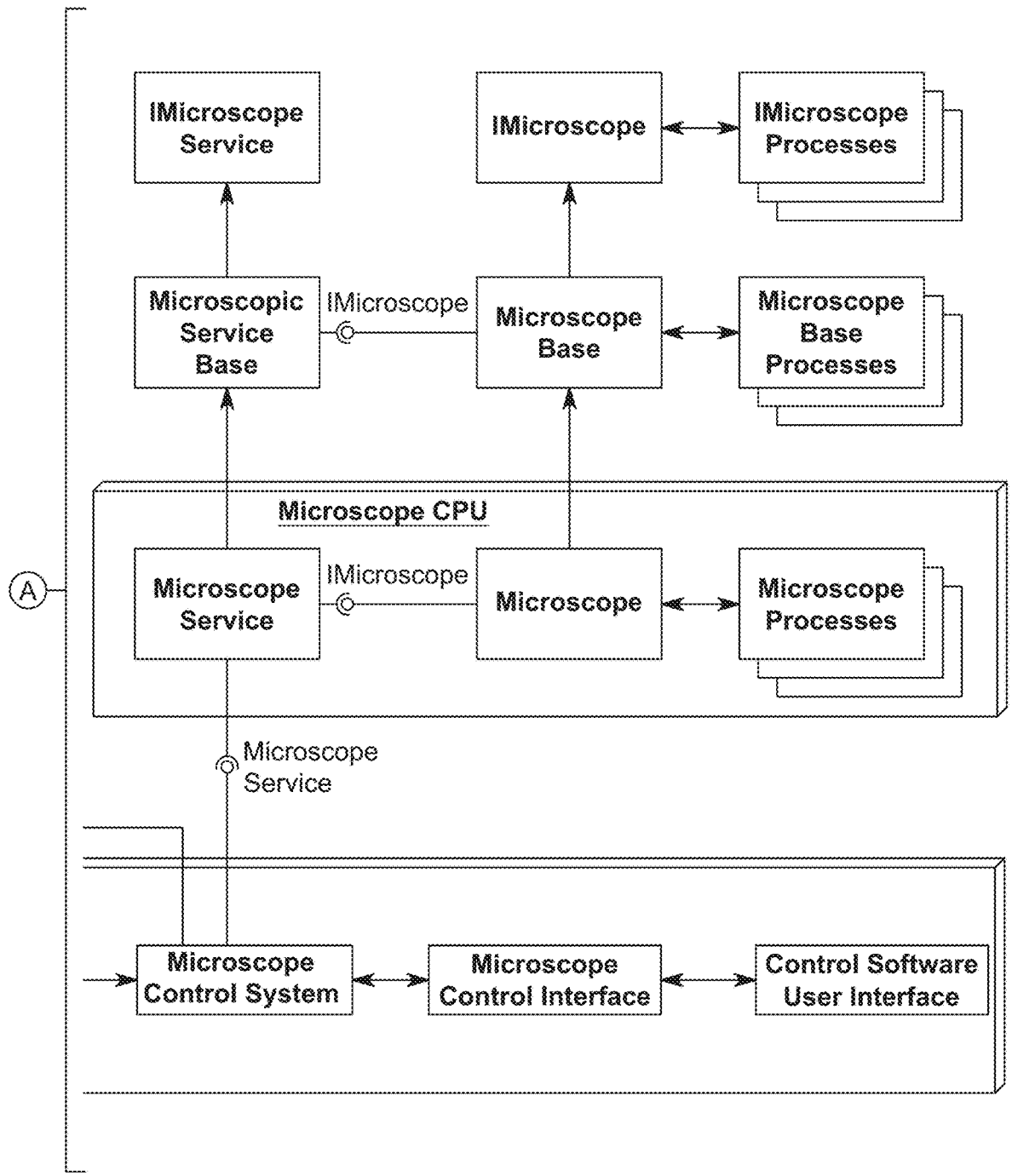

FIG. 68 is a schematic graphical representation of an architecture where the control software running on the control software CPU utilizes both a microscope service on the microscope CPU and an imaging service on the imaging CPU. The microscope service can handle all needed microscope commands and the imaging service handles are imaging commands needed by the control software in this architecture. The microscope CPU and imaging CPU can be the same CPU or different CPUs in this architecture.

Figure 69A:
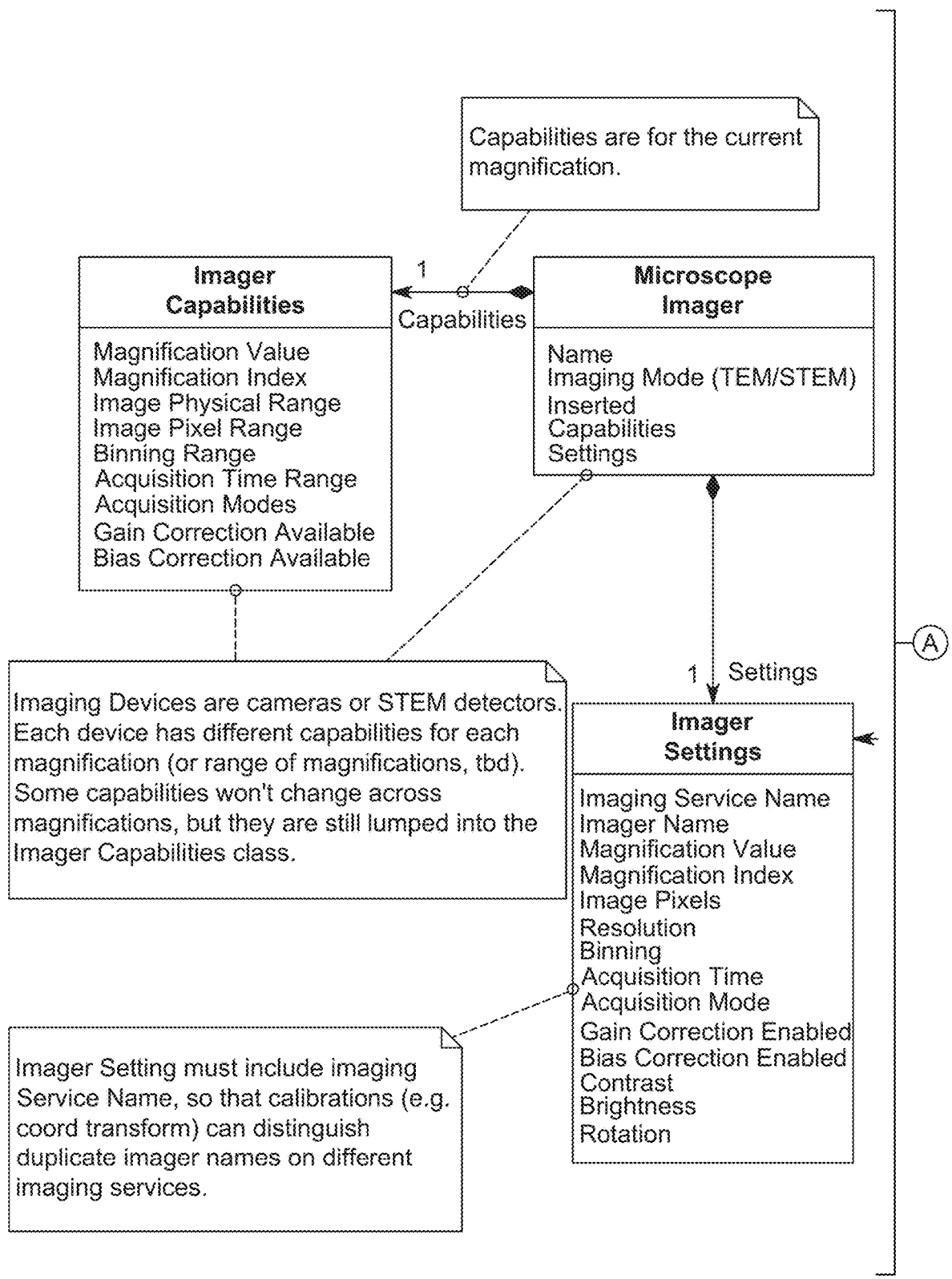
FIGS. 69A, 69B, and 69C are a schematic graphical representation of a microscope service class needed for microscope commands and imaging commands, according to one or more embodiments of the presently disclosed subject matter.
Figure 69B:
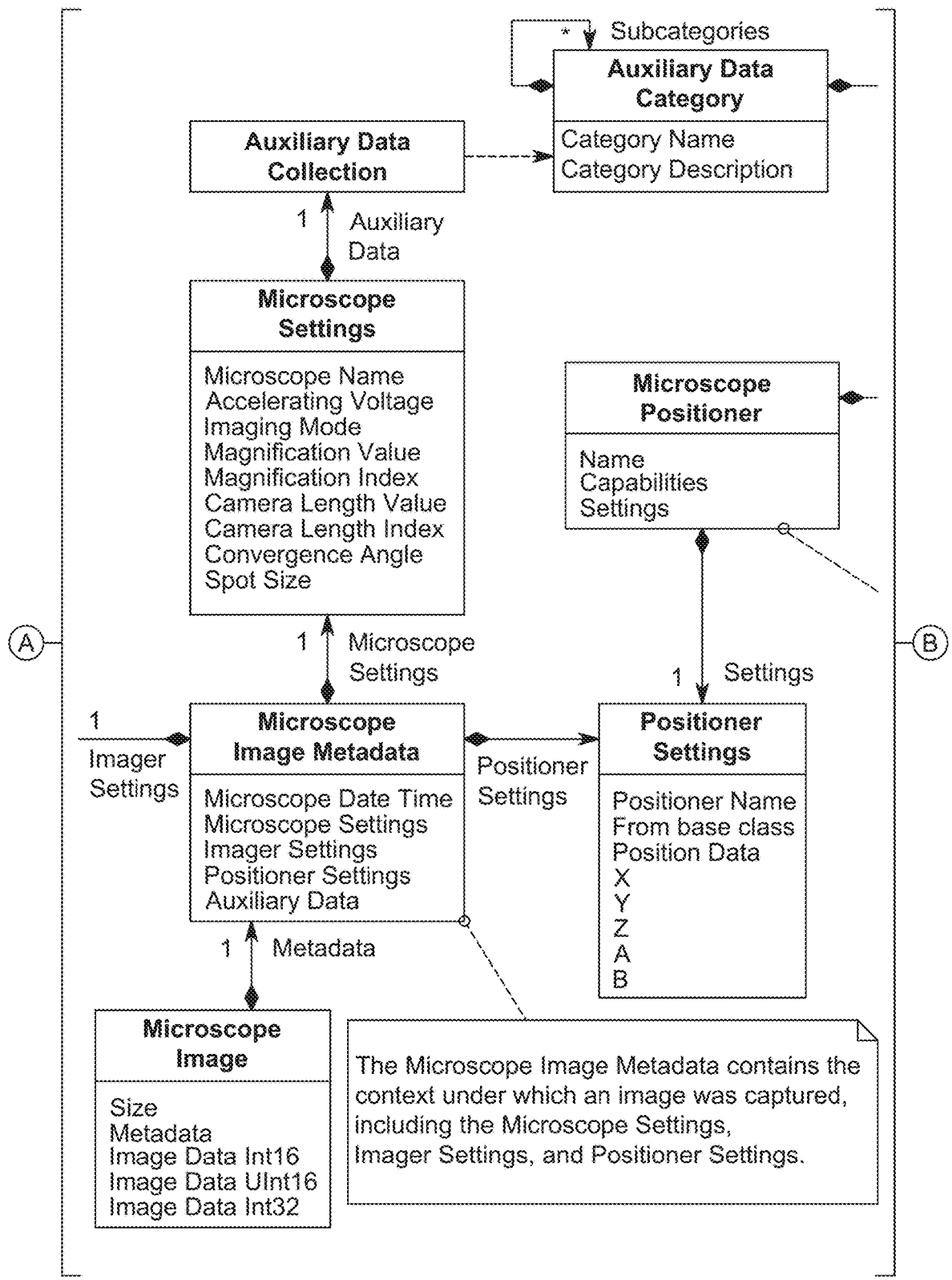
Figure 69C:
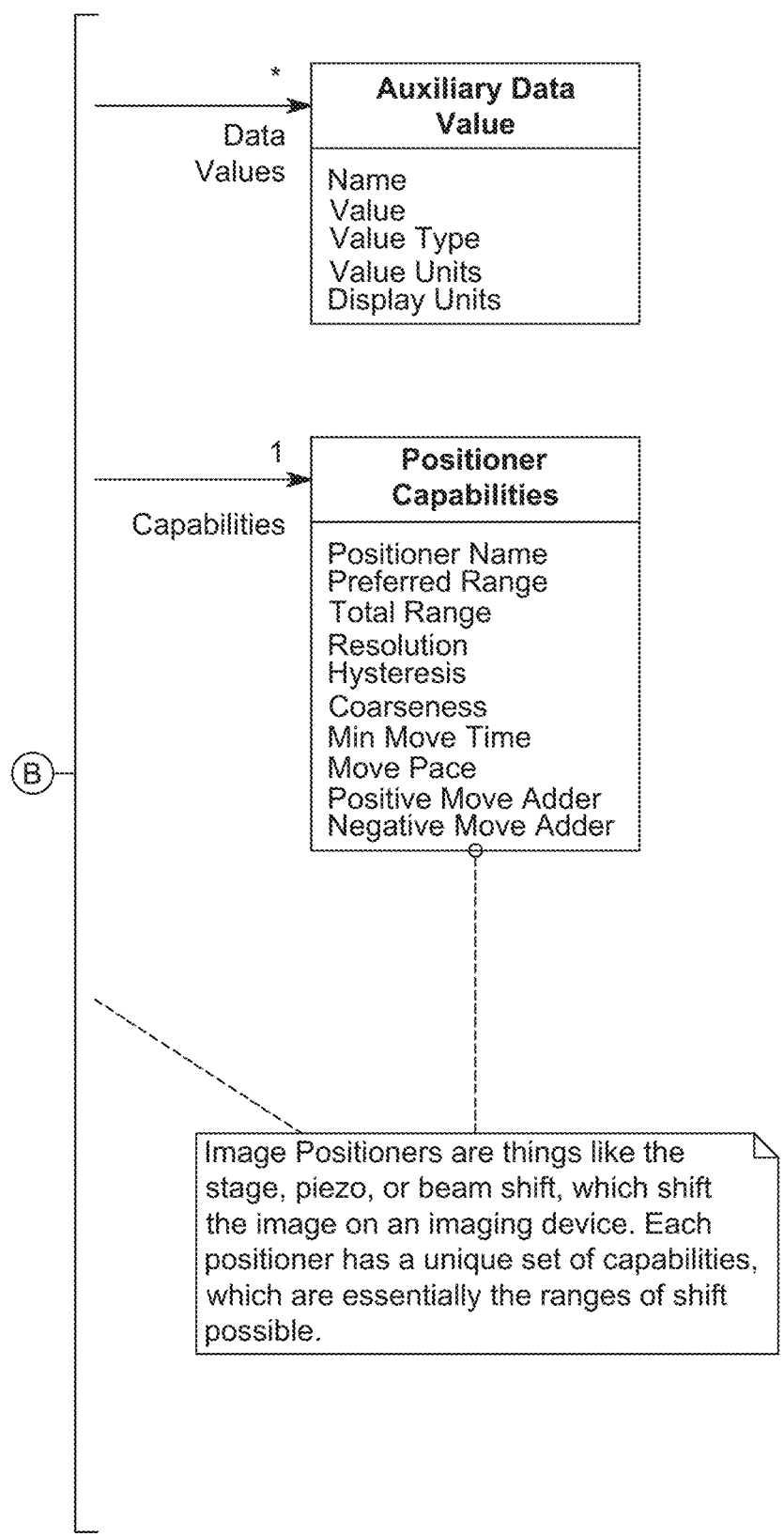

FIG. 69 is a schematic graphical representation of a microscope service class needed for microscope commands and imaging commands. Commands include getting images, getting microscope metadata, getting imaging metadata and setting positioners or imaging conditions dictated by the capabilities detailed in the control software.

Figure 70A:
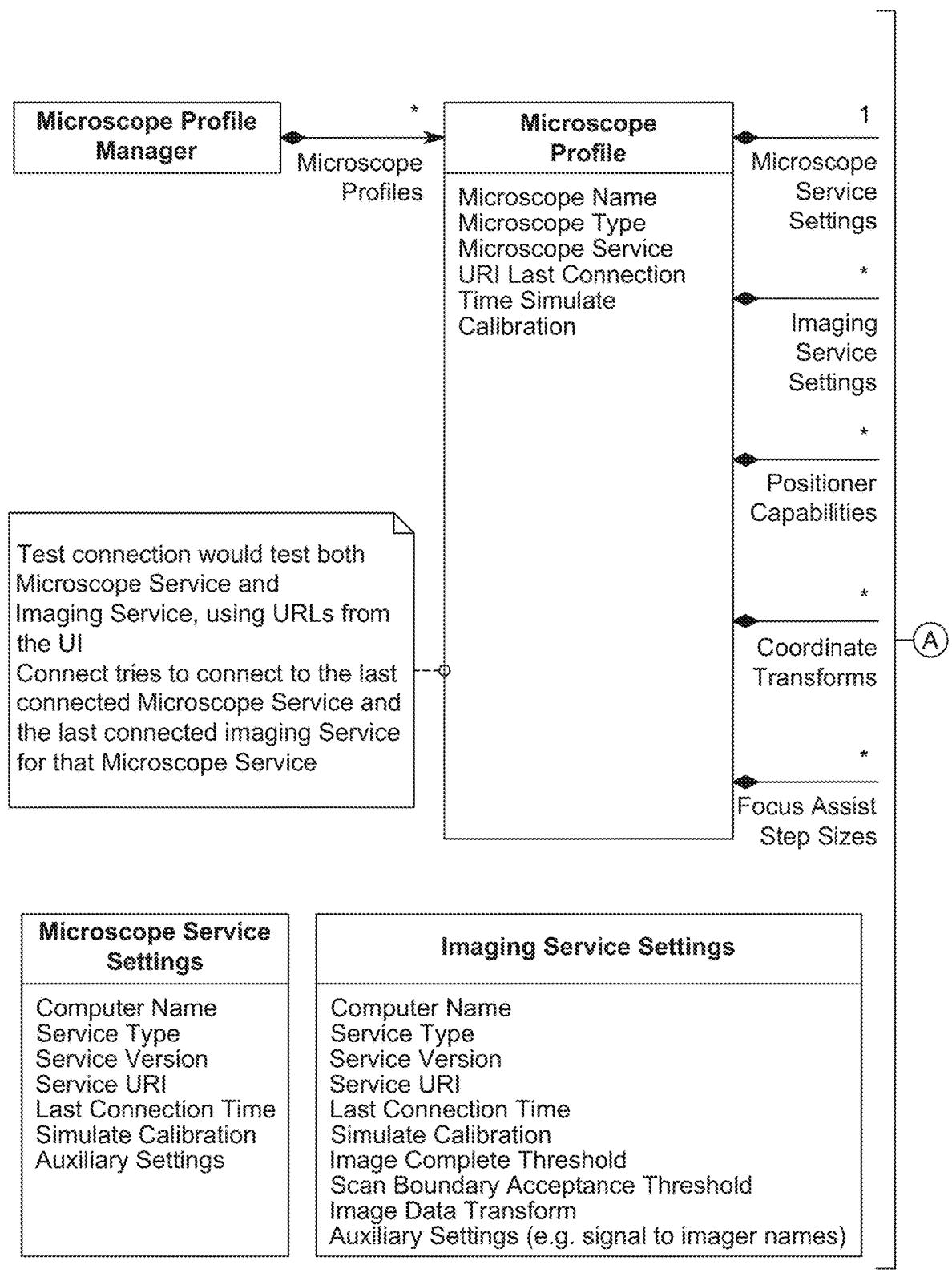
FIGS. 70A and 70B are a schematic graphical representation of a microscope profile, according to one or more embodiments of the presently disclosed subject matter.
Figure 70B:
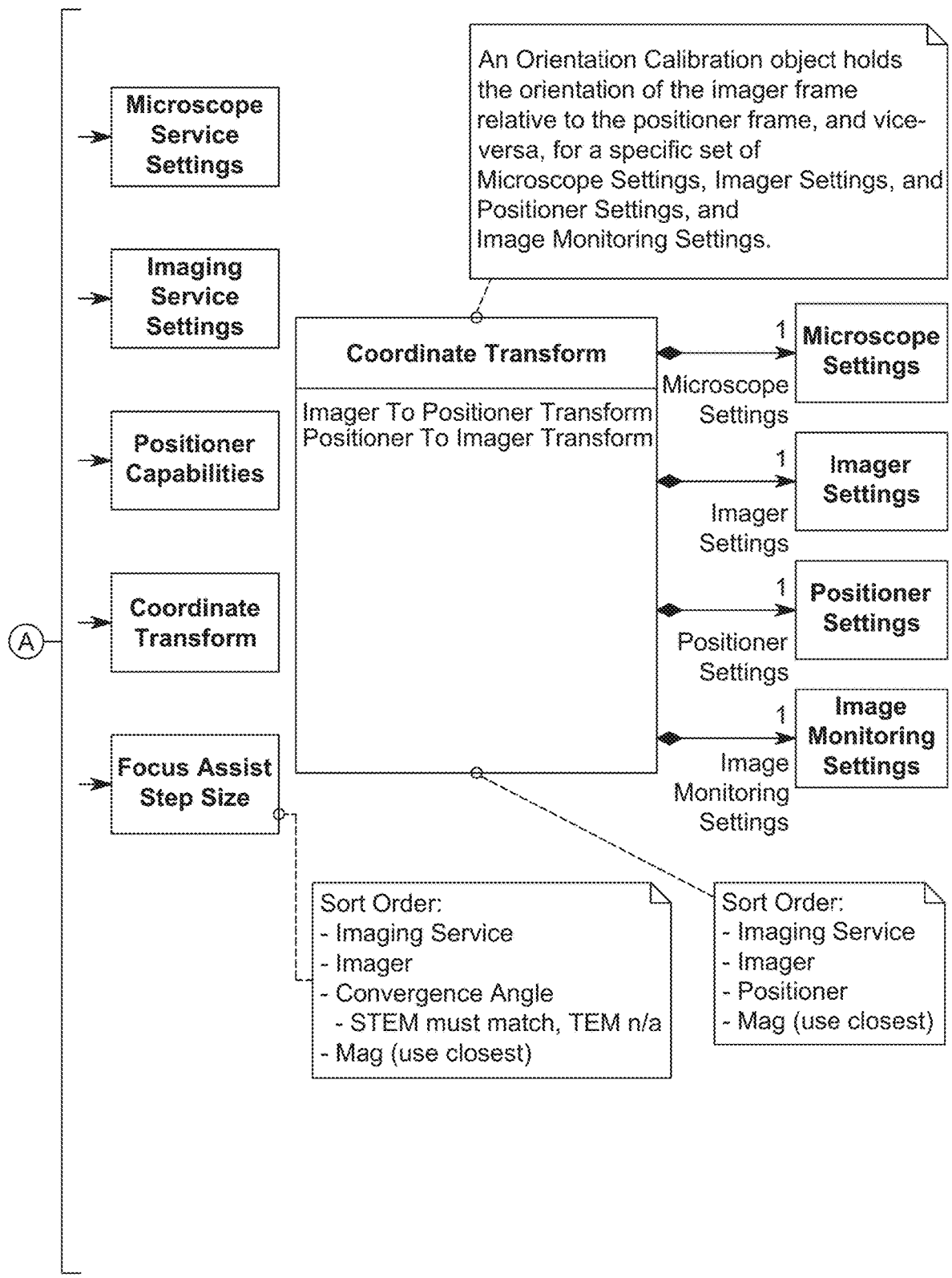
Figure 71A:
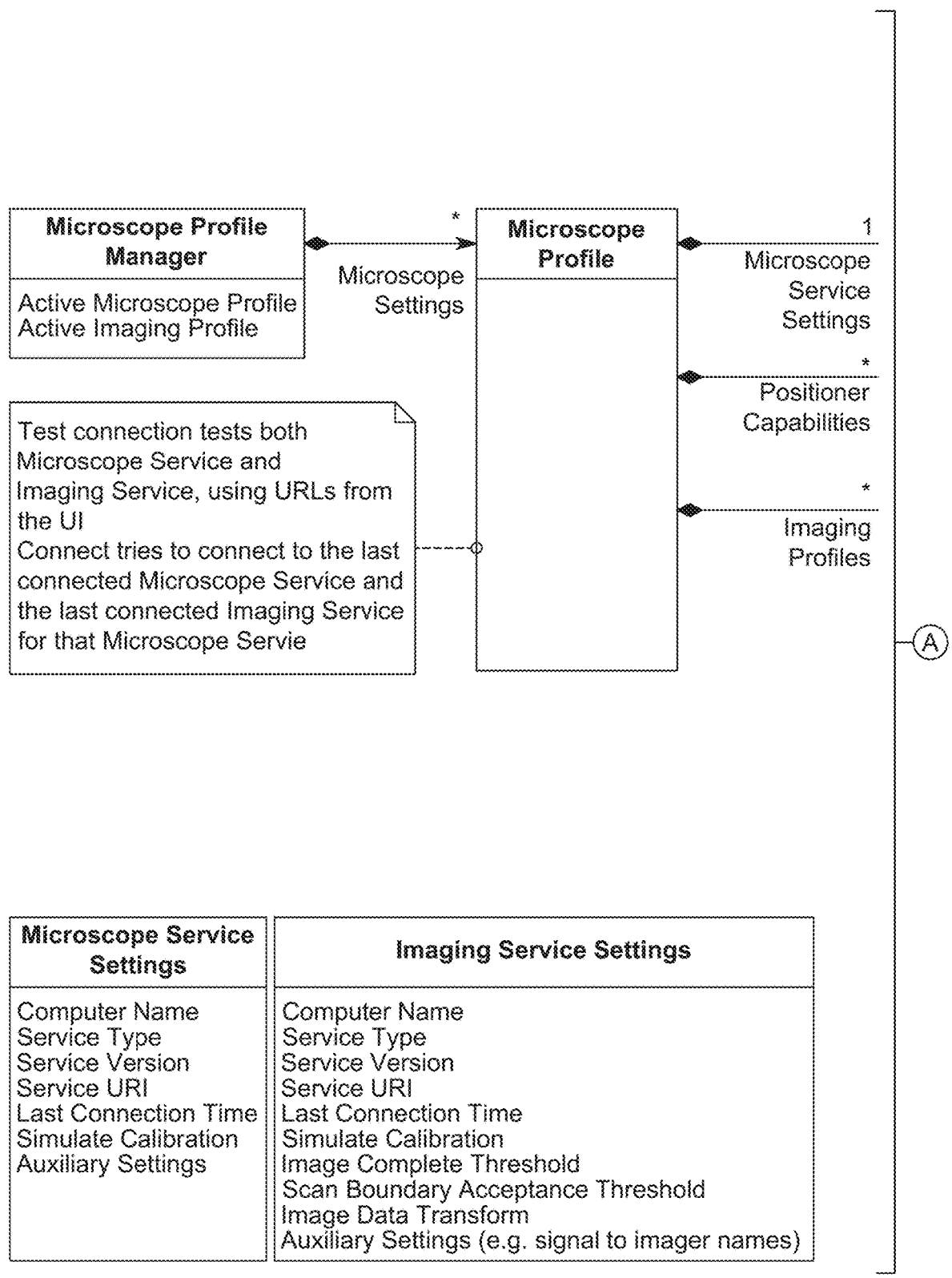
FIGS. 71A, 71B, and 71C are a variation of FIGS. 70A and 70B wherein the microscope profile is created from content and capabilities from an imaging service and a microscope service rather than a single service, according to one or more embodiments of the presently disclosed subject matter.
Figure 71B:
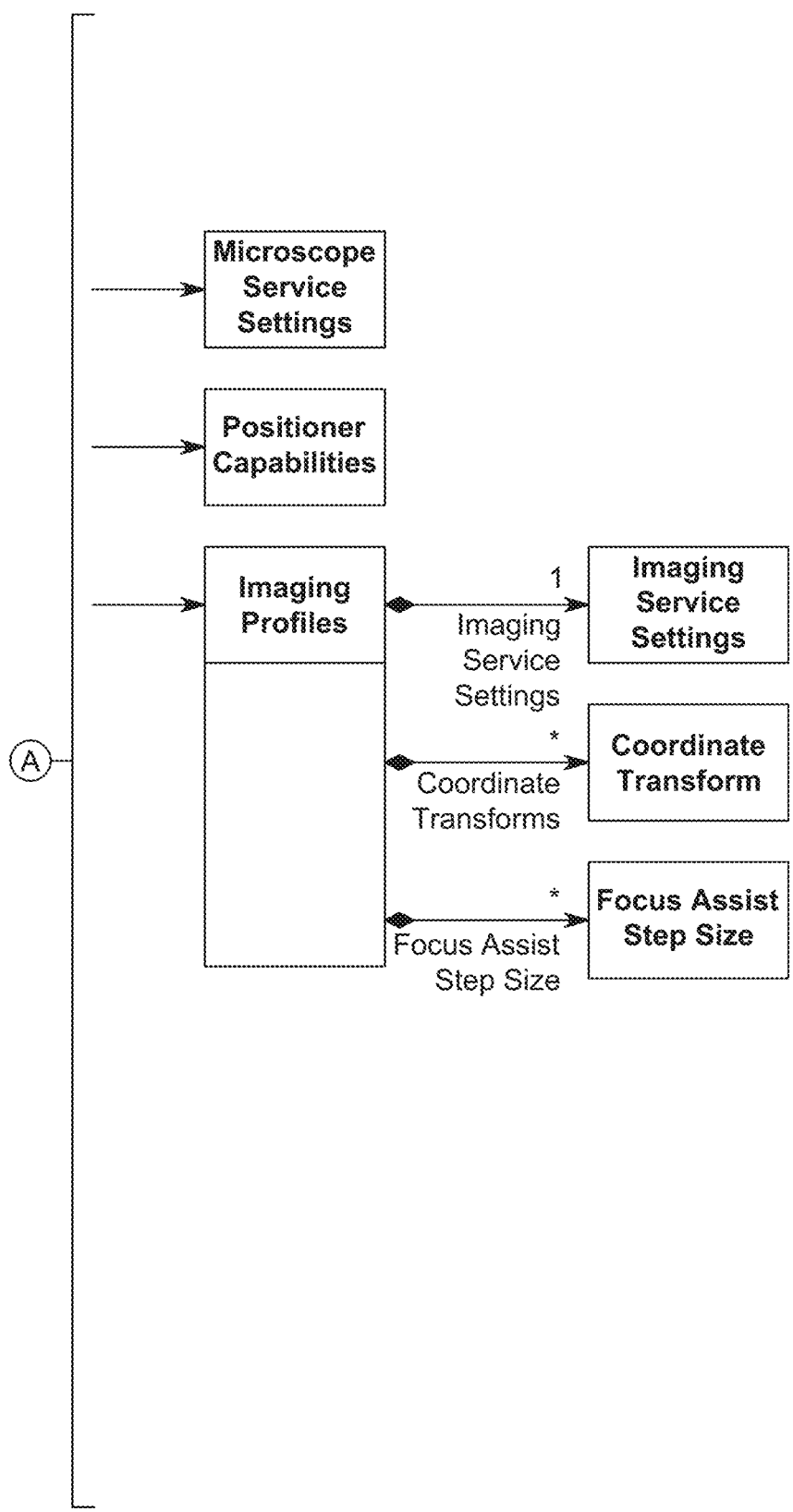
Figure 71C:
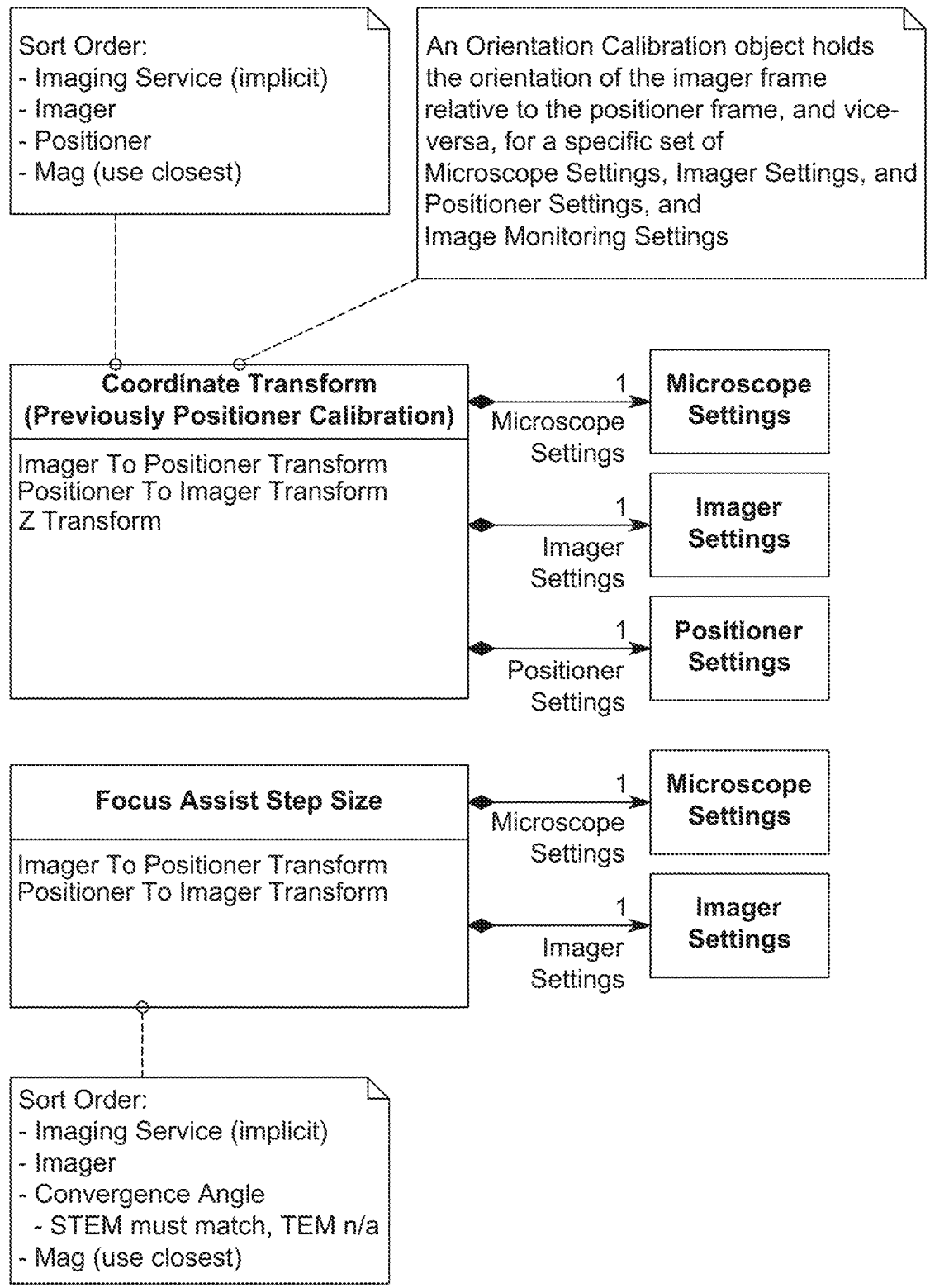

FIGS. 70A and 70B are a schematic graphical representation of a microscope profile. The microscope profile can be used to detail the network architecture, positioner capabilities and store needed calibrations of the microscope and imaging system. Calibrations are used to detail positioner capabilities, the rotational offset of positioners against each imager for specific imaging conditions and the relationship between positioner moves against focal depth for specific imaging conditions. FIGS. 71A, 71B, and 71C are a variation of FIGS. 70A and 70B where the microscope profile is created from content and capabilities from an imaging service and a microscope service rather than a single service.

Figure 72A:
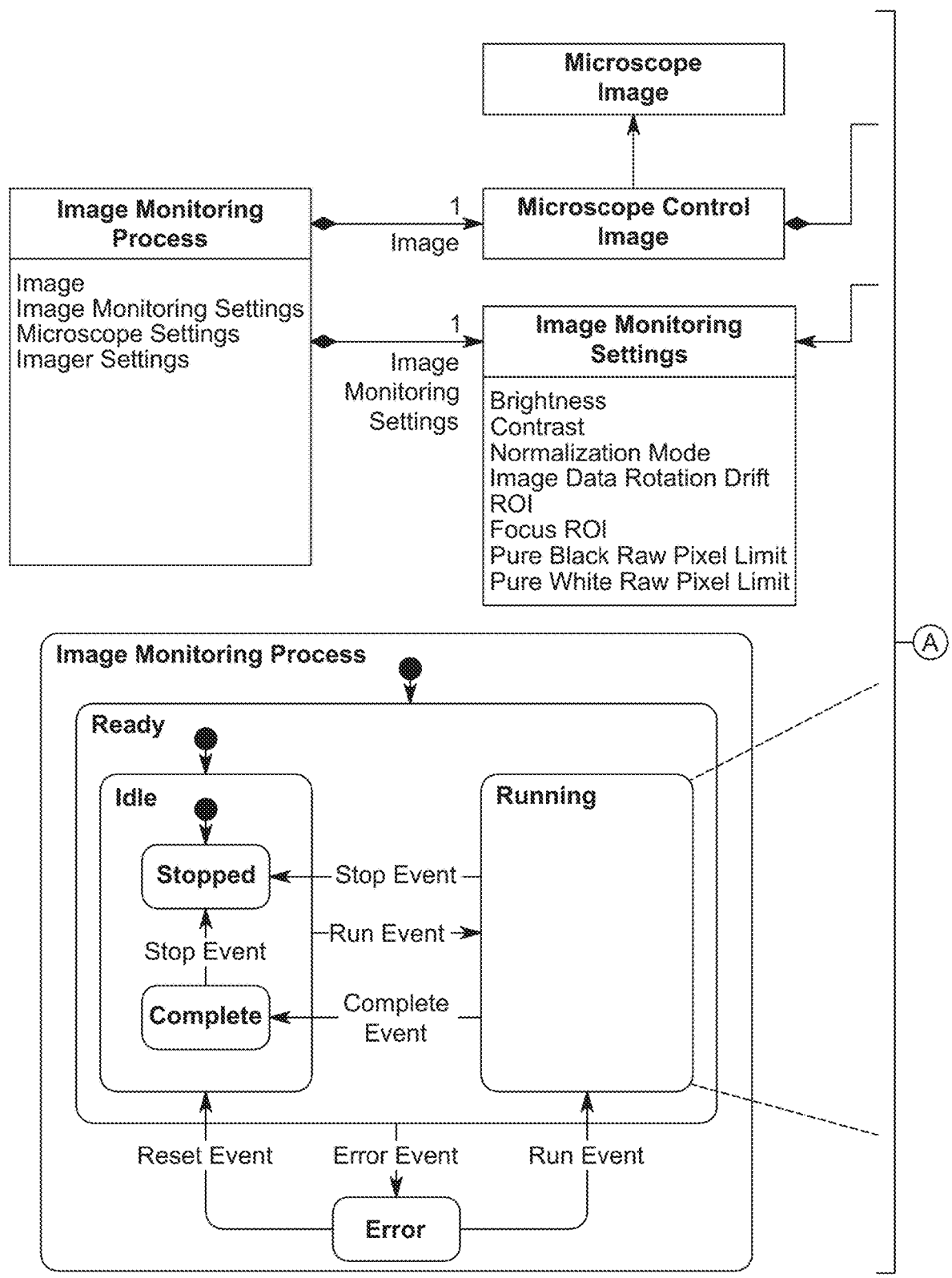
FIGS. 72A, 72B, and 72C are a schematic graphical representation of a high-level process to connect to the microscope and an imaging software module and transmit unique images with all relevant metadata to the control software module, according to one or more embodiments of the presently disclosed subject matter.
Figure 72B:
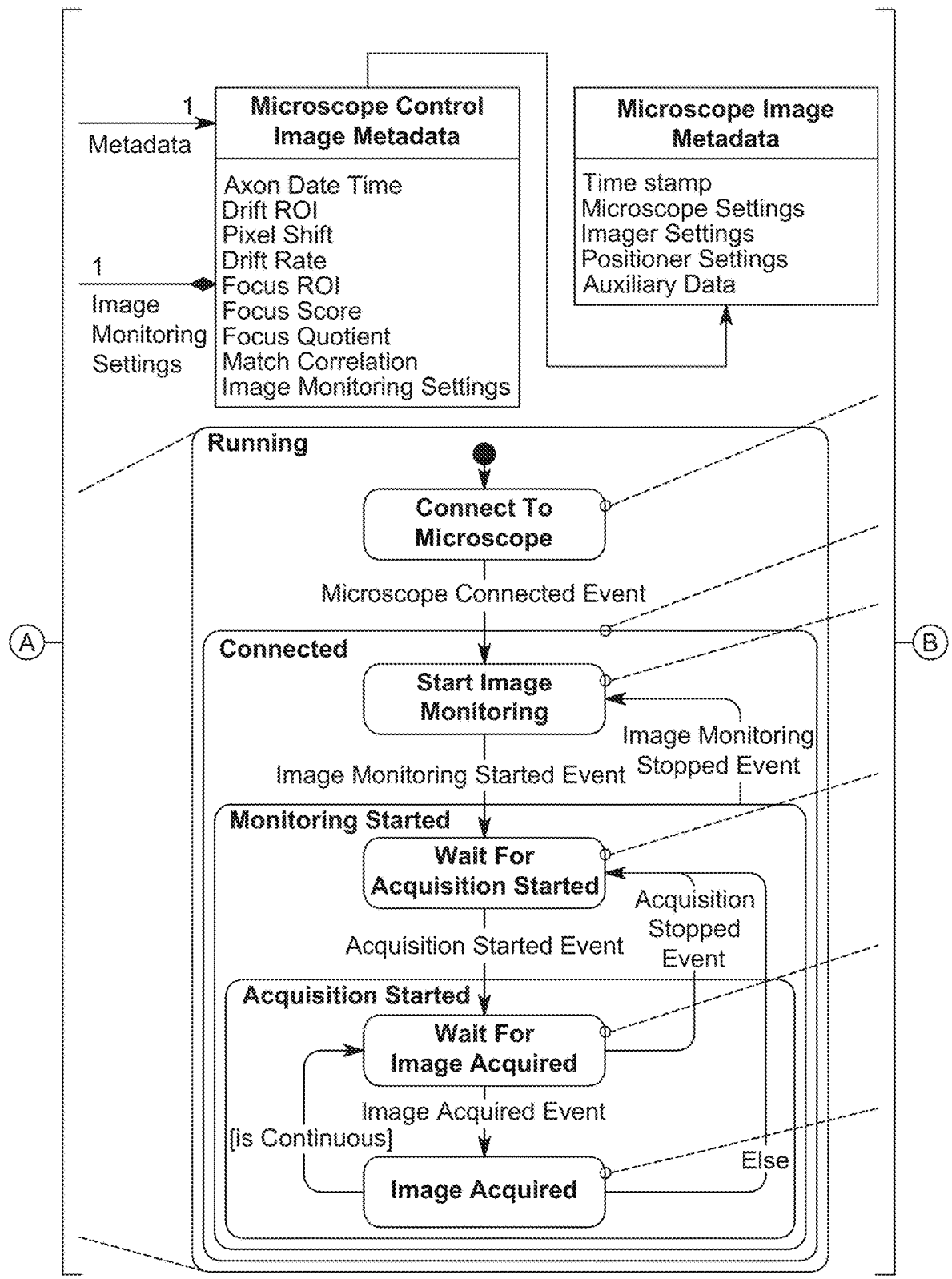
Figure 72C:
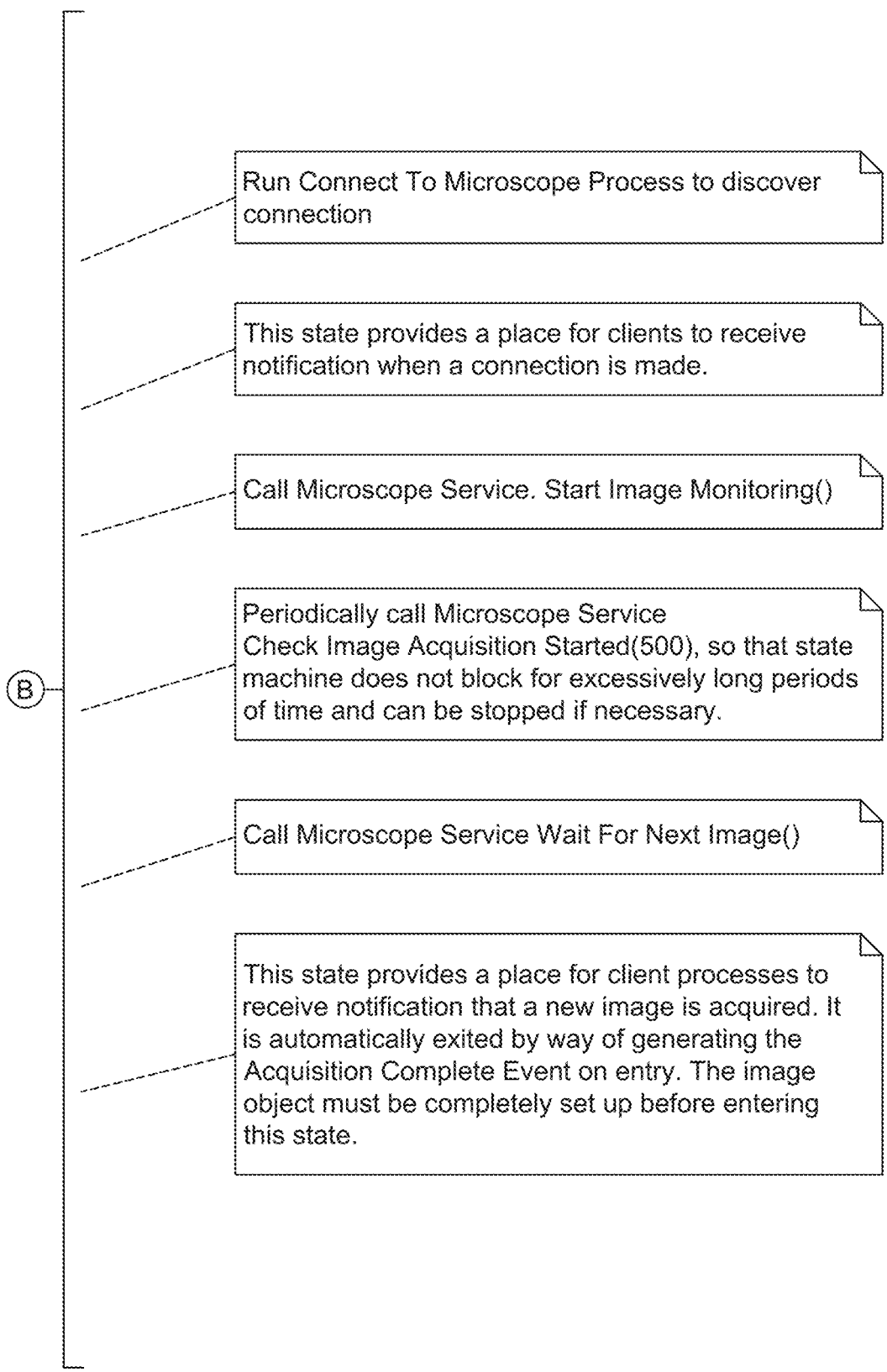
Figure 73A:
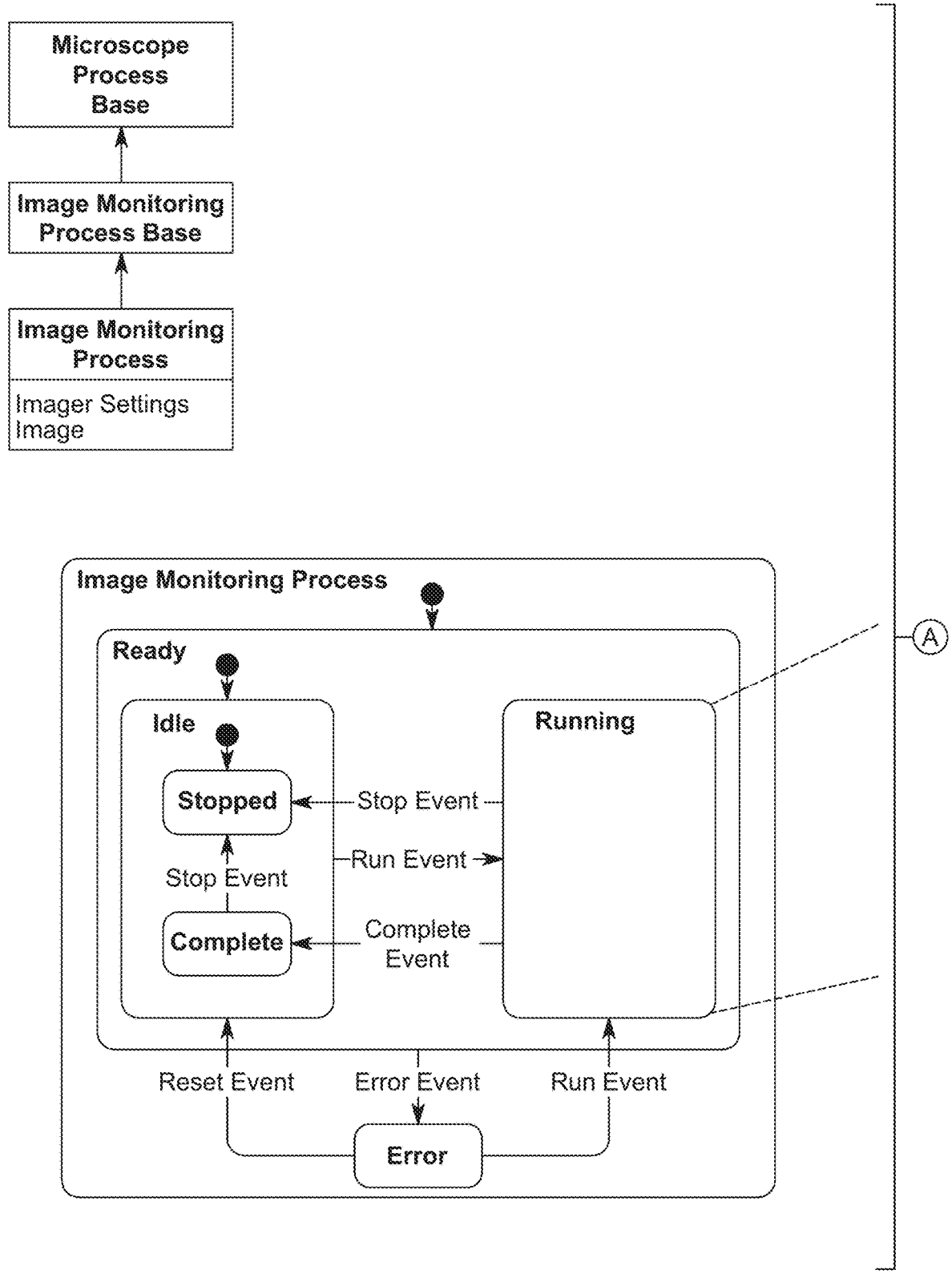
FIGS. 73A, 73B, and 73C are a schematic graphical representation of a more detailed image monitoring process that can be used to determine unique images from a continuous image feed and transmit the unique images to the control software module, according to one or more embodiments of the presently disclosed subject matter.
Figure 73B:
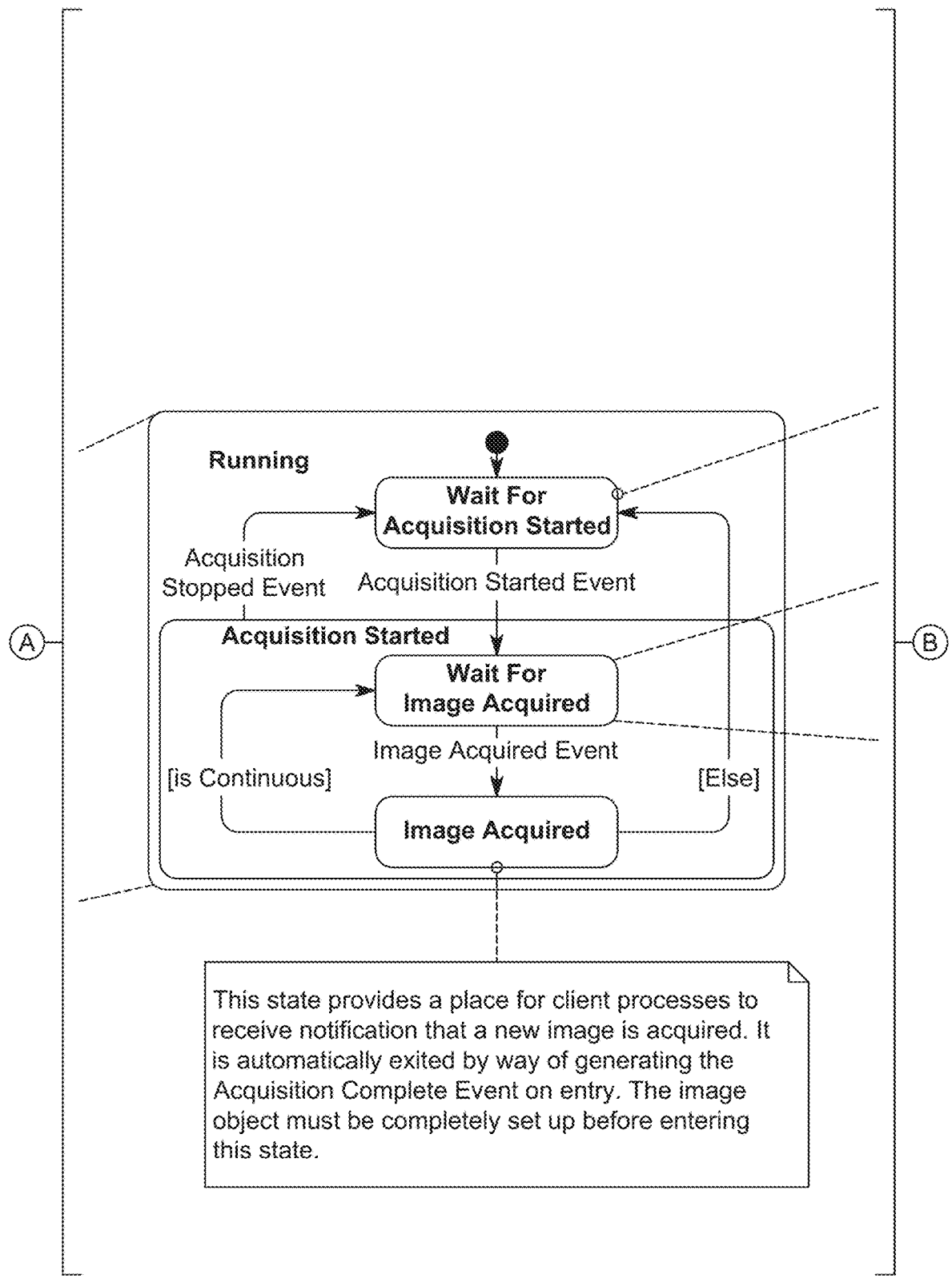
Figure 73C:
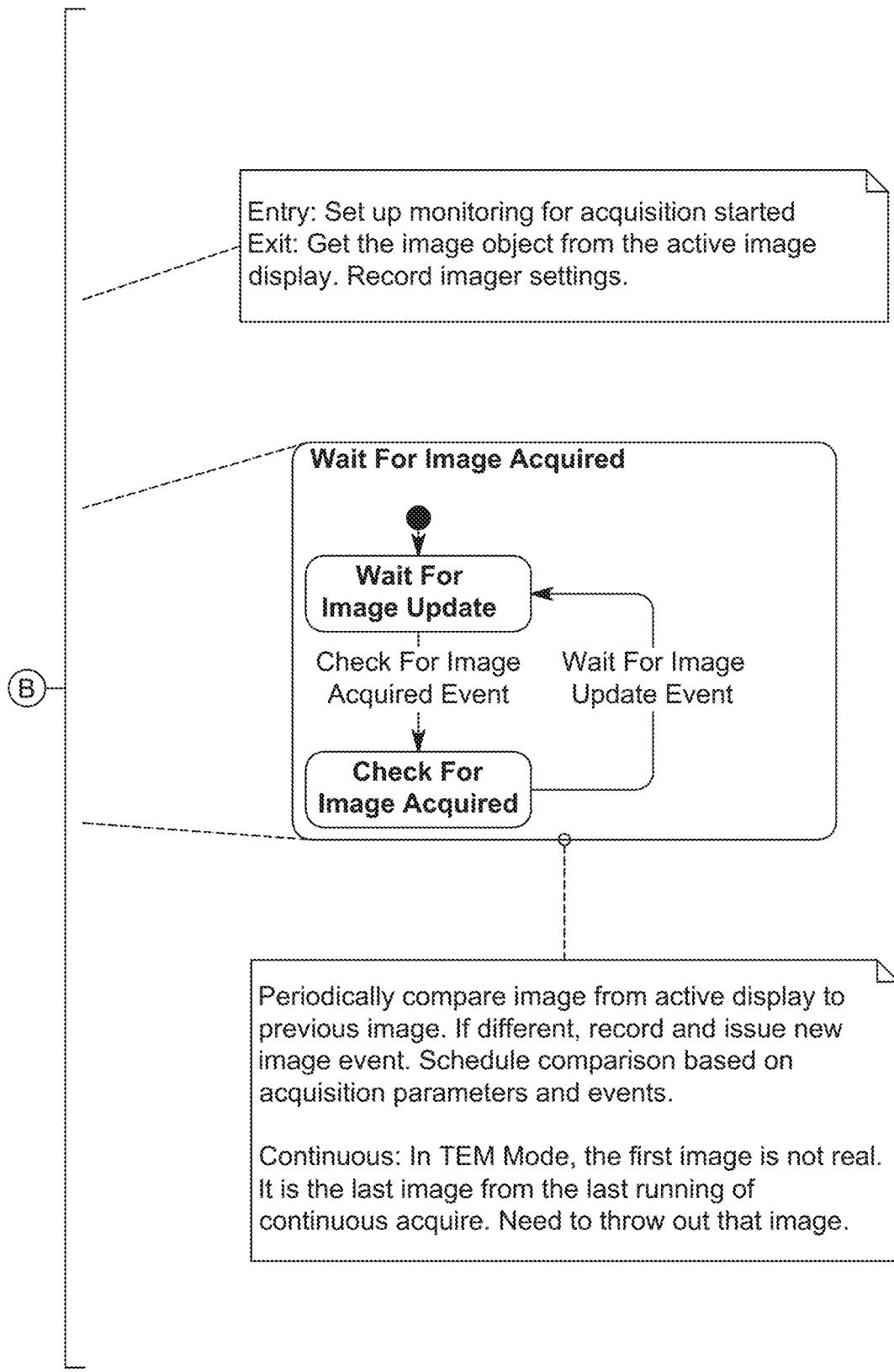
Figure 74A:
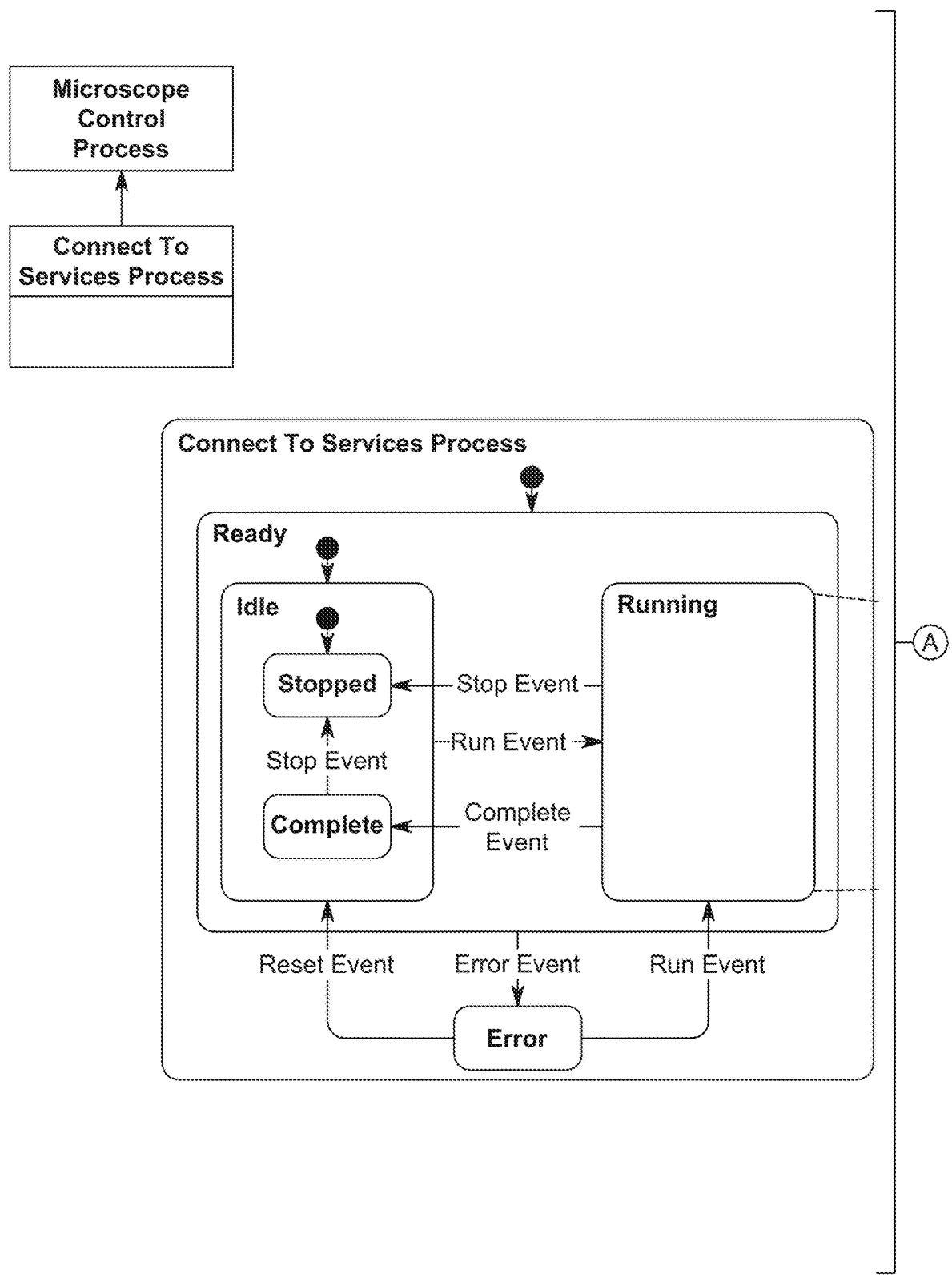
FIGS. 74A and 74B are a schematic graphical representation of a process used to connect to the required services, according to one or more embodiments of the presently disclosed subject matter.
Figure 74B:
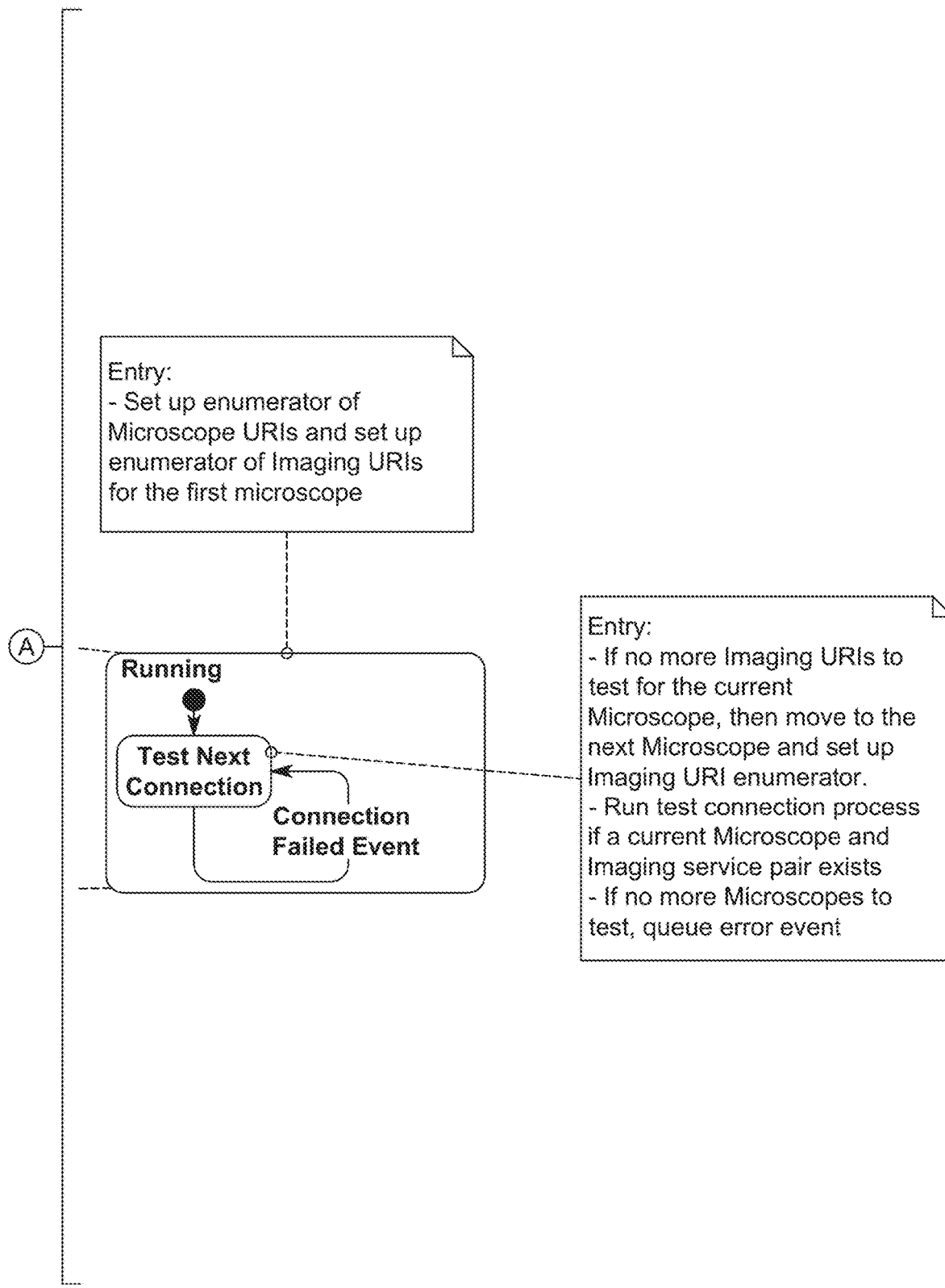

FIG. 72 is a schematic graphical representation of a high-level process to connect to the microscope and imaging software and transmit unique images with all relevant metadata to the control software. FIG. 73 is a schematic graphical representation of a more detailed image monitoring process that can be used to determine unique images from a continuous image feed and transmit the unique images to the control software. FIG. 74 is a schematic graphical representation of a process used to connect to the required services. Services could include microscope services, imaging services and services built to communicate to any number of detectors or ancillary equipment involved in the experiment.

Figure 75A:
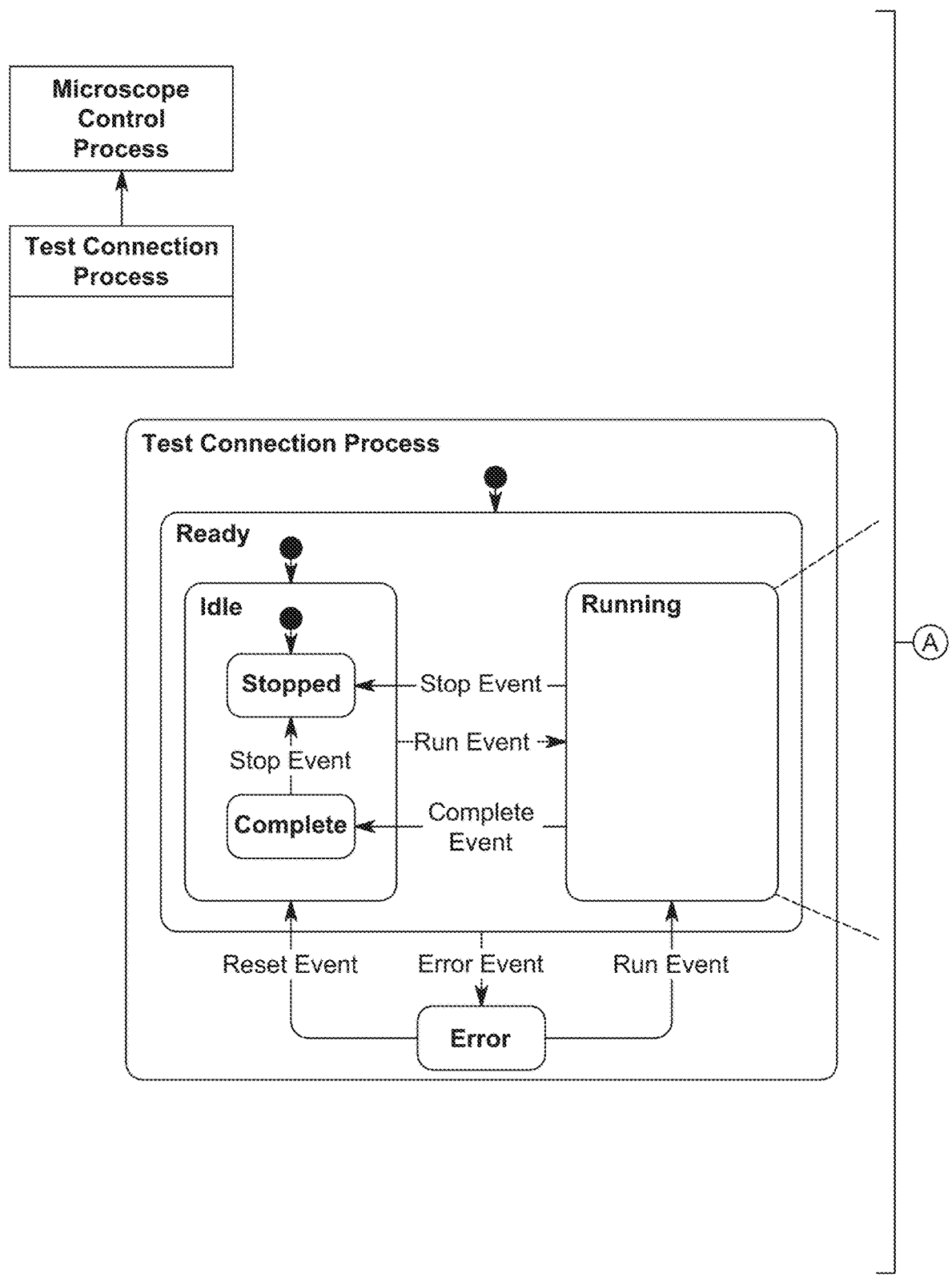
FIGS. 75A and 75B are a schematic graphical representation of a test connection process, according to one or more embodiments of the presently disclosed subject matter.
Figure 75B:
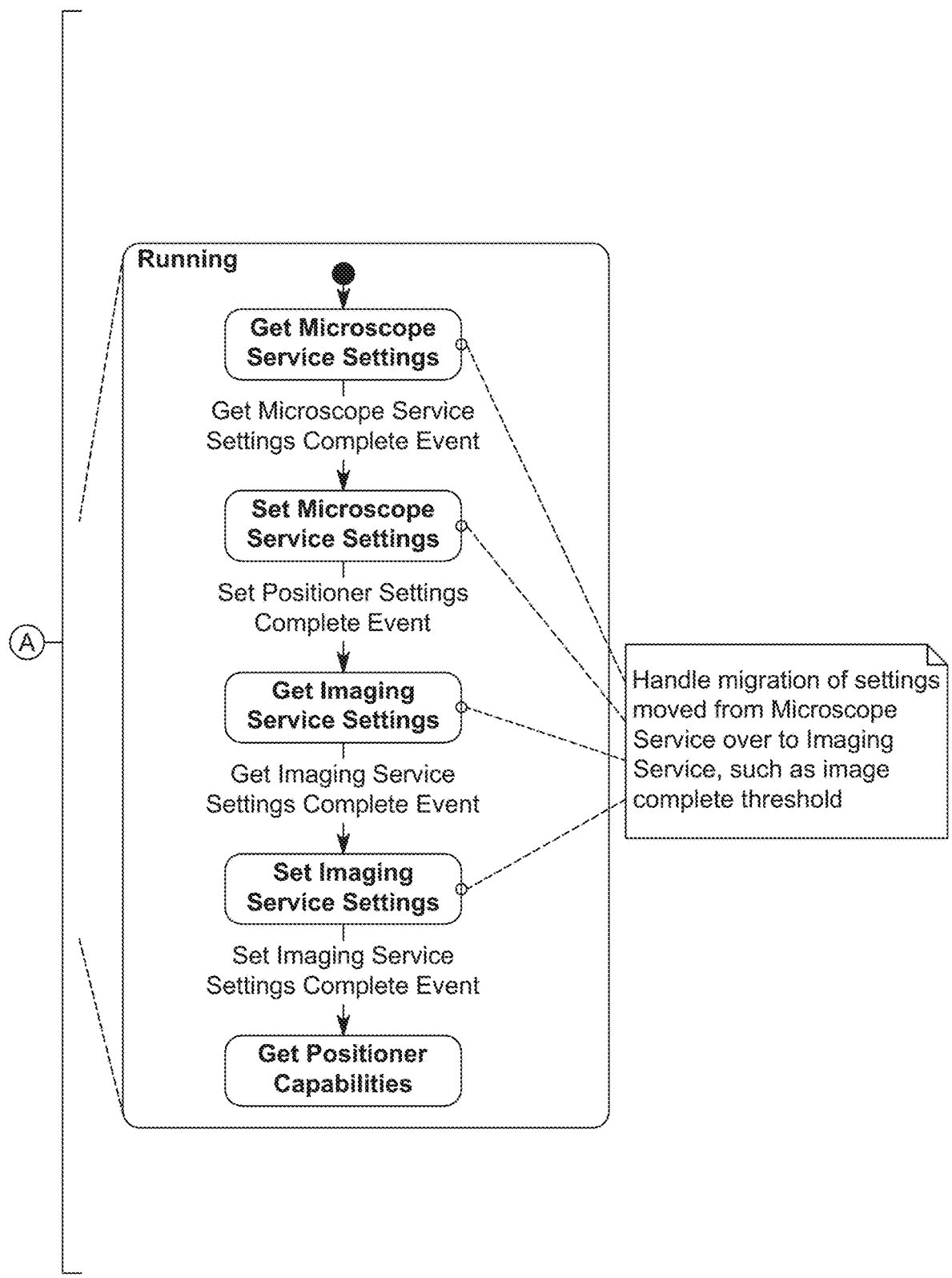
Figure 76A:
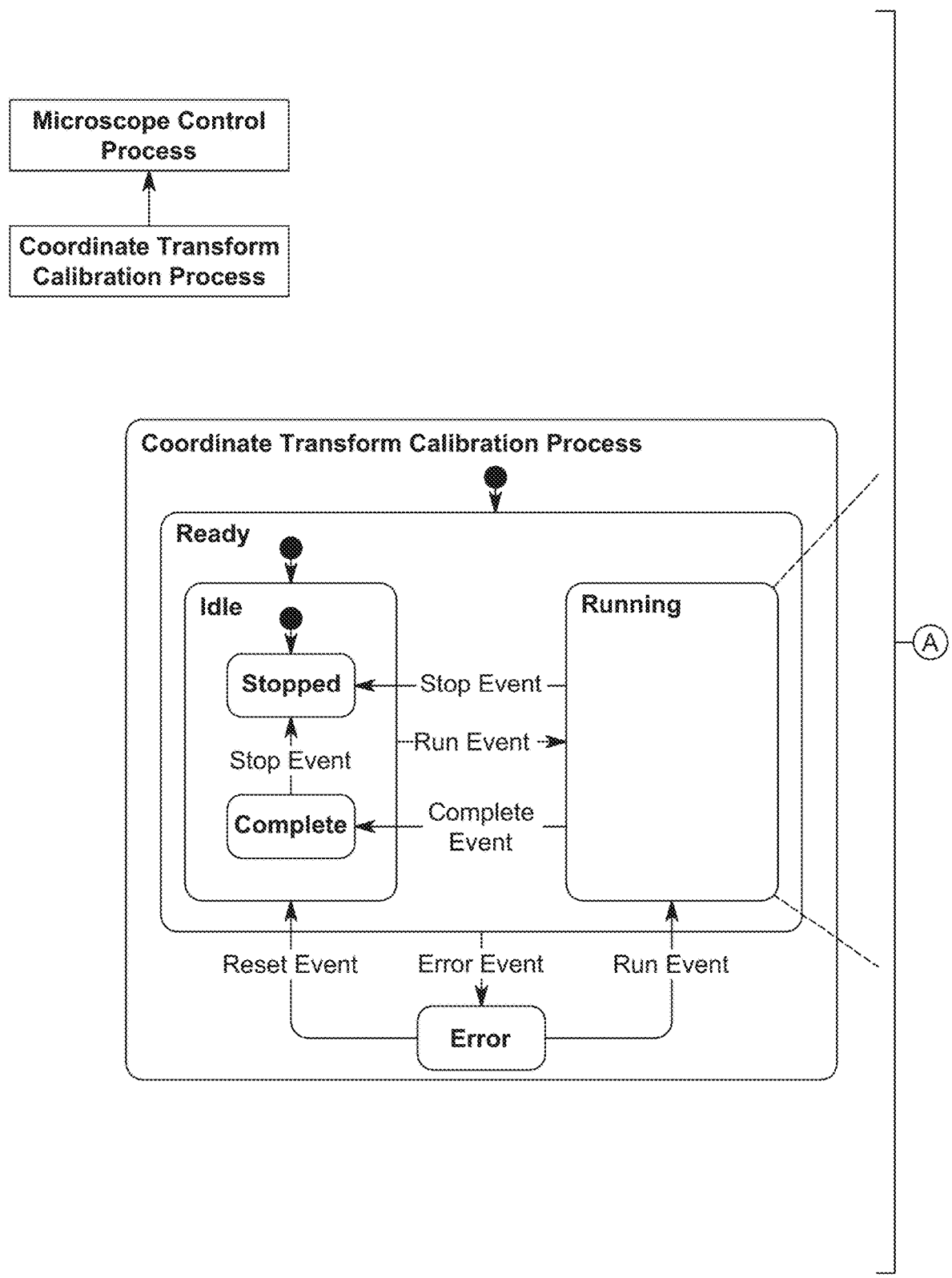
FIGS. 76A, 76B, and 76C are a schematic graphical representation of a process to calibrate for the X/Y rotational offset between a positioner and an imager, according to one or more embodiments of the presently disclosed subject matter.
Figure 76B:
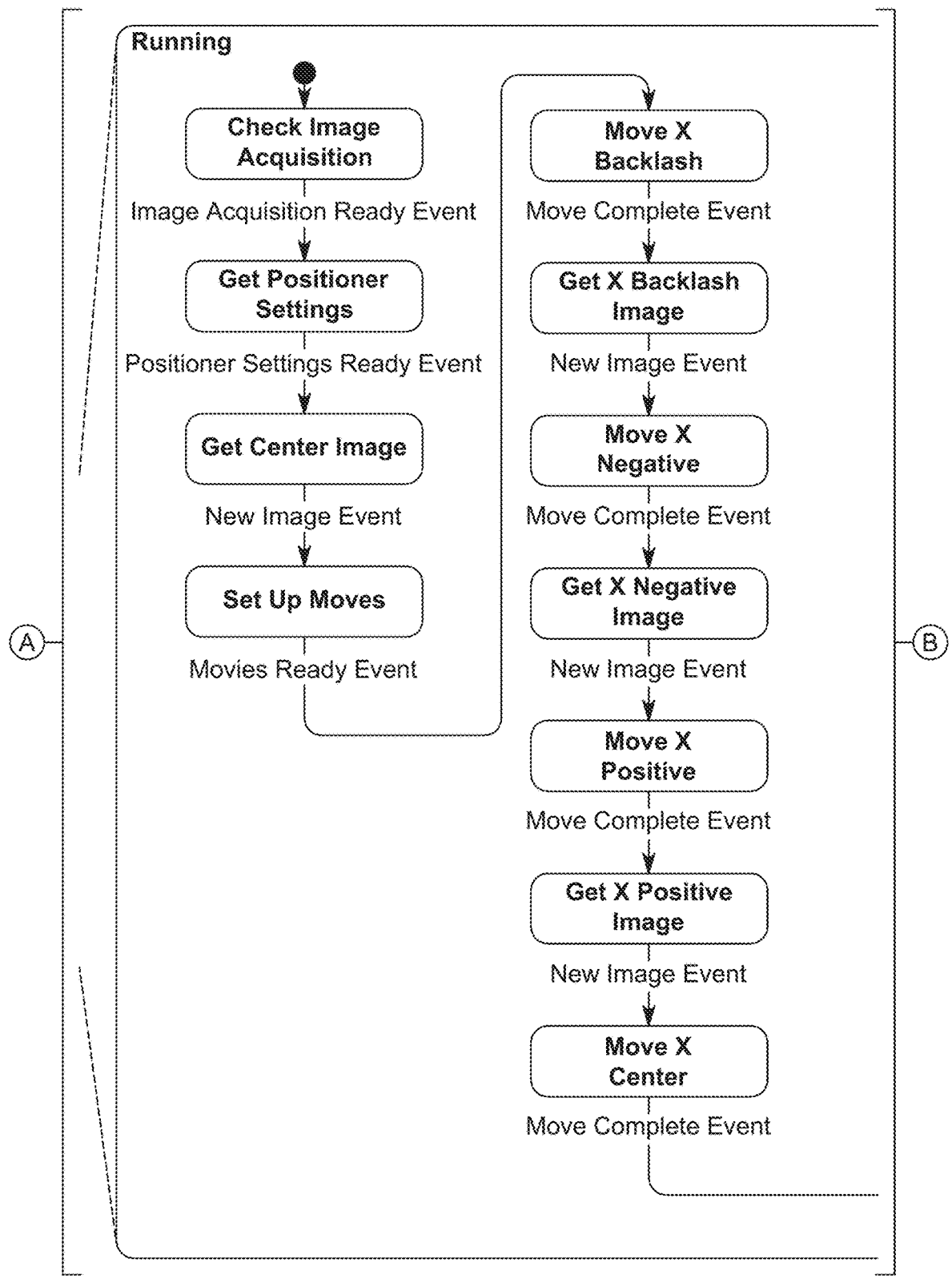
Figure 76C:
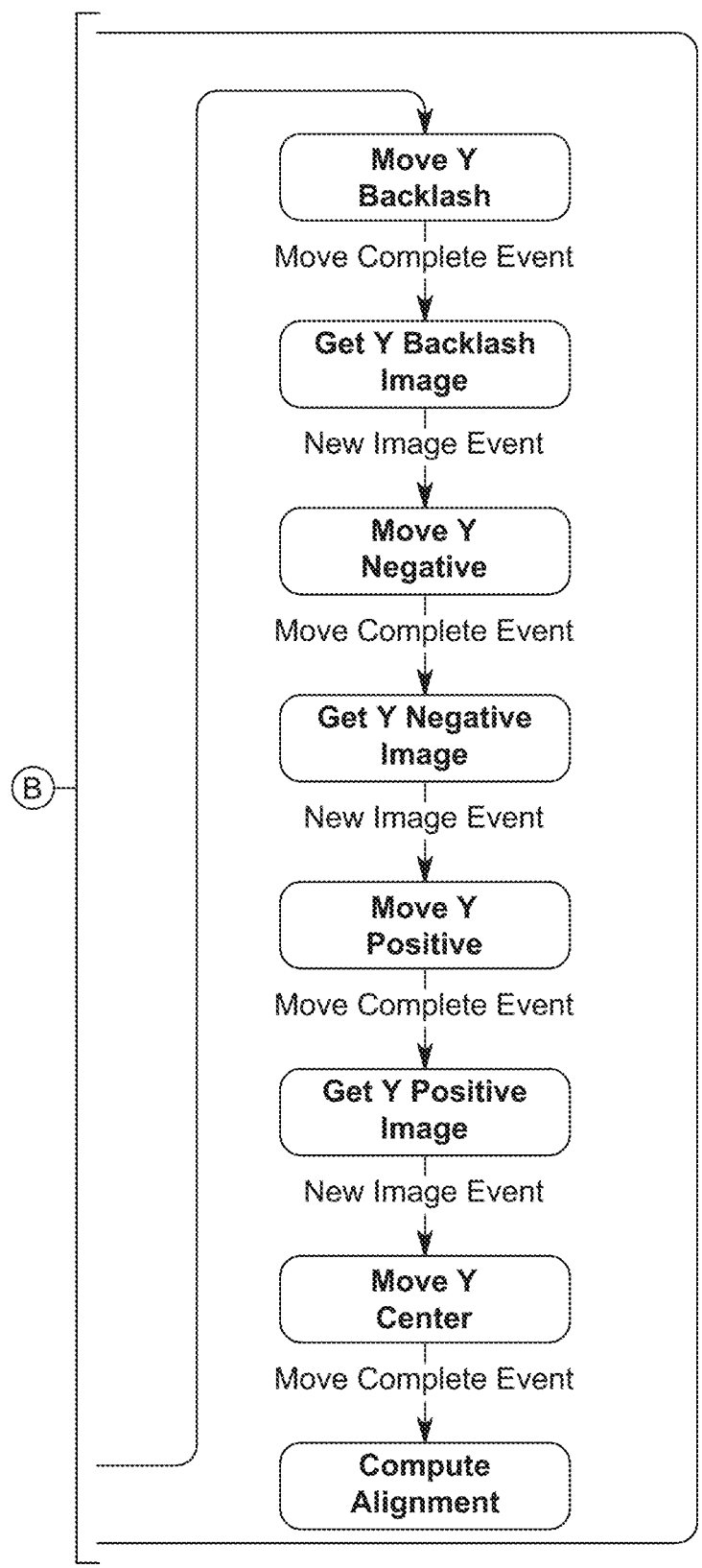
Figure 77A:
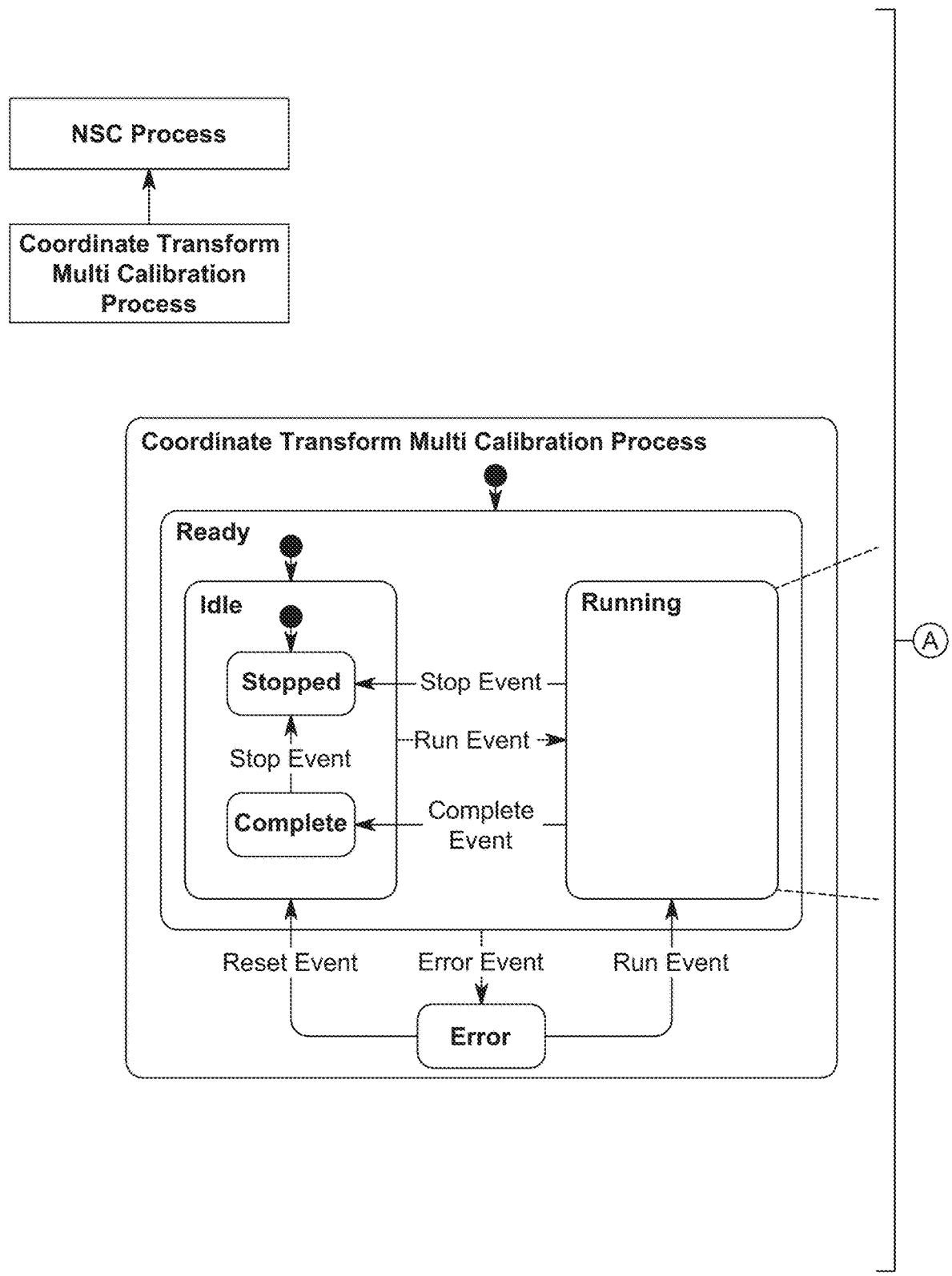
FIGS. 77A and 77B are a schematic graphical representation of a process to handle multiple positioners capable of calibrating under specific imaging conditions, according to one or more embodiments of the presently disclosed subject matter.
Figure 77B:
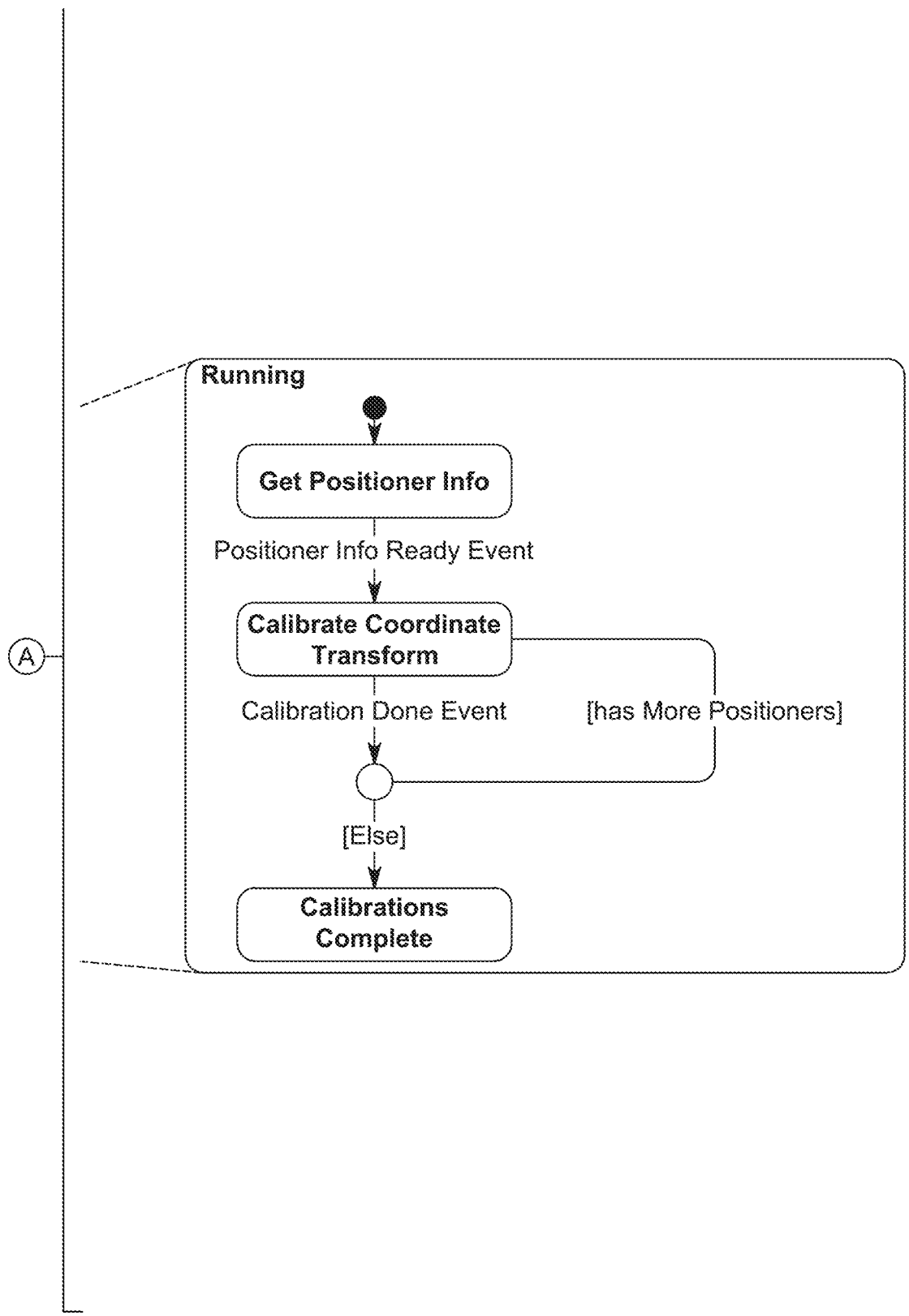
Figure 78A:
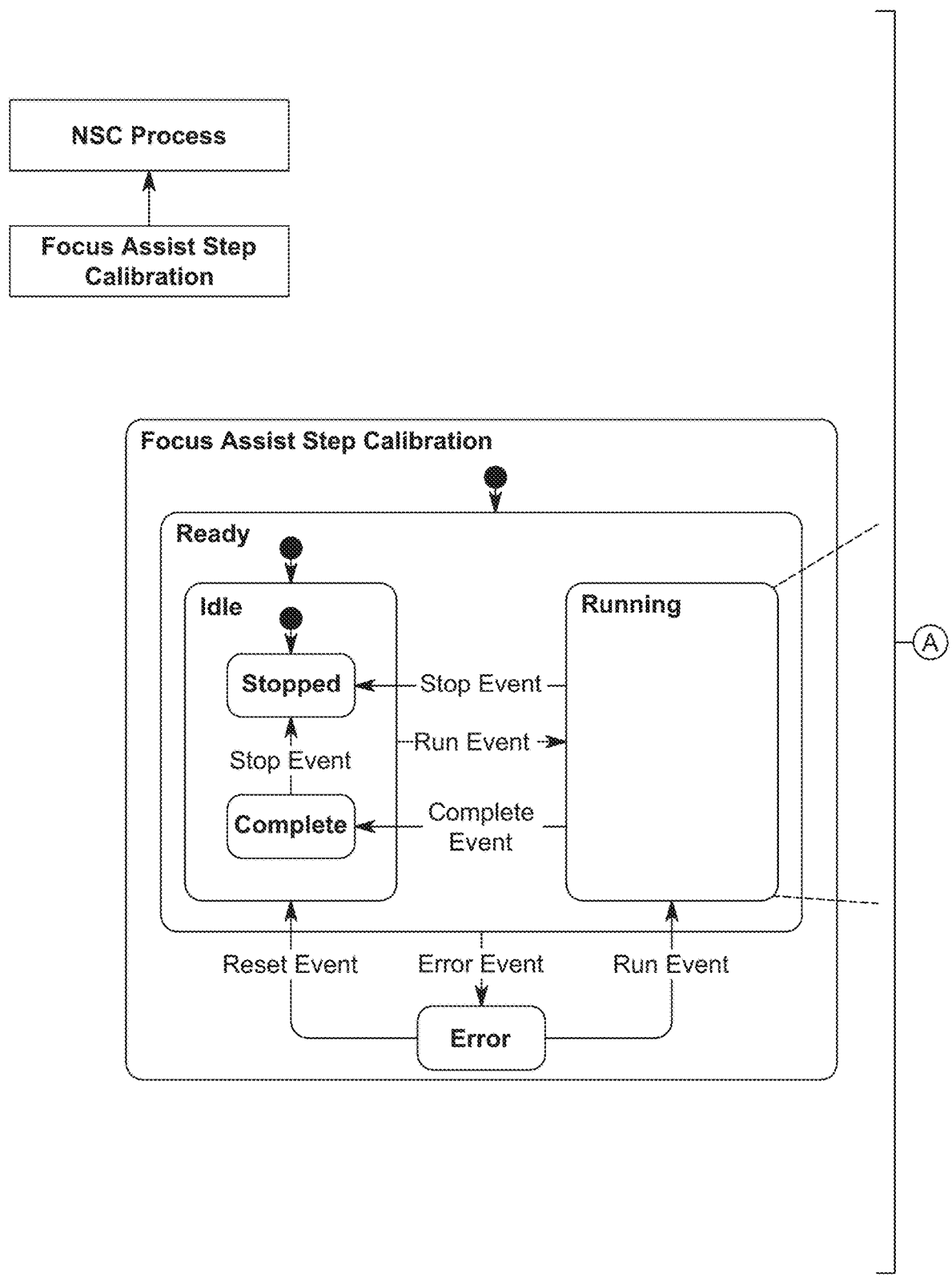
FIGS. 78A and 78B are a schematic graphical representation of a process to calibrate the required Z adjustment needed to correct for an image quality score change under specific imaging conditions, according to one or more embodiments of the presently disclosed subject matter.
Figure 78B:
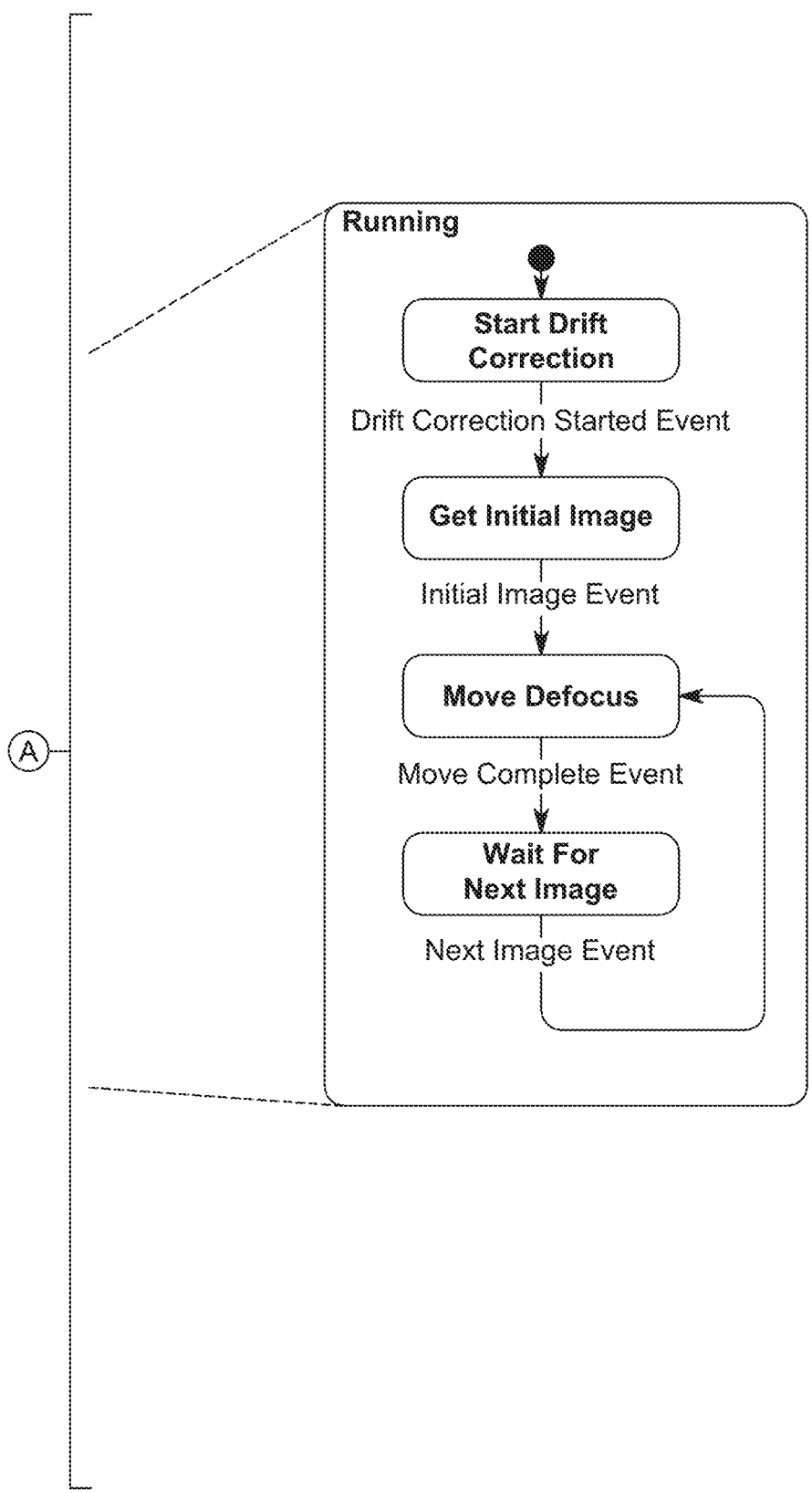
Figure 79A:
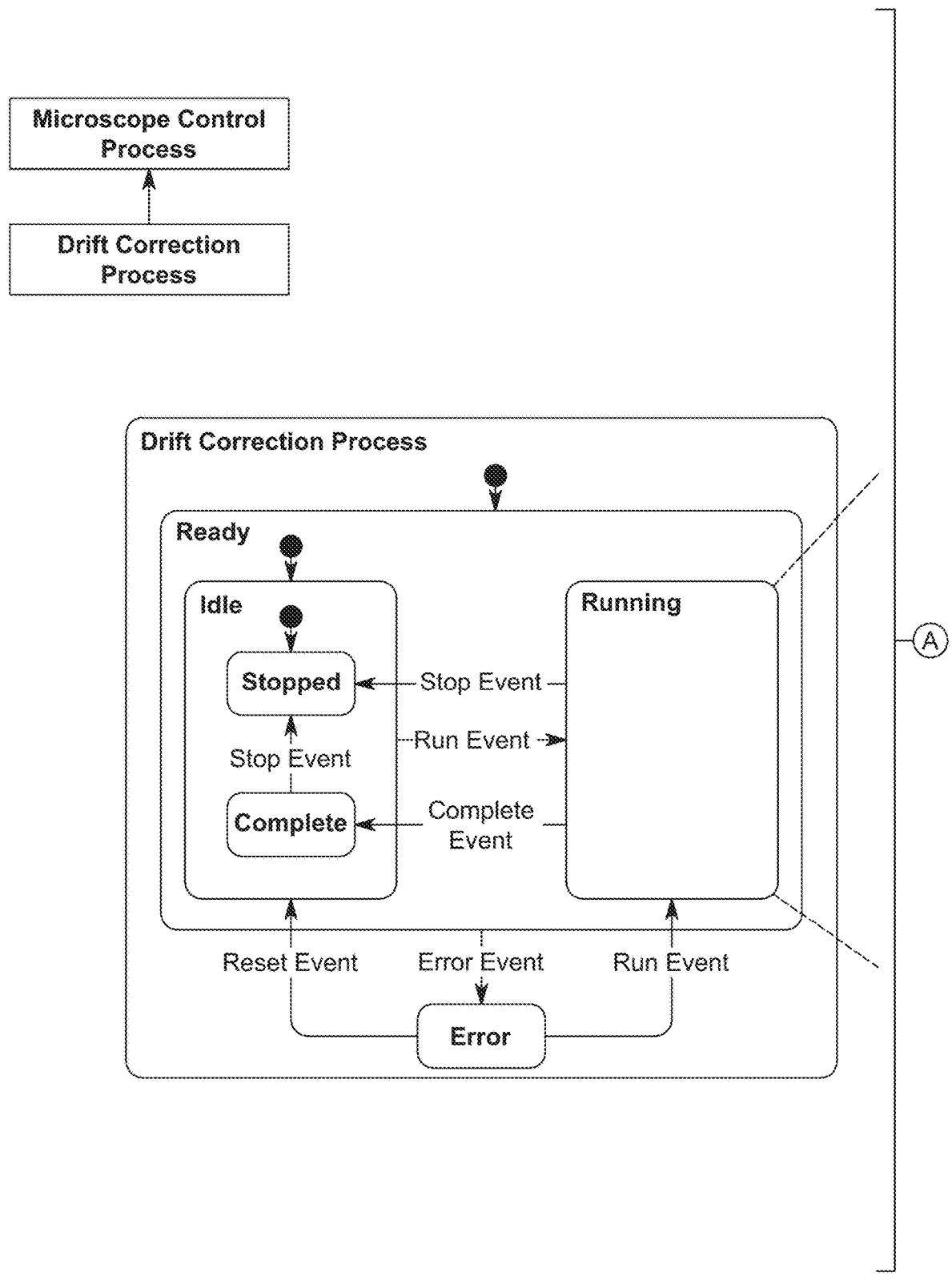
FIGS. 79A, 79B, 79C, and 79D are a schematic graphical representation of a process to run drift correction in X, Y and Z, according to one or more embodiments of the presently disclosed subject matter.
Figure 79B:
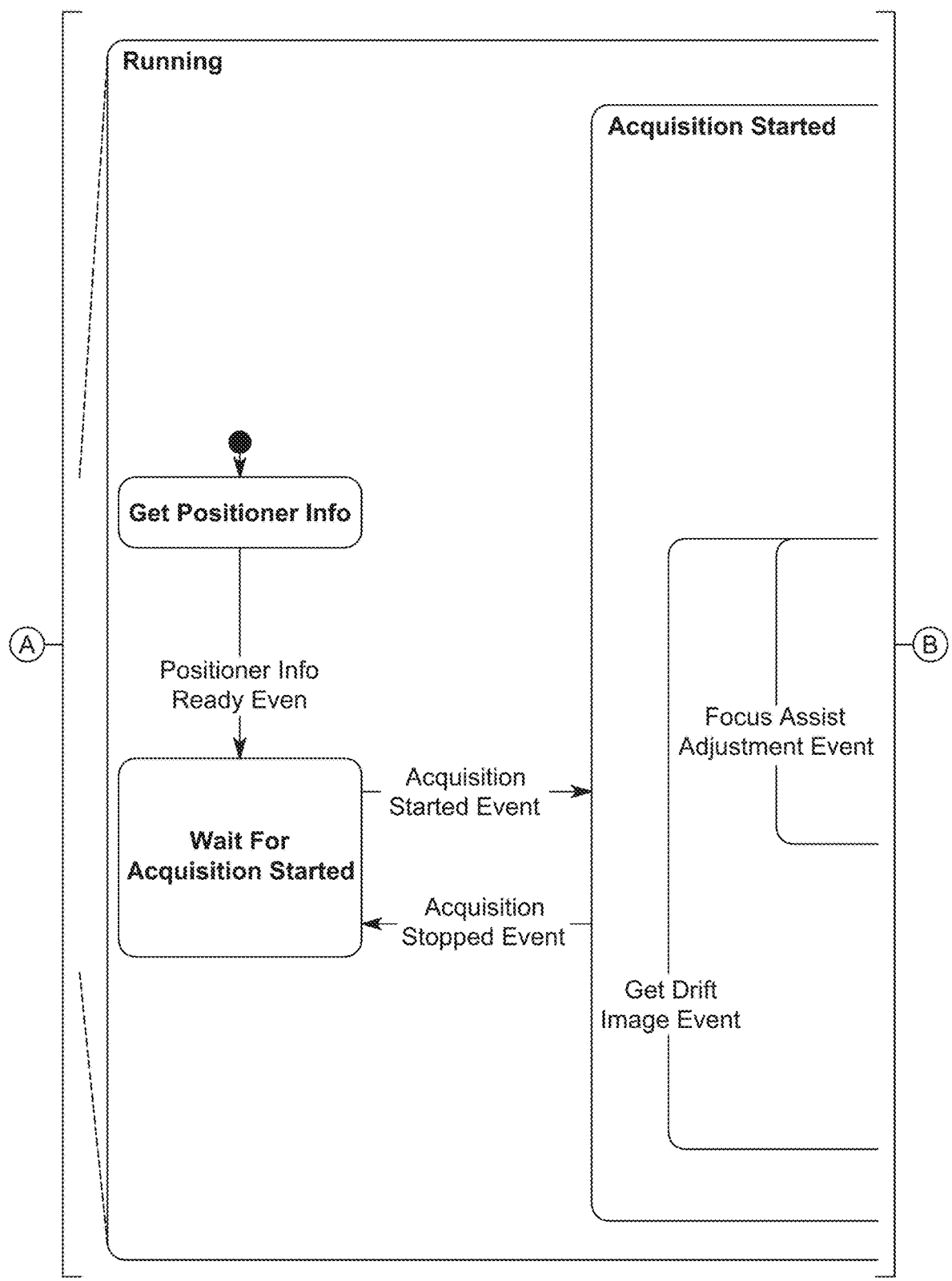
Figure 79C:
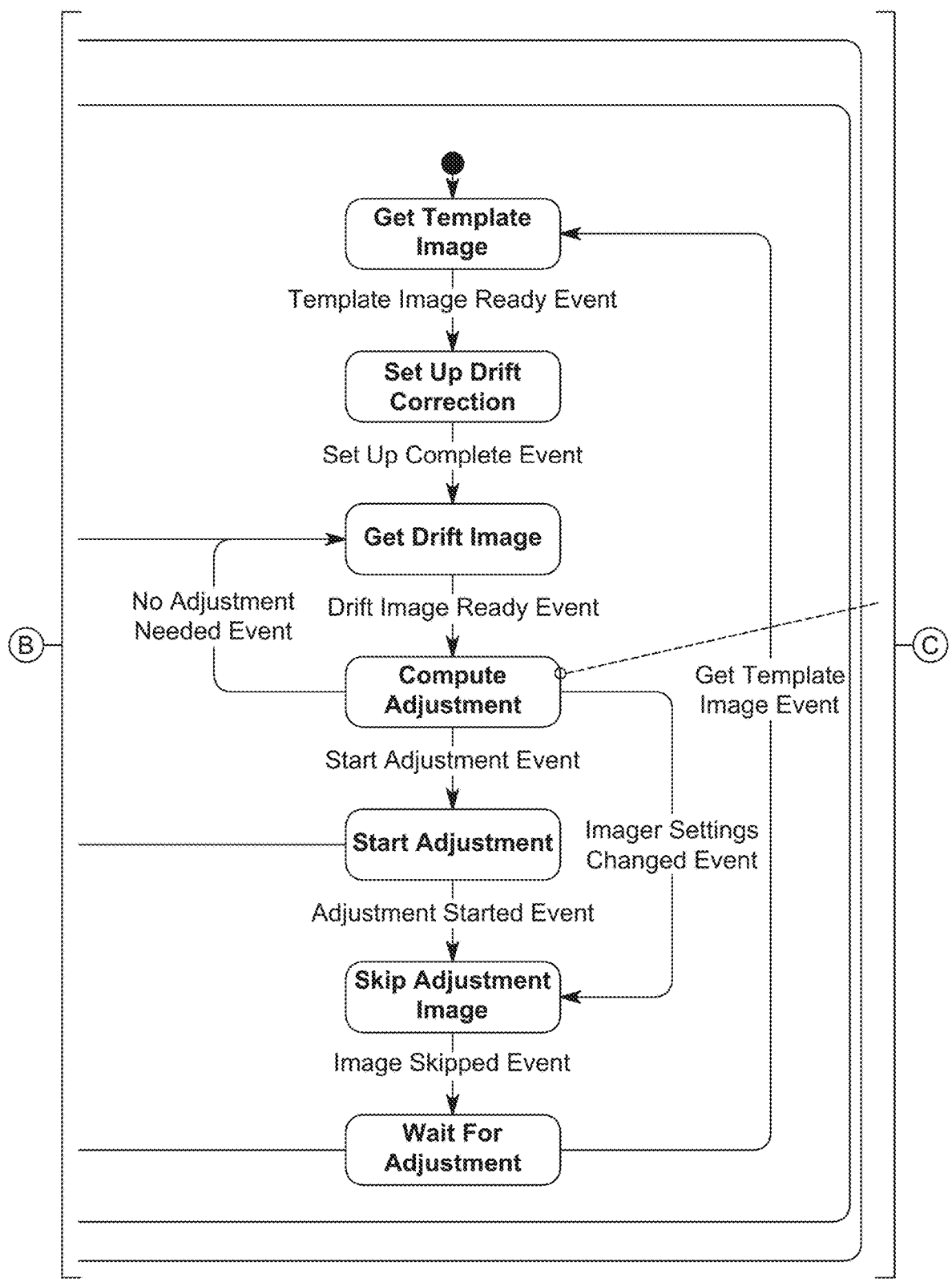
Figure 79D:
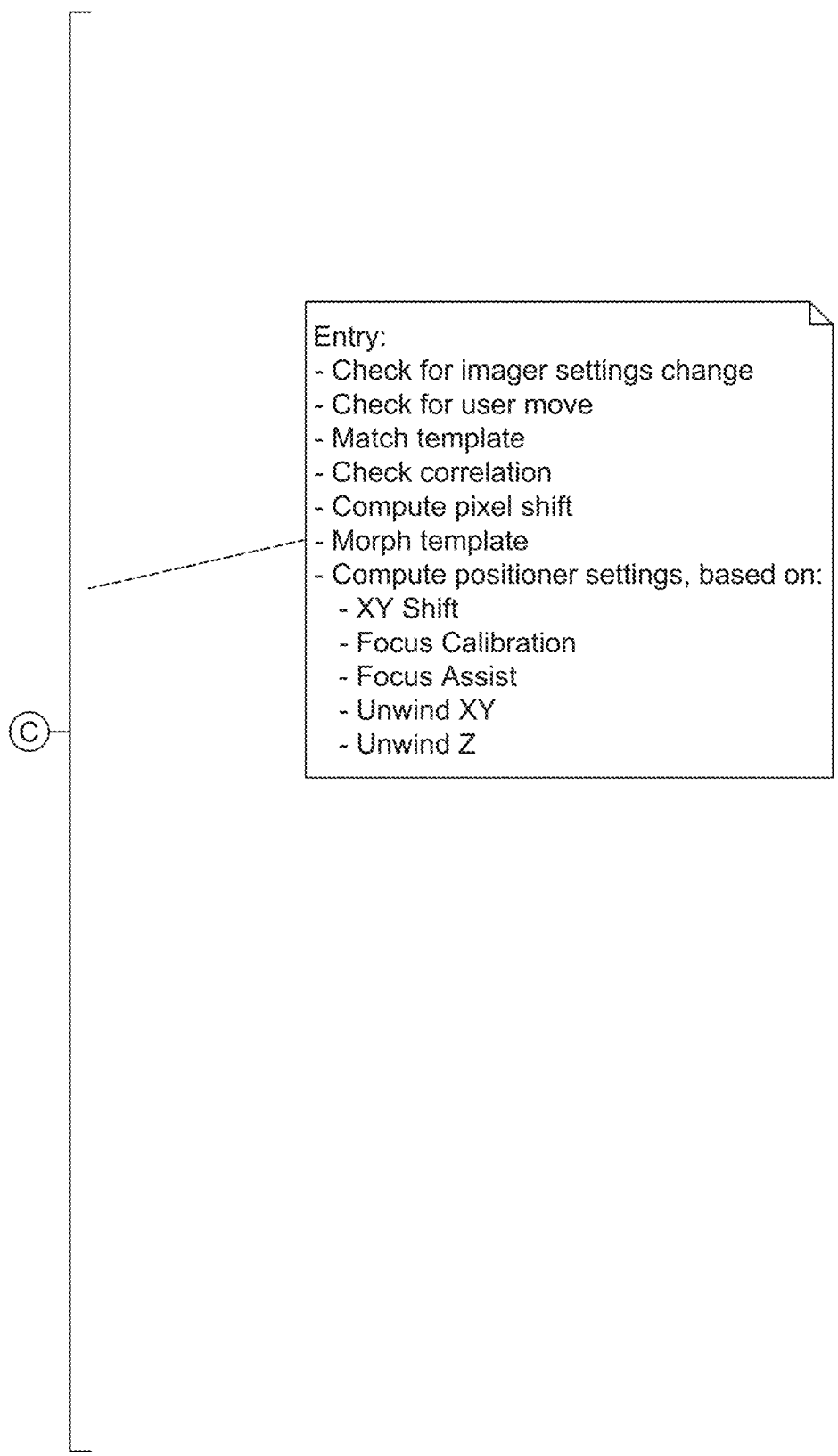

FIG. 75 is a schematic graphical representation of a test connection process. On successful connection, a microscope profile can be automatically created detailing the network configuration and pulling over any specific service settings. FIG. 76 is a schematic graphical representation of a process to calibrate for the X/Y rotational offset between a positioner and an imager. This process involves moving a positioner in a known direction accounting for calibrated resolution and backlash of the positioner and calculating the resulting coordinate transform. FIG. 77 is a schematic graphical representation of a process to handle multiple positioners capable of calibrating under specific imaging conditions. FIG. 78 is a schematic graphical representation of a process to calibrate the required Z adjustment needed to correct for an image quality score change under specific imaging conditions.

Figure 80A:
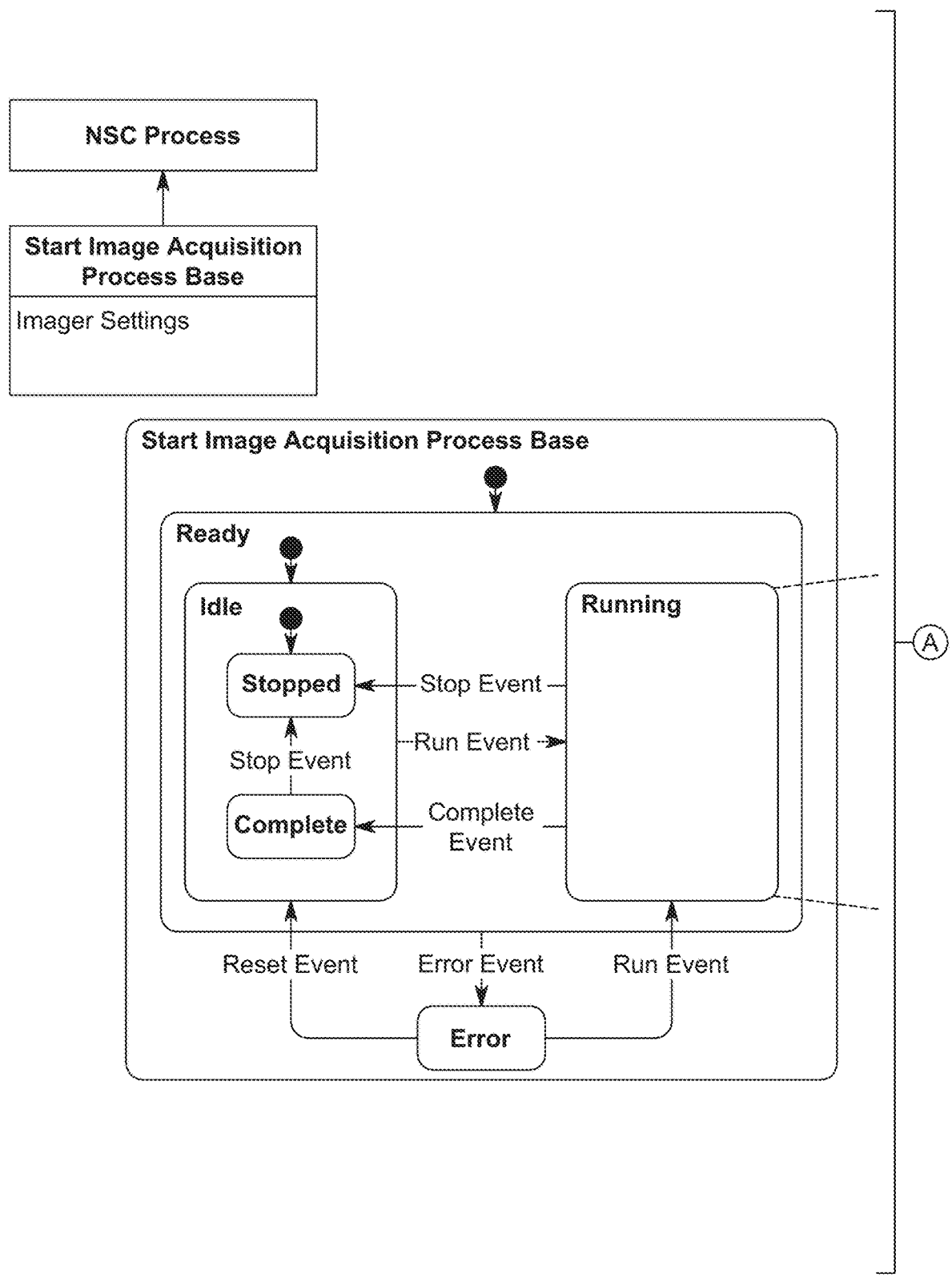
FIGS. 80A and 80B are a schematic graphical representation of a process to start image acquisition remotely from a control software module, according to one or more embodiments of the presently disclosed subject matter.
Figure 80B:
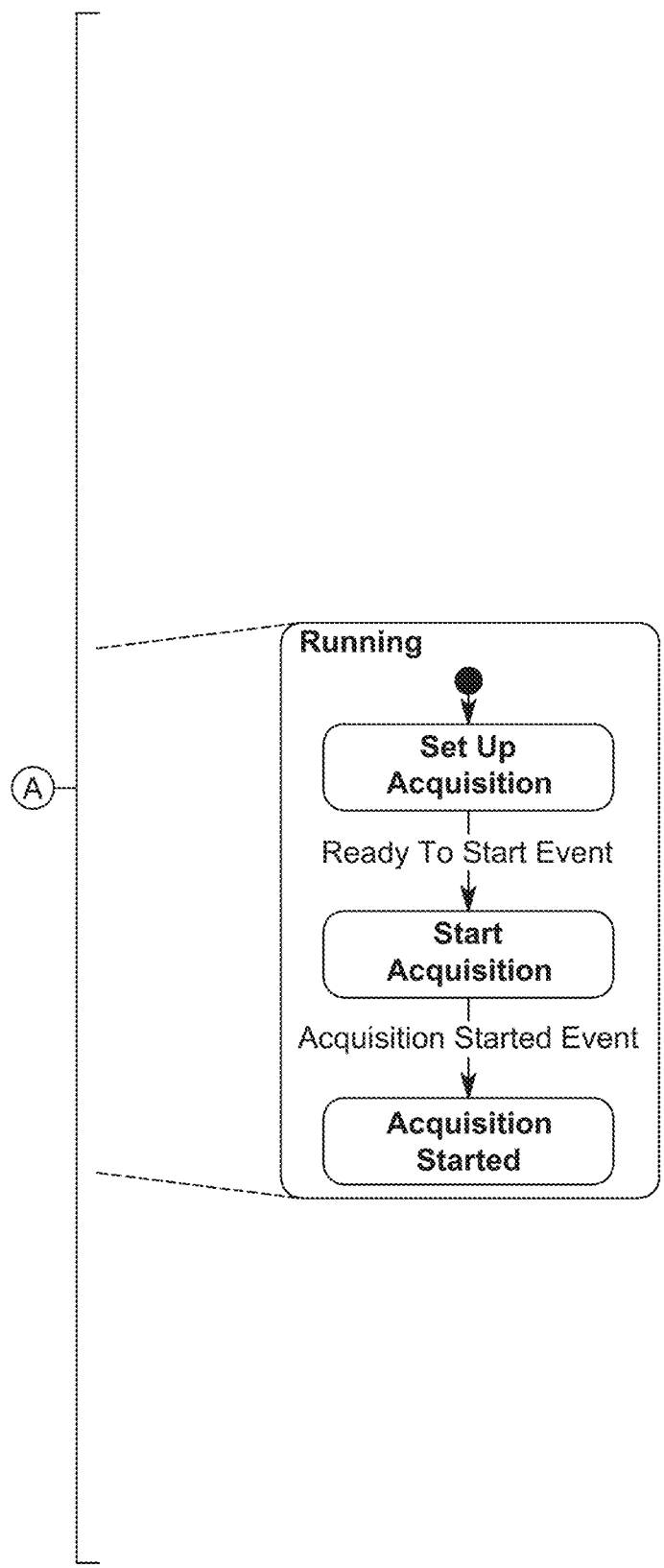
Figure 81A:
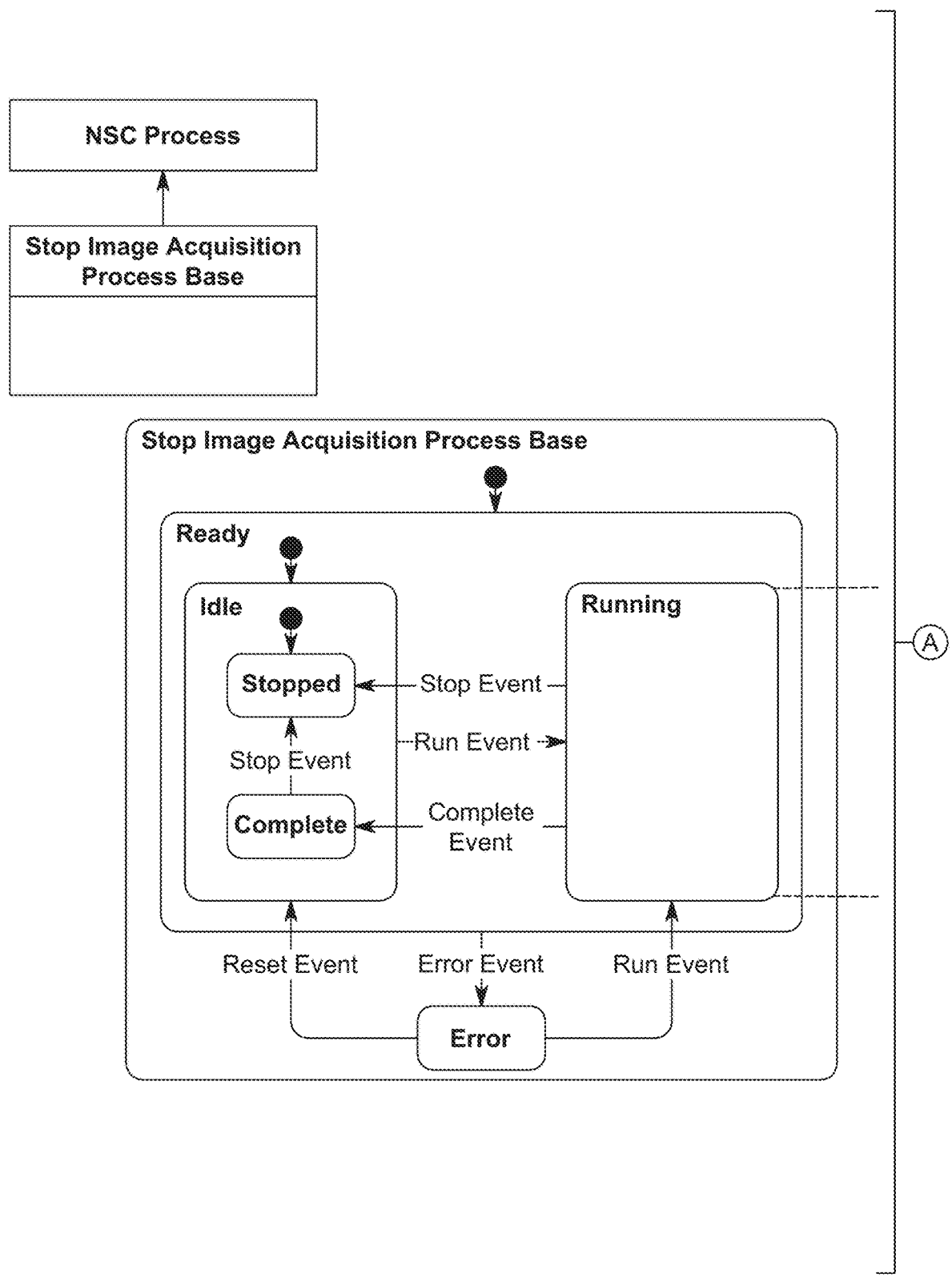
FIGS. 81A and 81B are a schematic graphical representation of a process to stop image acquisition remotely from a control software module, according to one or more embodiments of the presently disclosed subject matter.
Figure 81B:
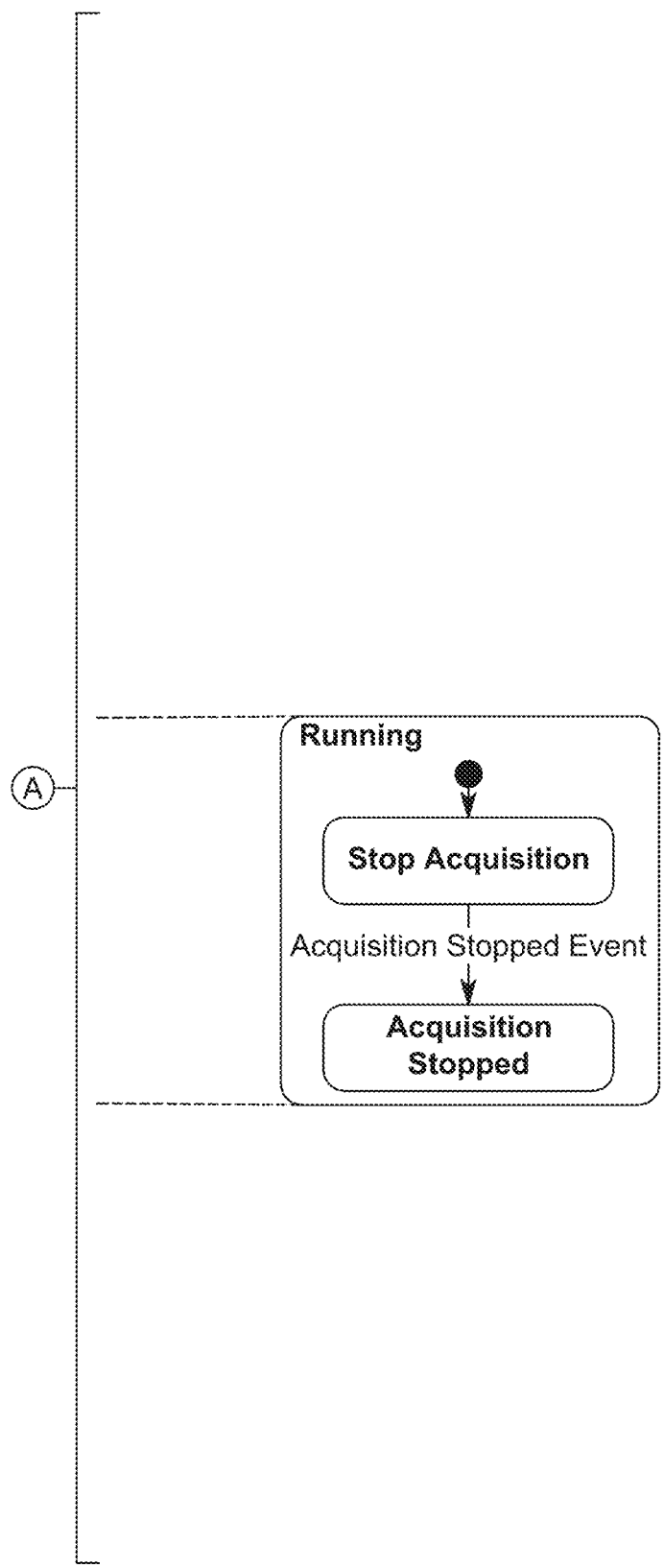

FIG. 79 is a schematic graphical representation of a process to run drift correction in X, Y and Z. Where Z focus corrections are continuous adjustments based on a history of focus quality scores of a region of interest in an X/Y drift corrected sequence. FIG. 80 is a schematic graphical representation of a process to start image acquisition remotely from a control software. FIG. 81 is a schematic graphical representation of a process to stop image acquisition remotely from a control software.

Figure 82A:
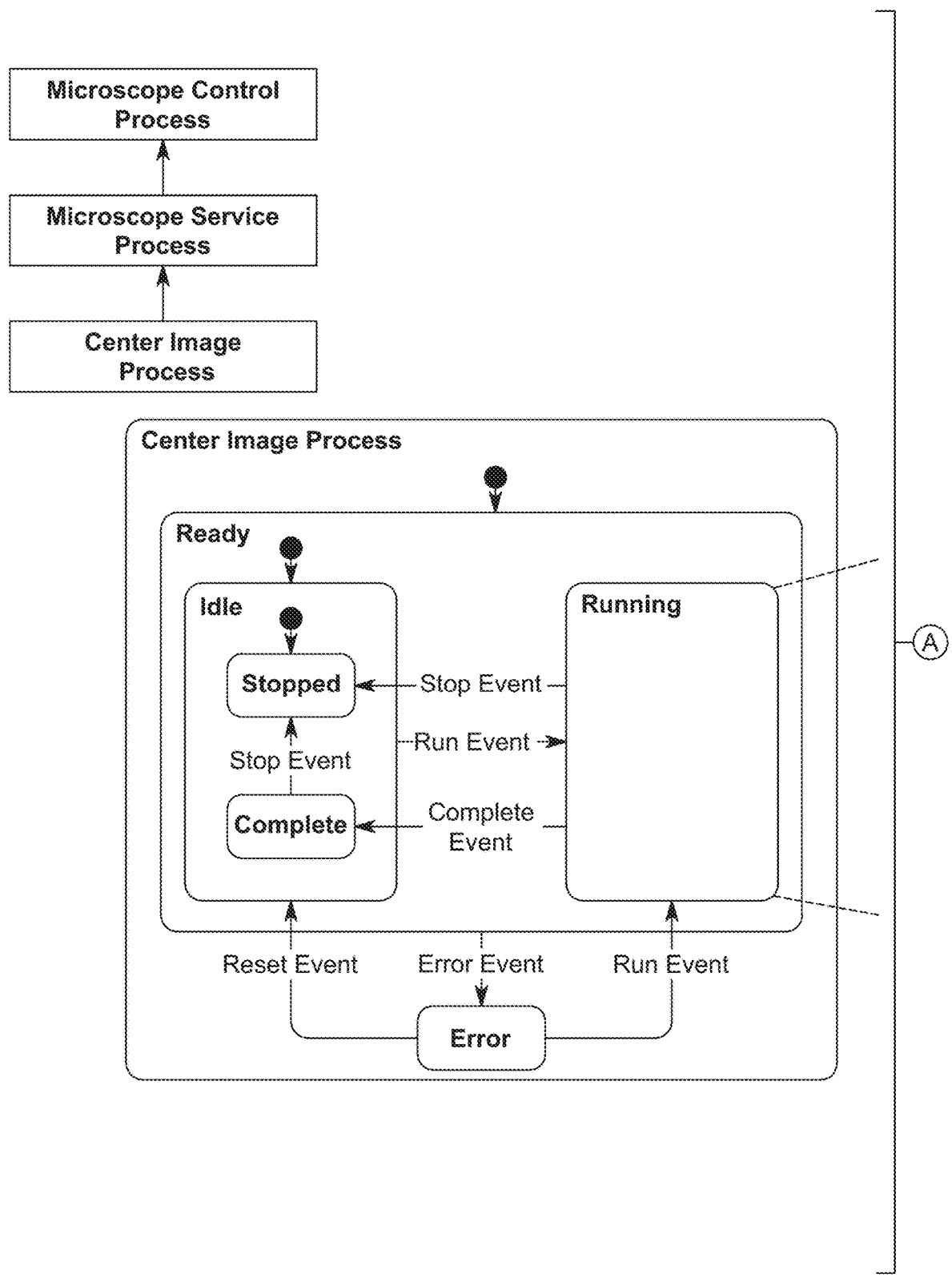
FIGS. 82A and 82B are a schematic graphical representation of a process to move a sample to a specific location in the field of view, according to one or more embodiments of the presently disclosed subject matter.
Figure 82B:
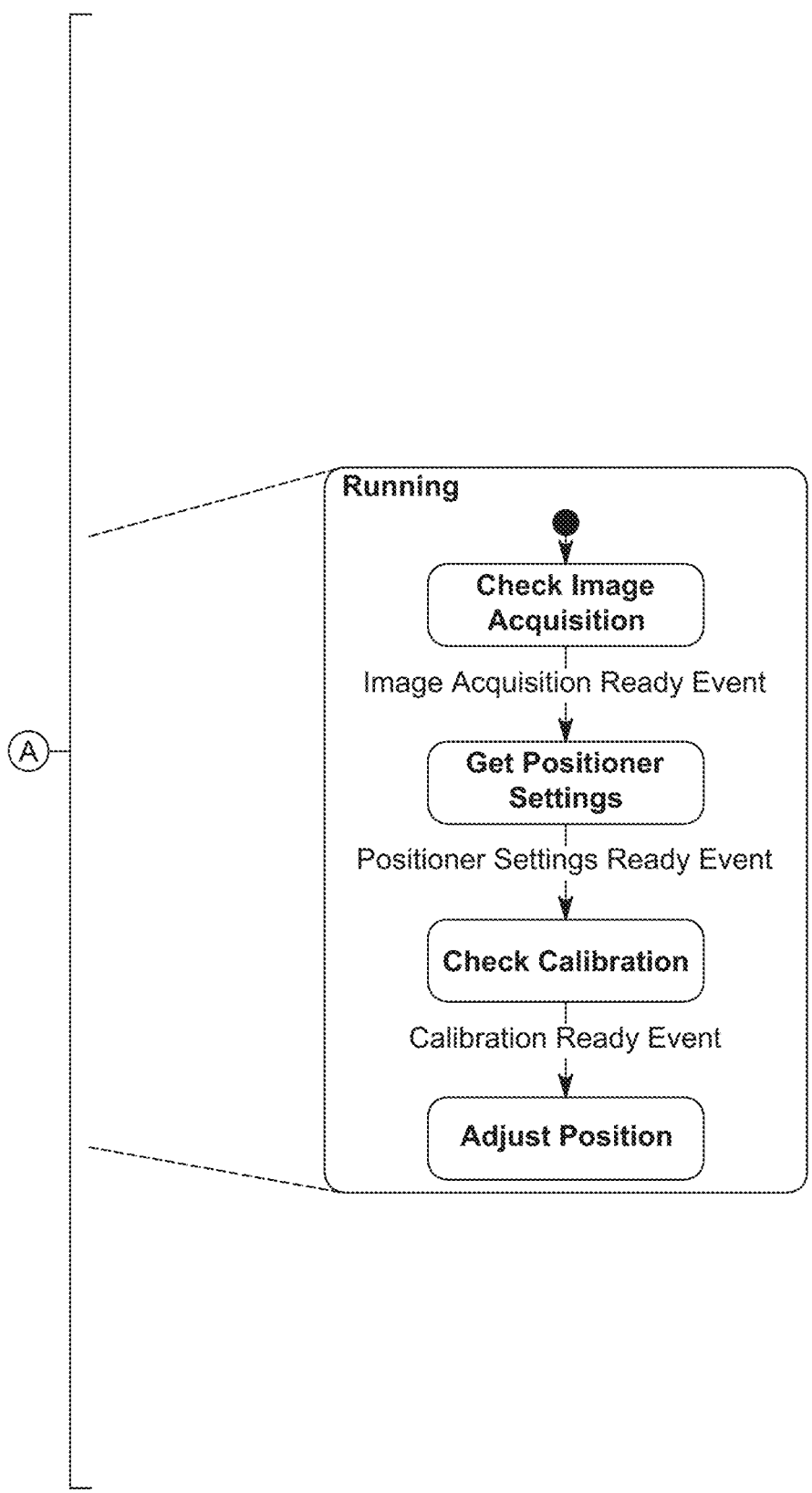

FIG. 82 is a schematic graphical representation of a process to move a sample to a specific location in the field of view. This process can be used to manually center a sample in the field of view, it can be used by drift correction process to automatically center a sample in the field of view or it can be used to move any specific region of interest to any location within the field of view.

Figure 83A:
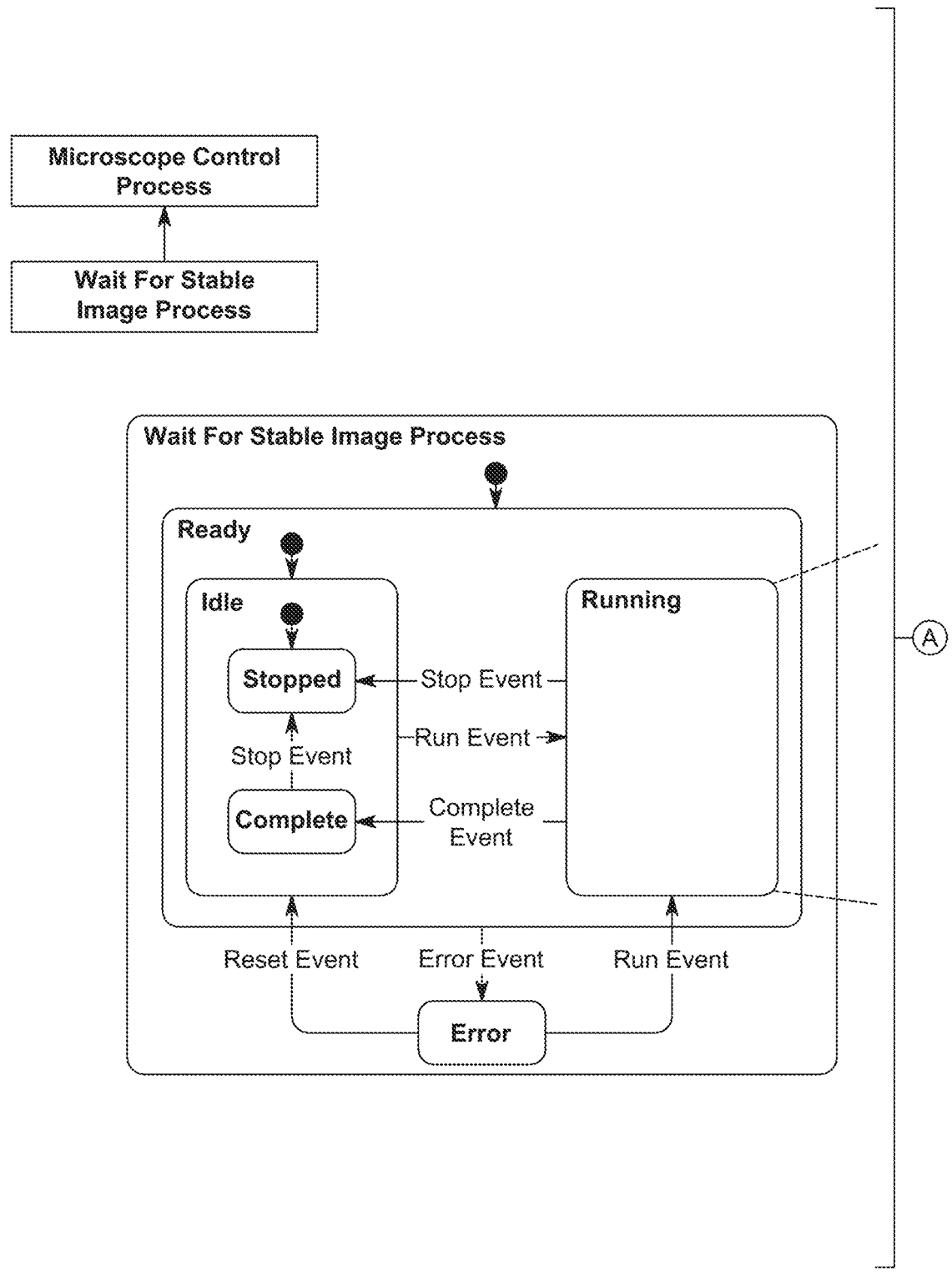
FIGS. 83A and 83B are a schematic graphical representation of a process to determine if the image has stabilized after a commanded move by the microscope, according to one or more embodiments of the presently disclosed subject matter.
Figure 83B:
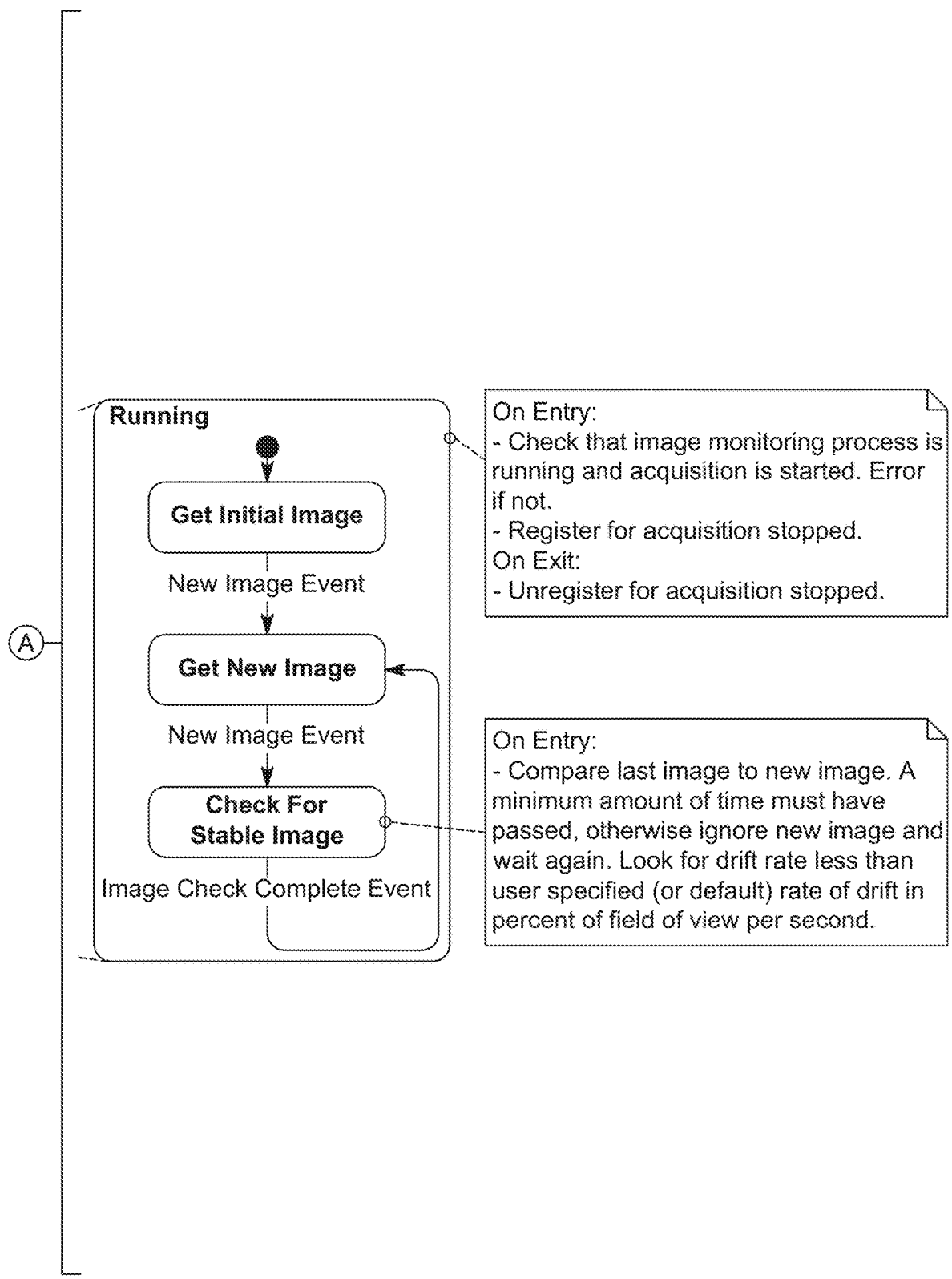

FIG. 83 is a schematic graphical representation of a process to determine if the image has stabilized after a commanded move by the microscope. This process can be used to remove frames from calculations needed for correction algorithms Additionally, this process can be used to leave the resulting drift corrected image sequence free of frames blurred by the physical corrections of microscope positioners.

Figure 84:
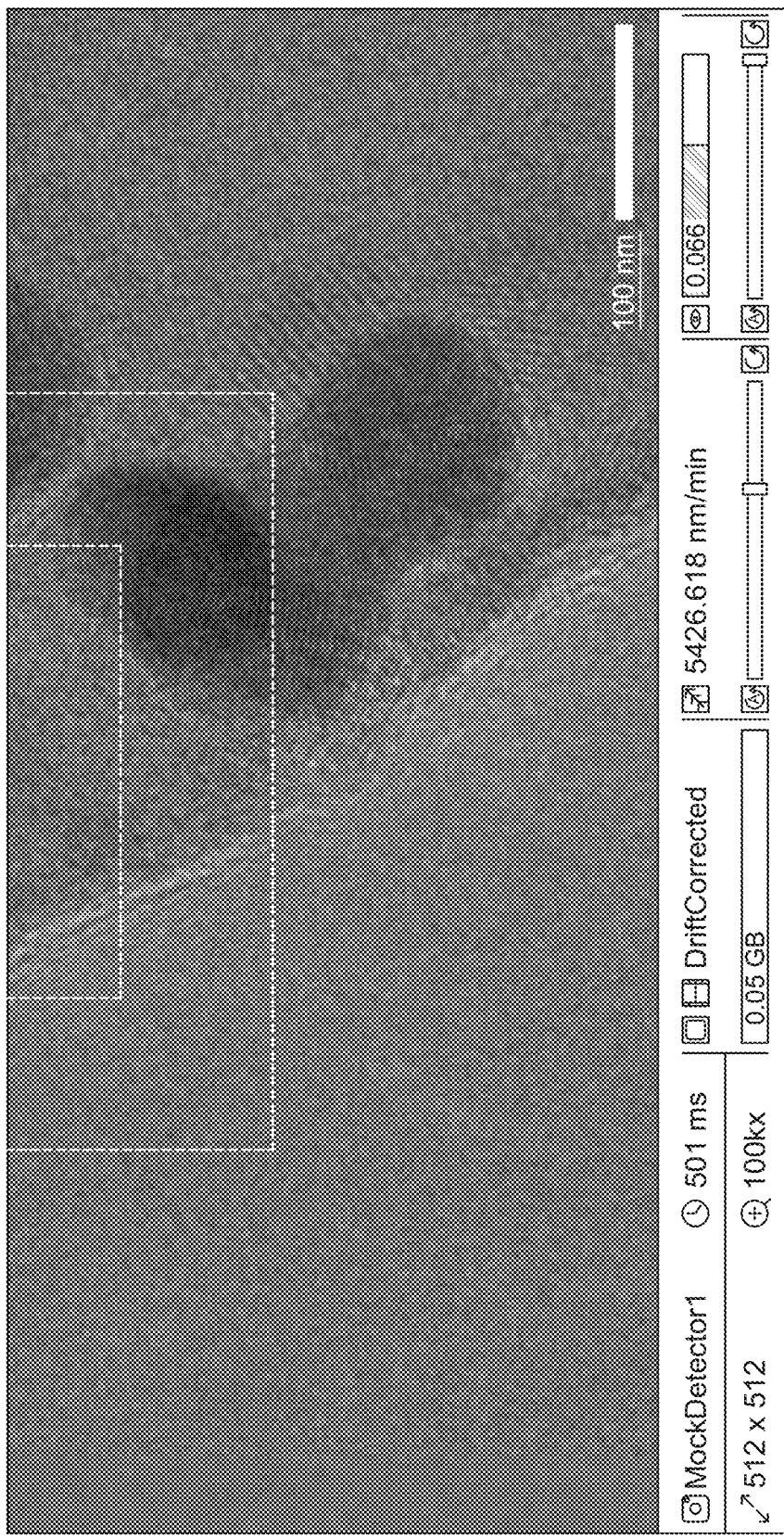
FIG. 84 is a graphical representation of key controls and indicators that could enhance the drift correction experience in the control software module user interface, according to one or more embodiments of the presently disclosed subject matter.

FIG. 84 is a graphical representation of key controls and indicators that could enhance the drift correction experience in the control software user interface. These indicators can include key metadata about the microscope status, in-situ status and imaging conditions. Additionally, these indicators in the user interface can enable users to switch between raw images and digitally registered images in the live view and give insight into the number of images saved into the image buffer in the active session—the total number of images and the percentage of available buffer. The drift rate of the region of interest can be displayed numerically as a distance over time or as more graphical indicators. The X and Y beam location can be displayed as coordinates or as a sliding indicator against preferred range. The Z defocus location can be displayed as a value or as a sliding indicator against preferred range. Buttons or automated trigger thresholds can be created to unwind X/Y beam or Z defocus back to 0,0,0 without losing the sample.

Figure 85:
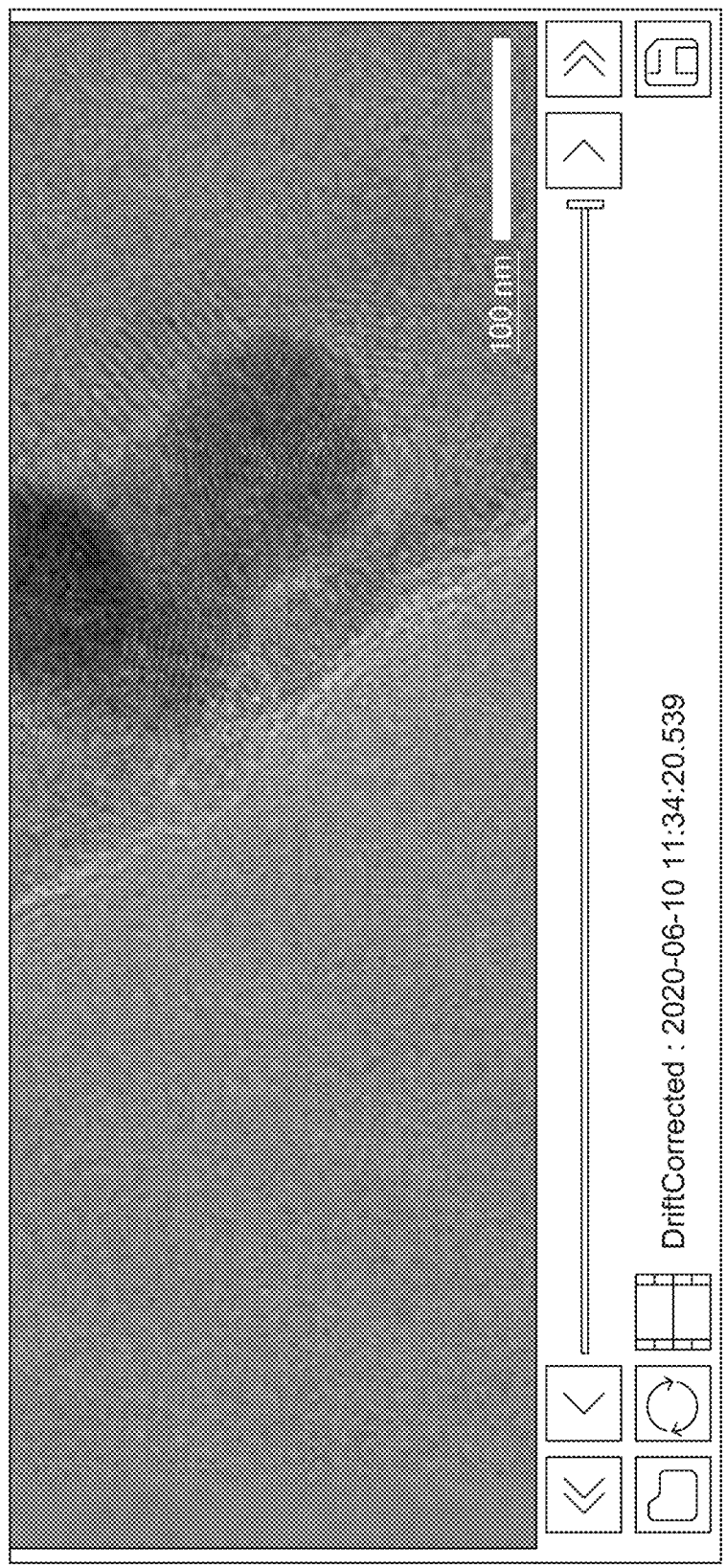
FIG. 85 is a graphical representation of key controls that can enable users to review the history of a session from the software module user interface, according to one or more embodiments of the presently disclosed subject matter.

FIG. 85 is a graphical representation of key controls that can enable users to review the history of a session from the software user interface. An image scrubber can be used to quickly navigate between frames. The raw images, drift corrected images and single acquisitions could be organized by time so that users could easily scrub through a drift corrected sequence and then toggle the display to show the corresponding raw image or nearest single acquisition.

Figure 86:
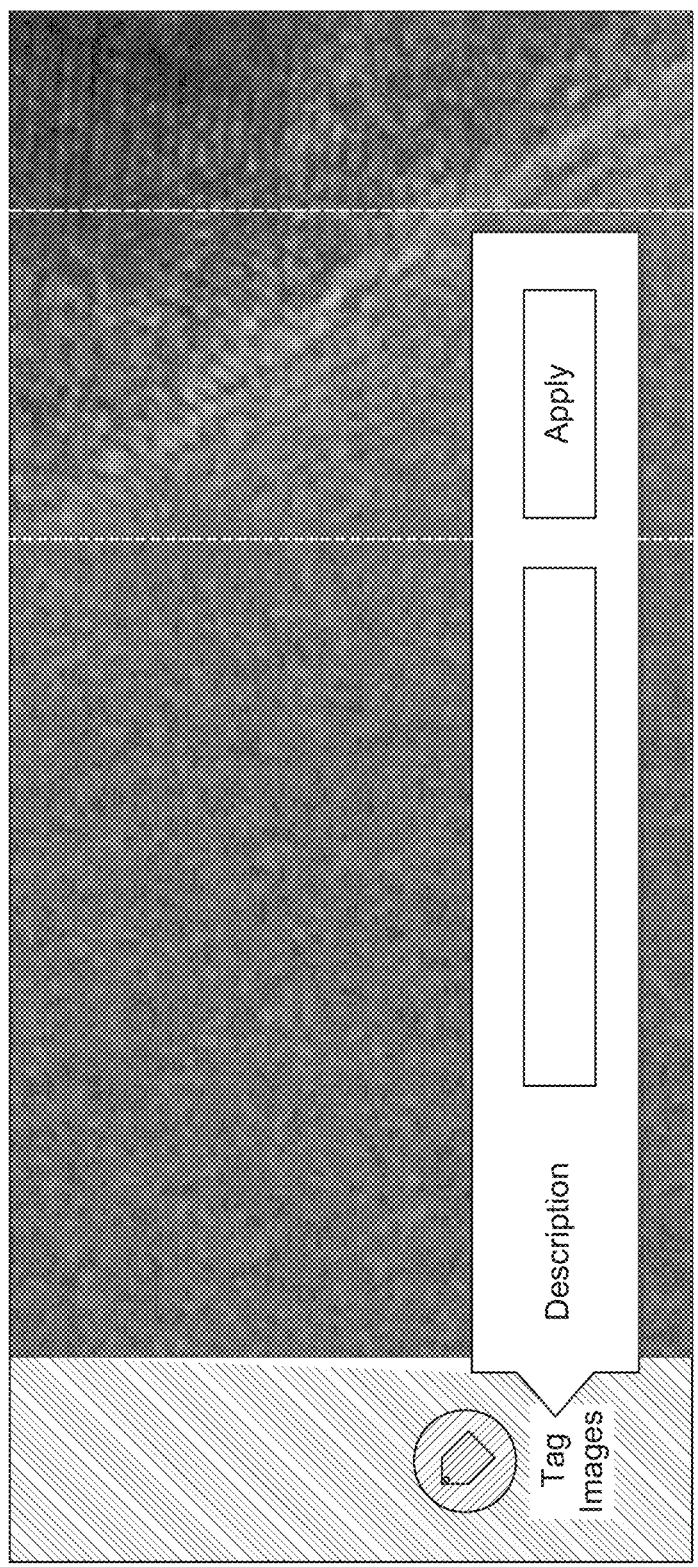
FIG. 86 is a graphical representation of a method by which users could tag specific frames and time sequences with a description from the control software module user interface, according to one or more embodiments of the presently disclosed subject matter.

FIG. 86 is a graphical representation of a method by which users could tag specific frames and time sequences with a description from the control software user interface. The tag feature could be used to give priority to images in the buffer so that they override first-in-first-out buffer rules preserving the key frames from being removed during automated buffer clean-up processes. Additionally, tagged frames could be highlighted in review tools or metadata plots for easy navigation. Tagged frames could be exported to data drives separately from the entire session buffer.

FIG. 87 is a graphical representation of key settings that a user could manipulate to customize the active image buffer and session management. User settings could be used to state the image buffer location, size, cleanup properties, what images are saved and the percentage of the buffer that can be allocated to preferred images.

Figure 88:
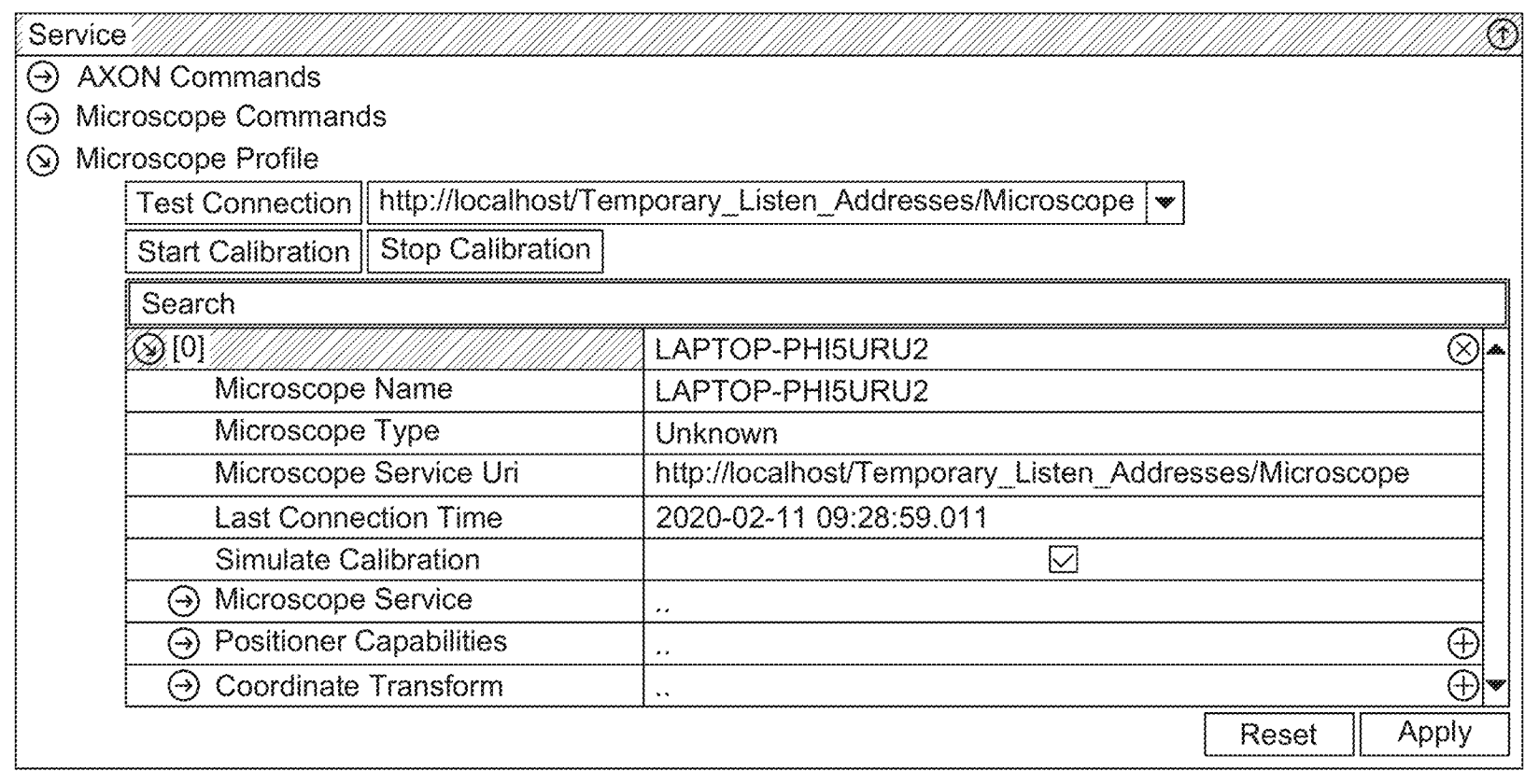
Figure 92:
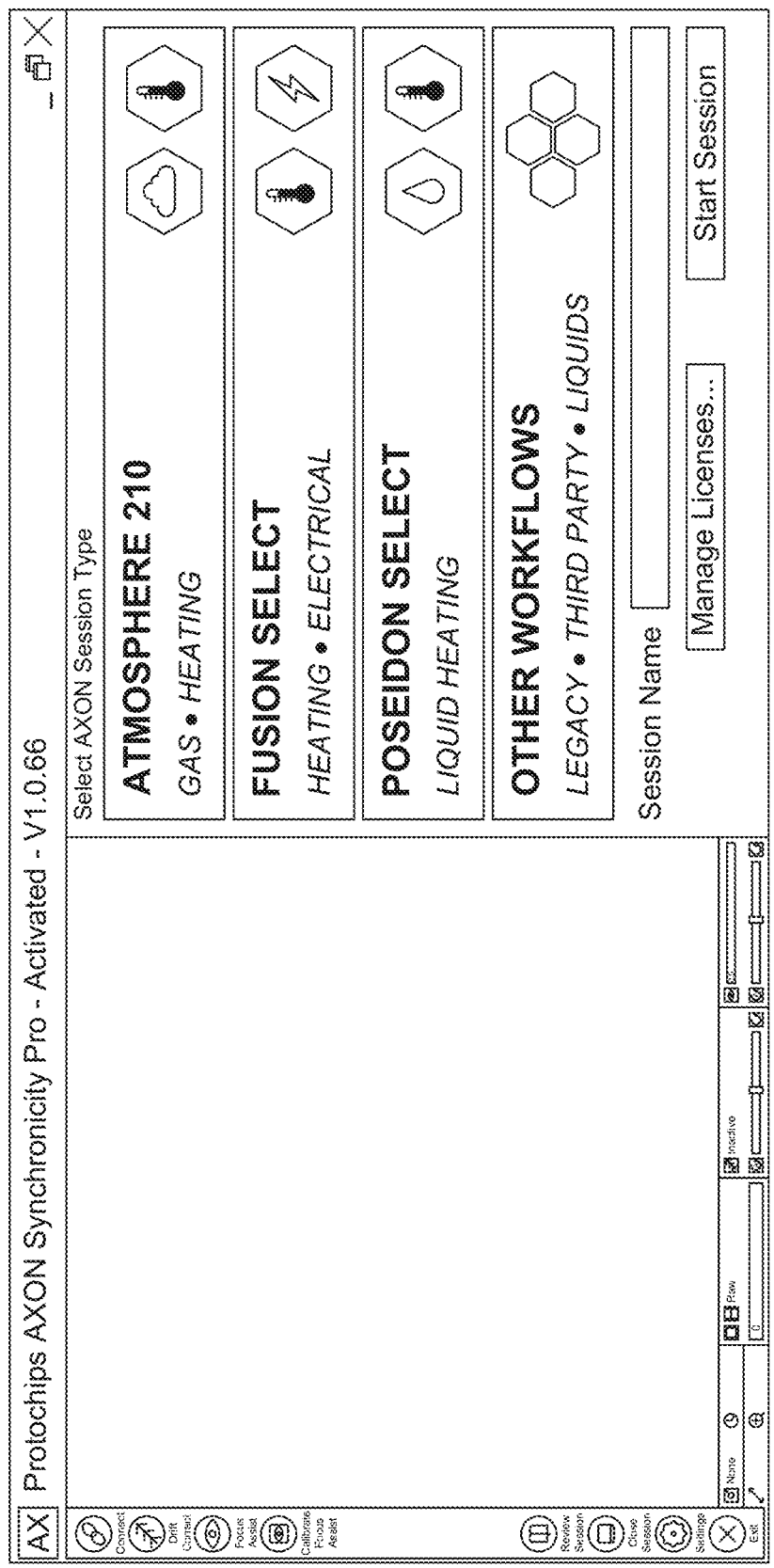
FIG. 92 is a graphical representation of a user interface enabling users to dictate specific types of in-situ experiments or workflows that may change the behavior or options of the control software module, according to one or more embodiments of the presently disclosed subject matter.

FIG. 88 and FIG. 89 are graphical representations of how the control software could be used to build a microscope profile characterizing the network configuration, positioner capabilities and required calibrations needed by the control software to function appropriately. The control software could enable raw control of the microscope functions to manually perform needed calibrations or provide automated processes. FIG. 90 and FIG. 91 are graphical representations of how the control software could manage calibrations specific to imaging conditions and imagers. FIG. 92 is a graphical representation of a user interface enabling users to dictate specific types of in-situ experiments or workflows that may change the behavior or options of the control software.

Figure 93A:
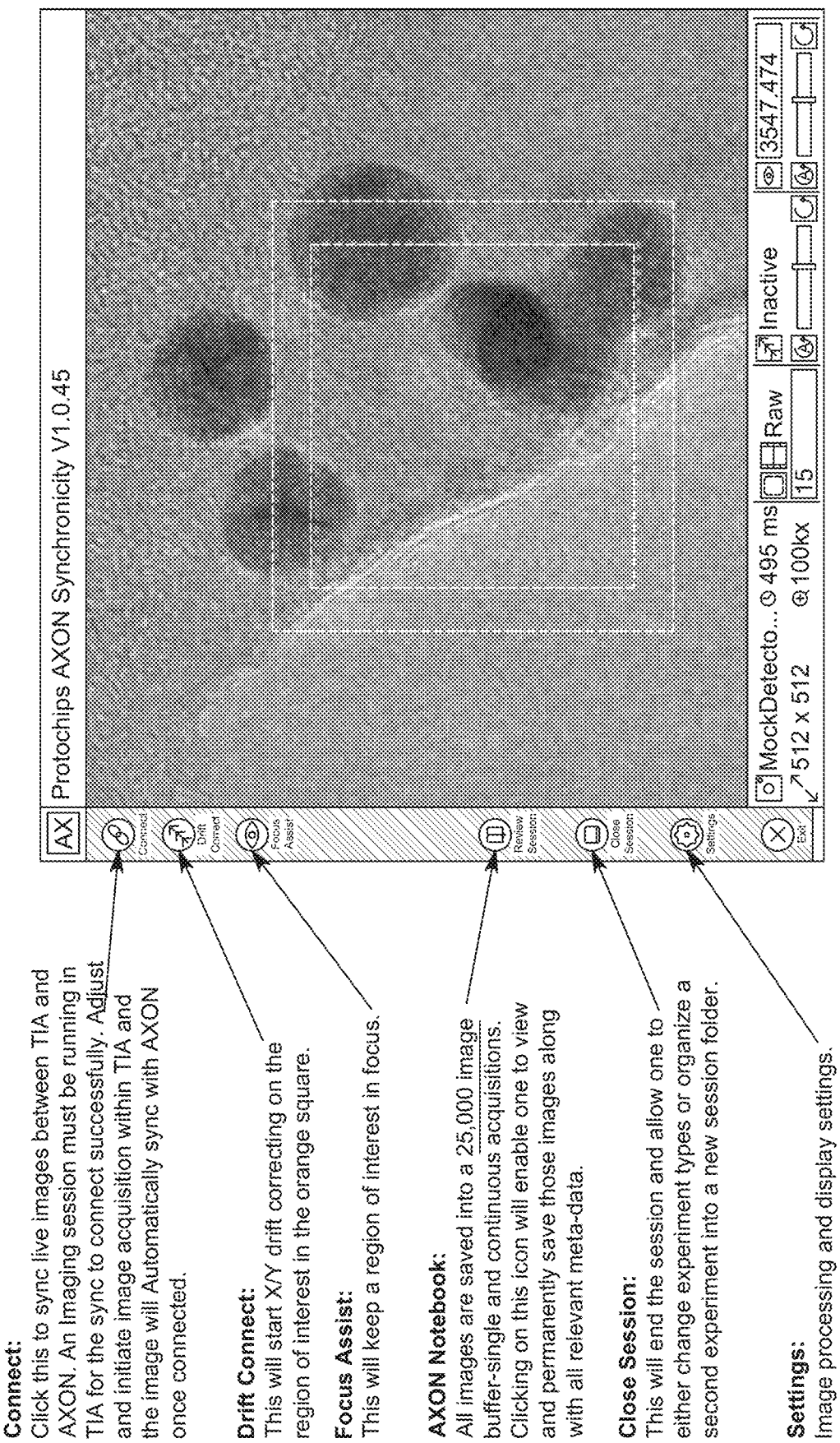
FIGS. 93A and 93B are a graphical representation of a user interface enabling key workflow functions, according to one or more embodiments of the presently disclosed subject matter.
Figure 93B:
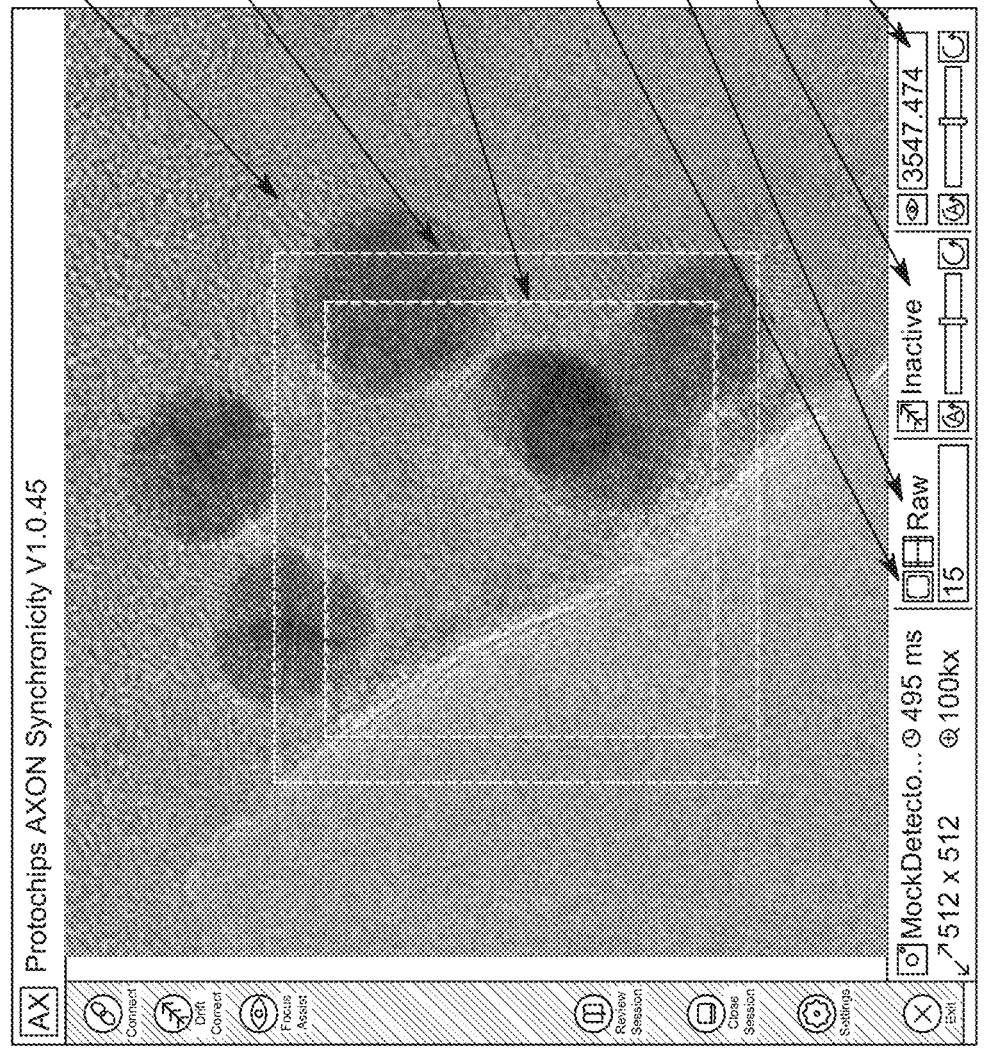

FIG. 93 is a graphical representation of a user interface enabling key workflow functions such as connect, drift correct, focus assist, review session, close session, settings and exit. Users can interact with the live image view with key indicators and controls easily viewable through the experiment.

Figure 94B:
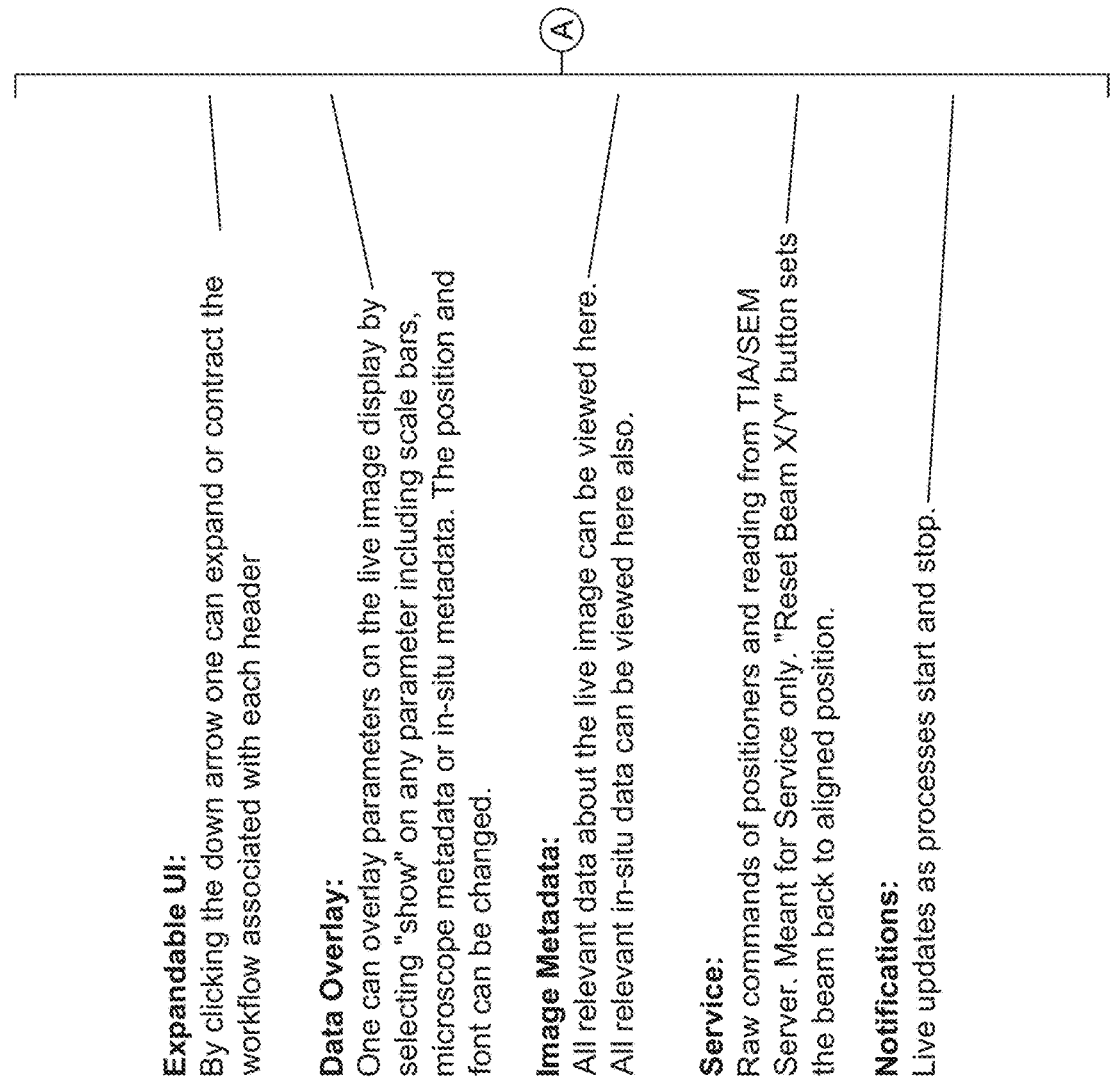
Figure 94C:
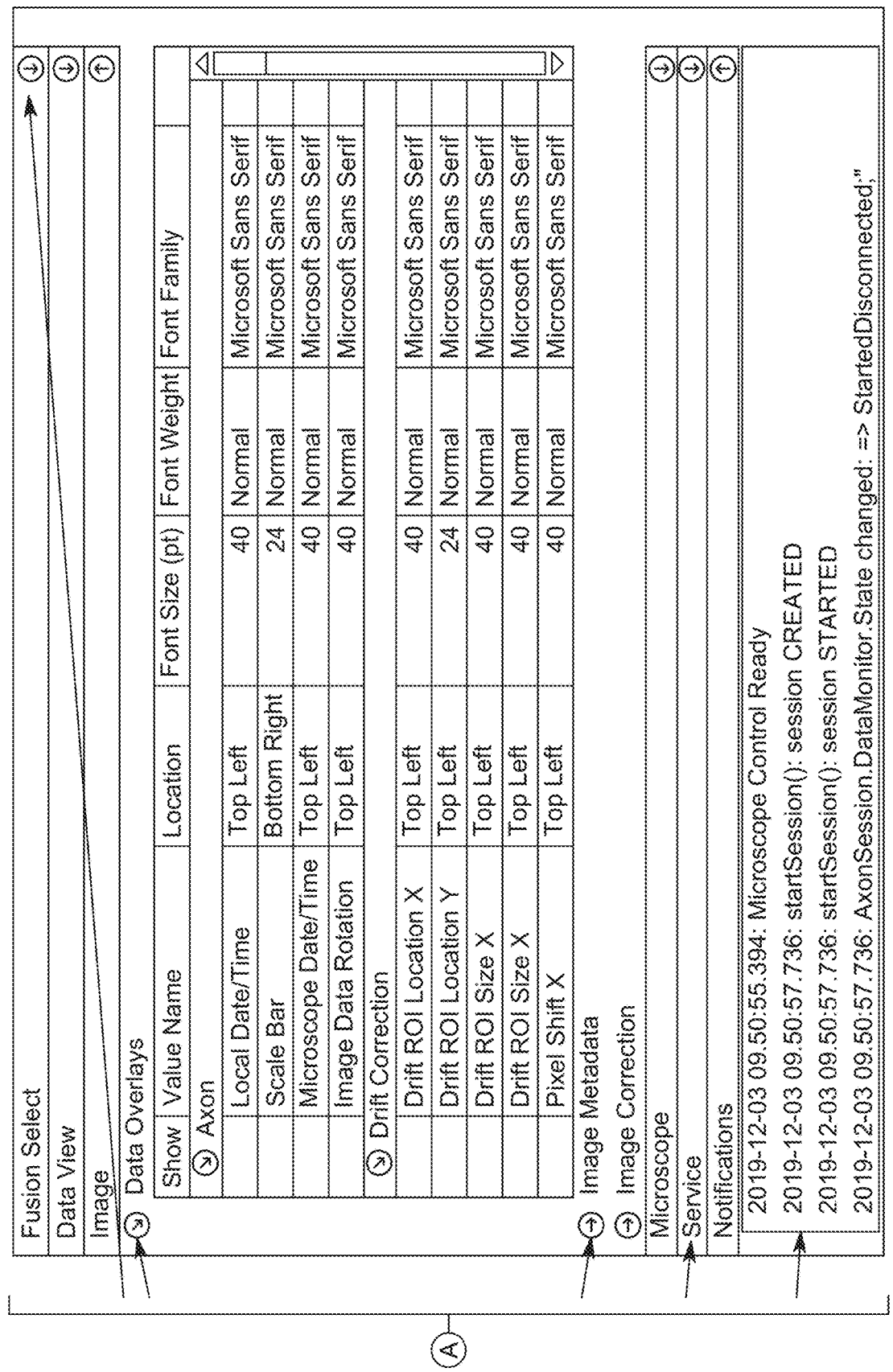
Figure 94D:

FIG. 94 is a graphical representation of a user interface comprised of indicators and triggers that enhance the correction experience. Additional user interface options can manipulate or overlay data on the live image to customize the experience.

Figure 95B:
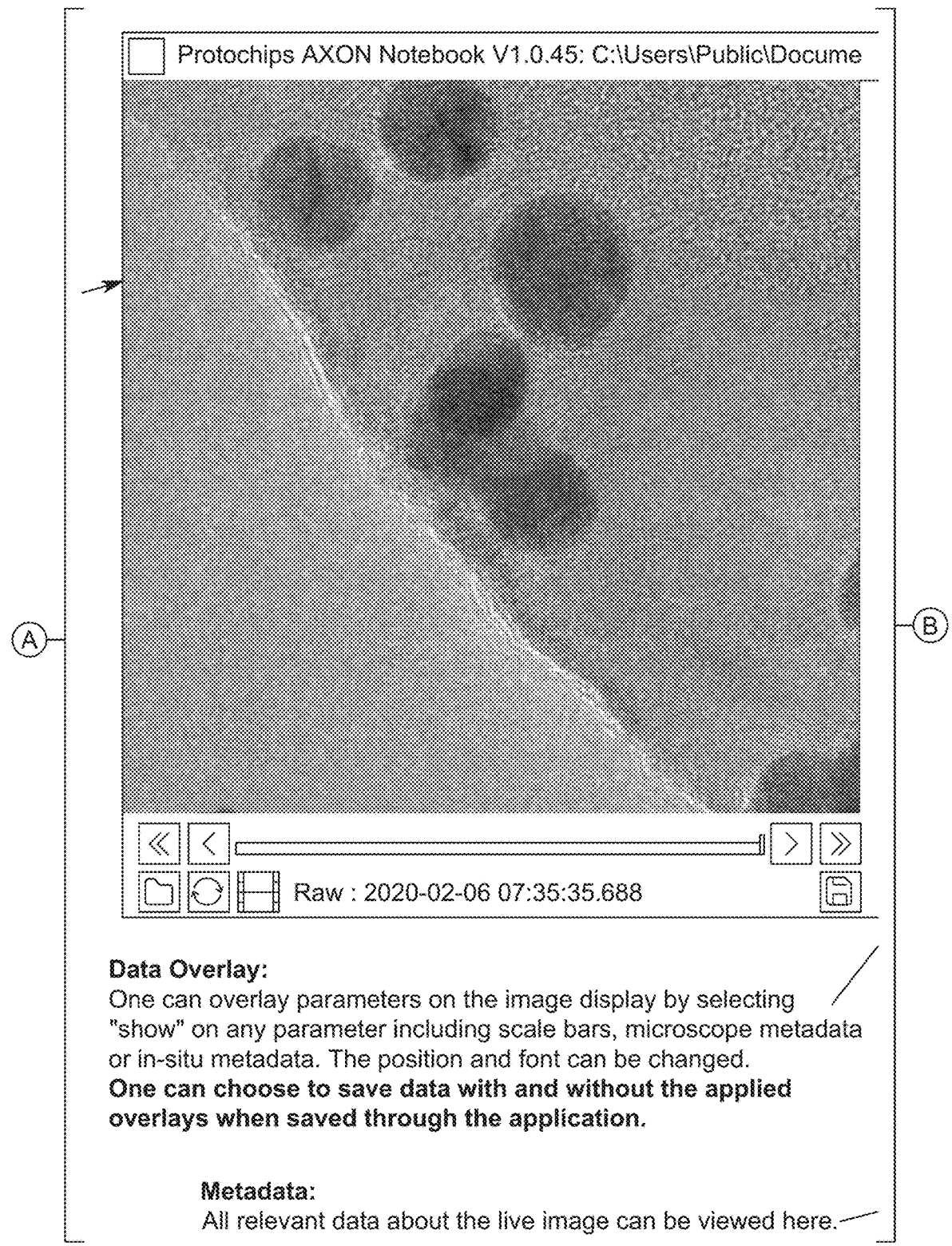
Figure 95C:
Figure 95D:
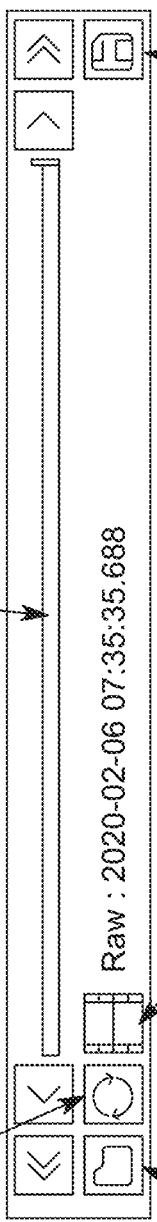

FIG. 95 is a graphical representation of a user interface for a session review tool where users can view images and metadata. Sessions could be moved to permanent storage in many file formats such as image stacks, single frames, videos, or databases from this tool.

Figure 96:
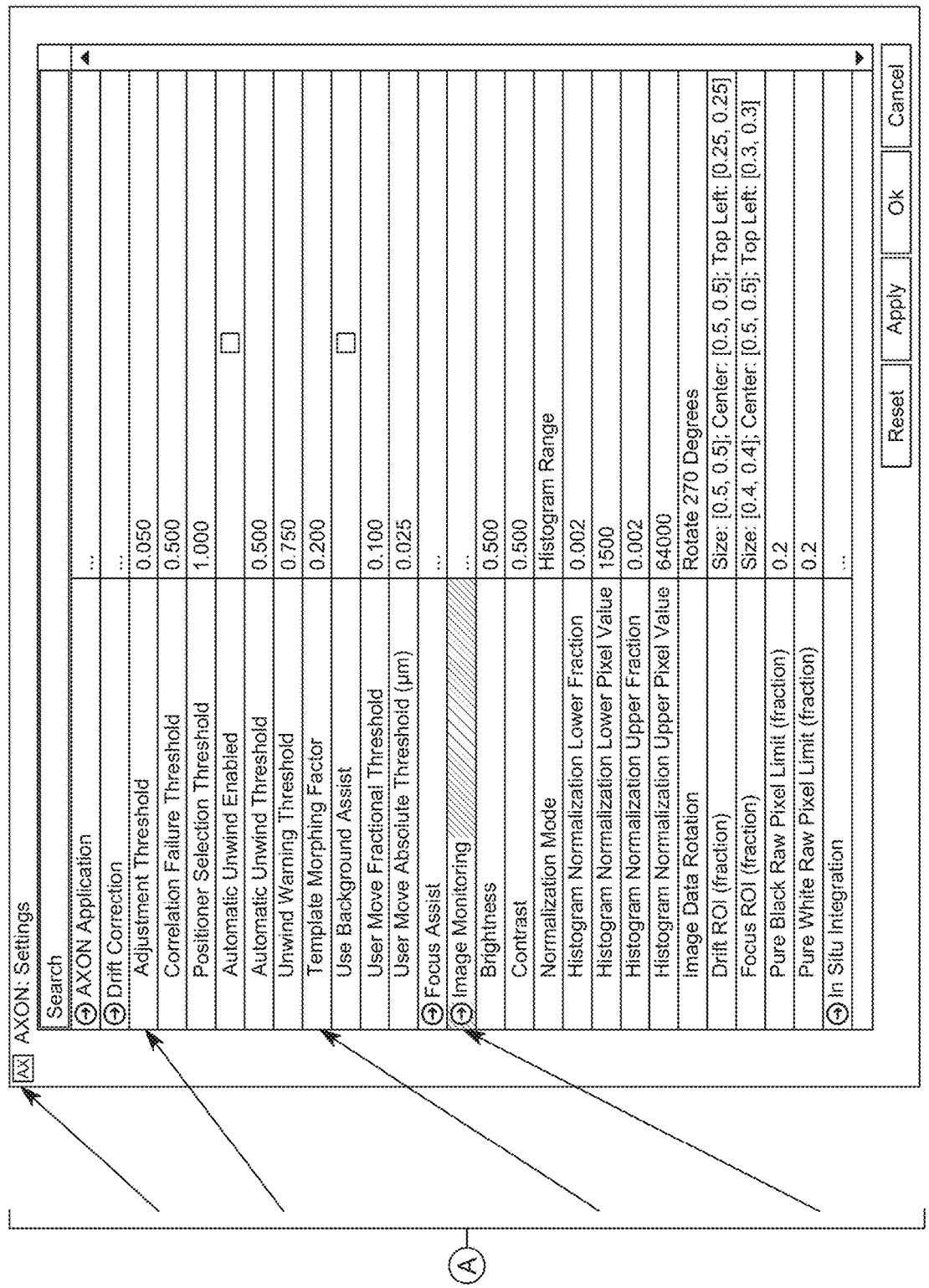
FIG. 96 is a graphical representation of user settings that can be manipulated to customize the experience, according to one or more embodiments of the presently disclosed subject matter.
Figure 97:
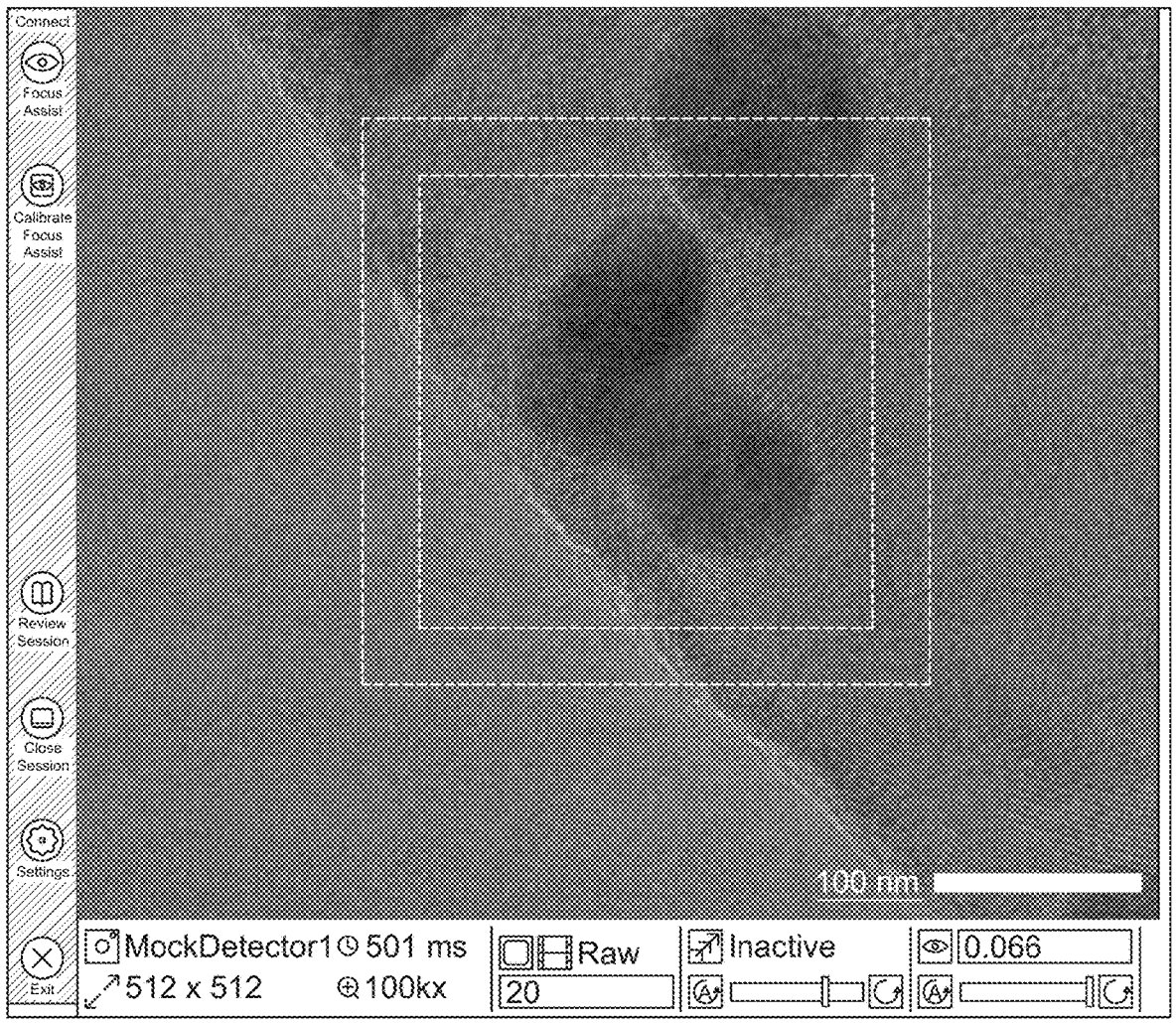
FIG. 97 is a graphical representation of a user interface where focus assist and focus assist calibrations can be enabled while viewing the live image, according to one or more embodiments of the presently disclosed subject matter.
Figure 98A:
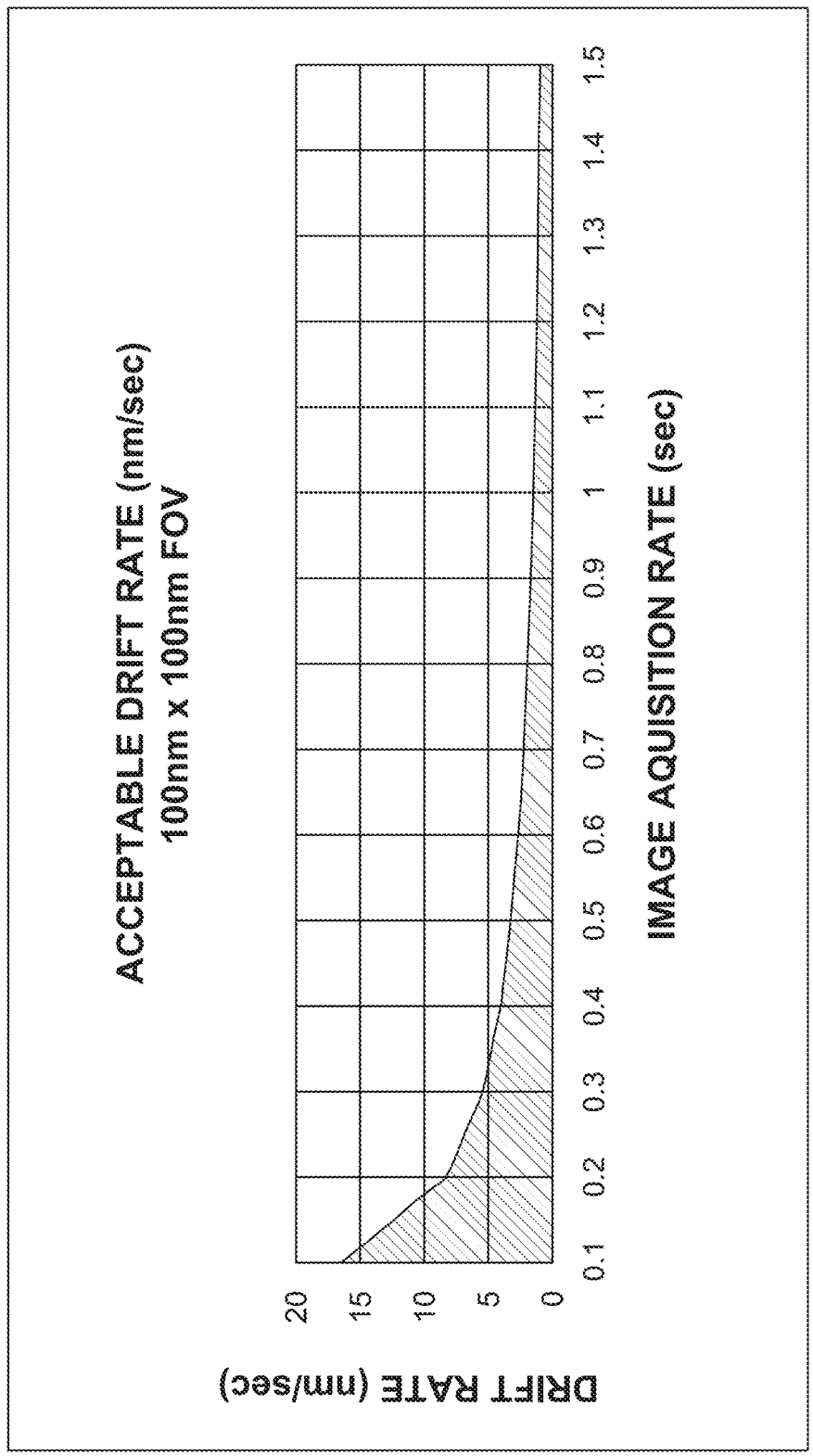
FIGS. 98A, 98B, and 98C are a graphical representation of how the control software module or associated documentation could communicate the relationship between image acquisition rate and field of view as a function of acceptable drift rate, according to one or more embodiments of the presently disclosed subject matter.
Figure 98B:
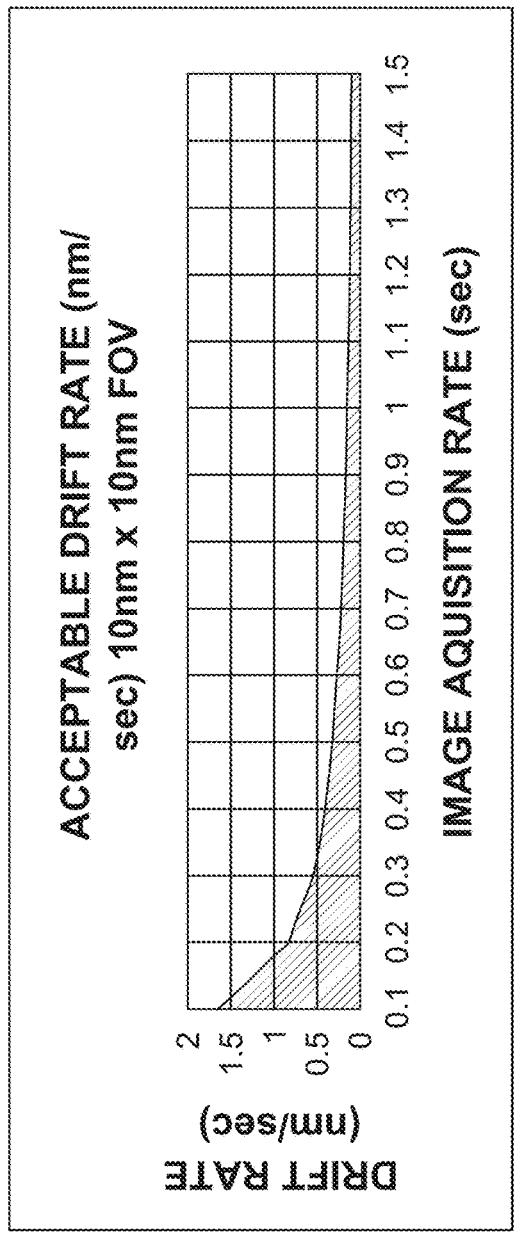
Figure 98C:
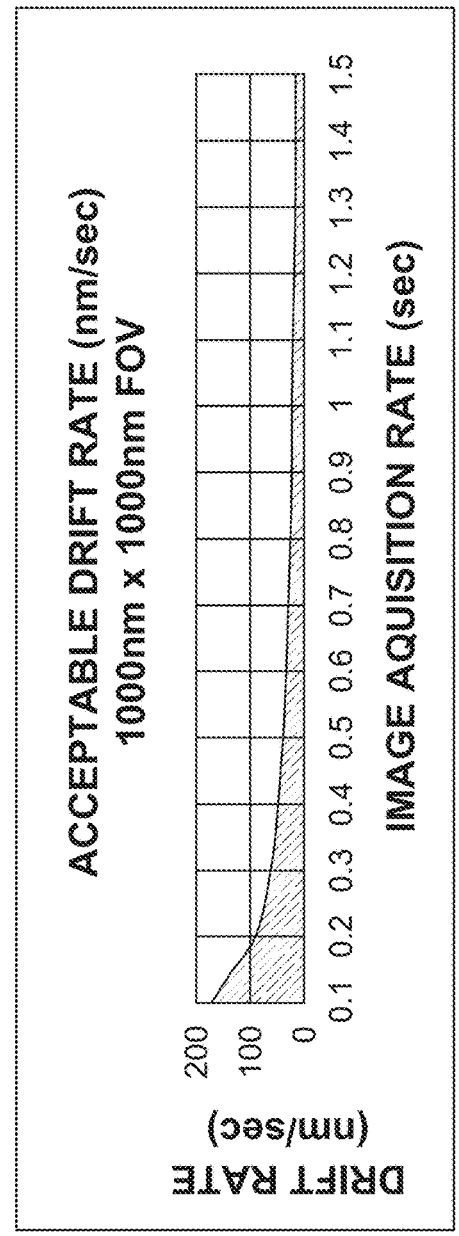

FIG. 96 is a graphical representation of user settings that can be manipulated to customize the experience. FIG. 97 is a graphical representation of a user interface where focus assist and focus assist calibrations can be enabled while viewing the live image. FIG. 98 is a graphical representation of how the control software or associated documentation could communicate the relationship between image acquisition rate and field of view as a function of acceptable drift rate.

Figure 99A:
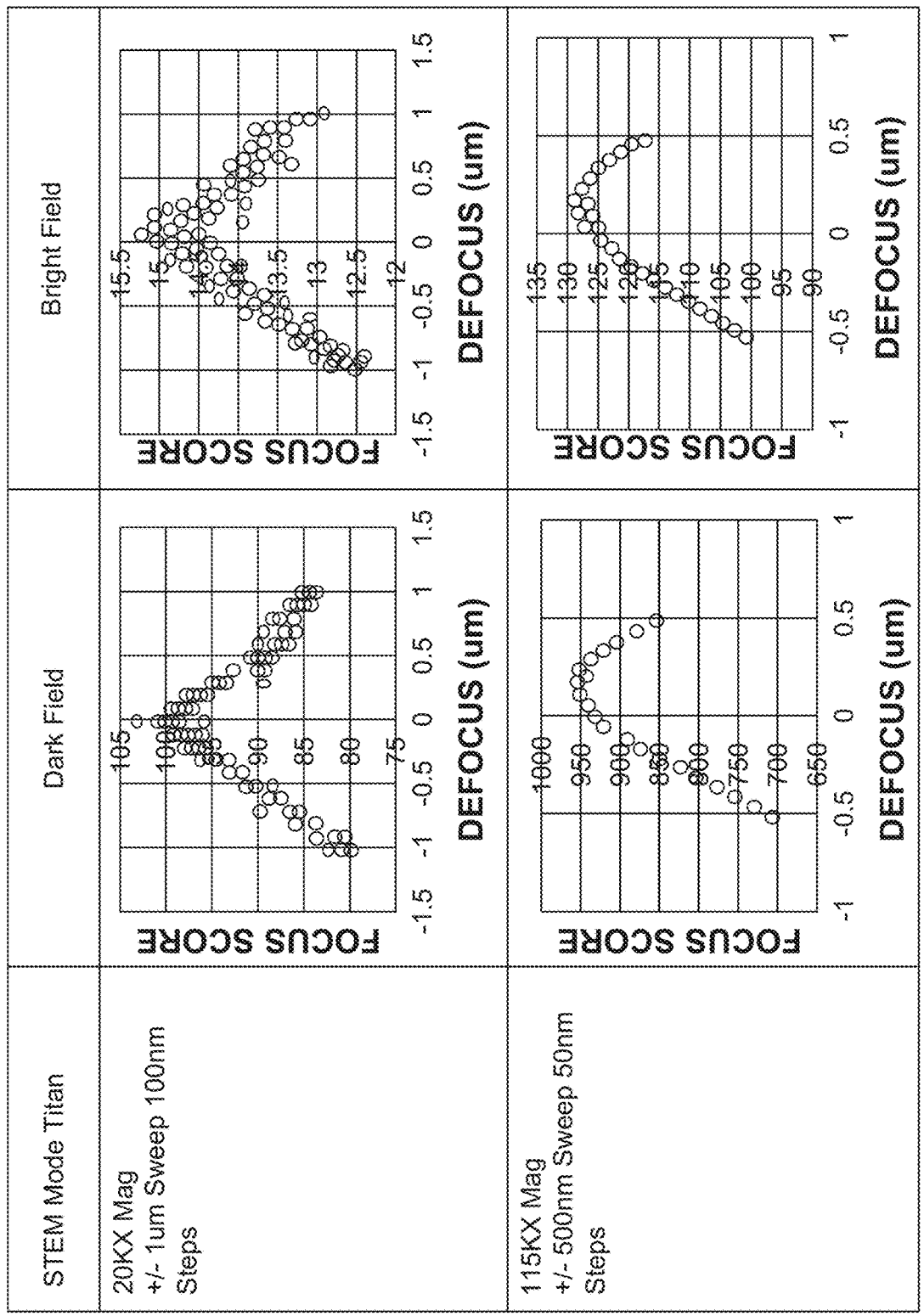
FIGS. 99A and 99B are a graphical representation of how a focus algorithm can utilize the focus quality score in STEM mode to drive toward an apex through adjustment of defocus, according to one or more embodiments of the presently disclosed subject matter.
Figure 99B:
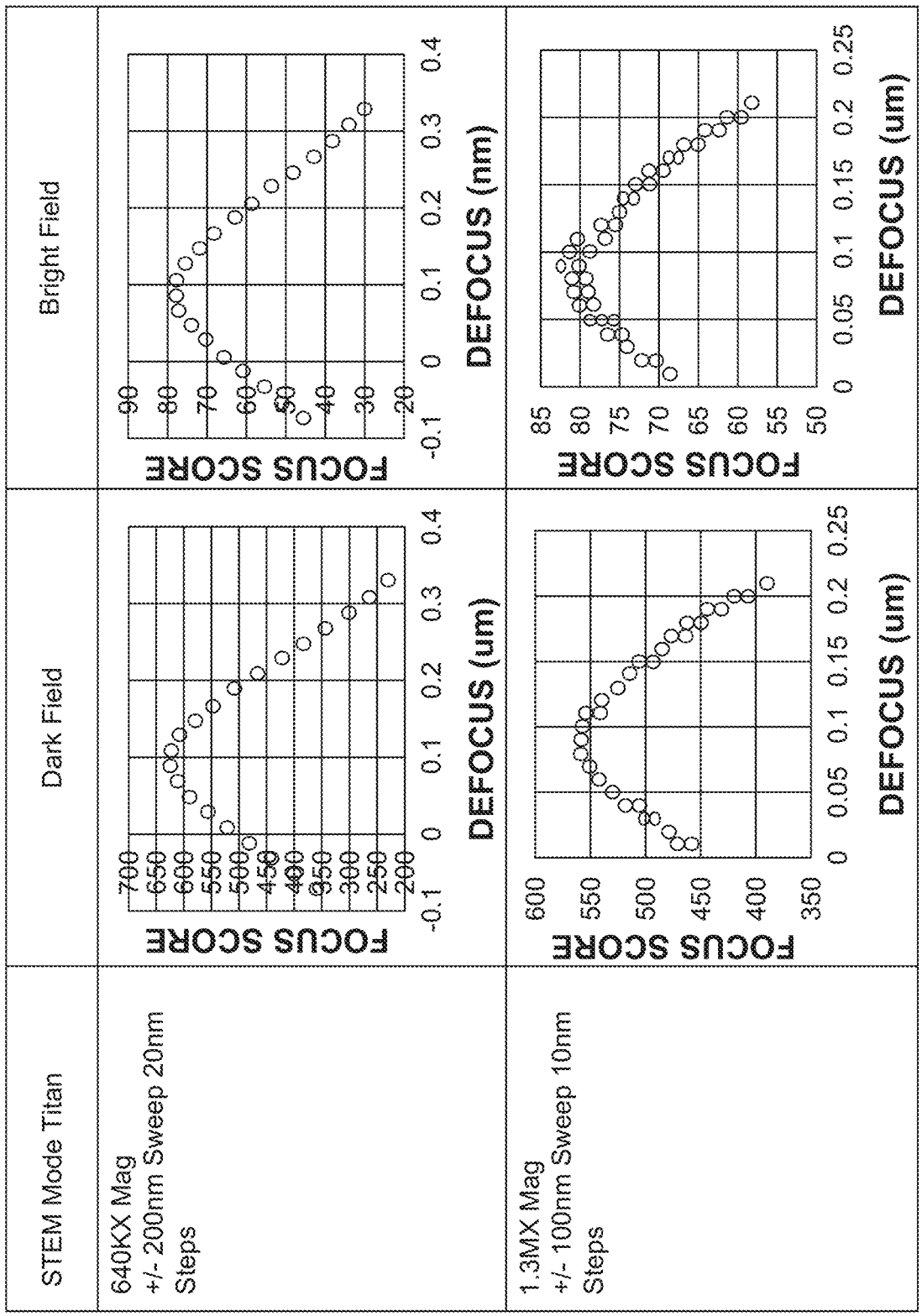

FIG. 99 is a graphical representation of how a focus algorithm can utilize the focus quality score in STEM mode to drive toward an apex through adjustment of defocus. Focus quality is determined by scoring the contrast of the region of interest. The size of steps is different depending on the imaging conditions, including the magnification among other parameters.

Figure 100A:
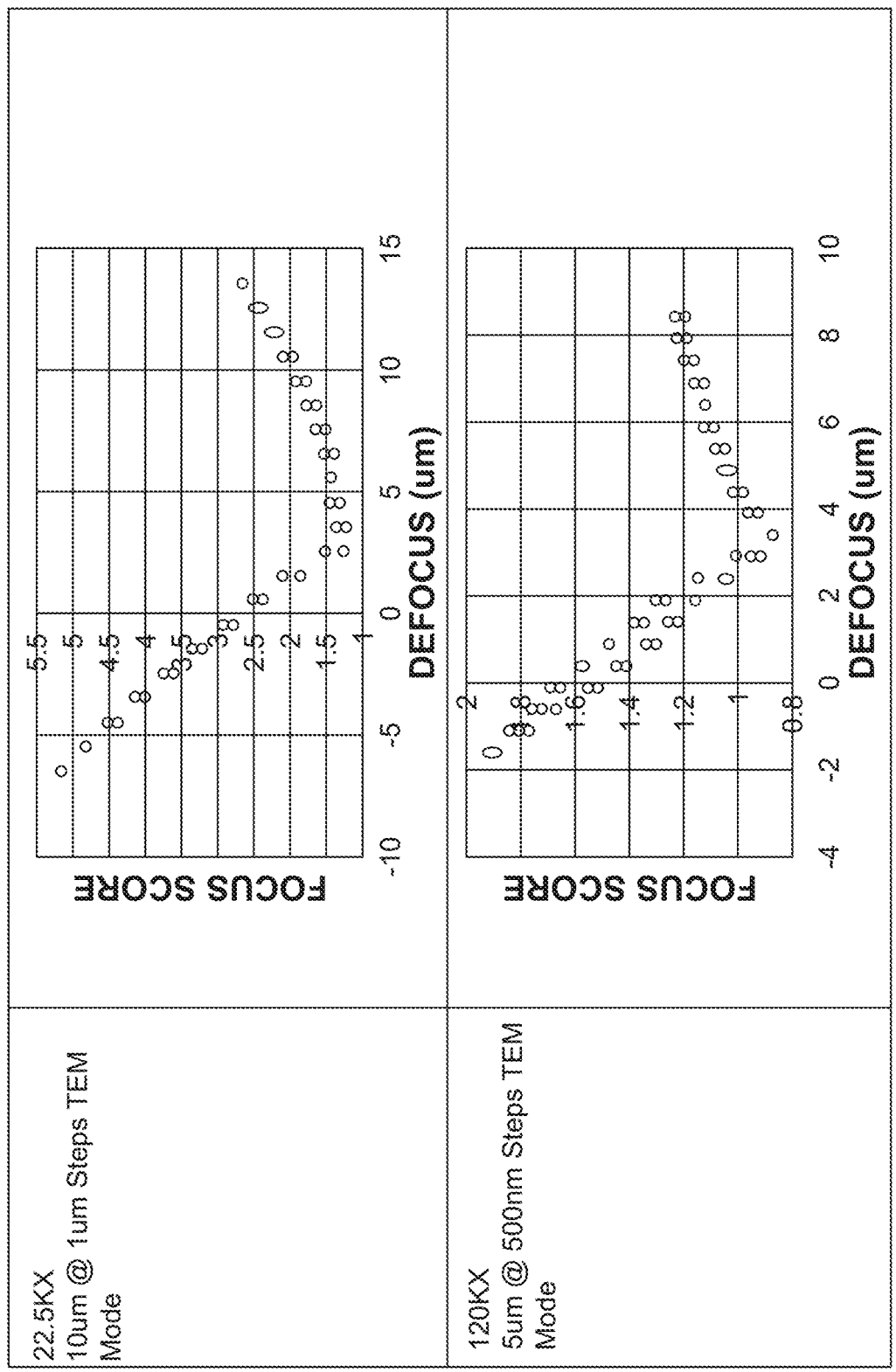
FIGS. 100A and 100B are a graphical representation of how a focus algorithm can utilize the inverse of the focus quality score in TEM mode to drive toward an apex through adjustment of defocus, according to one or more embodiments of the presently disclosed subject matter.
Figure 100B:
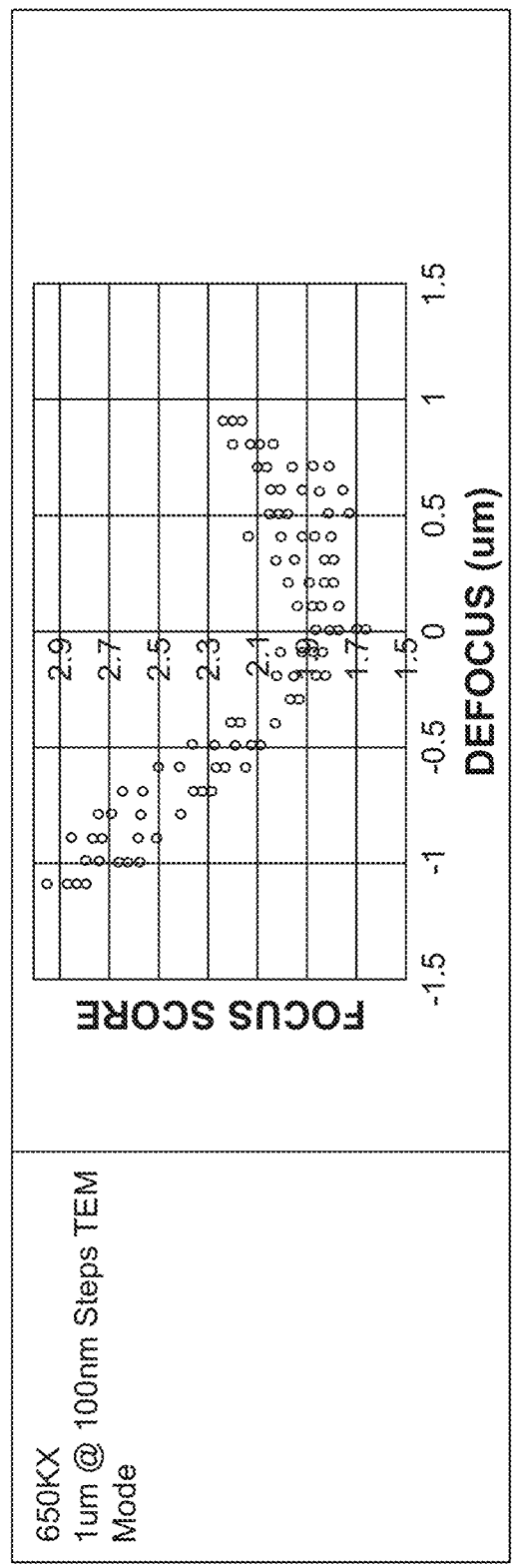

FIG. 100 is a graphical representation of how a focus algorithm can utilize the inverse of the focus quality score in TEM mode to drive toward an apex through adjustment of defocus. Focus quality is determined by scoring the contrast of the region of interest. The inverse of this scoring technique is required in TEM mode. The size of steps is different depending on the imaging conditions, including the magnification among other parameters.

Figure 101:
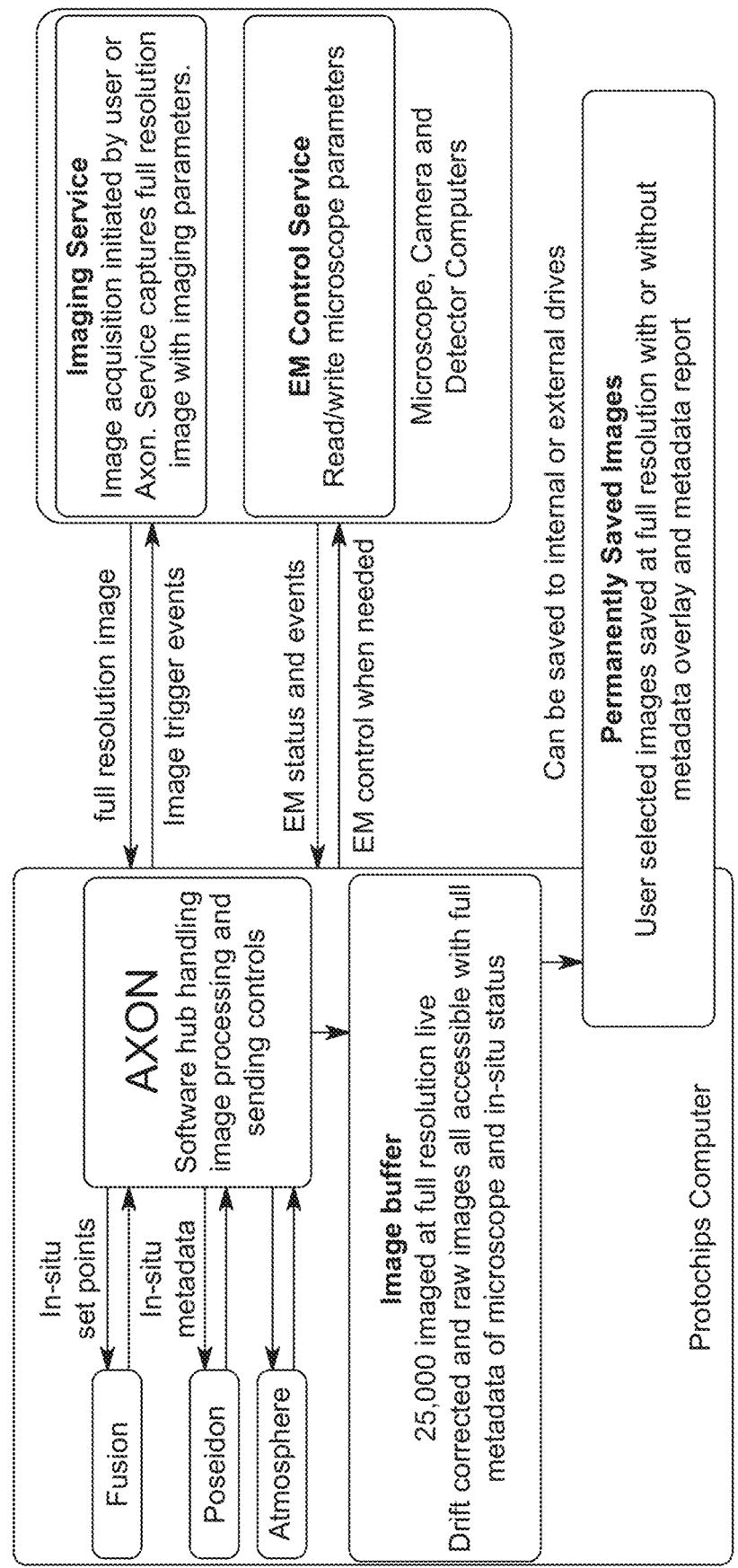
FIG. 101 is a graphical representation of the overall data flow for a control service interacting with various components of the system, according to one or more embodiments of the presently disclosed subject matter.
Figure 102A:
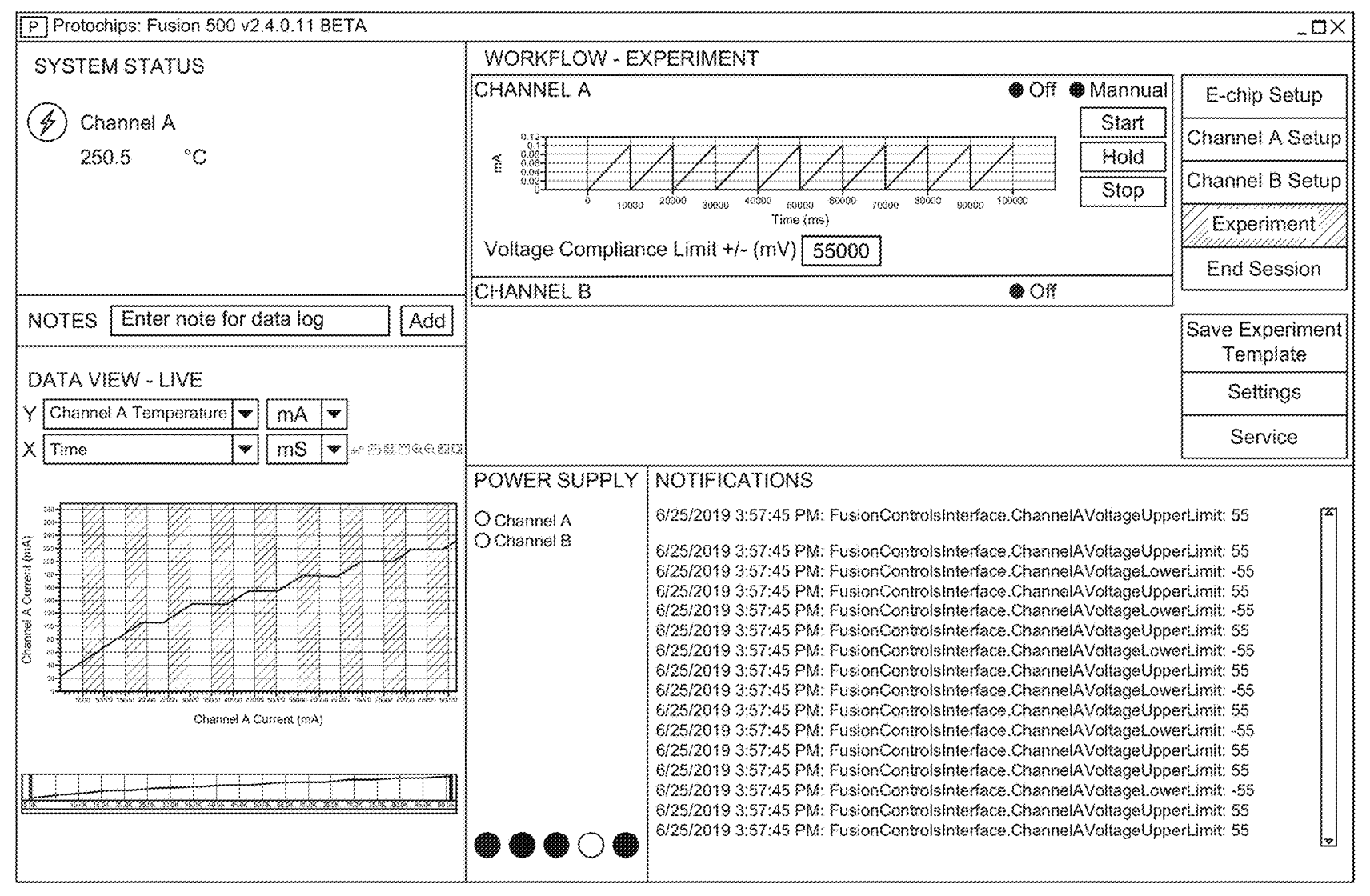
Figure 102B:
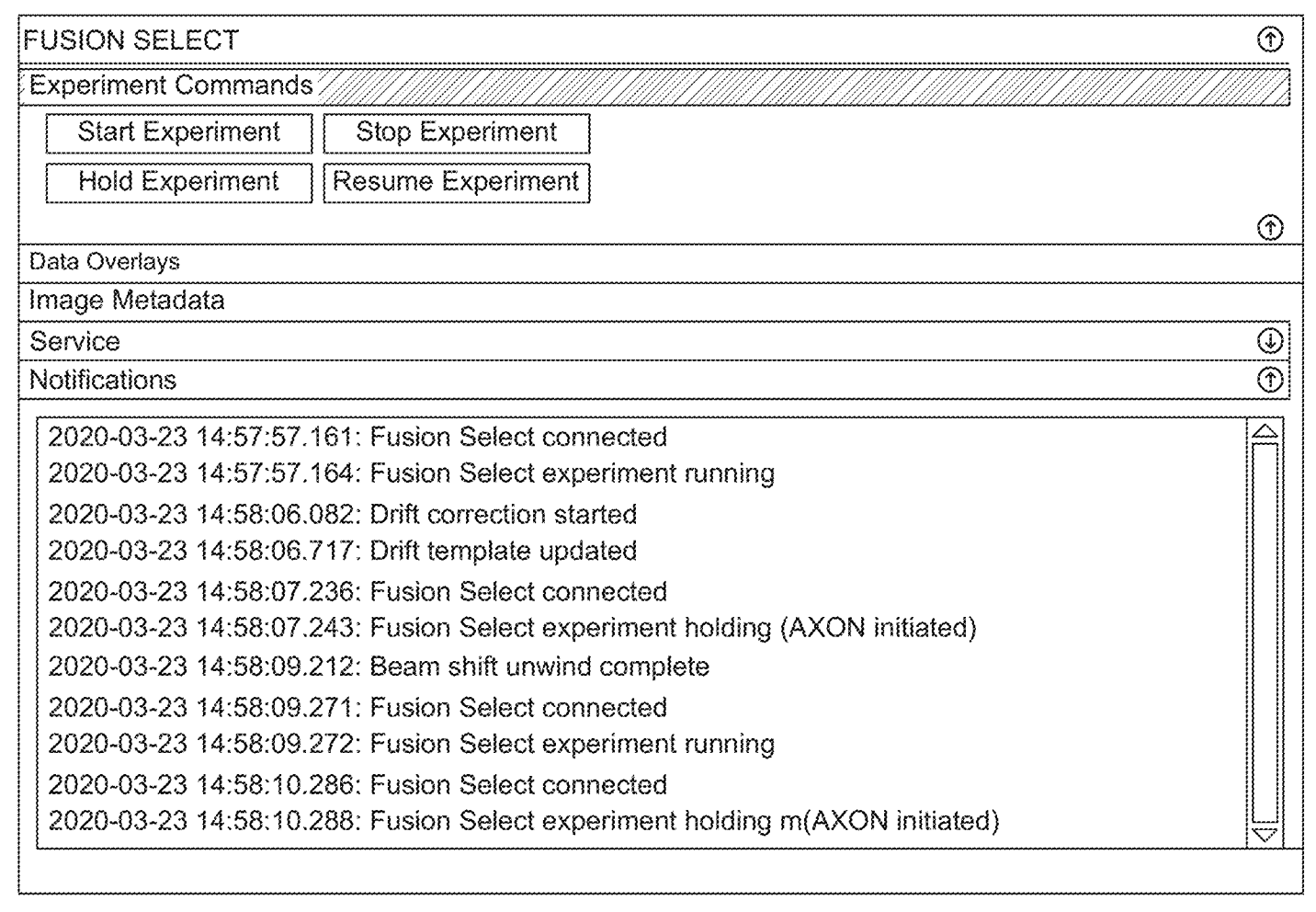
Figure 103A:
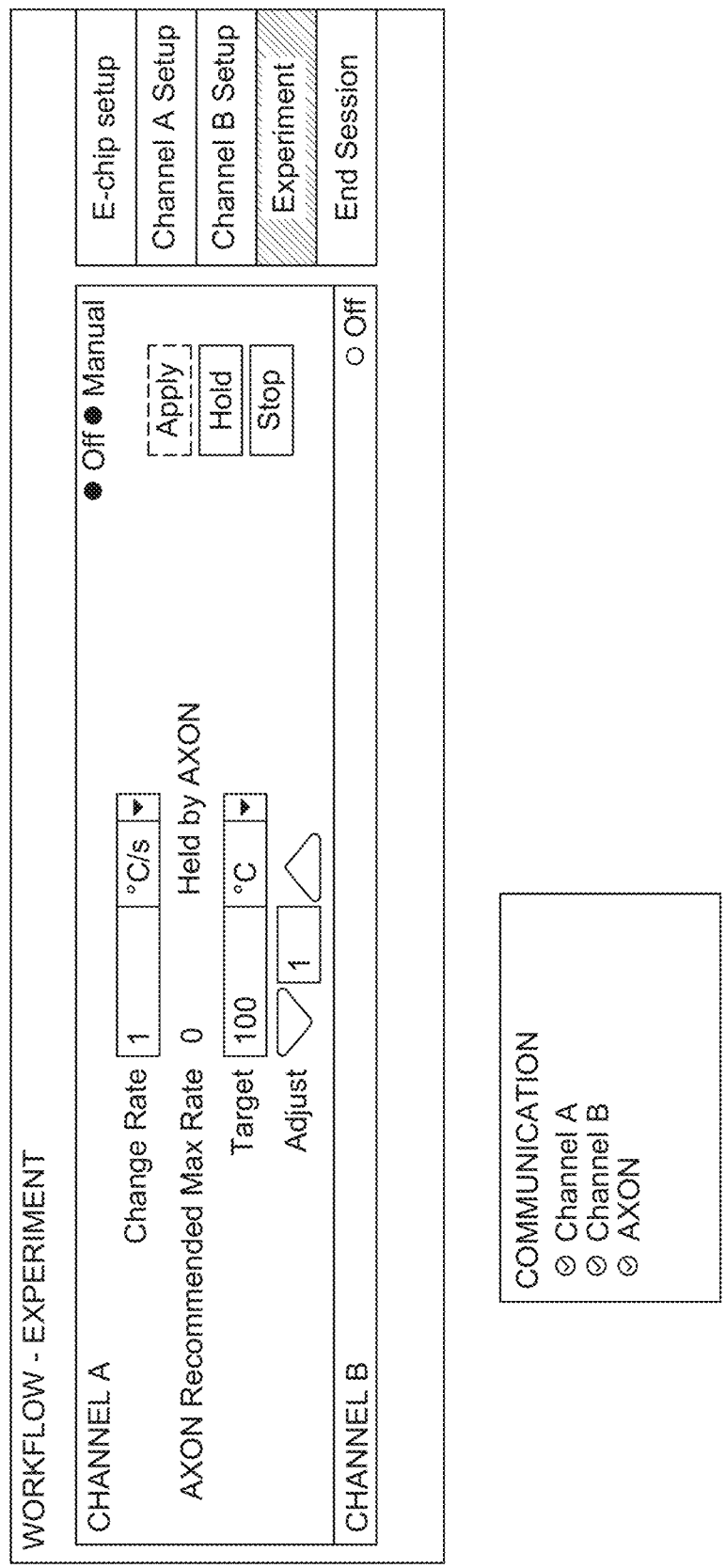
FIGS. 103A and 103B a graphical representation of a user interface where the control software module recommends ramp rates and communicates automated pauses/resumes and connection status within an in-situ software module and a control software module, according to one or more embodiments of the presently disclosed subject matter.
Figure 103B:
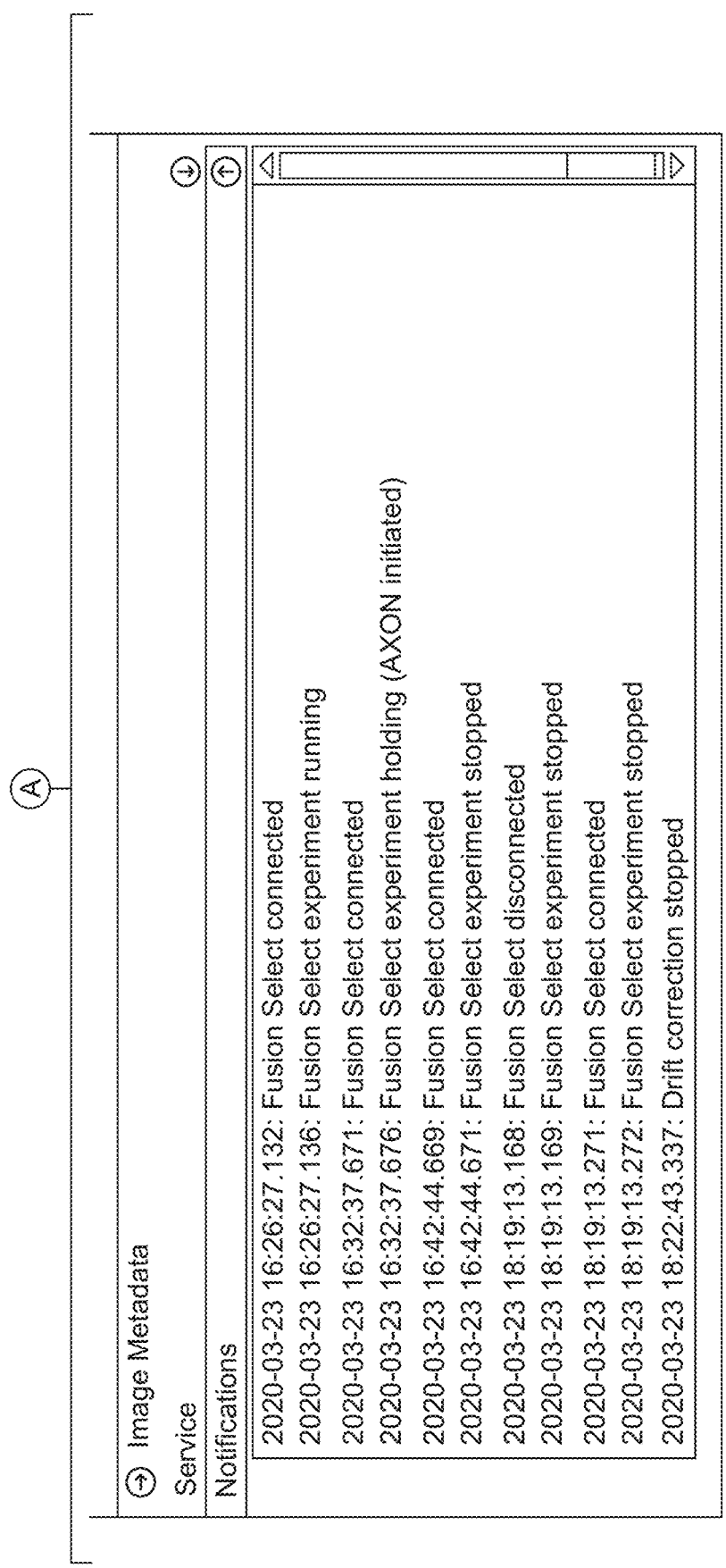

FIG. 101 is a graphical representation of the overall data flow for a control service interacting with in-situ systems, an imaging service, a microscope control service and eventually exporting images and metadata permanently to disk. FIG. 102 is a graphical representation of a user interface for prior art in-situ heating software. FIG. 103 is a graphical representation of a user interface where the control software recommends ramp rates and communicates automated pauses/resumes and connection status within the in-situ software and control software.

Figure 104A:
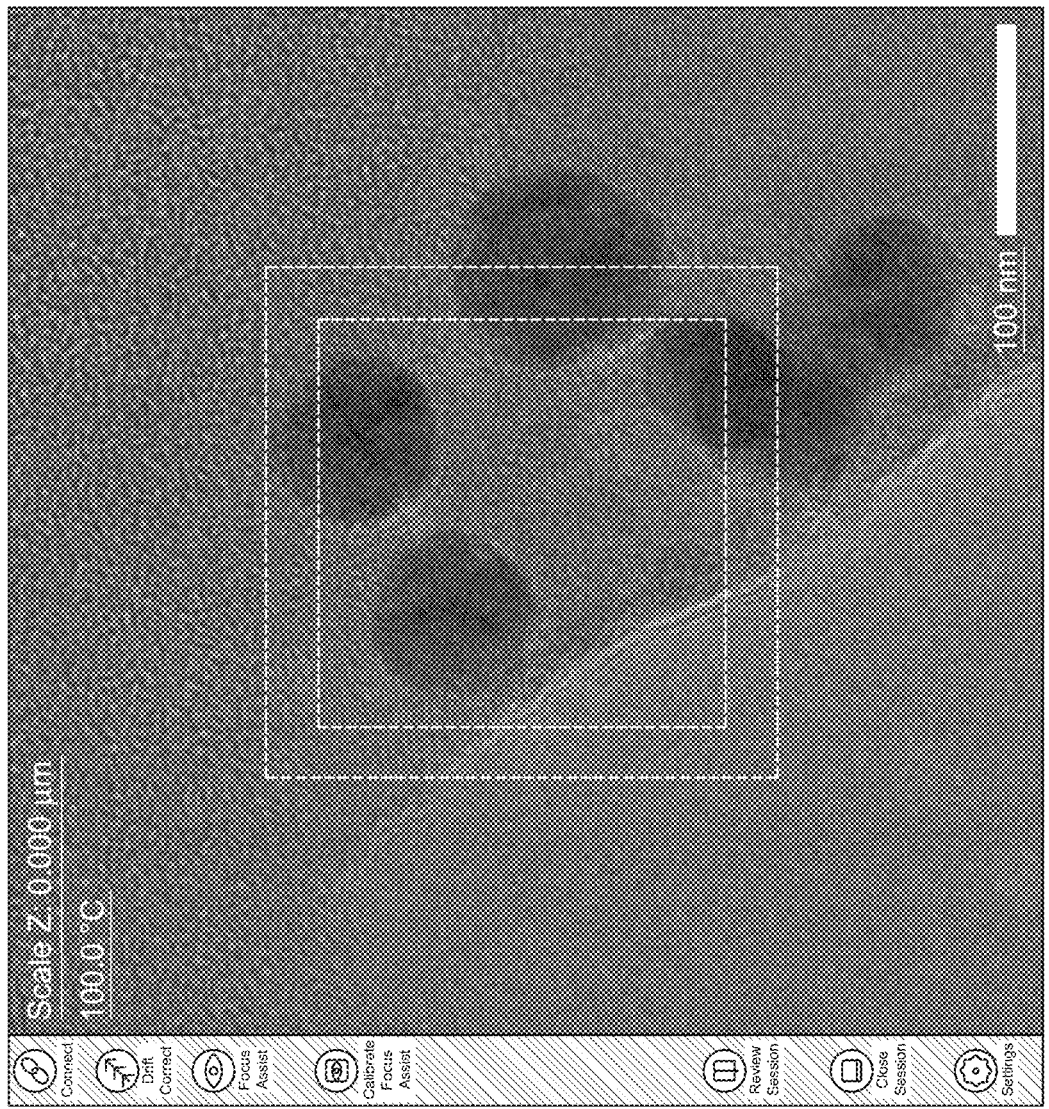
Figure 104C:
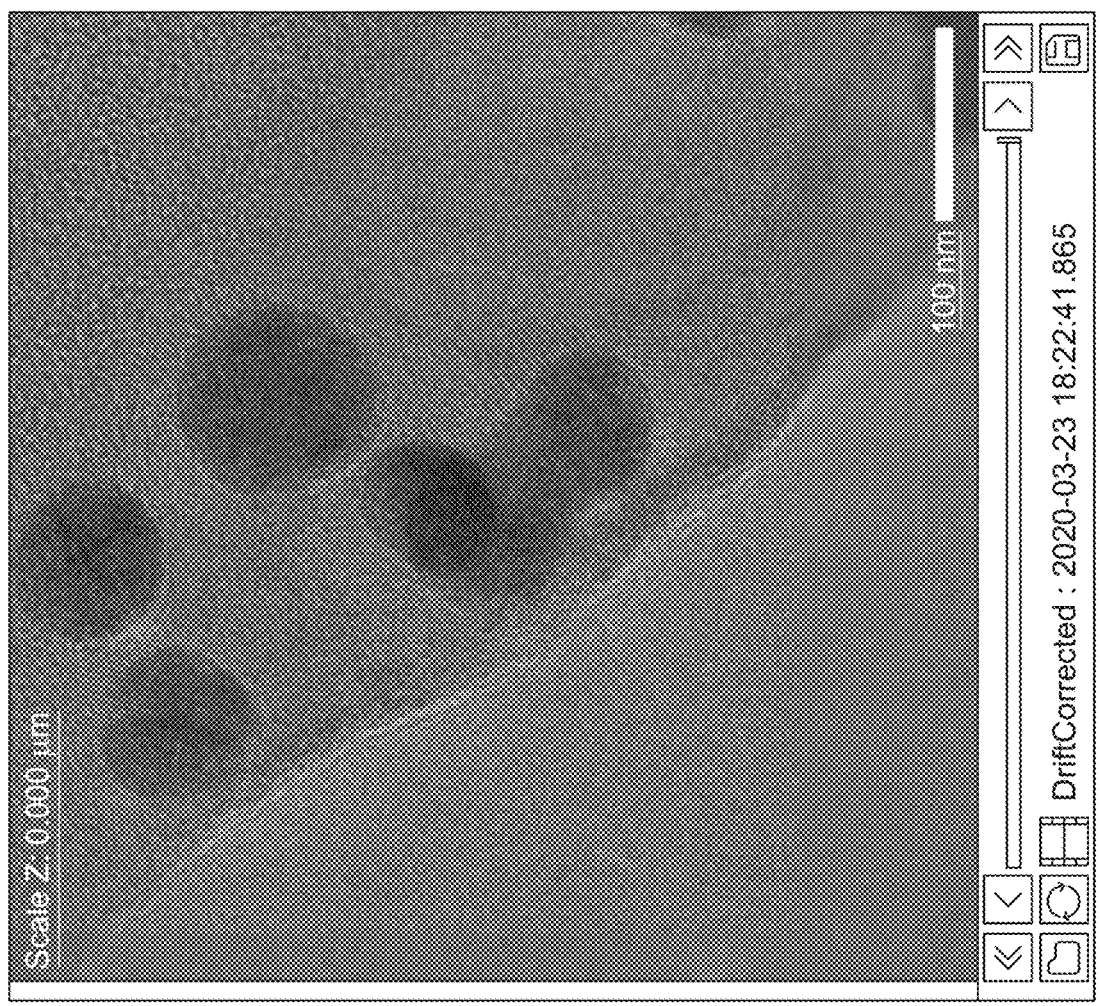

FIG. 104 is a graphical representation of a user interface where metadata from the in-situ system, microscope, imaging system and any other connected systems can be viewed and overlaid onto the live display and session or image review tool. Each image is saved with metadata that can be overplayed for users to see how parameters changed on the drift corrected sequence over time.

Figure 105A:
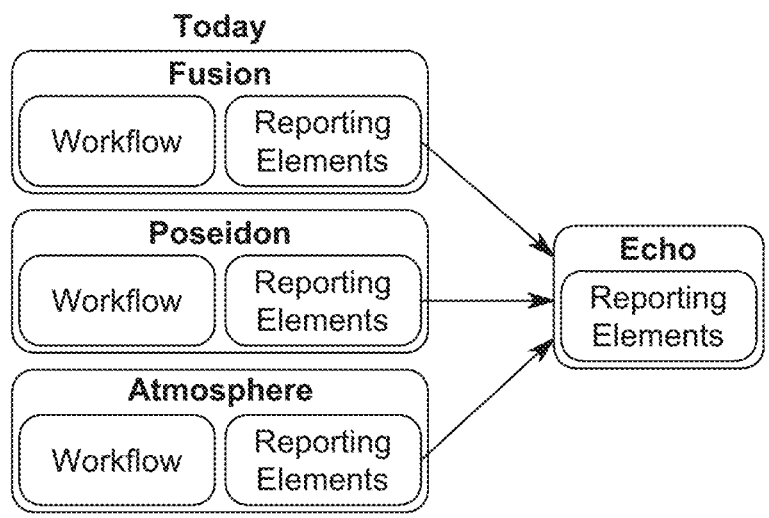
FIGS. 105A, 105B, and 105C are a graphical representation showing an example of an existing in-situ software module suite with unique workflows and reporting elements pushing data to another software module that synchronizes data; and, FIG. 105B details an example of a workflow in an existing in-situ software vs the reporting elements in that software module, according to one or more embodiments of the presently disclosed subject matter.
Figure 105B:
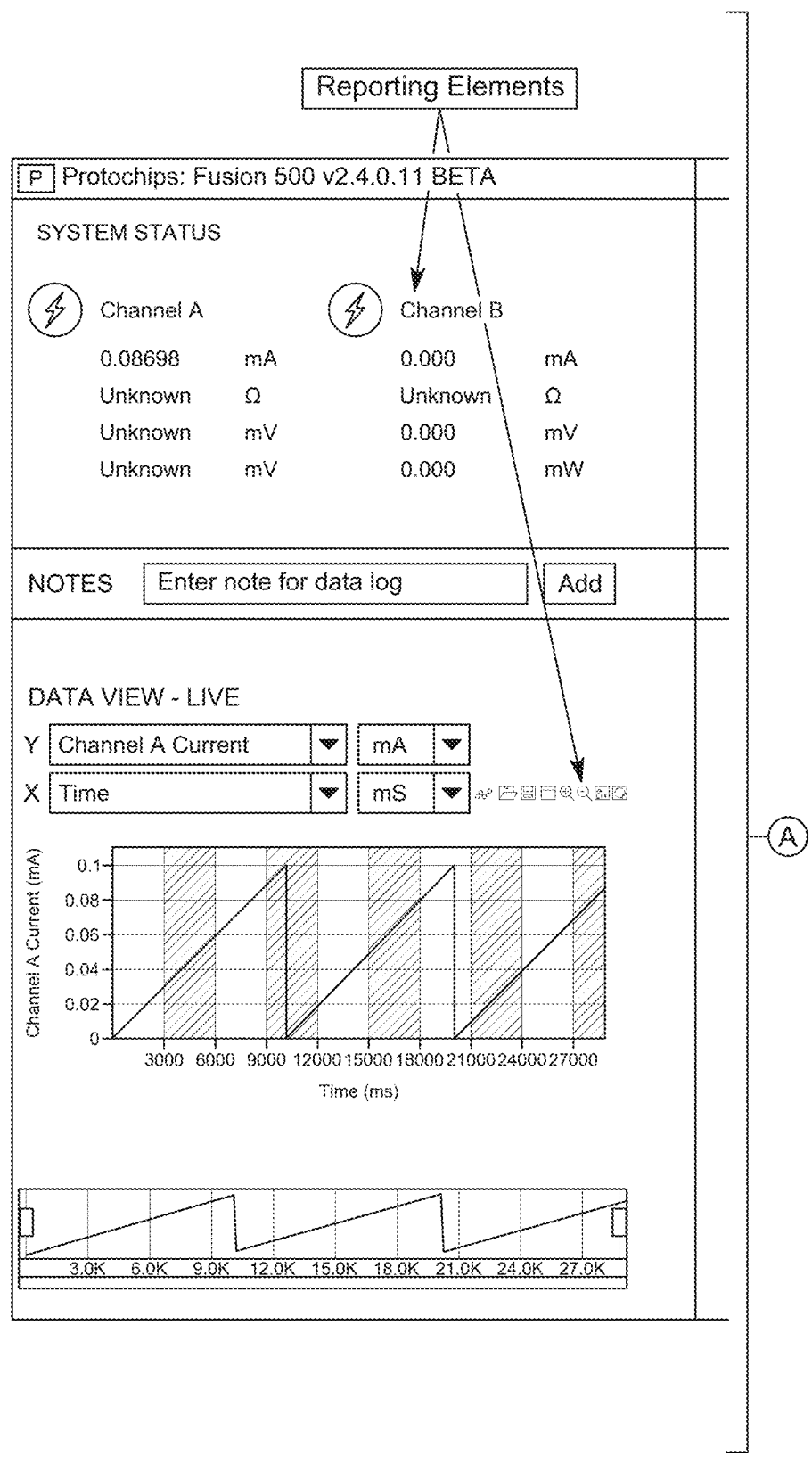
Figure 105C:
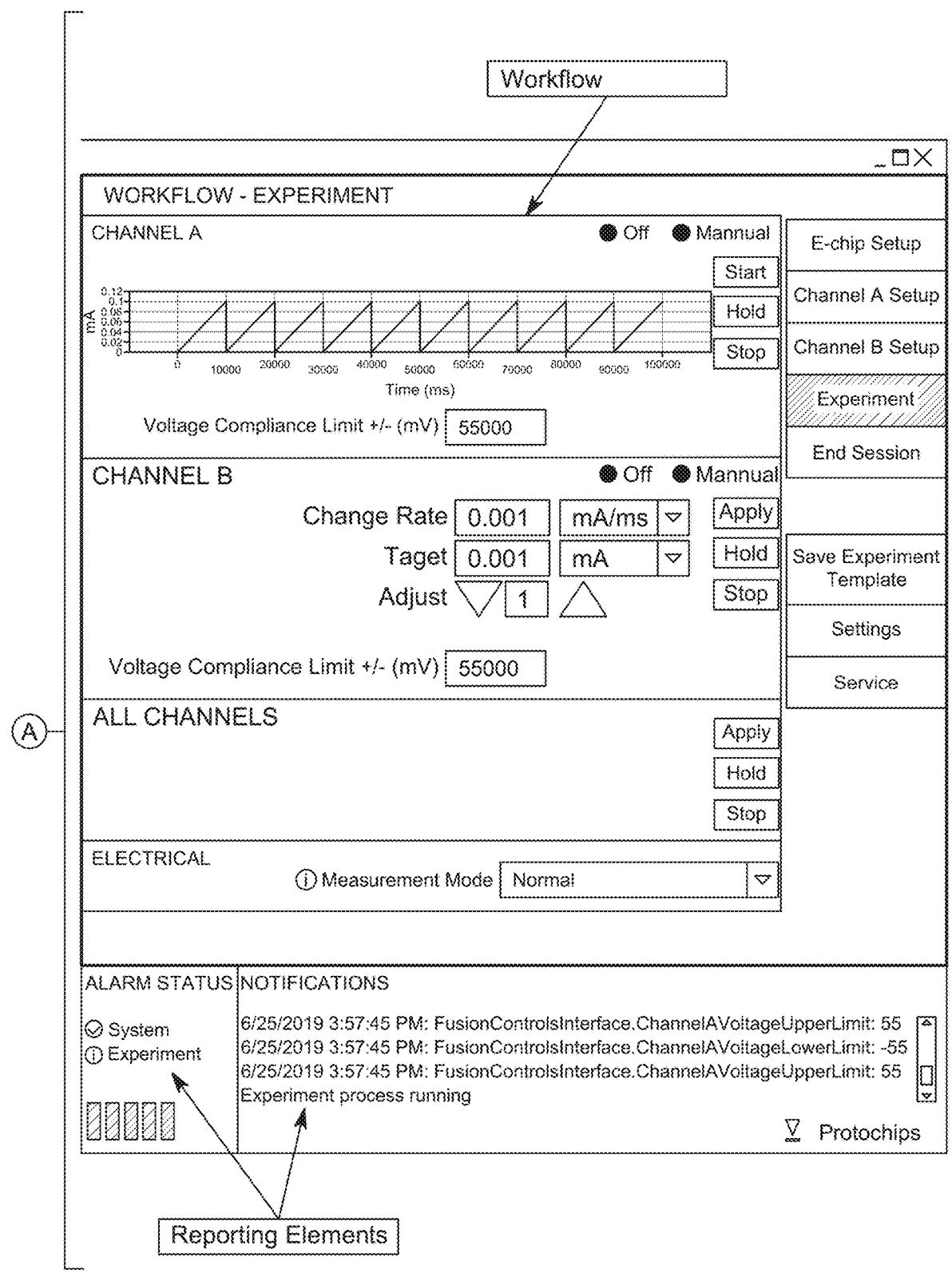

FIG. 105 is a graphical representation showing an example of an existing in-situ software suite with unique workflows and reporting elements pushing data to another software that synchronizes data FIG. 105B details an example of a workflow in an existing in-situ software vs the reporting elements in that software.

Figure 106:
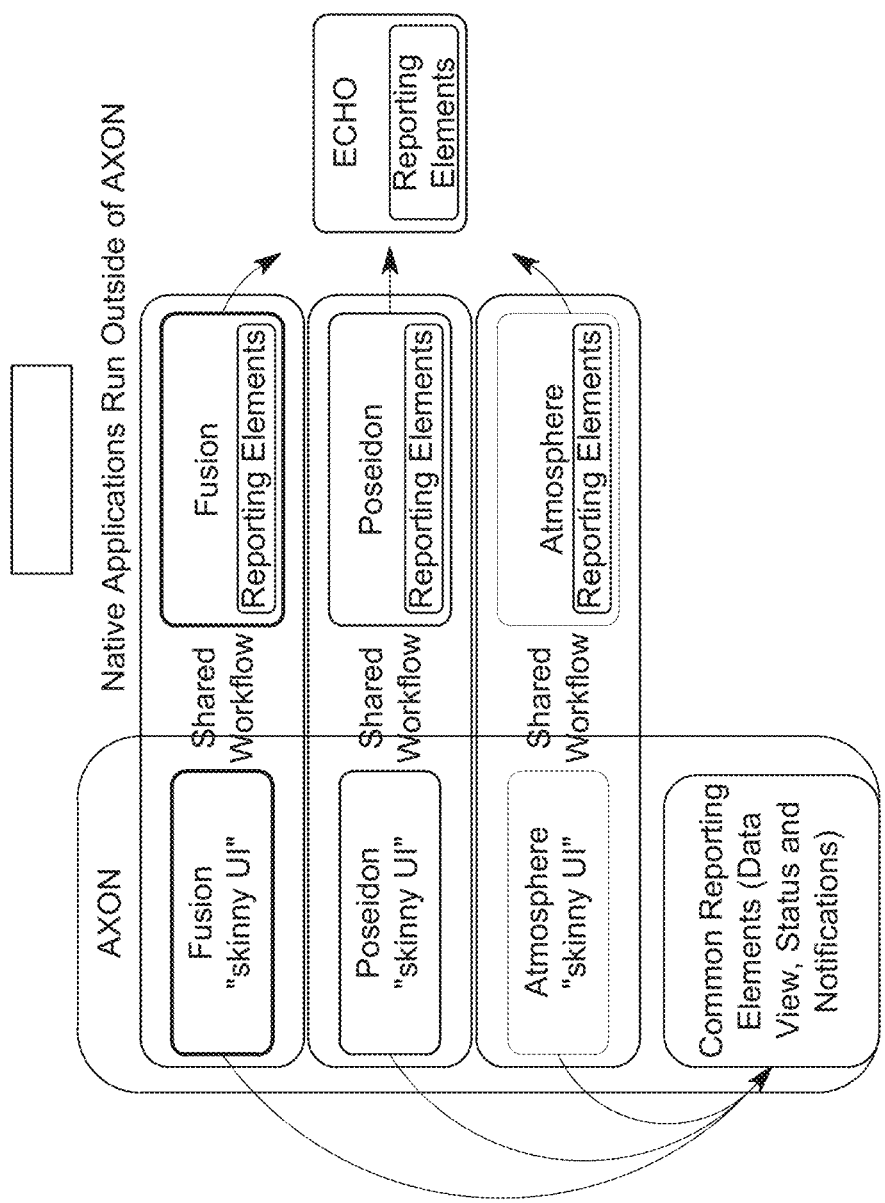
FIG. 106 is a graphical representation showing how the software module suite described in FIG. 105A could have workflows shared between the native in-situ software module and an embedded element within the control software module, according to one or more embodiments of the presently disclosed subject matter.
Figure 107A:
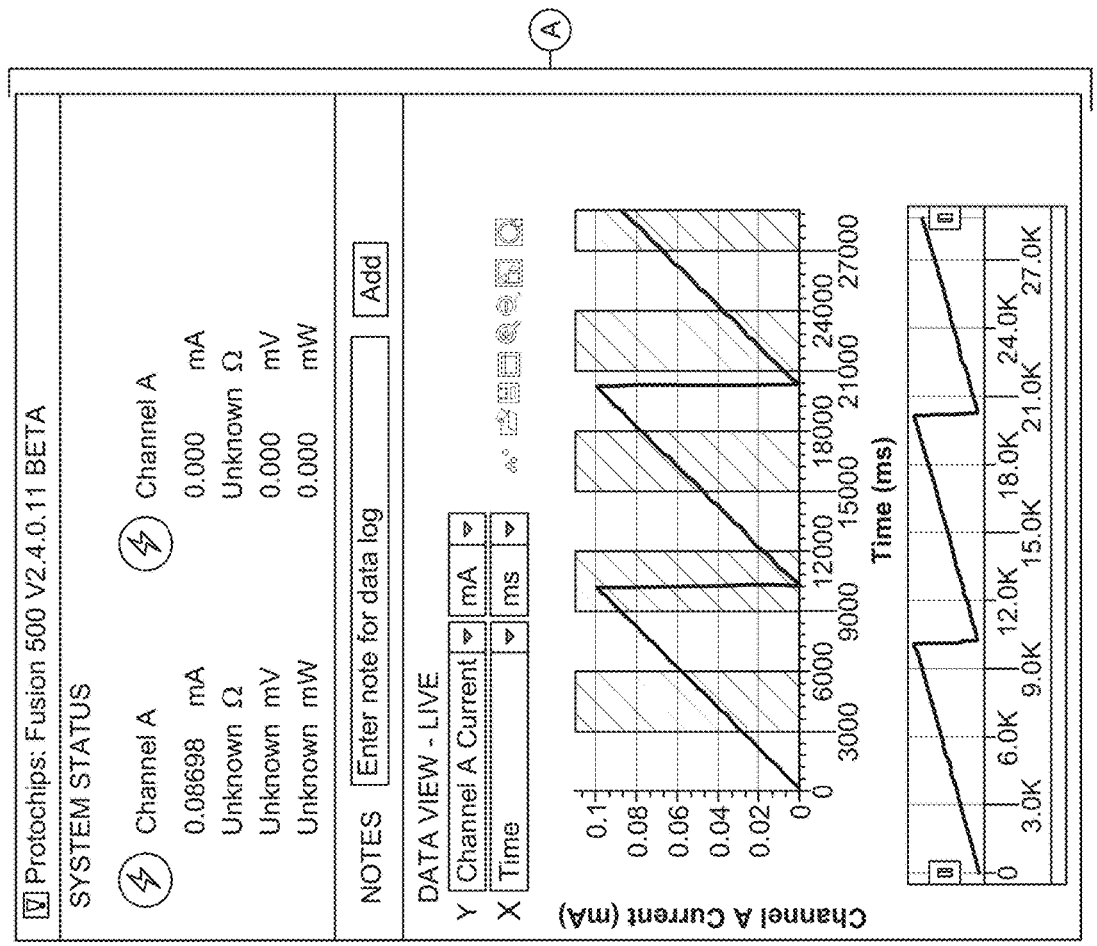
FIGS. 107A, 107B, 107C, and 107D are a graphical representation showing an example of the user interface of an existing in-situ software module, according to one or more embodiments of the presently disclosed subject matter.
Figure 107B:
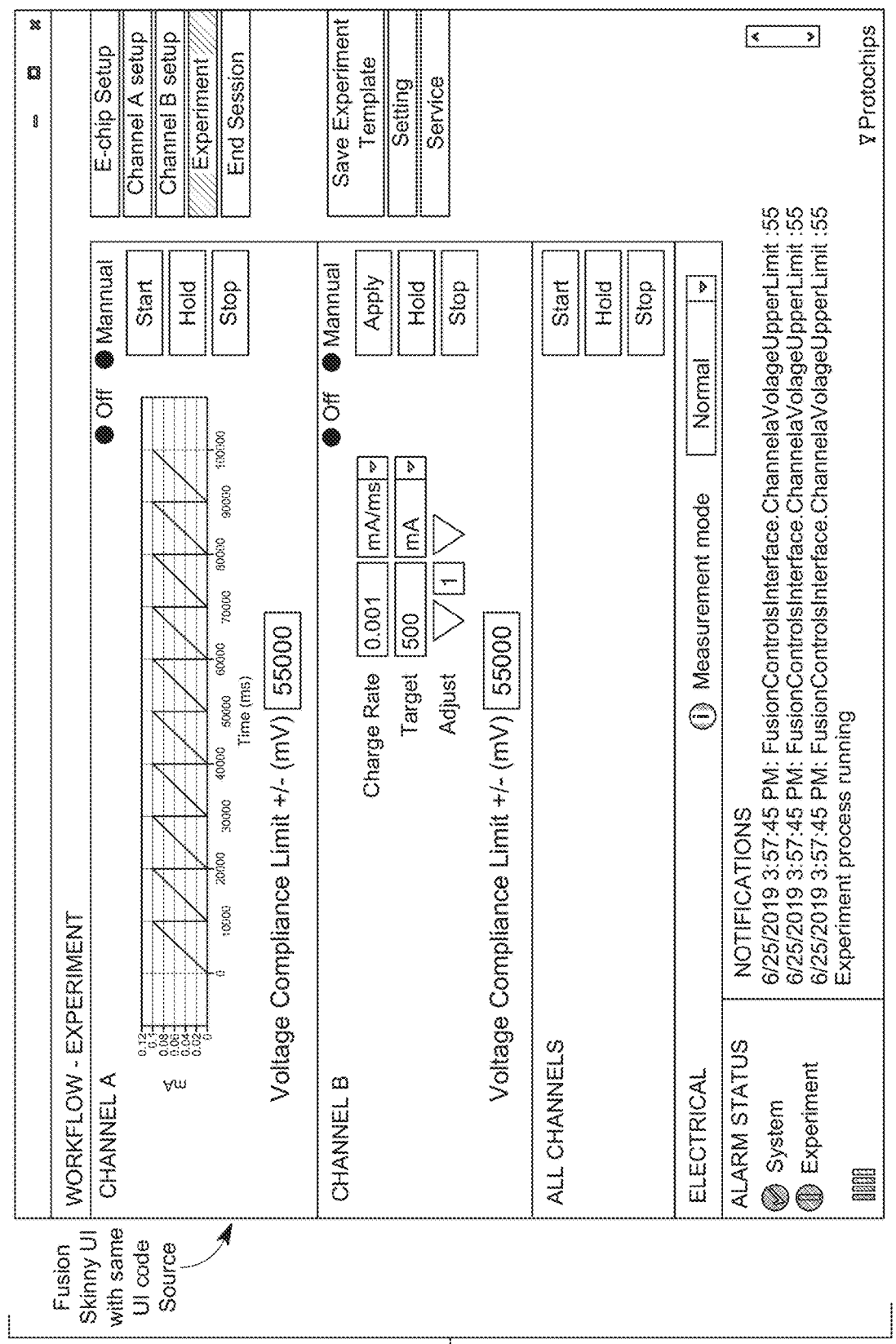
Figure 107C:
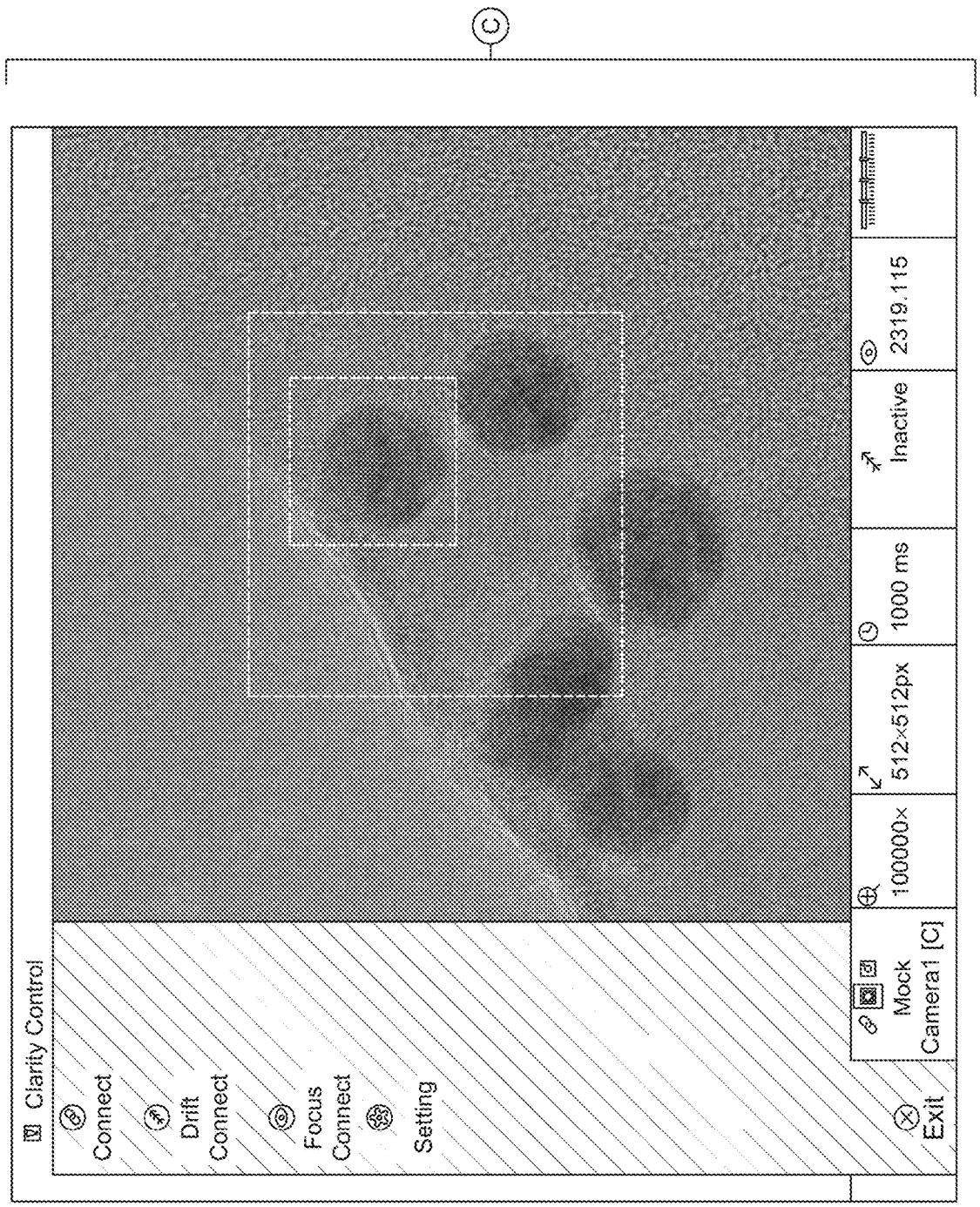
Figure 107D:
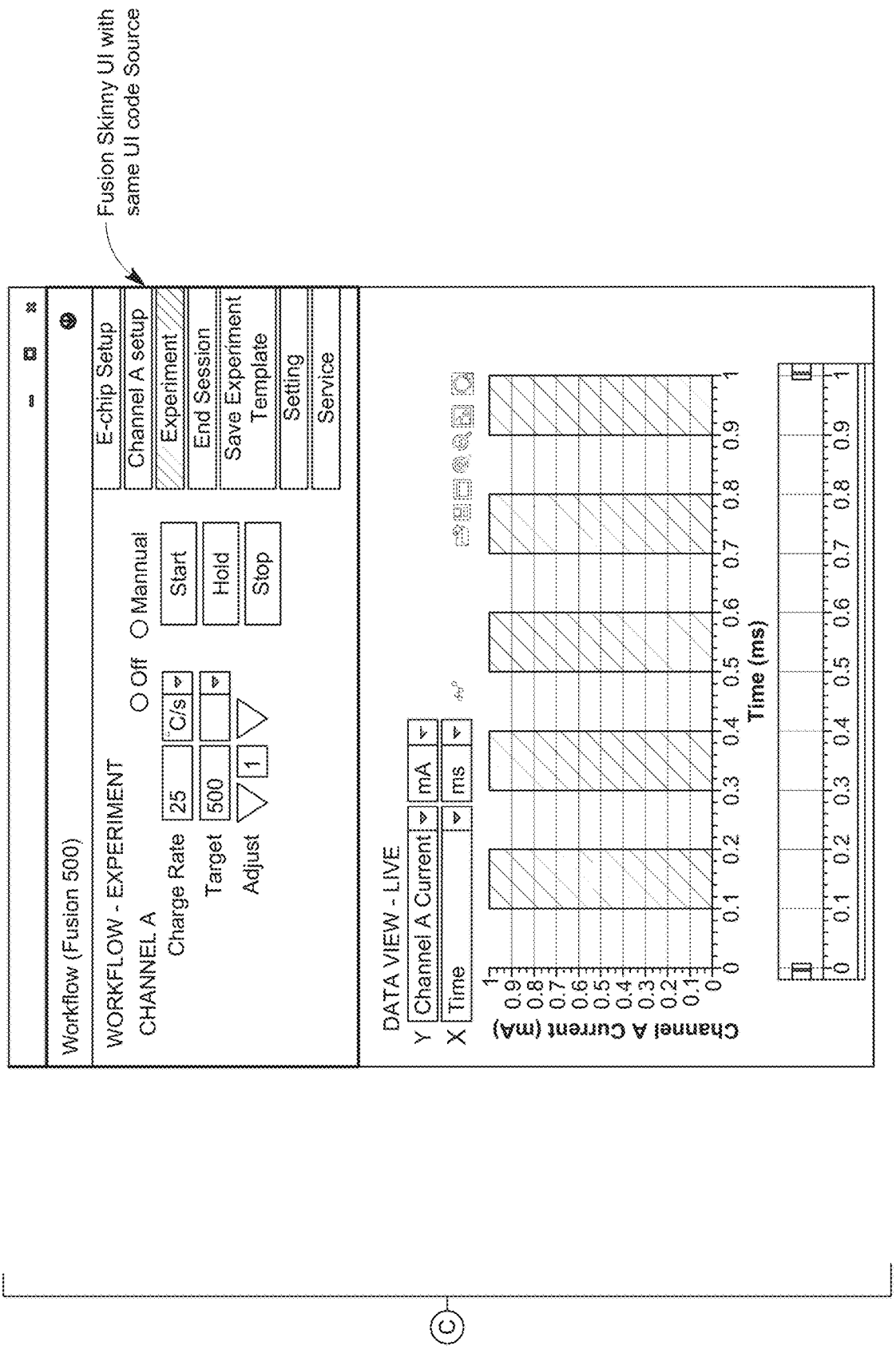

FIG. 106 is a graphical representation showing how the software suite described in FIG. 105 could have workflows shared between the native in-situ software and an embedded element within the control software. In this architecture, the entire in-situ user interfaces or certain subsets of in-situ user interfaces can be embedded in the control software user interface—possibly with a shared codebase. Reporting elements can be added as image metadata and incorporated into a common metadata plotting tool, log file or database.

FIG. 107 is a graphical representation showing an example of the user interface of an existing in-situ software and how certain elements of that user interface can be embedded into the control software giving users access to the live image, in-situ control and other features from a single tool. FIGS. 107A and 107B show the user interface of an existing in-situ software. FIGS. 107C and 107D show how the workflow and reporting elements could be embedded or built in the control software user interface.

Figure 108A:
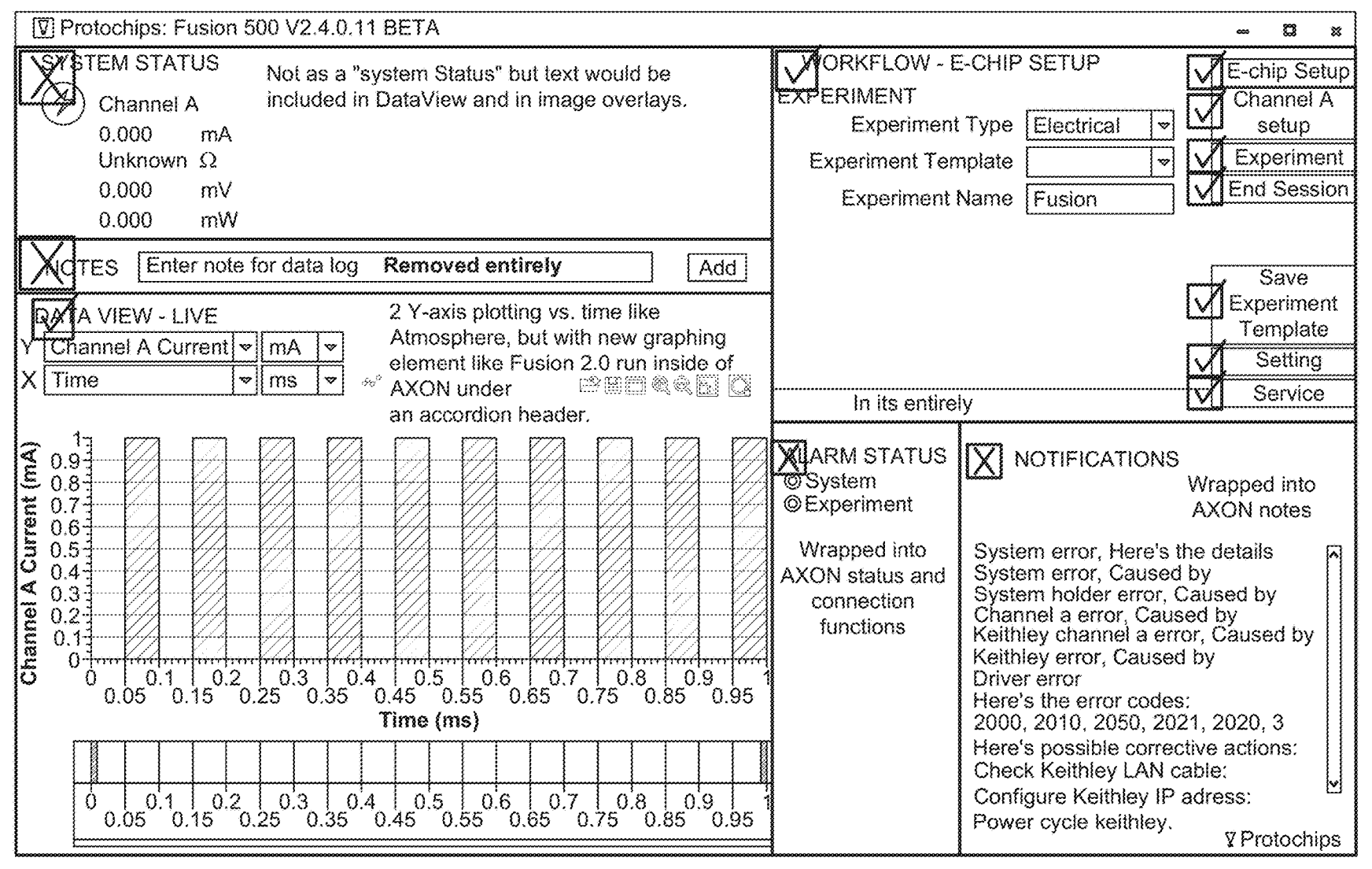
Figure 108B:
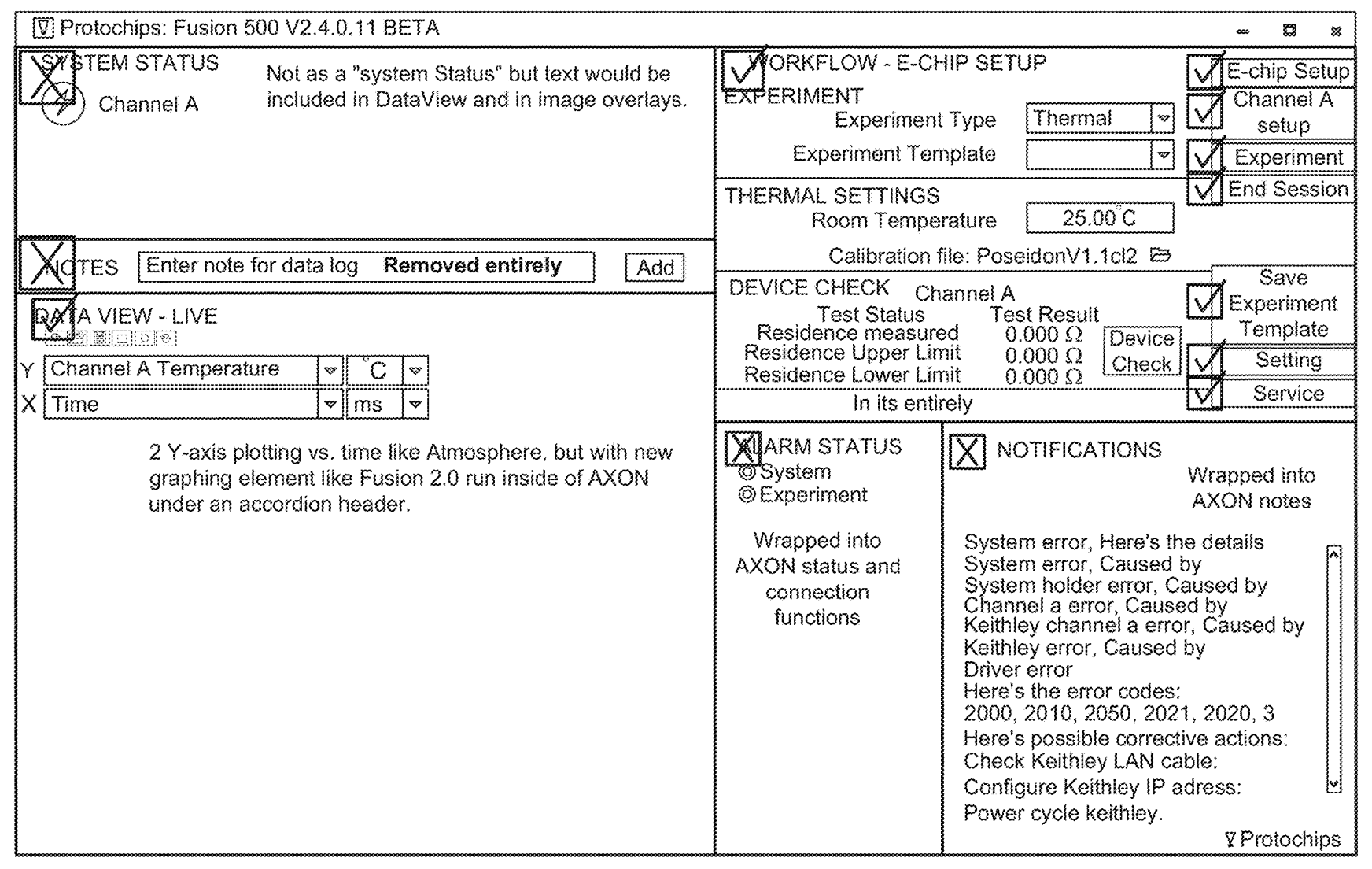
Figure 109:
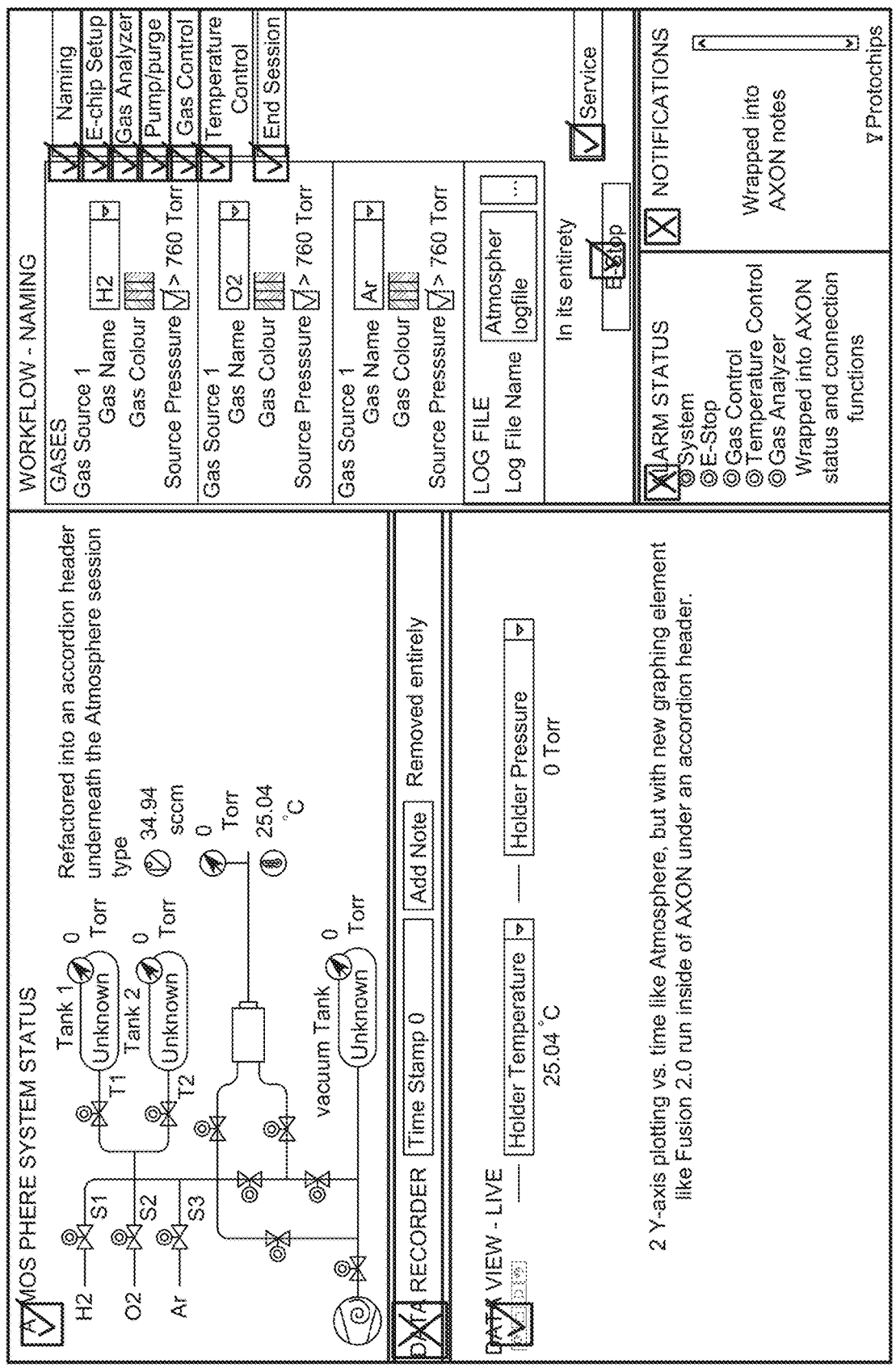

FIG. 108 and FIG. 109 are graphical representations of user interfaces used for existing in-situ control software, highlighting the critical elements that can be embedded into the control software workflow and user interface.

Figure 110:
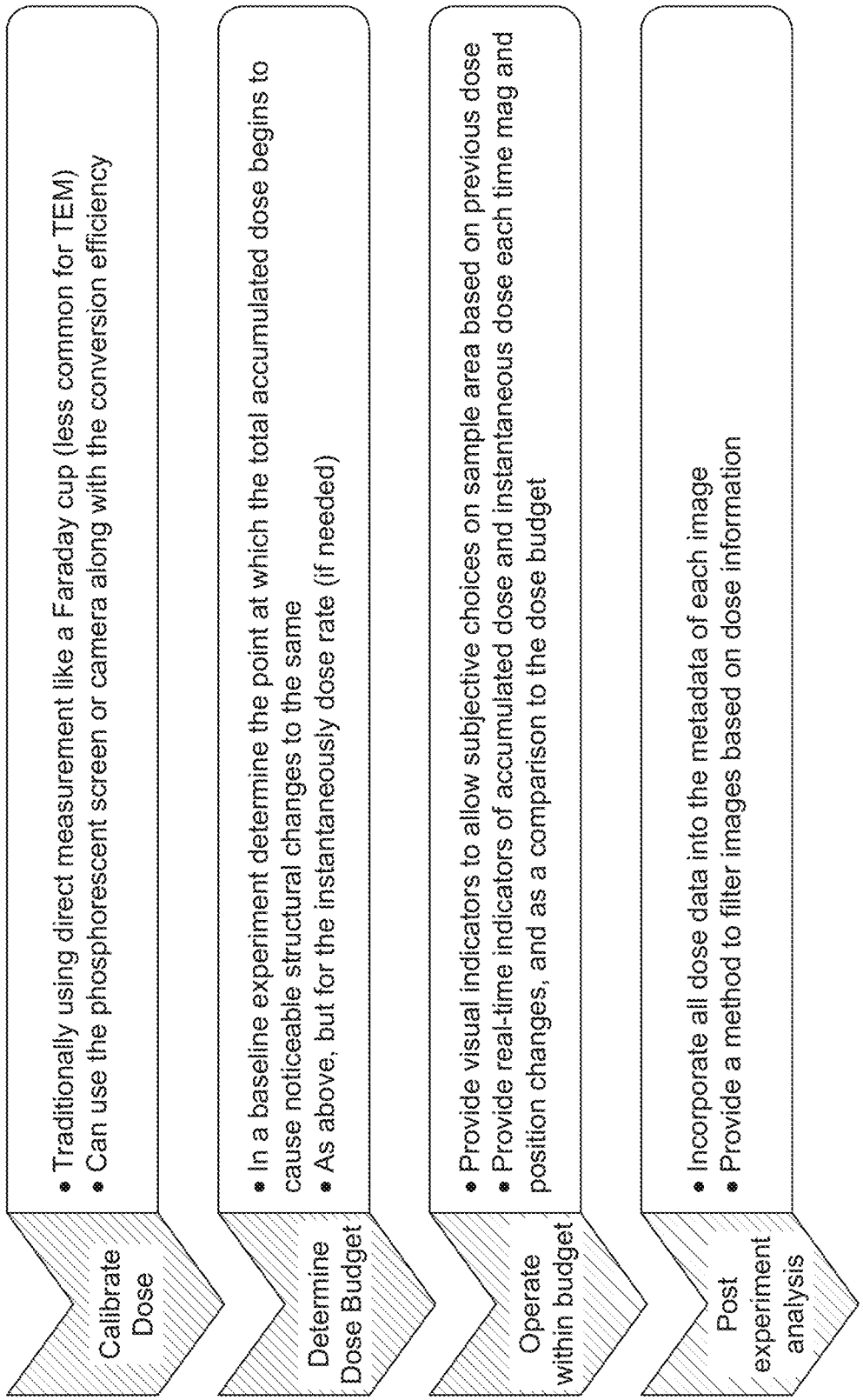
Figure 112:
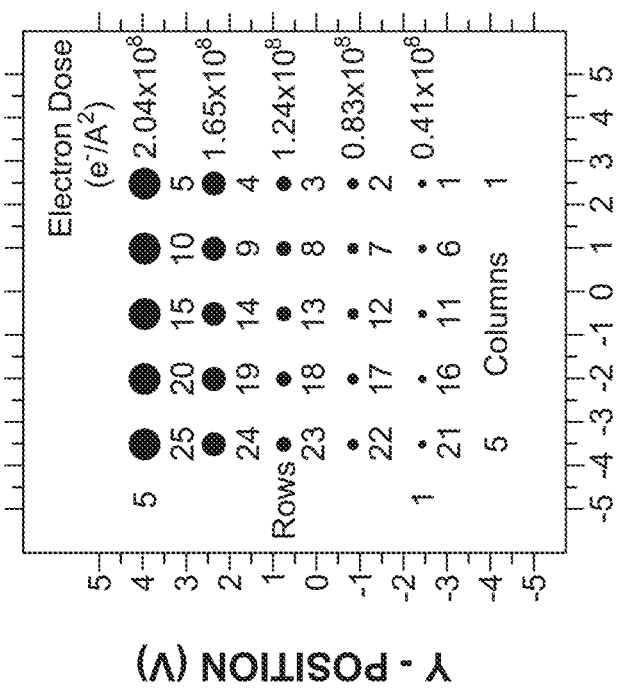
Figure 114:
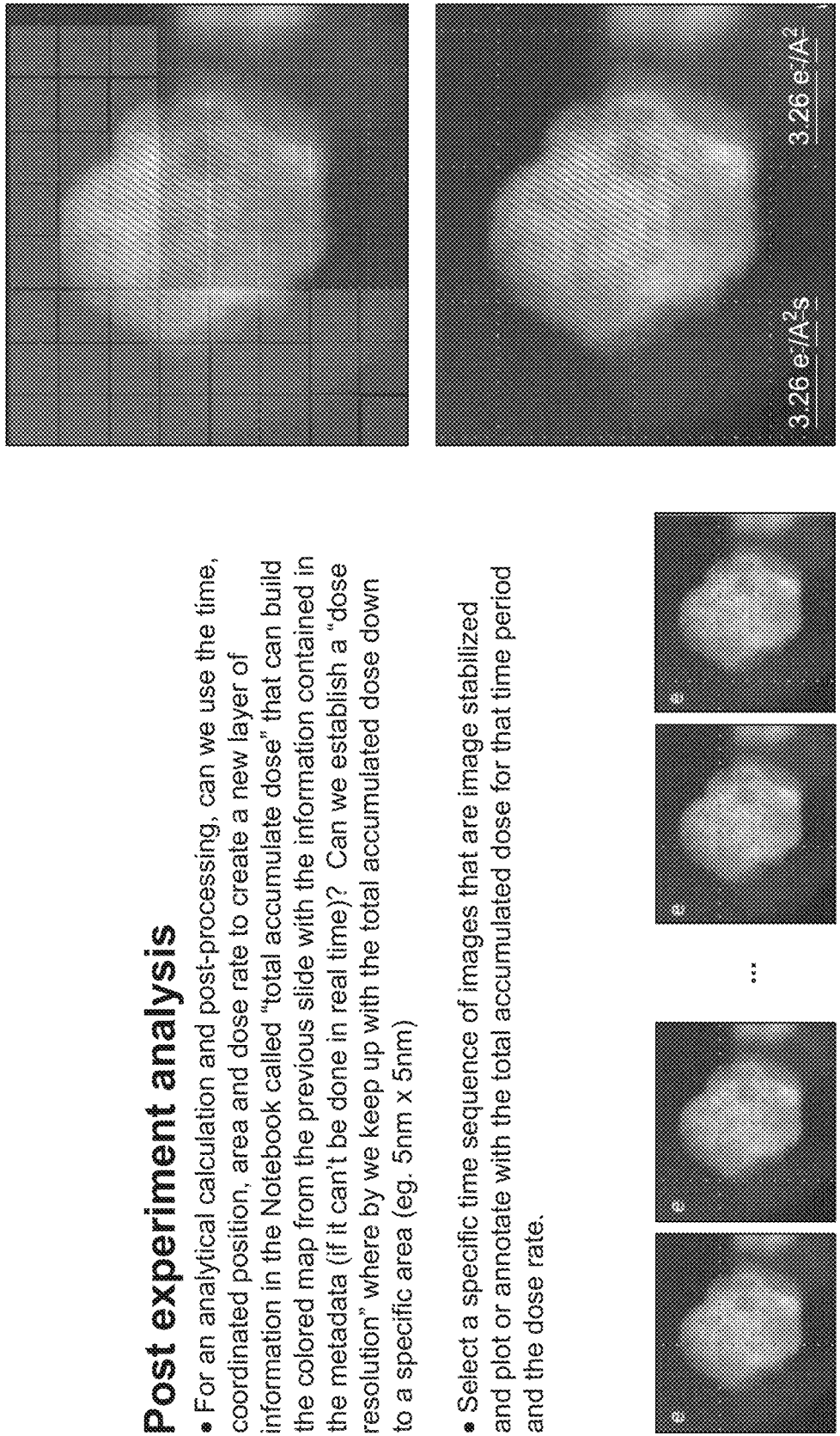
Figure 115:
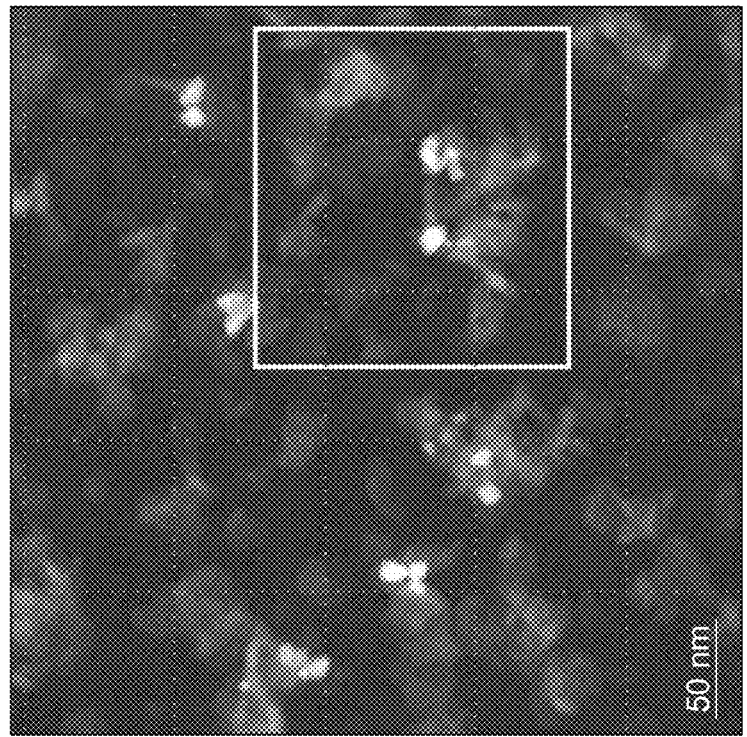

FIG. 110 through FIG. 115 represent a graphical flow chart detailing a workflow where the control software can help users effectively quantify, knowingly operate within, and review the effects of cumulative dose or maximum instantaneous dose rate on an experiment. FIG. 110 is a summary of an example workflow. FIG. 111 describes 2 methods where the control software can be used to help calibrate the true dose or dose rate at the sample so that experimental conditions are known and can be replicated. FIG. 112 shows how the control software can help users quantify and determine how much cumulative dose or instantaneous dose rate is too much for a sample and save the limits as a dose budget. FIG. 113 describes how the control software can help track the cumulative dose or instantaneous dose rate that operate within the established dose budget. FIGS. 114 and 115 describe methods that the control software can use to review sample sites and further quantify the effects of dose on their experiment.

Figure 116:
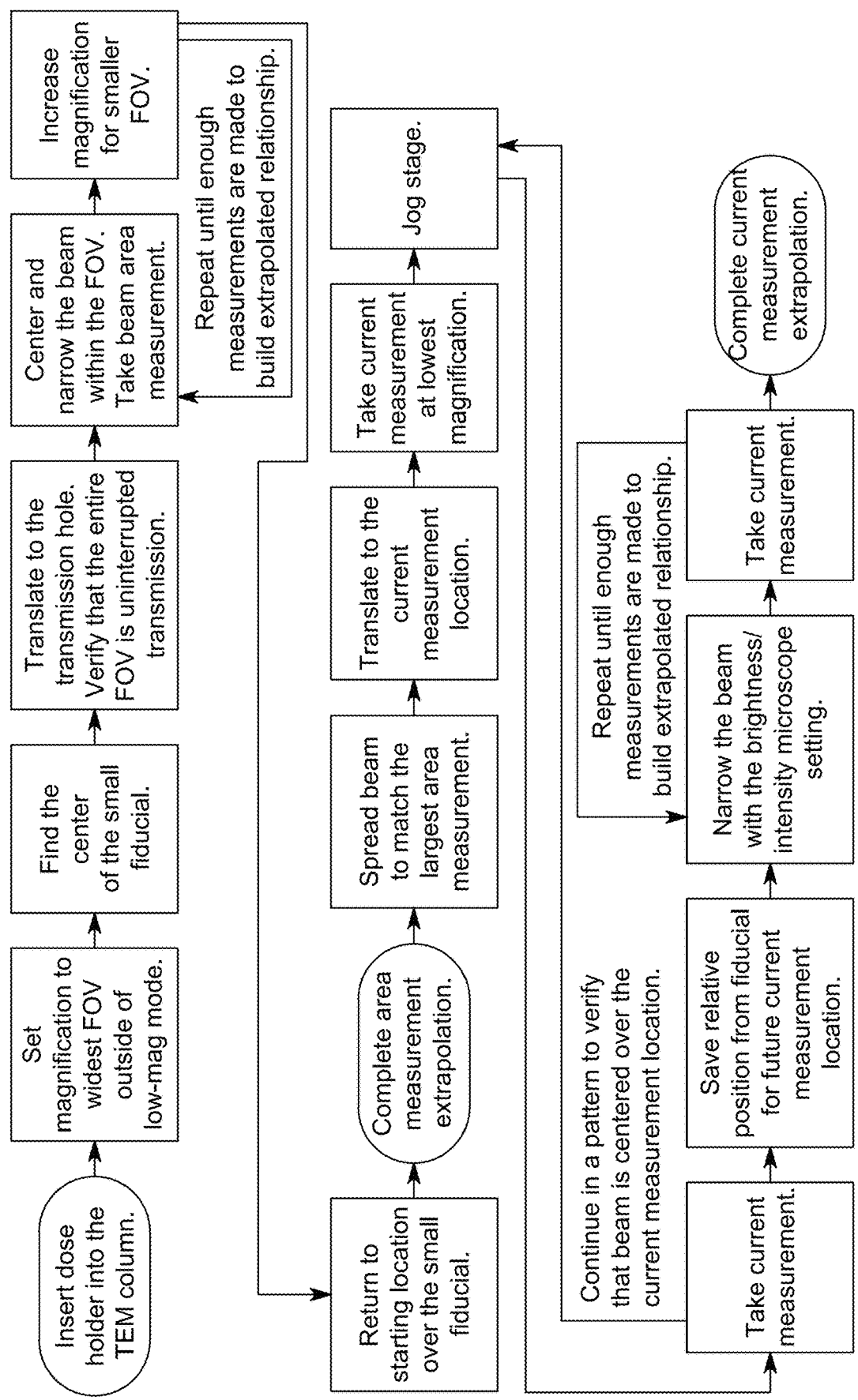
FIG. 116 depicts a process flow of an exemplary method of calibrating a TEM for measuring beam current.
Figure 117A:
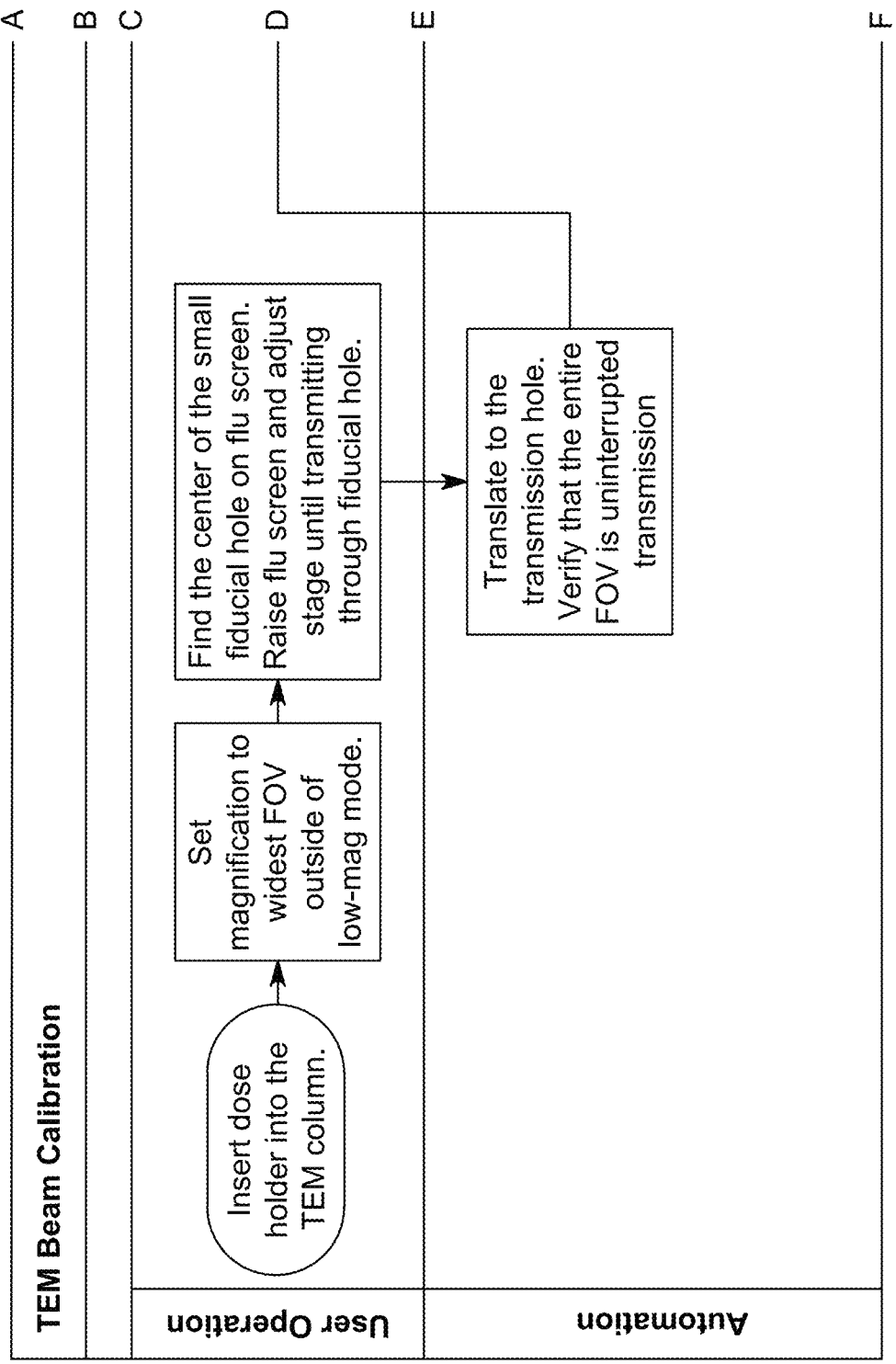
Figure 117B:
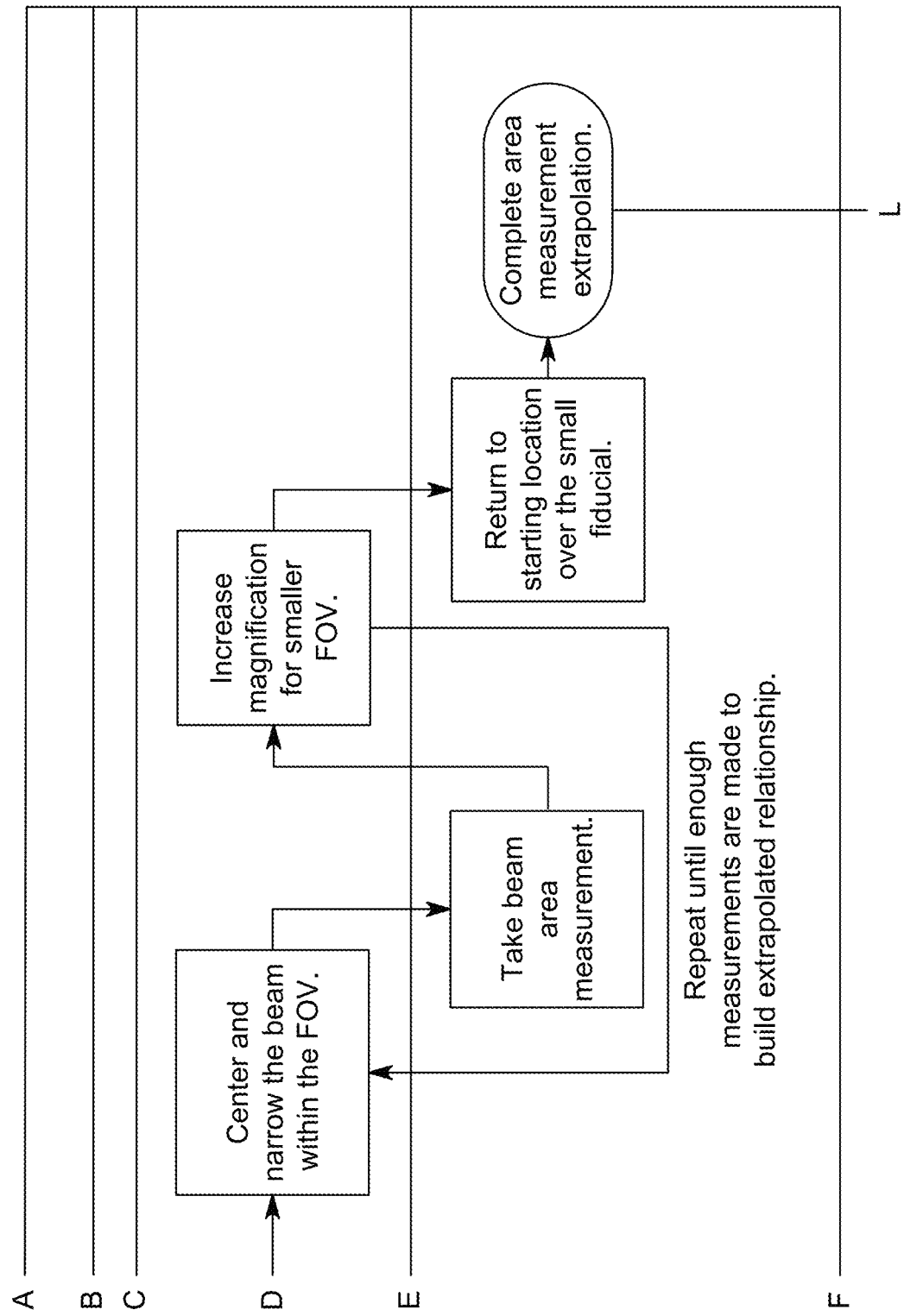
Figure 117C:
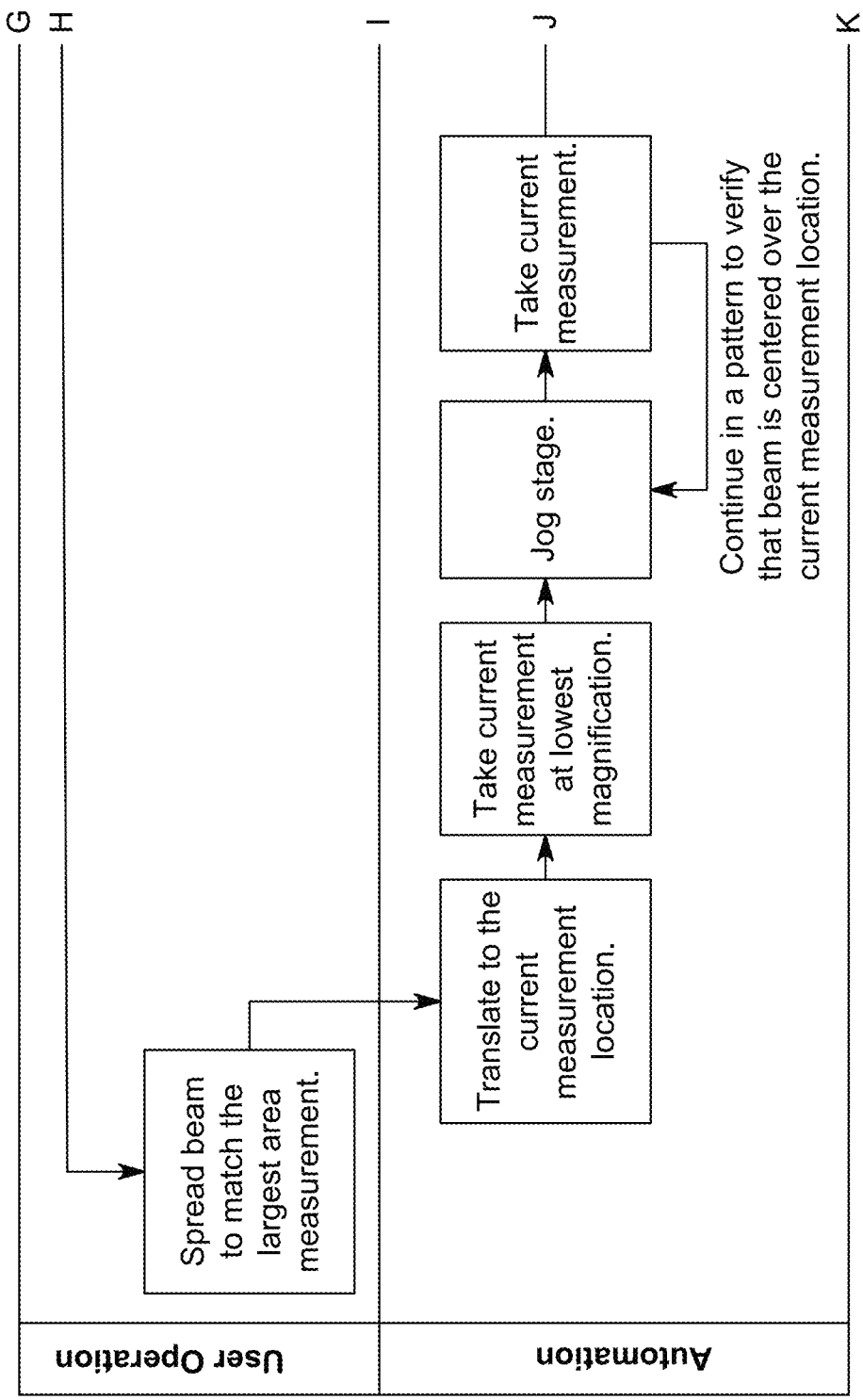

FIG. 116 depicts a process flow of an exemplary method of calibrating a TEM for measuring beam current. Referring to FIG. 116, the dose holder (also referred to as the TEM holder) is inserted into the TEM column. The TEM holder supports the sample at a eucentric position. The TEM holder includes one or more fiducial marks that may be used as a known reference point.

The magnification of the TEM is set to the widest field of view ("FOV") outside of low-magnification mode. The center of the fiducial mark of the TEM holder is located. In some embodiments, the center of the fiducial mark is located manually by the user, for example, by lowering the fluorescent screen and looking at that. In other embodiments, the center of the fiducial mark is located automatically using, for example, image recognition that identifies the known shape of the fiducial mark on the TEM holder.

After the fiducial mark has been located, the TEM holder is translated such that the transmission hole (also referred to as the through-hole) is aligned, and it is verified that the entire FOV is uninterrupted transmission. The amount of translation to align the transmission hole is known at this point because the fiducial mark has been located, and the transmission hole is located a known distance from the fiducial mark. In some embodiments, the translation is performed manually by the user. In some embodiments, the translation is performed by the goniometer, which moves the TEM holder by the known amount. The verification is a visual verification that may be performed manually by the user, or it may be performed automatically using software that checks for a substantial number of black pixels in the view.

After the transmission hole has been aligned, the beam is centered and narrowed within the FOV. This may be performed by checking for an area that is illuminated all the way around the view.

After the beam has been centered and narrowed, a measurement of beam area is taken.

After the measurement of beam area has been taken, the magnification is increased for a smaller FOV.

This process of centering and narrowing the FOV, taking the measurement of the beam area, and increasing the magnification for a smaller FOV is repeated until enough measurements of beam area have been made to build an extrapolated relationship. In other words, enough measurements are taken to allow a broader set of representative measurements to be extrapolated from the taken measurements. Once this process has repeated a sufficient number of times to build the extrapolated relationship, the TEM returns to the starting location over the small fiducial. The area measurement extrapolation is completed such that the full data set of area measurements are determined.

To do this, the beam is spread to match the largest area measurement from the extrapolated beam area measurement data. The TEM holder is translated to the location where the electron current is to be measured. A measurement of current is taken at the lowest magnification. The stage is then jogged, or translated, to a different point using the goniometer to move the TEM holder. This is done because the measurement of the current is being taken without knowing the precise location where the measurement is being taken, so by moving the TEM holder in small increments around the area of interest, it can be determined when the correct location has been found. Another measurement of current is taken. The process of jogging the stage and taking the measurement of current is continued in a pattern to verify that the beam is centered over the location of the current measurement. The relative position from the fiducial mark of the location for the measurement of the current is saved for a future current measurement location.

After it has been verified that the beam is centered over the location of the current measurement, the beam is narrowed using the brightness/intensity microscope setting, and a current measurement is taken. This process is repeated until enough measurements are made to build an extrapolated relationship. Once enough measurements have been taken, the area measurement extrapolation is completed.

At this point, the calibrations of the measurement of beam area and the measurement of current have been performed, so measurements can now be taken of a sample under investigation.

FIG. 117A through FIG. 117D depict the exemplary process flow of FIG. 116 broken down into user-performed actions and actions that are performed automatically. In various embodiments, however, the steps that are performed manually by the user may instead be performed automatically, as detailed above in the context of FIG. 116.

FIG. 118 depicts an exemplary embodiment of a TEM holder for measuring electron dose. The TEM shoulder is shown in FIG. 119A.

Figure 119A:
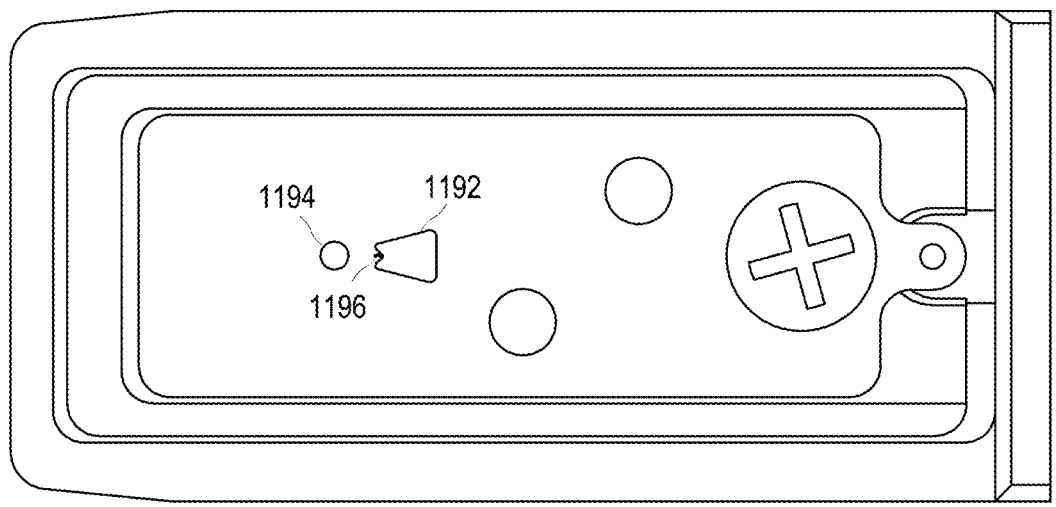
FIG. 119A depicts a top view of an exemplary embodiment of the tip of the TEM holder shown in FIG. 118.

FIG. 119A depicts a top view of the exemplary embodiment of the tip of the TEM holder shown in FIG. 118. Referring to FIG. 119A, the TEM holder tip includes a through-hole 1192, a current collection area 1194, and an exemplary fiducial mark 1196. The fiducial mark 1196 may be etched in the top layer 1195 of the TEM holder. In various embodiments, the fiducial mark 1192 may be various shapes or configurations, such as circles, rectangles triangles, or ellipses, which may be selected, for example, based on ease of location, ease of use to locate the current collection area and through-hole, and/or ease of manufacturing.

Figure 119B:
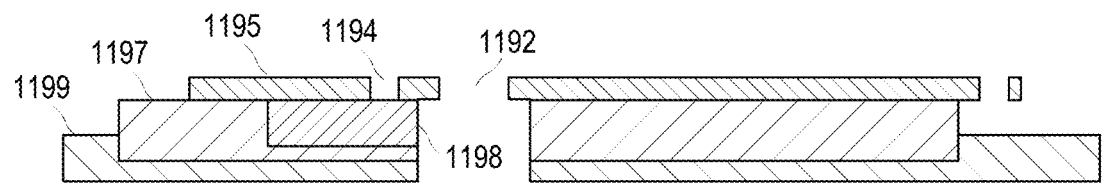
FIG. 119B depicts a cross-sectional side view of the exemplary embodiment of the tip of the TEM holder shown in FIG. 118 taken along the centerline.

FIG. 119B depicts a cross-sectional side view of the exemplary embodiment of the tip of the TEM holder shown in FIG. 118 taken along the centerline. Metal layer 1195 includes the current collection area 1194, through-hole 1192, and fiducial mark 1196 (not shown in FIG. 119B). The current collection area 1194 also includes a graphite or carbon block 1198 in the insulating layer 1197 below current collection area 1194. Insulating layer 1197 separates the metal layer 1195 from the body 1199 of the TEM holder tip. The through-hole 1192 passes completely through the TEM holder tip to allow for the beam to pass through.

Figure 120A:
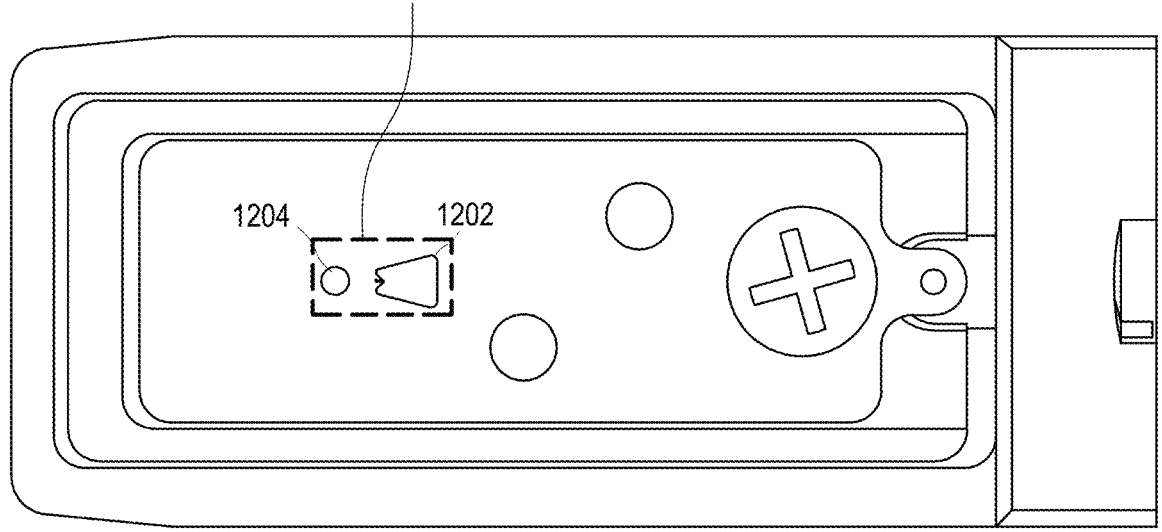
FIG. 120A depicts the top view of the exemplary embodiment of the tip of the TEM holder shown in FIG. 118 with the working area indicated in dashed lines.

FIG. 120A depicts the top view of the exemplary embodiment of the tip of the TEM holder shown in FIG. 118 with the working area indicated in dashed lines. The working area, which is shown in more detail in FIG. 120B, includes the through-hole, the current collection area, and the fiducial mark.

Figure 120B:
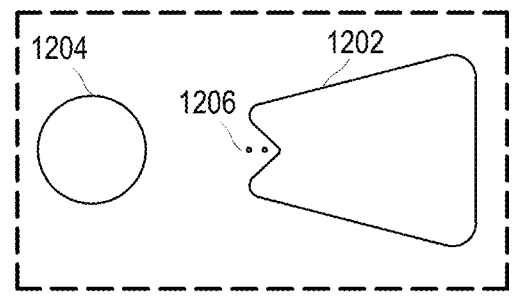
FIG. 120B depicts a zoomed-in view of the working area indicated in FIG. 120A.

FIG. 120B depicts a zoomed-in view of the working area indicated in FIG. 120A. Referring to FIG. 120B, the working area includes current collection area 1204, two fiducial dots 1206, and through-hole 1202. The two fiducial dots 1206 may be used for rotational offset and/or alignment, as well as operating as a marker within the fiducial mark.

Figure 121A:
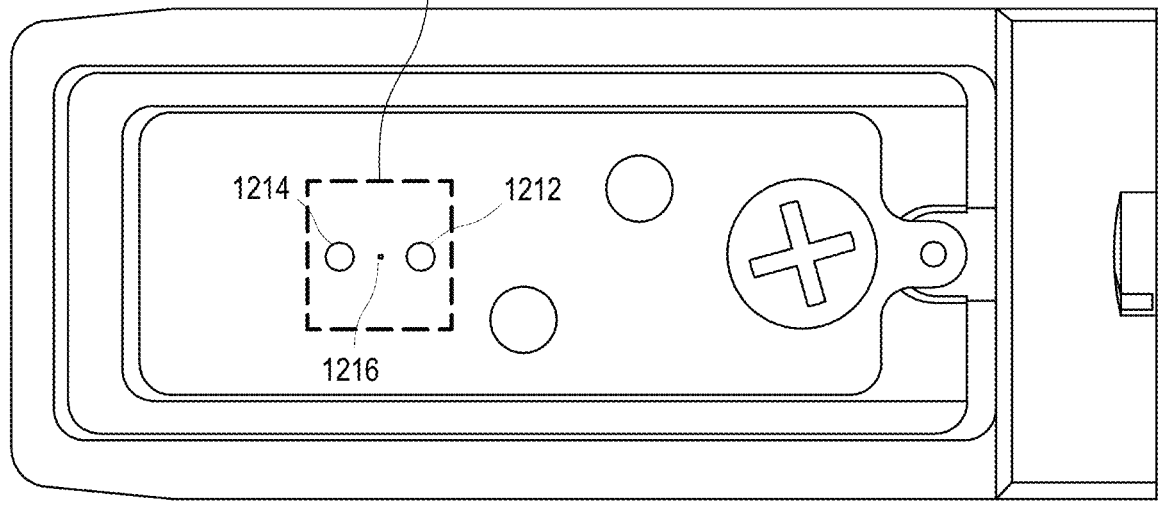
FIG. 121A depicts a top view of a second exemplary embodiment of the tip of the TEM holder with the working area indicated in dashed lines.

FIG. 121A depicts a top view of a second exemplary embodiment of the tip of a TEM holder with the working area indicated in dashed lines. Referring to FIG. 121A, the second exemplary embodiment of the TEM holder tip includes through-hole 1212, fiducial mark 1216, and current collection area 1214.

Figure 121B:
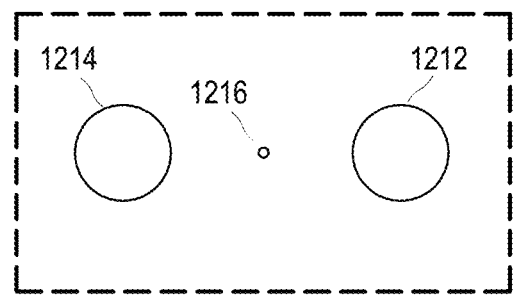
FIG. 121B depicts a zoomed-in view of the working area indicated in FIG. 121A.

FIG. 121B depicts a zoomed-in view of the working area indicated in FIG. 121A.

Figure 122A:
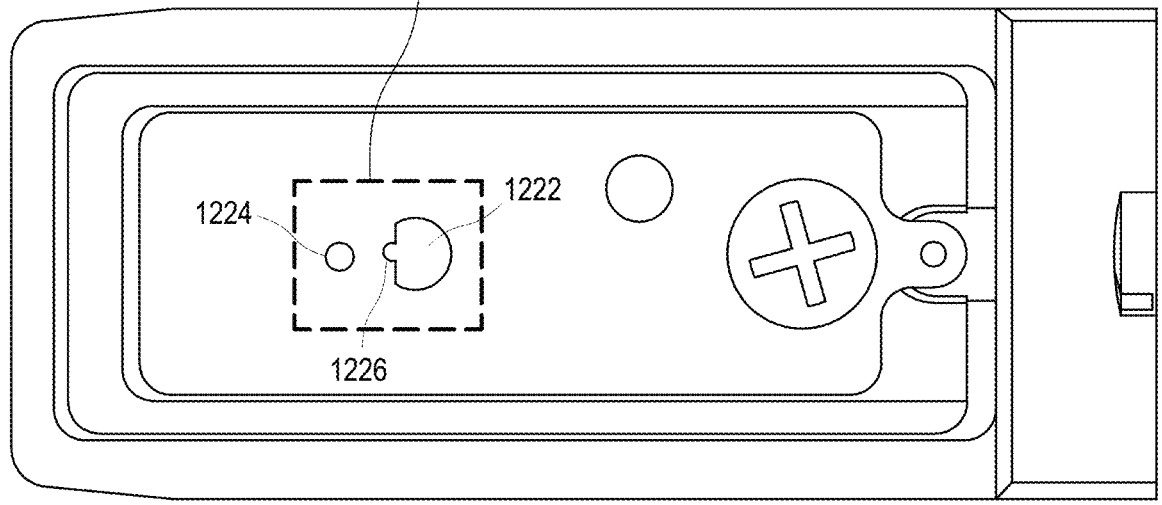
FIG. 122A depicts a top view of a third exemplary embodiment of the tip of the TEM holder with the working area indicated in dashed lines.

FIG. 122A depicts a top view of a third exemplary embodiment of the tip of a TEM holder with the working area indicated in dashed lines. Referring to FIG. 122A, the third exemplary embodiment of the TEM holder tip includes through-hole 1222, current collection area 1224, and fiducial mark 1226.

Figure 122B:
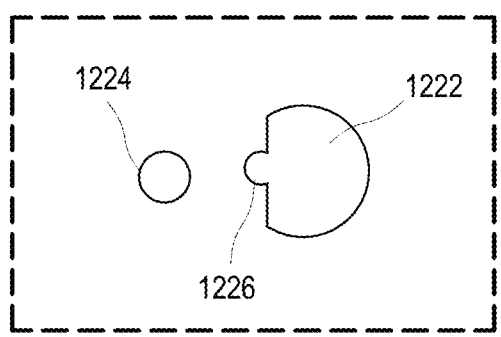
FIG. 122B depicts a zoomed-in view of the working area indicated in FIG. 122A.

FIG. 122B depicts a zoomed-in view of the working area indicated in FIG. 122A. As can be seen from FIG. 122B, in this particular embodiment, fiducial mark 1226 is integrated with the through-hole 1222.

Figure 123:
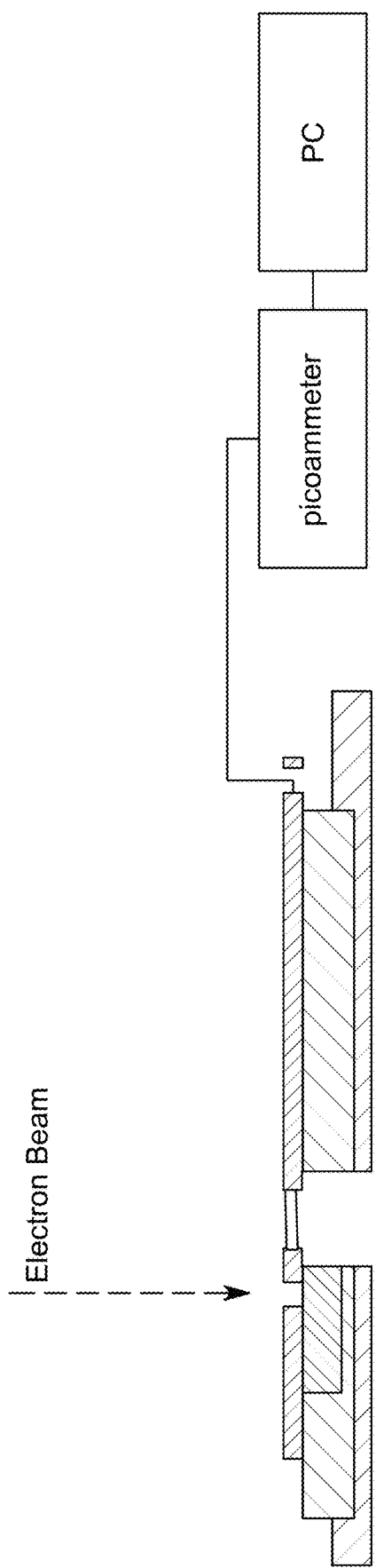
FIG. 123 depicts the side view of the tip of the TEM holder shown in FIG. 119A in which the current collection area is connected to a picoammeter and a PC.

FIG. 123 depicts the side view of the tip of the TEM holder shown in FIG. 119A in which the current collection area is connected to a picoammeter and a PC. The picoammeter is used for measuring the current.

Figure 124A:
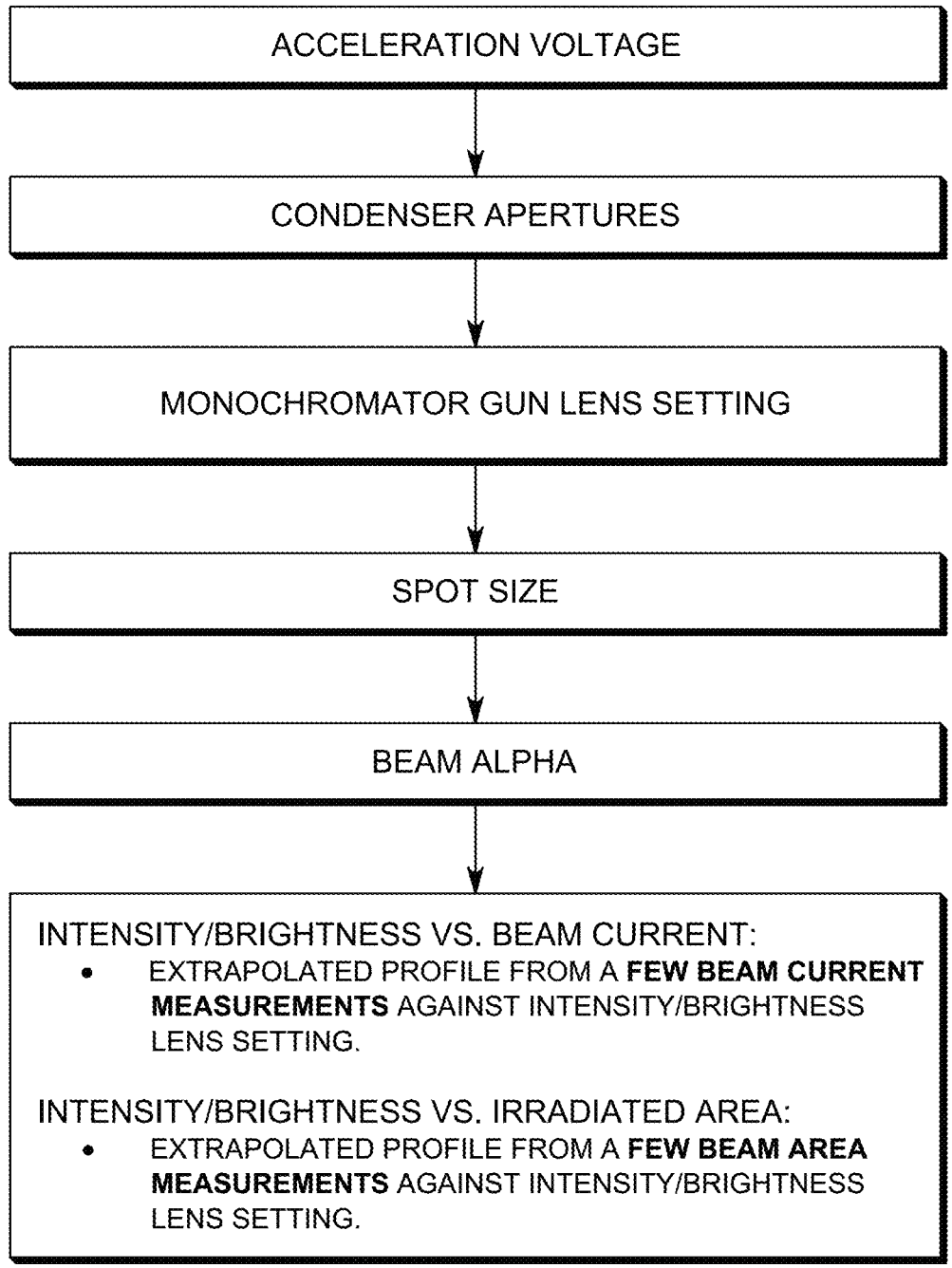
FIG. 124A depicts a list of TEM settings that make up a matrix of data determined during the calibration process described above in the context of FIG. 116.

FIG. 124A depicts a list of TEM settings that make up a matrix of data determined during the calibration process described above in the context of FIG. 116. Referring to FIG. 124A, each of the settings of acceleration voltage, condenser apertures, monochromator gun lens setting, spot size, and beam alpha (i.e., convergence angle) comprises data values that represent an intensity/brightness vs. beam current and intensity/brightness vs. irradiated area. The data may be represented in a matrix data structure such that each possible value of each variable can be configured against each other possible value of each variable. The intensity/brightness vs. beam current values are extrapolated from a few beam current measurements against intensity/brightness lens setting. The intensity/brightness vs. irradiated area values are extrapolated profile from a few beam area measurements against intensity/brightness lens setting.

A method for measuring electron dose in a sample with a transmission electron microscope (TEM) is disclosed herein. The method includes locating a fiducial mark on a TEM holder tip. The TEM holder tip includes a through-hole located at a predetermined distance from the fiducial mark and a current collection area located at a predetermined distance from the fiducial mark. The method further includes calibrating the TEM for measuring beam area across a range of possible beam areas to generate a calibration table for beam area for the TEM. The method further includes calibrating the TEM for measuring beam current across a range of possible beam currents to generate a calibration table for beam current for the TEM. The method further includes measuring electron dose on the sample during an experiment using the calibrated TEM having a defined configuration. The measured electron dose is determined using the calibration table for beam area and the calibration table for beam current.

In one embodiment, calibrating the TEM for measuring beam area across the range of possible beam areas includes locating the fiducial mark on the TEM holder tip, translating the TEM to the through-hole of the TEM holder tip based on the location of the fiducial mark, taking multiple beam area measurements of the TEM, with the multiple beam area measurements corresponding to multiple beam magnifications of the TEM, and extrapolating the multiple beam area measurements to generate the calibration table for beam area for the TEM.

In one embodiment, calibrating the TEM for measuring beam current across a range of possible beam currents includes locating the fiducial mark on the TEM holder tip, translating the TEM to the current collection area of the TEM holder tip based on the location of the fiducial mark, collecting current using a Faraday cup on the TEM holder tip, taking multiple beam current measurements of the TEM from the collected current, with the multiple beam current measurements corresponding to multiple configurations of the TEM, and extrapolating the multiple beam current measurements to generate the calibration table for beam current for the TEM.

A method for measuring electron dose in a sample with a transmission electron microscope (TEM) is disclosed herein. The method includes locating a fiducial mark on a TEM holder tip. The TEM holder tip includes a through-hole located at a predetermined distance from the fiducial mark and a current collection area located at a predetermined distance from the fiducial mark. The method further includes calibrating the TEM for measuring beam area across a range of possible beam areas to generate a calibration table for beam area for the TEM. Calibrating the TEM for measuring beam area across the range of possible beam areas includes locating the fiducial mark on the TEM holder tip, translating the TEM to the through-hole of the TEM holder tip based on the location of the fiducial mark, taking multiple beam area measurements of the TEM, with the multiple beam area measurements corresponding to multiple beam magnifications of the TEM, and extrapolating the multiple beam area measurements to generate the calibration table for beam area for the TEM. The method further includes calibrating the TEM for measuring beam current across a range of possible beam currents to generate a calibration table for beam current for the TEM. Calibrating the TEM for measuring beam current across a range of possible beam currents includes locating the fiducial mark on the TEM holder tip, translating the TEM to the current collection area of the TEM holder tip based on the location of the fiducial mark, collecting current using a Faraday cup on the TEM holder tip, taking multiple beam current measurements of the TEM from the collected current, with the multiple beam current measurements corresponding to multiple configurations of the TEM, and extrapolating the multiple beam current measurements to generate the calibration table for beam current for the TEM. The method further includes measuring electron dose on the sample during an experiment using the calibrated TEM having a defined configuration. The measured electron dose is determined using the calibration table for beam area and the calibration table for beam current.

The methods for measuring electron dose in a sample with a transmission electron microscope (TEM) described herein may be implemented in a microscope control system by a processor, as described above.

The methods and systems described herein may be used to generate a three-dimensional model of electron-sample interactions in the TEM based on the calibration table for beam area for the TEM and the calibration table for beam current for the TEM. The three-dimensional model of electron-sample interactions in the TEM may be used to convert measurements of electron dose into other useful data sets. As just one example, measurements of electron dose may be combined with Monte Carlo simulations of electron trajectories at the same accelerating voltage into material having the same composition.

Figure 124B:
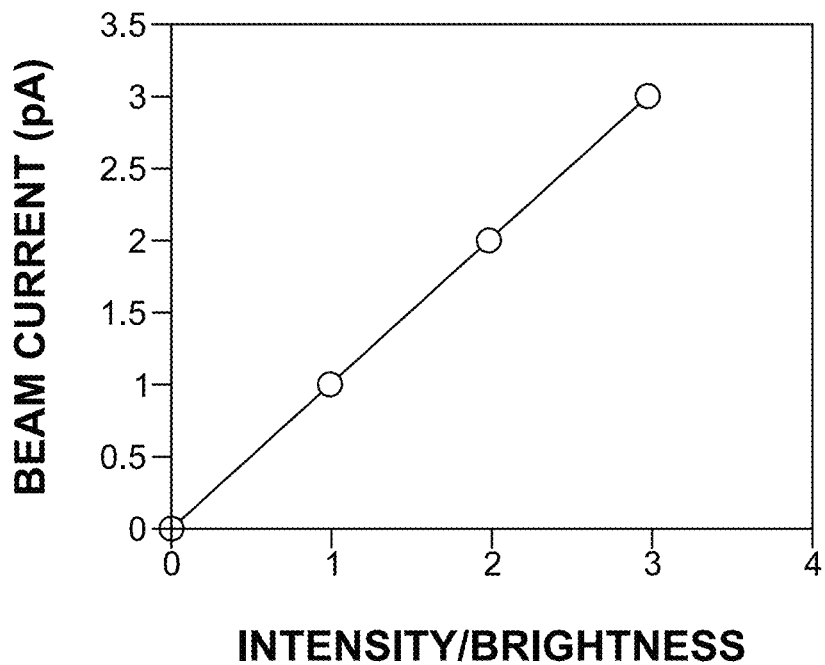
FIG. 124B shows a graph of intensity/brightness vs. beam current extrapolated from measurements taken during the calibration described in the context of FIG. 116.

FIG. 124B shows a graph of intensity/brightness vs. beam current extrapolated from measurements taken during the calibration described in the context of FIG. 116.

Figure 124C:
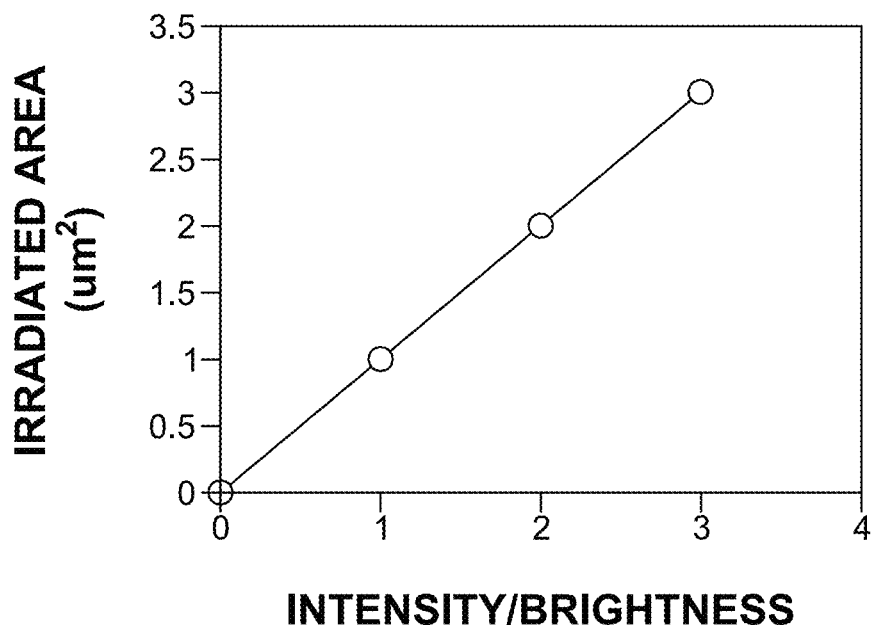
FIG. 124C shows a graph of intensity/brightness vs. irradiated area extrapolated from measurements taken during the calibration described in the context of FIG. 116.

FIG. 124C shows a graph of intensity/brightness vs. irradiated area extrapolated from measurements taken during the calibration described in the context of FIG. 116.

Figure 125:
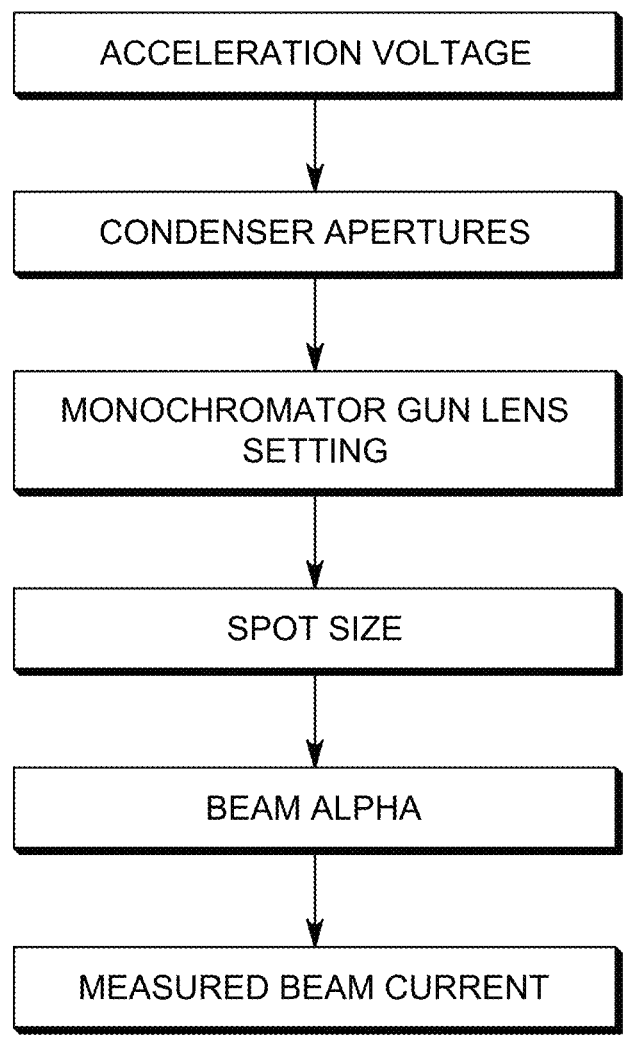
FIG. 125 depicts a list of STEM settings that make up a matrix of data determined during the calibration process for a STEM microscope.

FIG. 125 depicts a list of STEM settings that make up a matrix of data determined during the calibration process for a STEM microscope. Comparing the data of FIG. 124A to FIG. 125, it can be seen that the microscope settings are the same, but the only measured beam current is needed for a STEM microscope.

FIG. 126 depicts an exemplary graphical user interface showing a property grid with the matrix of data built based on the setting shown in FIG. 124.

FIG. 127 depicts an exemplary image shown as part of the measurement of beam area. Referring to FIG. 127, the top image represents the actual image as measured, for example, by the CCD or image sensor, and the bottom image depicts how the actual image is represented on the graphical user interface.

Figure 128A:
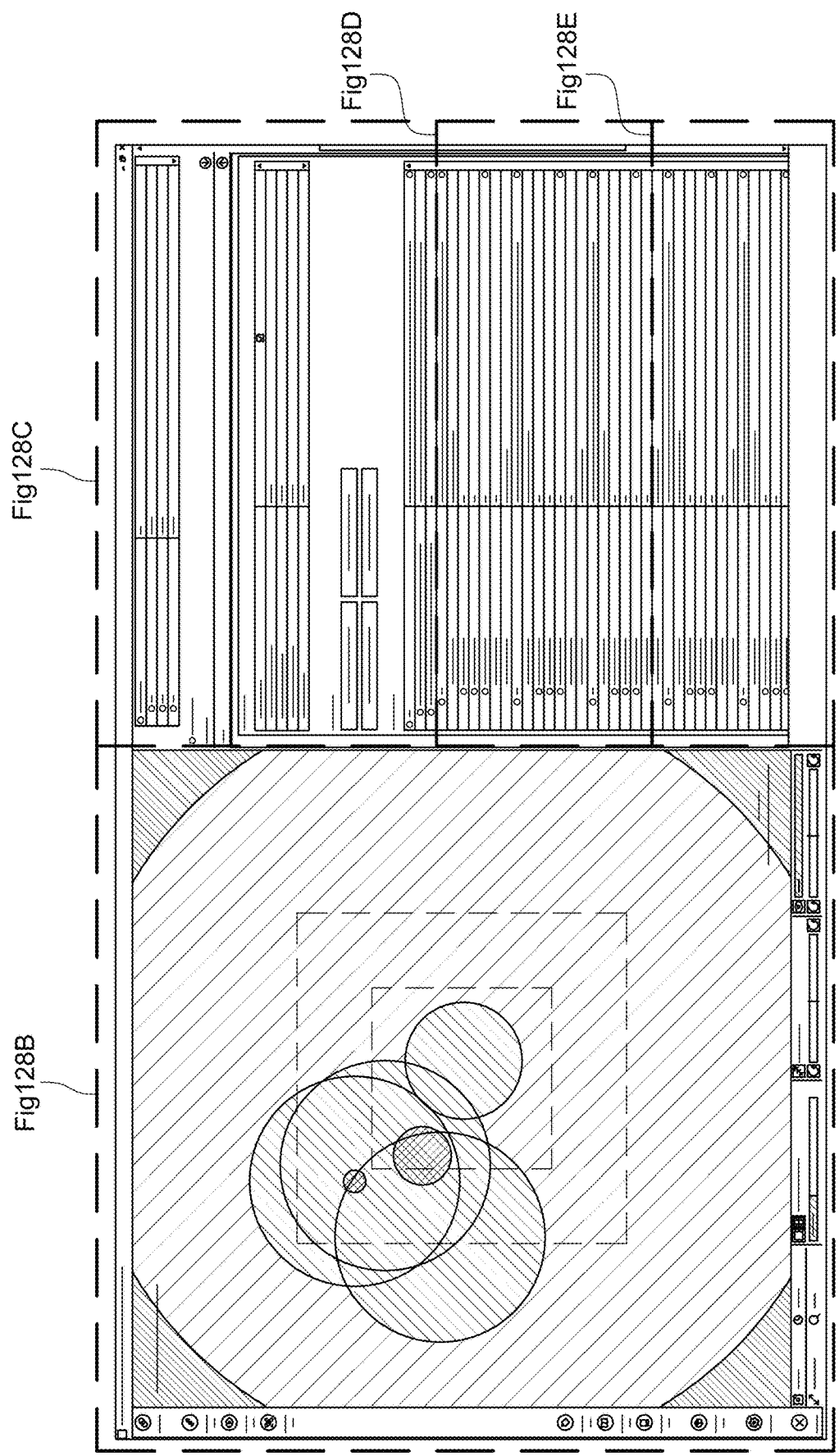
Figure 128B:
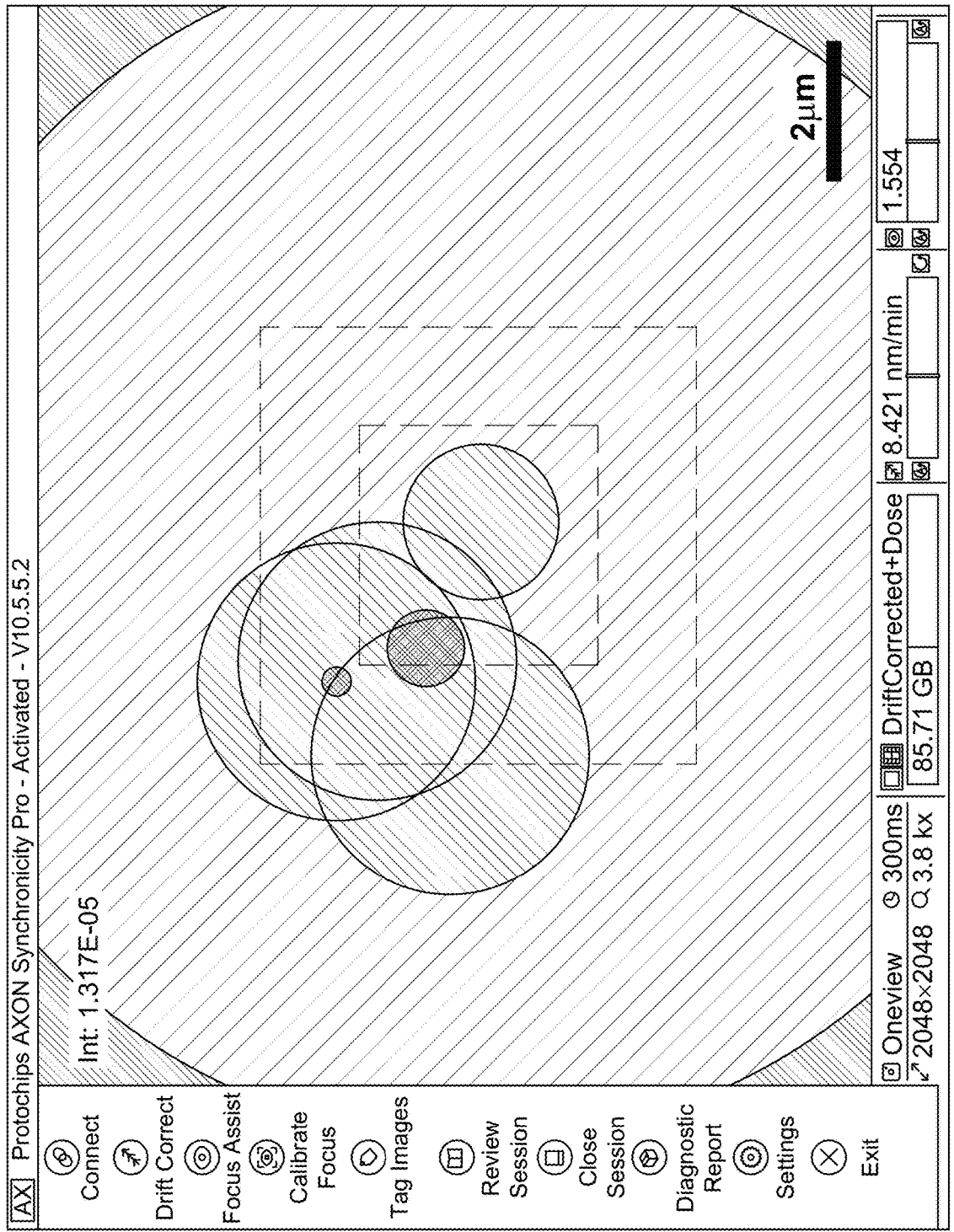

FIG. 128A through FIG. 128E depict an exemplary graphical user interface showing electron dose measurements taken as described herein. FIG. 128B shows a heat map representation of the end results of the calibration. In particular, FIG. 128B represents a cumulative electron dose rate over the course of an experiment.

Figure 129:
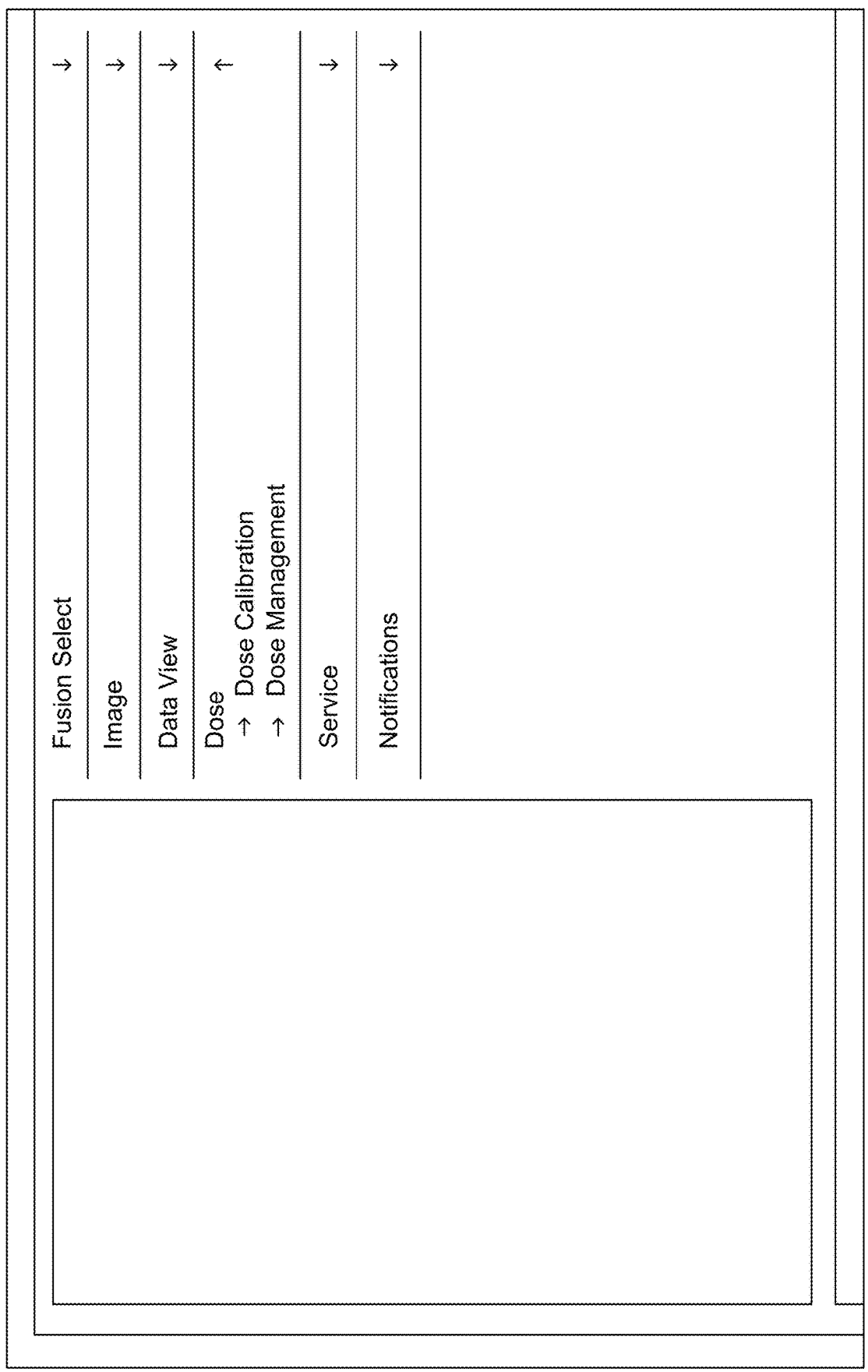
FIG. 129 through FIG. 131 depict an exemplary graphical user interface displaying the electron current measurements as described herein.
Figure 130:
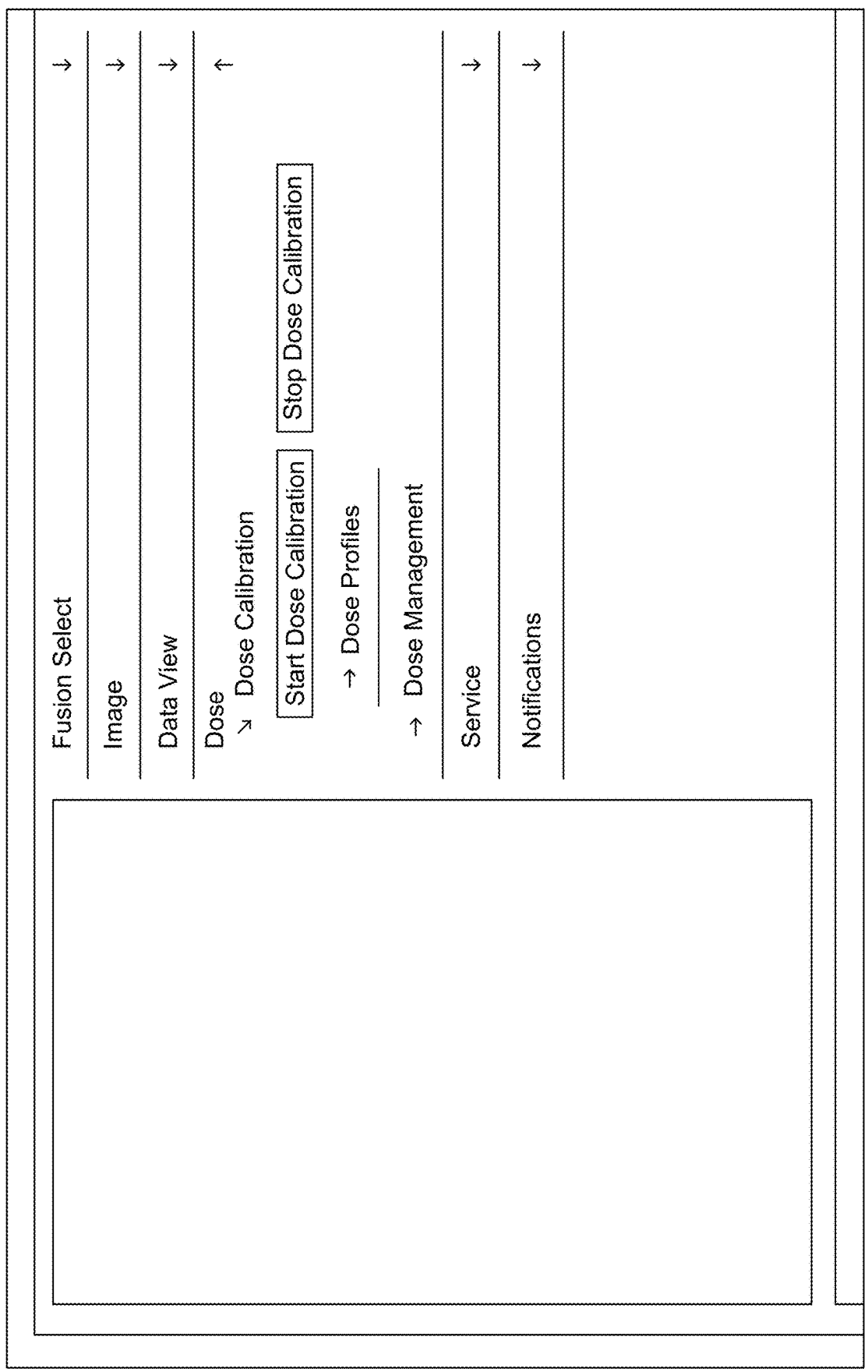
Figure 131:
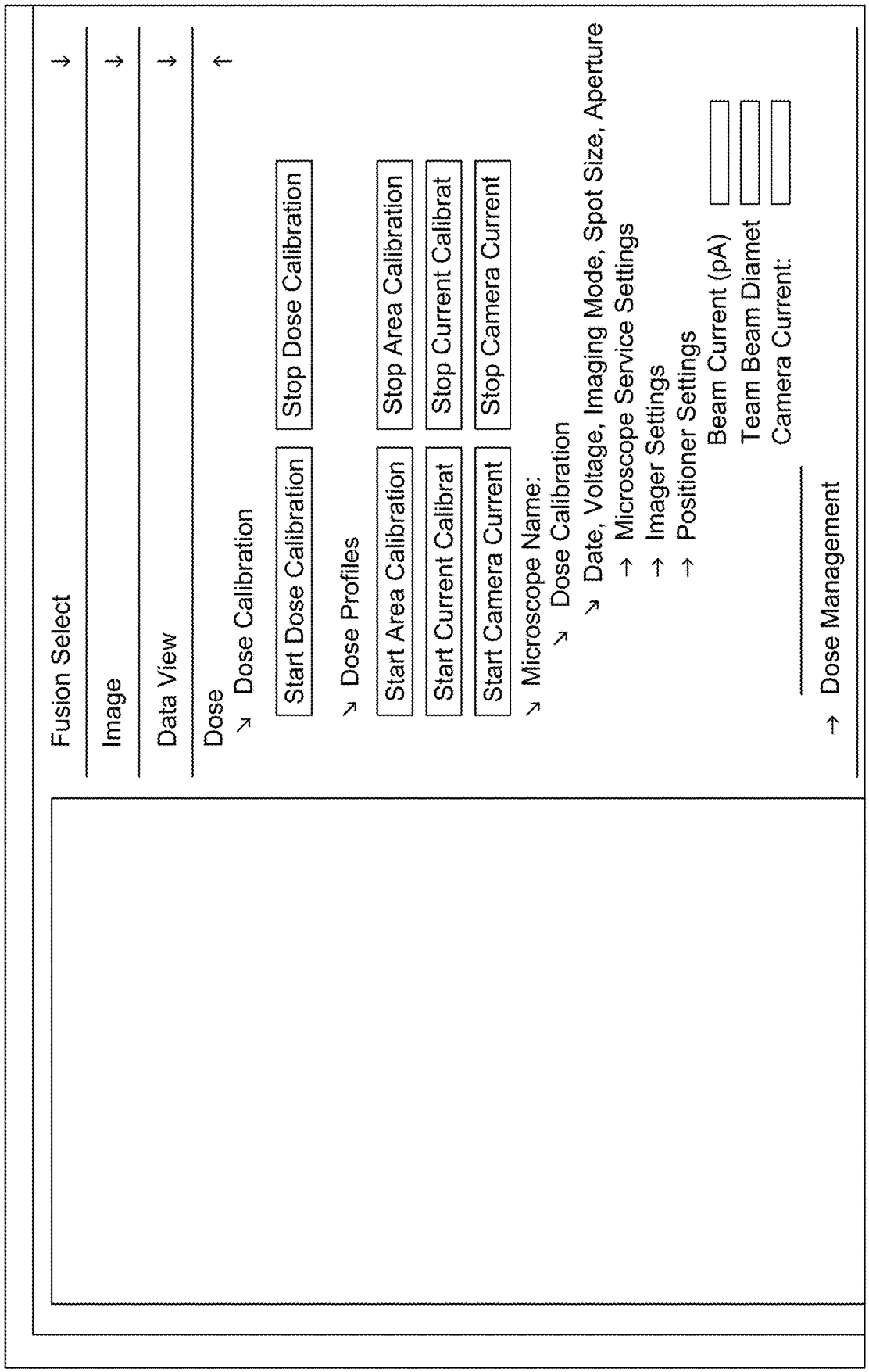

FIG. 129 through FIG. 131 depict an exemplary graphical user interface displaying the electron current measurements as described herein.

As may be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

These and other changes can be made to the disclosure in light of the Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. A method for measuring electron dose in a sample with a transmission electron microscope (TEM), the method comprising:

locating a fiducial mark on a TEM holder tip, wherein the TEM holder tip includes a through-hole located at a predetermined distance from the fiducial mark and a current collection area located at a predetermined distance from the fiducial mark;

calibrating the TEM for measuring beam area across a range of possible beam areas to generate a calibration table for beam area for the TEM;

calibrating the TEM for measuring beam current across a range of possible beam currents to generate a calibration table for beam current for the TEM; and measuring electron dose on the sample during an experiment using the calibrated TEM having a defined configuration, wherein the measured electron dose is determined using the calibration table for beam area and the calibration table for beam current.

2. The method of claim 1, wherein calibrating the TEM for measuring beam area across the range of possible beam areas comprises:
locating the fiducial mark on the TEM holder tip;
translating the TEM to the through-hole of the TEM holder tip based on the location of the fiducial mark;
taking multiple beam area measurements of the TEM, with the multiple beam area measurements corresponding to multiple beam magnifications of the TEM; and
extrapolating the multiple beam area measurements to generate the calibration table for beam area for the TEM.

3. The method of claim 1, wherein calibrating the TEM for measuring beam current across a range of possible beam currents comprises:
locating the fiducial mark on the TEM holder tip;
translating the TEM to the current collection area of the TEM holder tip based on the location of the fiducial mark;
collecting current using a Faraday cup on the TEM holder tip;
taking multiple beam current measurements of the TEM from the collected current, with the multiple beam current measurements corresponding to multiple configurations of the TEM; and
extrapolating the multiple beam current measurements to generate the calibration table for beam current for the TEM.

4. The method of claim 1, wherein the defined configuration of the TEM includes spot size, an aperture setting, an intensity or brightness setting, or an accelerating voltage.

5. The method of claim 1, further comprising correlating measured beam current to beam current reported by a fluorescent screen or camera across a range of TEM configurations to determine a correction factor such that a true beam current value can be determined for a value of fluorescent screen current or camera current for the defined configuration.

6. The method of claim 1, further comprising reducing an electron dose rate when a critical value for an electron dose rate or a cumulative electron dose has been reached.

7. The method of claim 6, wherein the electron dose rate is reduced by changing an aperture setting, changing the spot size, changing a beam intensity, or changing the beam current.

8. A microscope control system for measuring electron dose in a sample with a transmission electron microscope (TEM), the system comprising:
a processor configured for:
calibrating the TEM for measuring beam area across a range of possible beam areas to generate a calibration table for beam area for the TEM;
calibrating the TEM for measuring beam current across a range of possible beam currents to generate a calibration table for beam current for the TEM; and
measuring electron dose on the sample during an experiment using the calibrated TEM having a defined configuration, wherein the measured electron dose is determined using the calibration table for beam area and the calibration table for beam current.

9. The microscope control system of claim 8, wherein calibrating the TEM for measuring beam area across the range of possible beam areas comprises:
translating the TEM to a through-hole of a TEM holder tip based on a location of a fiducial mark on the TEM holder tip;
taking multiple beam area measurements of the TEM, with the multiple beam area measurements corresponding to multiple beam magnifications of the TEM; and
extrapolating the multiple beam area measurements to generate the calibration table for beam area for the TEM.

10. The microscope control system of claim 8, wherein calibrating the TEM for measuring beam current across a range of possible beam currents comprises:
translating the TEM to a current collection area of a TEM holder tip based on a location of a fiducial mark on the TEM holder tip;
taking multiple beam current measurements of the TEM using readings from an ammeter that reads current collected using a Faraday cup on the TEM holder tip, with the multiple beam current measurements corresponding to multiple configurations of the TEM; and
extrapolating the multiple beam current measurements to generate the calibration table for beam current for the TEM.

11. The microscope control system of claim 8, wherein the defined configuration of the TEM includes spot size, an aperture setting, an intensity or brightness setting, or an accelerating voltage.

12. The microscope control system of claim 8, wherein the processor is further configured for correlating measured beam current to beam current reported by a fluorescent screen or camera across a range of TEM configurations to determine a correction factor such that a true beam current value can be determined for a value of fluorescent screen current or camera current for the defined configuration.

13. The microscope control system of claim 8, wherein the processor is further configured for reducing an electron dose rate when a critical value for an electron dose rate or a cumulative electron dose has been reached.

14. The microscope control system of claim 13, wherein the electron dose rate is reduced by changing an aperture setting, changing the spot size, changing a beam intensity, or changing the beam current.

15. A transmission electron microscope (TEM) holder tip for measuring electron beam current, the TEM holder tip comprising:
a through-hole for allowing an electron beam to pass through the TEM holder tip;
a current collection area for capturing beam current of the electron beam; and
a fiducial mark positioned a predetermined distance from the collection area and a predetermined distance from the through-hole.

16. The TEM holder tip of claim 15, wherein the beam current is measured using an ammeter.

17. The TEM holder tip of claim 16, wherein a path from the current collection area to the ammeter comprises a low-resistance material and is electrically shielded to prevent interference.

18. The TEM holder tip of claim 15, wherein the TEM holder comprises a material having a low atomic number and low electrical resistivity for minimizing electron backscatter.

19. The TEM holder tip of claim 15, wherein the TEM holder tip comprises an aperture for minimizing electron backscatter.

20. The TEM holder tip of claim 15, wherein the current collection area is electrically isolated from a body of the TEM holder tip to avoid leakage.

21. The TEM holder tip of claim 15, wherein the through-hole, current collection area, and fiducial mark are defined in the same layer of the TEM holder tip to avoid a tolerance stack.

22. A method for measuring electron dose in a sample with a scanning transmission electron microscope (STEM), the method comprising:
  locating a fiducial mark on a STEM holder tip, wherein the STEM holder tip includes a current collection area located at a predetermined distance from the fiducial mark;
  calibrating the STEM for measuring beam current across a range of possible beam currents to generate a calibration table for beam current for the STEM; and
  measuring electron dose on the sample during an experiment using the calibrated STEM having a defined configuration, wherein the measured electron dose is determined using the calibration table for beam current.

23. The method of claim 22, wherein calibrating the STEM for measuring beam current across a range of possible beam currents comprises:
  locating the fiducial mark on the STEM holder tip;
  translating the STEM to the current collection area of the STEM holder tip based on the location of the fiducial mark;
  collecting current using a Faraday cup on the STEM holder tip;
  taking multiple beam current measurements of the STEM from the collected current, with the multiple beam current measurements corresponding to multiple configurations of the STEM; and
  extrapolating the multiple beam current measurements to generate the calibration table for beam current for the STEM.

24. The method of claim 22, further comprising reducing an electron dose rate when a critical value for an electron dose rate or a cumulative electron dose has been reached.

25. The method of claim 24, wherein the electron dose rate is reduced by reducing dwell time, reducing raster area, or using sparse scanning techniques.

* * * * *